(12) United States Patent
Suehiro et al.

(10) Patent No.: US 8,154,047 B2
(45) Date of Patent: Apr. 10, 2012

(54) SOLID ELEMENT DEVICE AND METHOD FOR MANUFACTURING THE SAME

(75) Inventors: Yoshinobu Suehiro, Aichi-ken (JP); Mitsuhiro Inoue, Aichi-ken (JP); Hideaki Kato, Aichi-ken (JP); Kunihiro Hadame, Aichi-ken (JP); Ryoichi Tohmon, Aichi-ken (JP); Satoshi Wada, Aichi-ken (JP); Koichi Ota, Aichi-ken (JP); Kazuya Aida, Saitama-ken (JP); Hiroki Watanabe, Saitama-ken (JP); Yoshinori Yamamoto, Saitama-ken (JP); Masaaki Ohtsuka, Saitama-ken (JP); Naruhito Sawanobori, Saitama-ken (JP)

(73) Assignees: Toyoda Gosei Co., Ltd., Aichi-ken (JP); Sumita Optical Glass Inc., Saitama-shi, Saitama-ken (JP)

( * ) Notice: Subject to any disclaimer, the term of this patent is extended or adjusted under 35 U.S.C. 154(b) by 0 days.

(21) Appl. No.: 12/923,788

(22) Filed: Oct. 7, 2010

(65) Prior Publication Data

US 2011/0101399 A1    May 5, 2011

Related U.S. Application Data

(62) Division of application No. 10/548,560, filed as application No. PCT/JP2004/003089 on Mar. 10, 2004, now Pat. No. 7,824,937.

(30) Foreign Application Priority Data

| Mar. 10, 2003 | (JP) | 2003-063015 |
|---|---|---|
| Jun. 5, 2003 | (JP) | 2003-160855 |
| Jun. 5, 2003 | (JP) | 2003-160867 |
| Jul. 7, 2003 | (JP) | 2003-193182 |
| Sep. 30, 2003 | (JP) | 2003-342705 |
| Sep. 30, 2003 | (JP) | 2003-342706 |
| Jan. 19, 2004 | (JP) | 2004-010385 |

(51) Int. Cl.
*H01L 33/56* (2010.01)

(52) U.S. Cl. ......... 257/100; 257/E23.118; 257/E23.125; 257/E33.059; 362/311.02; 362/311.05

(58) Field of Classification Search ........... 257/100, 257/E23.118, E23.125, E33.059; 362/311.02, 362/311.05
See application file for complete search history.

(56) References Cited

U.S. PATENT DOCUMENTS 2,801,375 A    7/1957    Losco
(Continued)

FOREIGN PATENT DOCUMENTS

DE    195 44 980 A1    6/1996
(Continued)

OTHER PUBLICATIONS

Japanese Office Action dated Feb. 20, 2007, with partial English translation.
(Continued)

*Primary Examiner* — David Vu
*Assistant Examiner* — Earl Taylor
(74) *Attorney, Agent, or Firm* — McGinn IP Law Group, PLLC

(57) ABSTRACT

A solid element device includes a solid element, an electric power receiving and supplying part for receiving electric power from and supplying the electric power to the solid element, and an inorganic sealing material for sealing the solid element. The inorganic sealing material includes a low melting glass selected from $SiO_2$—$Nb_2O_5$-based, $B_2O_3$—F-based, $P_2O_5$—F-based, $P_2O_5$—ZnO-based, $SiO_2$—$B_2O_3$—$La_2O_3$-based, and $SiO_2$—$B_2O_3$-based low melting glasses.

14 Claims, 100 Drawing Sheets

U.S. PATENT DOCUMENTS

| | | | |
|---|---|---|---|
| 3,377,522 | A | 4/1968 | Tsuji et al. |
| 3,596,136 | A | 7/1971 | Fischer |
| 3,723,835 | A | 3/1973 | Davis et al. |
| 4,018,613 | A | 4/1977 | Martin |
| 4,174,491 | A | 11/1979 | Nakamura et al. |
| 4,680,617 | A | 7/1987 | Ross |
| 4,784,872 | A | 11/1988 | Moeller et al. |
| 4,940,677 | A * | 7/1990 | Beall et al. ............... 501/45 |
| 5,022,921 | A * | 6/1991 | Aitken ................. 106/38.9 |
| 5,122,484 | A * | 6/1992 | Beall et al. ............... 501/46 |
| 5,391,523 | A | 2/1995 | Marlor |
| 5,476,553 | A | 12/1995 | Hanoka et al. |
| 5,607,886 | A | 3/1997 | Onozawa |
| 5,641,997 | A | 6/1997 | Ohta et al. |
| 5,665,983 | A | 9/1997 | Nagano |
| 5,670,797 | A | 9/1997 | Okazaki |
| 5,814,533 | A | 9/1998 | Shakuda |
| 5,814,837 | A | 9/1998 | Okazaki |
| 5,882,949 | A | 3/1999 | Okazaki |
| 5,981,945 | A | 11/1999 | Spaeth et al. |
| 6,028,327 | A | 2/2000 | Mizoguchi et al. |
| 6,163,106 | A * | 12/2000 | Sugawara et al. ............ 313/480 |
| 6,340,824 | B1 | 1/2002 | Komoto et al. |
| 6,417,019 | B1 | 7/2002 | Mueller et al. |
| 6,756,731 | B1 * | 6/2004 | Sano ..................... 313/499 |
| 7,151,064 | B2 * | 12/2006 | Otsuka et al. ............. 501/44 |
| 7,382,033 | B2 * | 6/2008 | Roth et al. ............... 257/432 |
| 7,470,926 | B2 * | 12/2008 | Suehiro et al. ............ 257/10 |
| 7,667,223 | B2 * | 2/2010 | Suehiro et al. ............ 257/10 |
| 2001/0000622 | A1 | 5/2001 | Reeh et al. |
| 2001/0010449 | A1 | 8/2001 | Chiu et al. |
| 2001/0026011 | A1 | 10/2001 | Roberts et al. |
| 2001/0045573 | A1 | 11/2001 | Waitl et al. |
| 2002/0001881 | A1 | 1/2002 | Kosokabe |
| 2002/0070449 | A1 | 6/2002 | Yagi et al. |
| 2003/0013595 | A1 | 1/2003 | Uehara |
| 2003/0050177 | A1 | 3/2003 | Uehara |
| 2003/0122482 | A1 | 7/2003 | Yamanaka et al. |
| 2003/0230751 | A1 | 12/2003 | Harada |
| 2004/0004437 | A1 * | 1/2004 | Shimizu et al. ............ 313/512 |
| 2004/0061433 | A1 | 4/2004 | Izuno et al. |
| 2004/0072383 | A1 | 4/2004 | Nagahama et al. |
| 2004/0087428 | A1 * | 5/2004 | Otsuka et al. ............. 501/48 |
| 2004/0169466 | A1 * | 9/2004 | Suehiro et al. ............ 313/512 |
| 2004/0222435 | A1 * | 11/2004 | Shimizu et al. ........... 257/100 |
| 2004/0223315 | A1 * | 11/2004 | Suehiro et al. ............ 362/84 |
| 2004/0257797 | A1 * | 12/2004 | Suehiro et al. ............ 362/34 |
| 2005/0161771 | A1 * | 7/2005 | Suehiro et al. ............ 257/612 |
| 2006/0012299 | A1 | 1/2006 | Suehiro et al. |
| 2006/0128118 | A1 | 6/2006 | Nagahama et al. |
| 2006/0163683 | A1 * | 7/2006 | Roth et al. ............... 257/432 |
| 2006/0261364 | A1 * | 11/2006 | Suehiro et al. ........... 257/100 |
| 2006/0267042 | A1 | 11/2006 | Izuno et al. |
| 2008/0029780 | A1 * | 2/2008 | Ohtsuka et al. ............ 257/99 |
| 2008/0296609 | A1 | 12/2008 | Nagahama et al. |

FOREIGN PATENT DOCUMENTS

| | | |
|---|---|---|
| EP | 0 078 658 | 5/1983 |
| GB | 1 163 258 A | 9/1969 |
| JP | 48-29383 | 4/1973 |
| JP | 49-53387 | 5/1974 |
| JP | 49-31278 | 8/1974 |
| JP | 58-84134 | 5/1983 |
| JP | 59-191388 | 10/1984 |
| JP | 61-96780 | 5/1986 |
| JP | 63-31557 | 3/1988 |
| JP | 63-67792 | 3/1988 |
| JP | 5-315652 | 11/1993 |
| JP | 05-343744 | 12/1993 |
| JP | 06-289321 | 10/1994 |
| JP | 07-099294 | 4/1995 |
| JP | 07-169994 | 7/1995 |
| JP | 8-102553 | 4/1996 |
| JP | 8-213660 | 8/1996 |
| JP | 9-283803 | 10/1997 |
| JP | 10-135492 | 5/1998 |
| JP | 10-190190 | 7/1998 |
| JP | 11-040848 | 2/1999 |
| JP | 11-116275 | 4/1999 |
| JP | 11-177129 | 7/1999 |
| JP | 11-204838 | 7/1999 |
| JP | 11-251643 A | 9/1999 |
| JP | 11-289098 | 10/1999 |
| JP | 11-307692 | 11/1999 |
| JP | 2000-147750 A | 5/2000 |
| JP | 2000-223750 A | 8/2000 |
| JP | 2000-233939 | 8/2000 |
| JP | 2000-239801 | 9/2000 |
| JP | 2000-340876 | 12/2000 |
| JP | 2001-015773 | 1/2001 |
| JP | 2001-097737 | 4/2001 |
| JP | 2001-98144 | 4/2001 |
| JP | 2001-217467 | 8/2001 |
| JP | 2002-009347 | 1/2002 |
| JP | 2002-055211 | 2/2002 |
| JP | 2002-94123 | 3/2002 |
| JP | 2002-094128 | 3/2002 |
| JP | 2002-134792 A | 5/2002 |
| JP | 2002-134821 | 5/2002 |
| JP | 2002-348133 | 12/2002 |
| JP | 2002-374006 | 12/2002 |
| JP | 2003-8071 | 1/2003 |
| JP | 2003-20249 | 1/2003 |
| JP | 2003-34791 | 2/2003 |
| JP | 2003-54983 | 2/2003 |
| JP | 2003-133596 | 5/2003 |
| JP | 2003-347586 | 12/2003 |
| JP | 2004-171710 | 3/2004 |
| WO | WO 03/034508 A1 | 4/2003 |

OTHER PUBLICATIONS

Japanese Office Action dated Sep. 18, 2007, with partial English translation.
Chinese Office Action dated Mar. 13, 2009 with English translation.
Notification of Reasons for Refusal dated Mar. 27, 2007, with partial English translation.
Chinese Office Action dated Jul. 6, 2007, with English translation.
Archer, Inorganic and Organometallic Polymers, 2001, pp. 1-33.
Chinese Office Action dated Jul. 3, 2009 with English translation.
Japanese Office Action dated Mar. 27, 2007 with partial English translation.
Supplementary European Search Report dated Aug. 20, 2010.
Japanese Office Action dated Aug. 10, 2010 (with a partial English translation).
Japanese Office Action dated Nov. 6, 2007 with partial English translation.
Japanese Office Action dated Mar. 11, 2008 with partial English translation.
Japanese Office Action dated Feb. 14, 2012 with partial English Translation.

* cited by examiner

FIG. 15
(a)
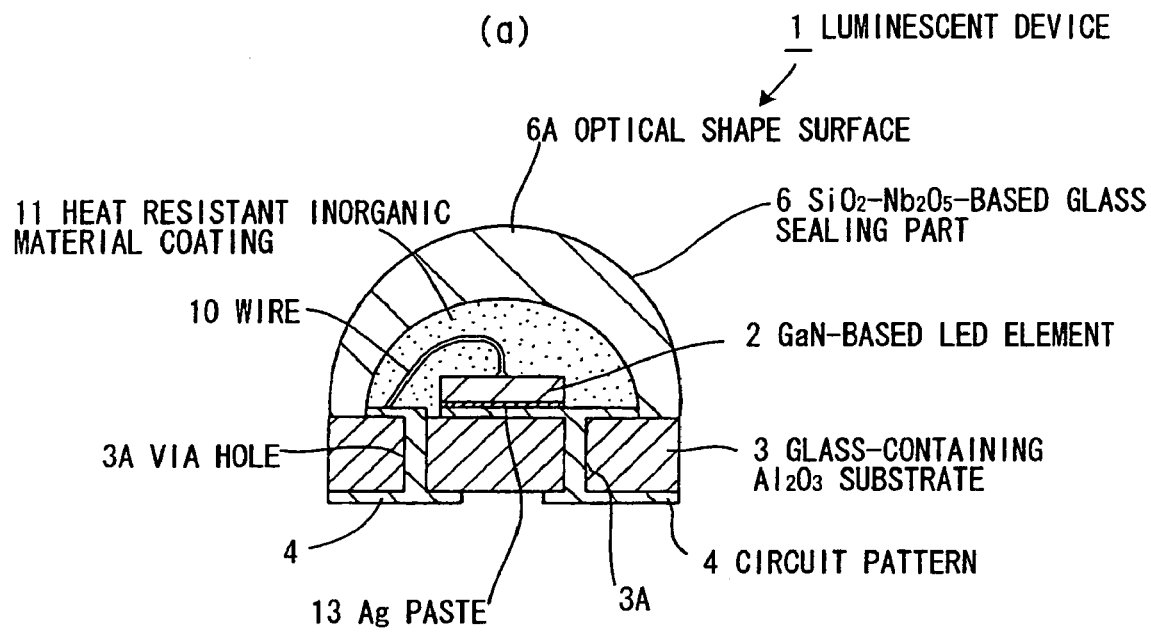
(b)
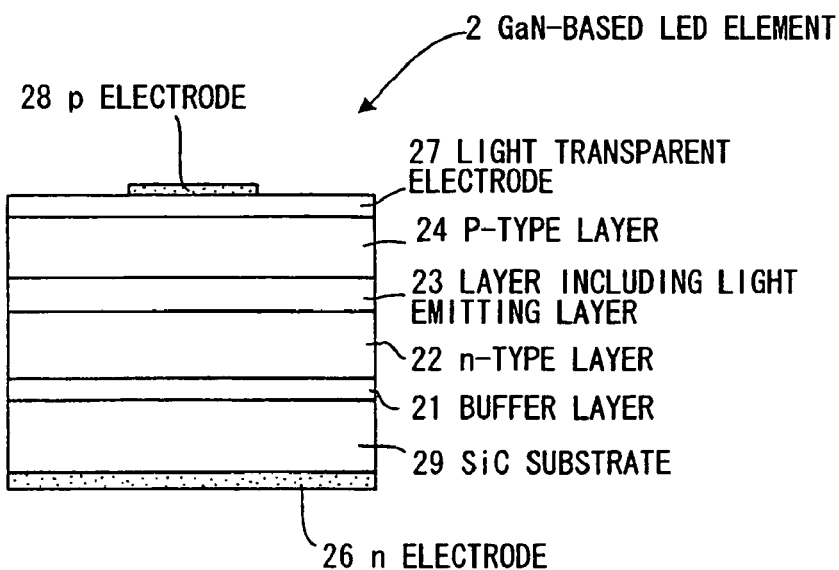

FIG. 16
(a)
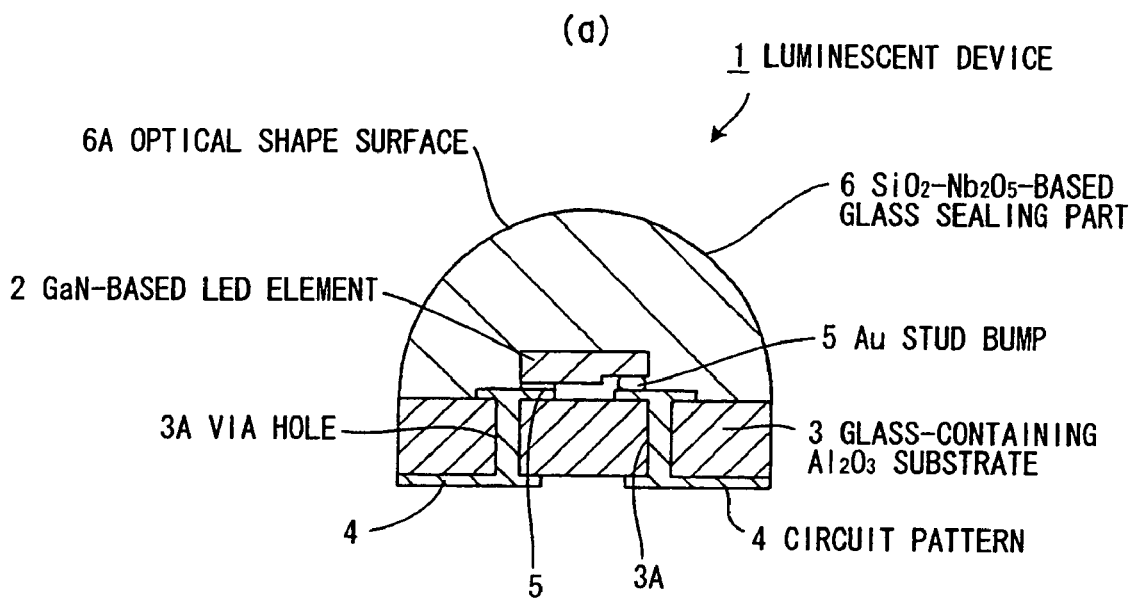
- 1 LUMINESCENT DEVICE
- 6A OPTICAL SHAPE SURFACE
- 6 SiO$_2$-Nb$_2$O$_5$-BASED GLASS SEALING PART
- 2 GaN-BASED LED ELEMENT
- 5 Au STUD BUMP
- 3A VIA HOLE
- 3 GLASS-CONTAINING Al$_2$O$_3$ SUBSTRATE
- 4 CIRCUIT PATTERN
(b)
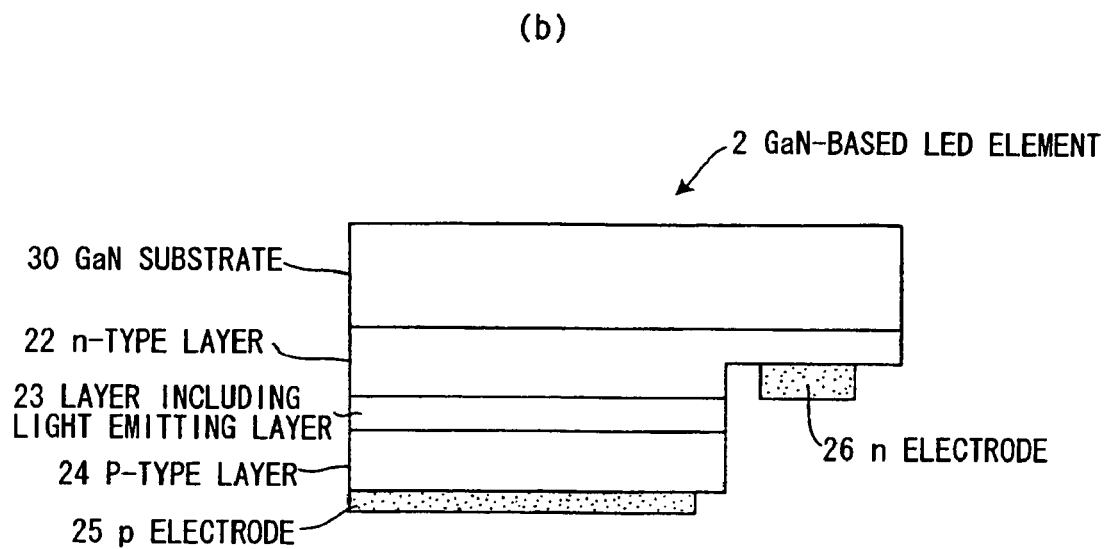
- 2 GaN-BASED LED ELEMENT
- 30 GaN SUBSTRATE
- 22 n-TYPE LAYER
- 23 LAYER INCLUDING LIGHT EMITTING LAYER
- 24 P-TYPE LAYER
- 26 n ELECTRODE
- 25 p ELECTRODE FIG. 17
(a)
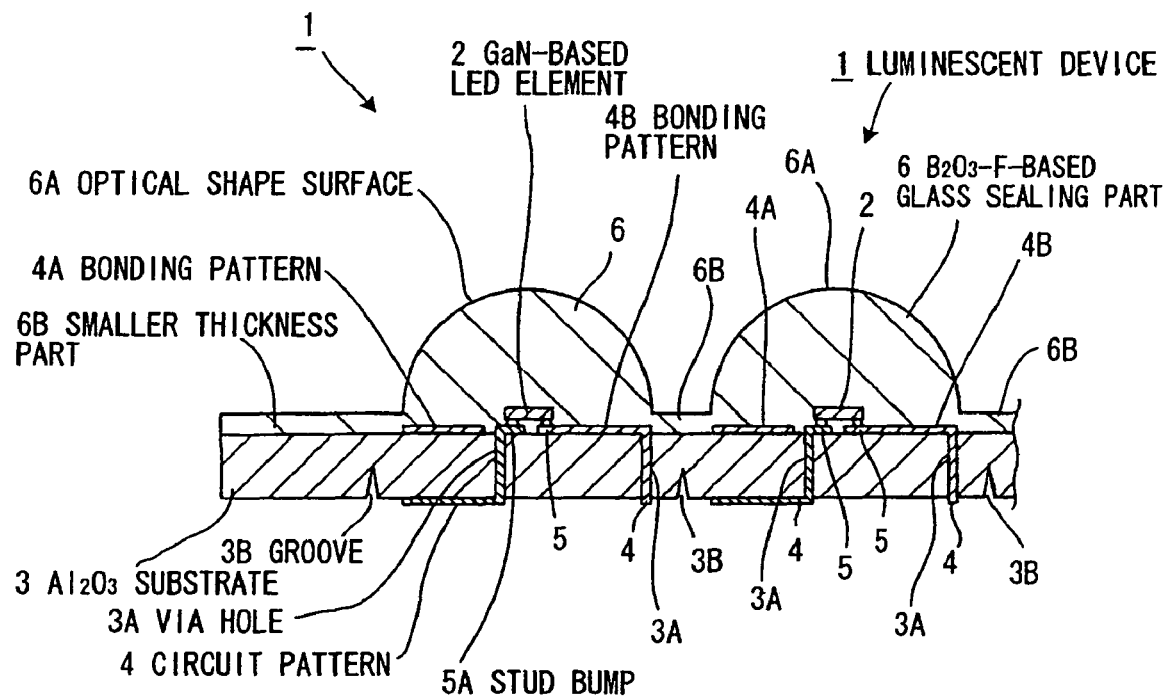
(b)
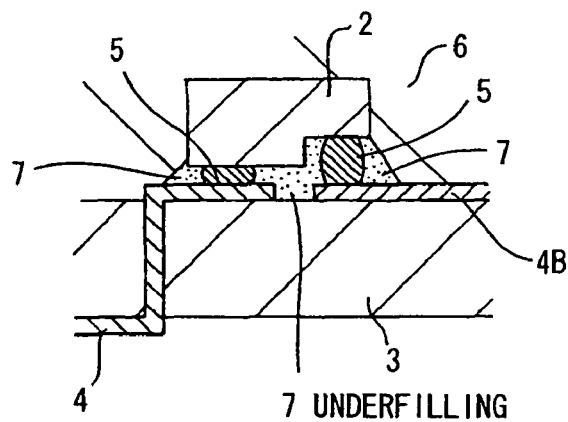

FIG. 19
(a)
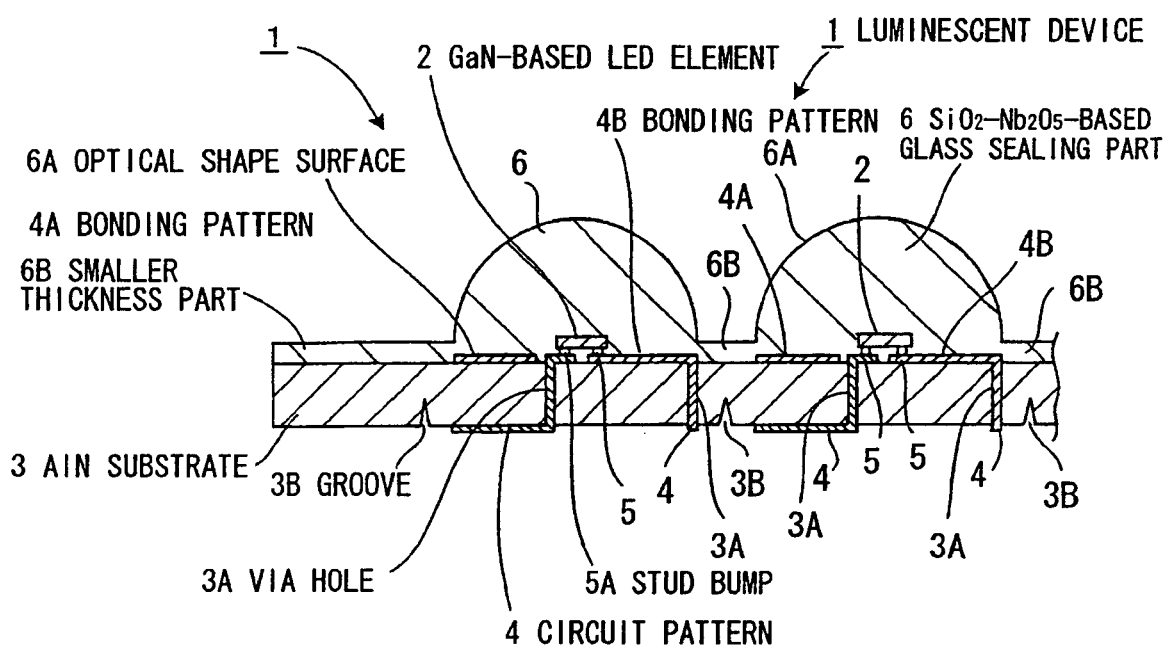
(b)
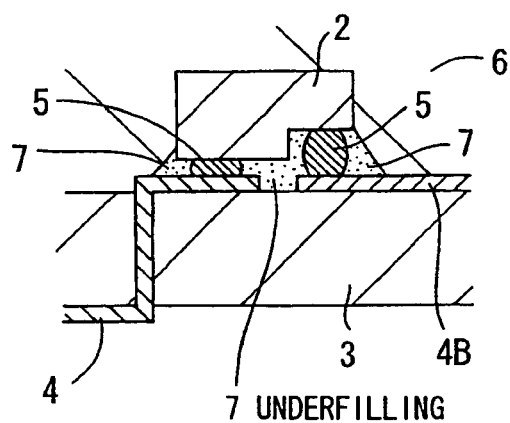

FIG. 25
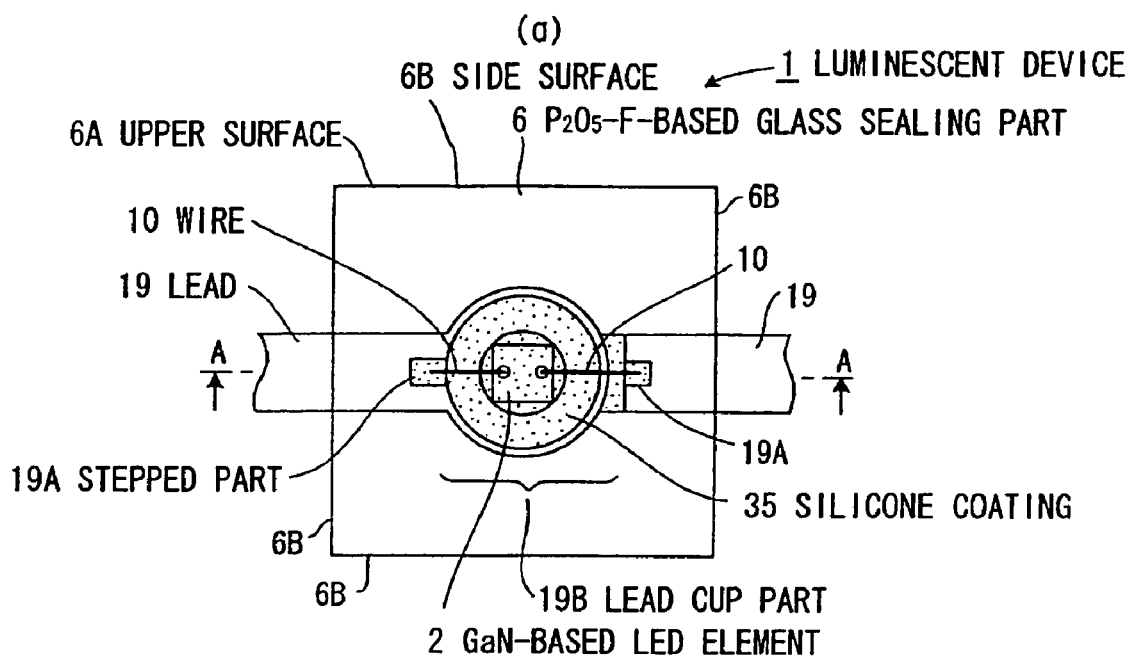
(a)
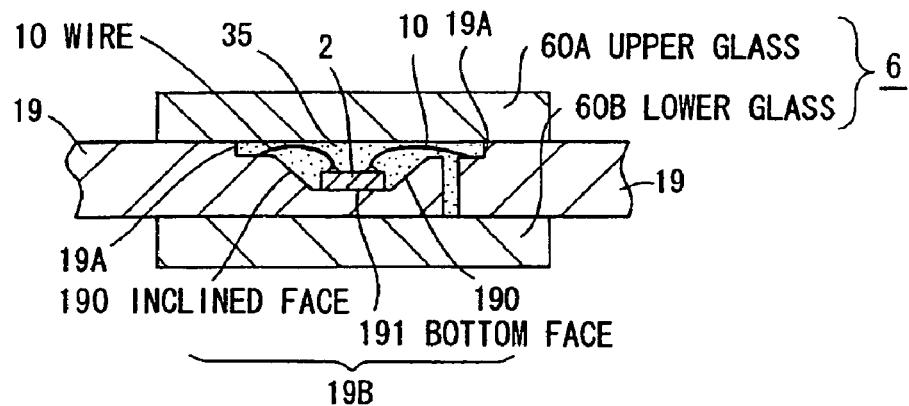
(b)
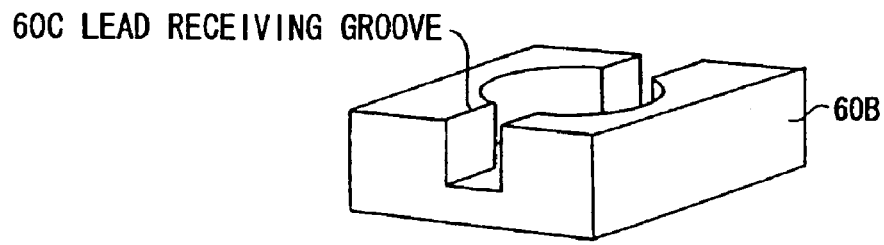
(c)

FIG. 28
(a)
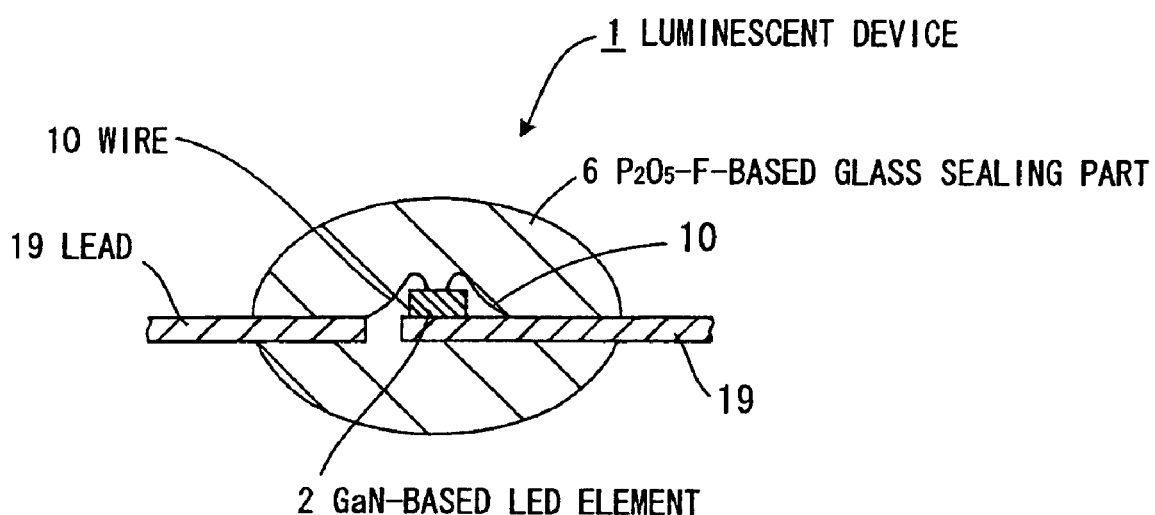
(b)
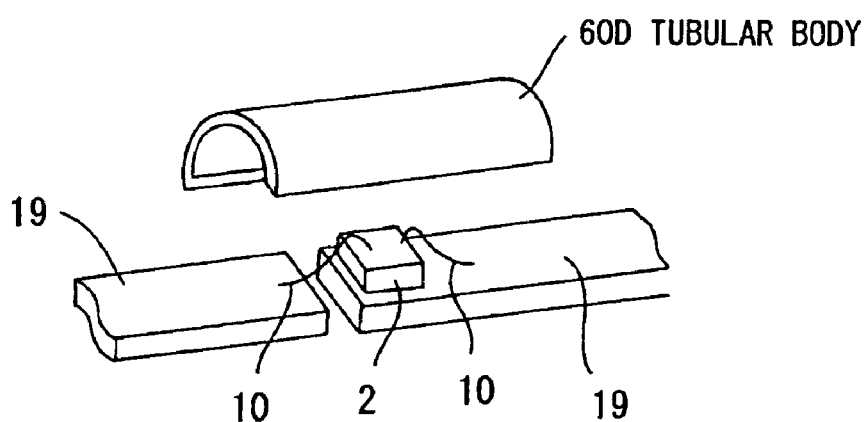

FIG. 57
(a)
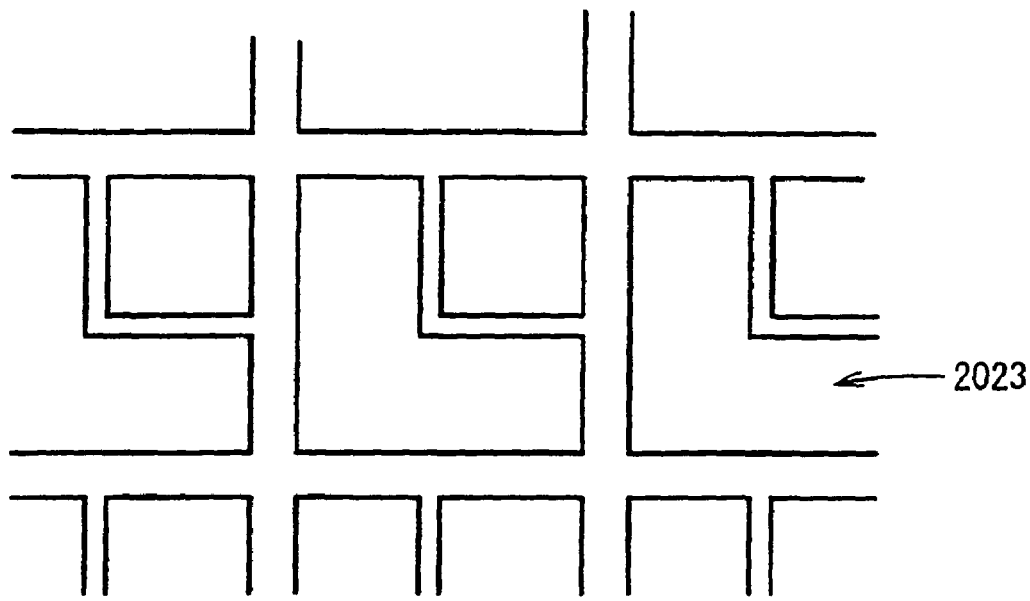
(b)
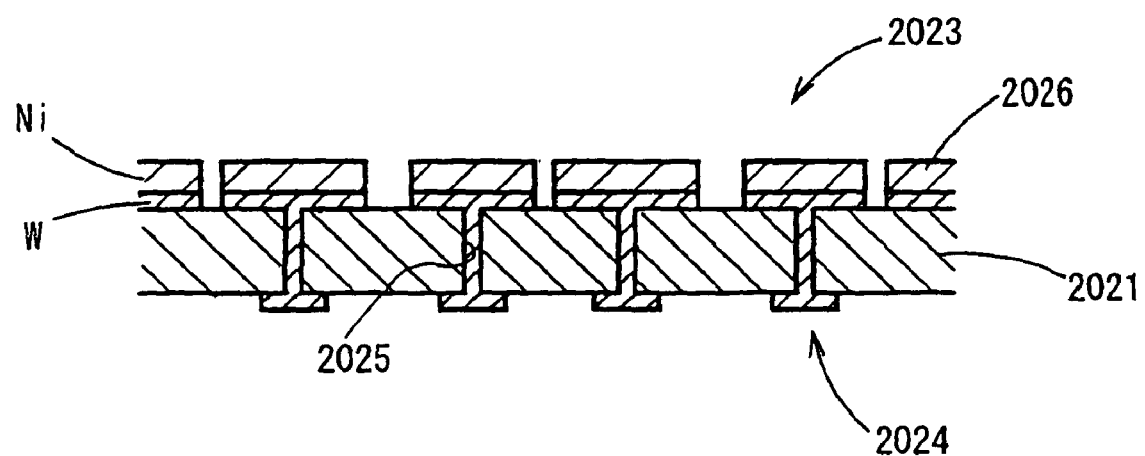

FIG. 58
(a)
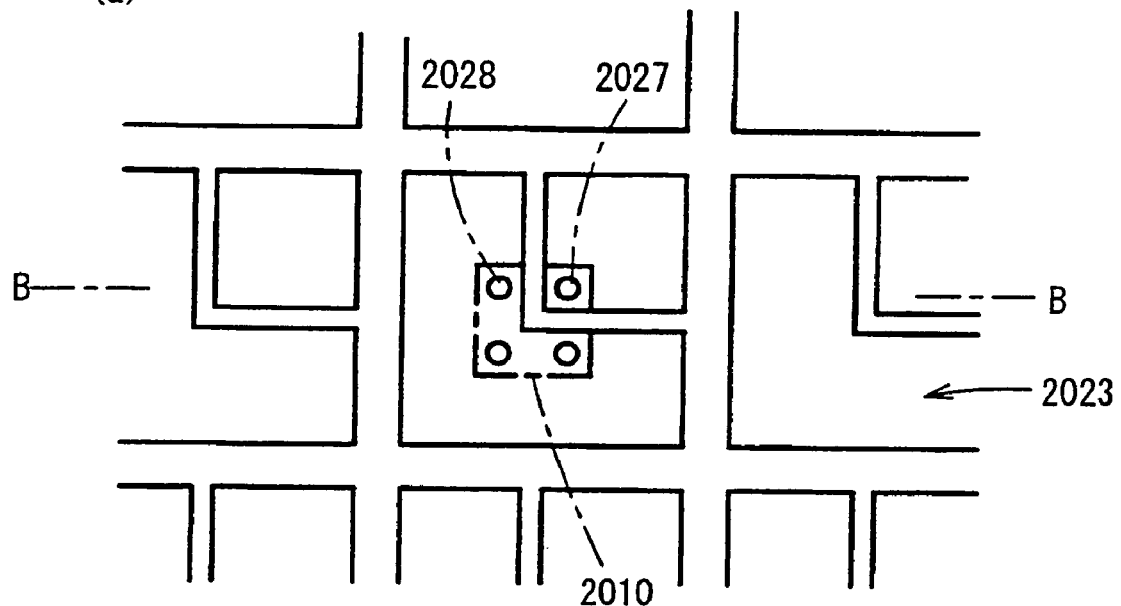
(b)
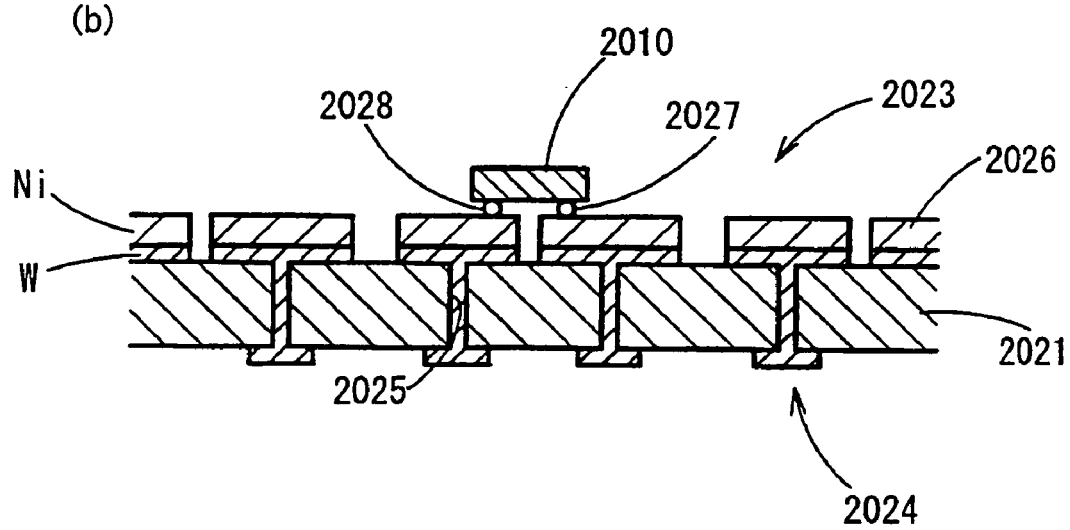

FIG. 99
(a)
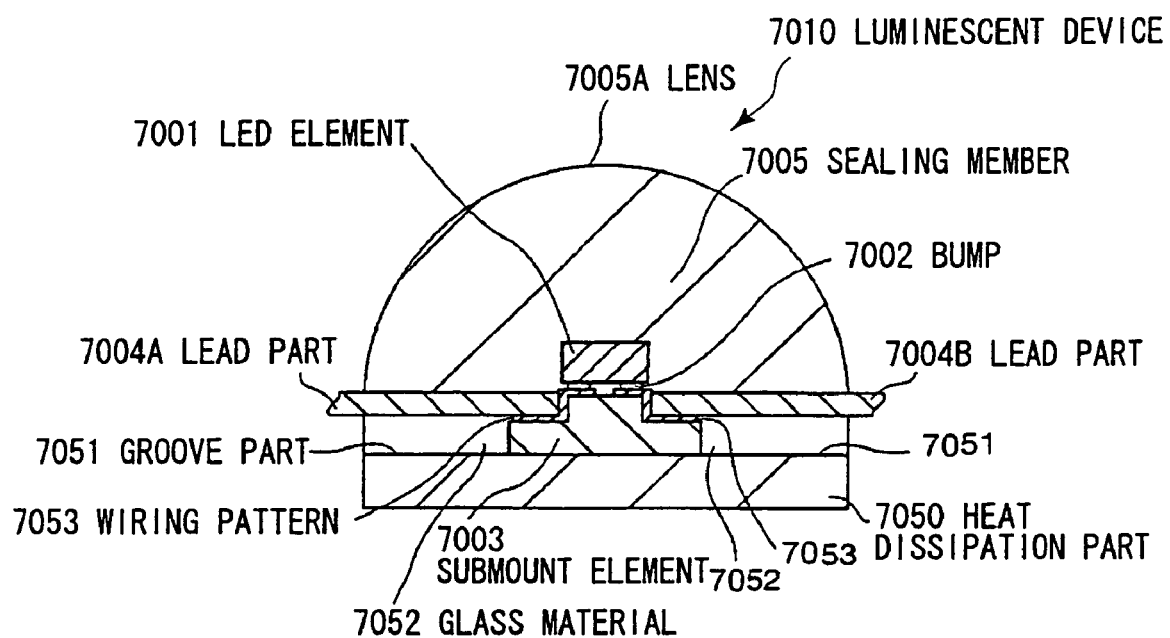
(b)
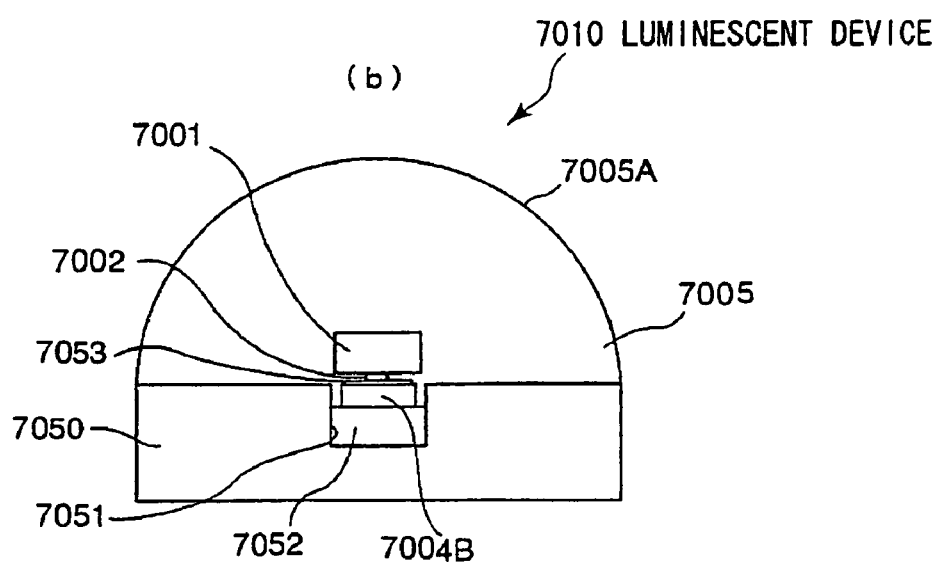

FIG. 100
(a)
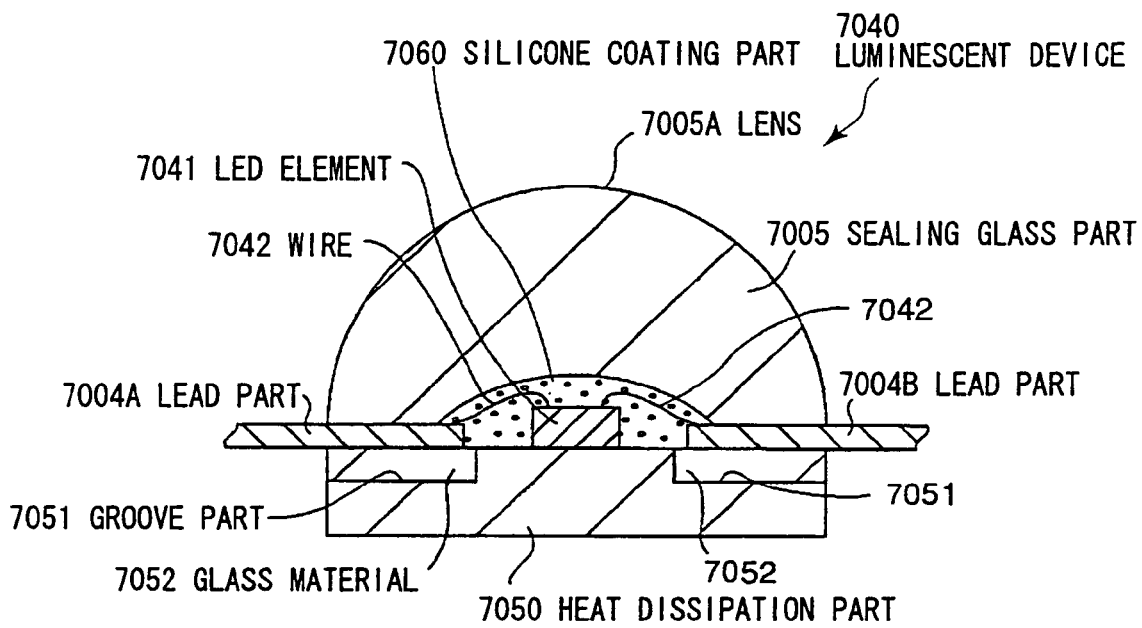
(b)
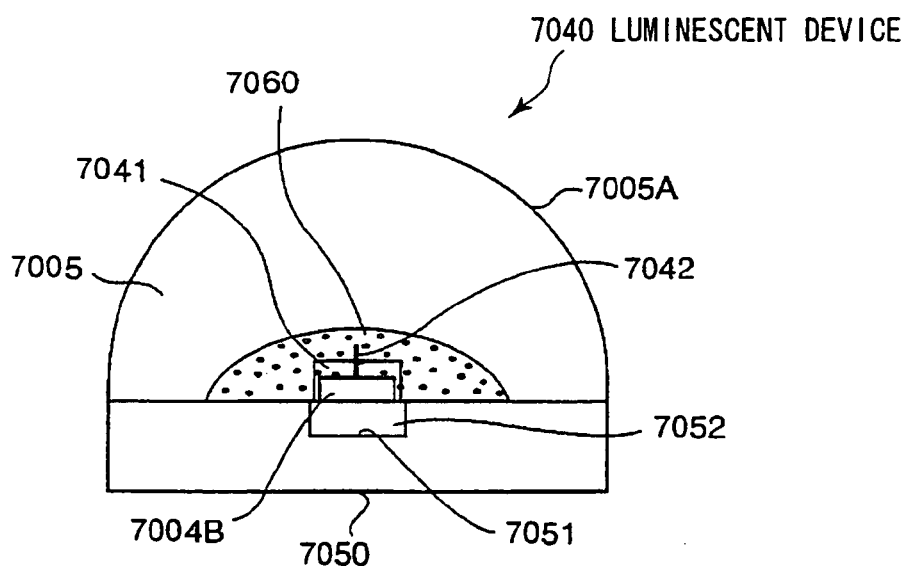

SOLID ELEMENT DEVICE AND METHOD FOR MANUFACTURING THE SAME

The present application is a Divisional Application of U.S. patent application Ser. No. 10/548,560, filed on Nov. 25, 2005, now U.S. Pat. No. 7,824,937, which is a national stage entry of PCT/JP2004/003089 filed on Mar. 10, 2004, which is based on Japanese Patent Application Nos. 2003-063015, 2003-160855, 2003-160867, 2003-193182, 2003-342705, 2003-342706, and 2004-010385, the entire contents of which are incorporated herein by reference.

TECHNICAL FIELD

The invention relates to a solid element device (or solid-state device) comprising an optical element sealed with a glass material, and particularly to a solid element device using a low melting glass material as a glass material.

BACKGROUND ART

Solid element devices comprising a solid element, such as a light emitting diode, sealed with a light transparent resin material such as an epoxy resin have hitherto been known. In such solid element devices, it is known that, upon exposure to high intensity light, the light transparent resin causes deterioration such as yellowing. In particular, when a group III nitride-based compound semiconductor light emitting element which emits short-wavelength light is used, the light transparent resin near the element is yellowed by high energy light generated from the element and the heat generated from the element per se and, consequently, the light takeout efficiency is often lowered to an extent that is not negligible.

In order to prevent the deterioration of the sealing member, a luminescent device using a low melting glass as a sealing member has been proposed in Japanese Patent Laid-Open Nos. 1996-102553 and 1999-177129.

In the luminescent device described in Japanese Patent Laid-Open No. 1996-102553, an LED element, a wire bonding part, and the periphery of the upper end of a lead part are covered with a sealing body 7 made of a transparent low melting glass. The low melting glass used is that, for example, selenium, thallium, arsenic, or sulfur has been added to bring the melting point to about 130 to 350° C. In this case, preferably, the low melting glass has a melting point of 200° C. or below (more preferably 150° C. or below).

According to the luminescent device described in Japanese Patent Laid-Open No. 1996-102553, a problem of a change in color of the sealing body to yellow with the elapse of time due to poor or weak resistance to ultraviolet light possessed by the epoxy resin and the like can be avoided.

On the other hand, the luminescent device described in Japanese Patent Laid-Open No. 1999-177129 uses, as a sealing body covering the LED light emitting element, a low melting glass having a refractive index of about 2 which is close to the refractive index of a GaN-based LED light emitting element, about 2.3.

According to the luminescent device described in Japanese Patent Laid-Open No. 1999-177129, sealing of the LED light emitting element with the low melting glass having a refractive index close to the GaN-based LED light emitting element can reduce the quantity of light, which is totally reflected from the surface of the LED light emitting element and is returned to the inside, and can increase the quantity of light, which is emitted from the LED light emitting element and enters the low melting glass. As a result, the emission efficiency of the chip-type LED and the like according to the invention of the application is higher than the conventional device in which the LED light emitting element has been sealed with the epoxy resin.

According to the solid element devices using the conventional low melting glass as the sealing member, although the glass is low melting glass, high temperature fabrication should be carried out, and, due to the hard material, in fact, disadvantageously, any sample device cannot be provided by the continuation of the resin sealing.

Accordingly, an object of the invention is to extract and solve problems involved in the realization of inorganic material sealing and to provide a solid element device, which can actually offer expected effects by glass sealing, and a method for manufacturing the same.

DISCLOSURE OF THE INVENTION

In order to attain the above object, the invention provides a solid element device that comprises: a solid element being flip-chip mounted; an electric power receiving and supplying part for receiving electric power from and supplying the electric power to said solid element; and an inorganic sealing material for sealing said solid element.

Further, in order to attain the above object, the invention provides a solid element device that comprises: a solid element: an electric power receiving and supplying part for receiving electric power from and supplying the electric power to said solid element; a heat resistant member for covering an electrical connection part and a part of said electric power receiving and supplying part in said solid element; and an inorganic sealing material for sealing said solid element including said heat resistant member.

In order to attain the above object, the invention provides a solid element device that comprises: a solid element; an electric power receiving and supplying part for receiving electric power from and supplying the electric power to said solid element; and a glass sealing part for sealing said solid element, said glass sealing part comprising a low melting glass selected from $SiO_2$—$Nb_2O_5$-based, $B_2O_3$—F-based, $P_2O_5$—F-based, $P_2O_5$—ZnO-based, $SiO_2$—$B_2O_3$—$La_2O_3$-based and $SiO_2$—$B_2O_3$-based low melting glasses.

Furthermore, in order to attain the above object, the invention provides a solid element device that comprises: a solid element; a lead part made of a metal for receiving electric power from and supplying the electric power to said solid element; and an inorganic sealing material for sealing said solid element.

Furthermore, in order to attain the above object, the invention provides a solid element device that comprises: a solid element; an electric power receiving and supplying part comprising an inorganic material substrate for receiving electric power from and supplying the electric power to said solid element; and an inorganic sealing material for sealing said solid element and a part of said electric power receiving and supplying part, said inorganic sealing material having a coefficient of thermal expansion equivalent to said inorganic material substrate.

Furthermore, in order to attain the above object, the invention provides a method of making a solid element device that comprises: a mounting step of mounting a solid element on an electric power receiving and supplying part; and a sealing step of pressing an inorganic sealing material for said solid element in an oxygen barrier atmosphere at a temperature at or above the deformation point of said inorganic sealing material to perform sealing.

BRIEF DESCRIPTION OF THE DRAWINGS

FIG. 15 is a diagram showing a first variant of the luminescent device in the sixth embodiment, wherein (a) is a longitudinal sectional view of the luminescent device and (b) a side view of a GaN-based LED element as a light source;

FIG. 16 is a diagram showing a second variant of the luminescent device in the sixth embodiment, wherein (a) is a longitudinal sectional view of the luminescent device and (b) a side view of a GaN-based LED element as a light source;

FIG. 17 is a diagram showing a luminescent device in a seventh embodiment, wherein (a) is a longitudinal sectional view of the luminescent device and (b) a side view of a GaN-based LED element as a light source;

FIG. 19 is a diagram showing a luminescent device in an eighth embodiment, wherein (a) is a longitudinal sectional view of the luminescent device and (b) a side view of a GaN-based LED element as a light source;

FIG. 25 is a diagram showing a luminescent device in a tenth embodiment, wherein (a) is a plan view, (b) a cross-sectional view taken on line A-A of (a), and (c) a perspective view of lower glass;

FIG. 28 is a diagram showing a luminescent device in an eleventh embodiment, wherein (a) is a side view and (b) a perspective view illustrating glass sealing;

FIG. 57 is a diagram illustrating a method for manufacturing an optical device in Example 10;

FIG. 58 is a diagram illustrating the state of mounting of an optical element on a substrate;

FIG. 99 is a diagram showing a flip chip-type luminescent device in a twenty-second embodiment, wherein (a) is a cross-sectional view and (b) a side view as viewed from the right side face of (a); and FIG. 100 is a diagram showing a face up-type luminescent device in a twenty-third embodiment, wherein (a) is a cross-sectional view and (b) a side view as viewed from the right side face of (a).

BEST MODE FOR CARRYING OUT THE INVENTION

The solid element device according to the invention will be explained in detail in conjunction with drawings and the like.

Figure 1:
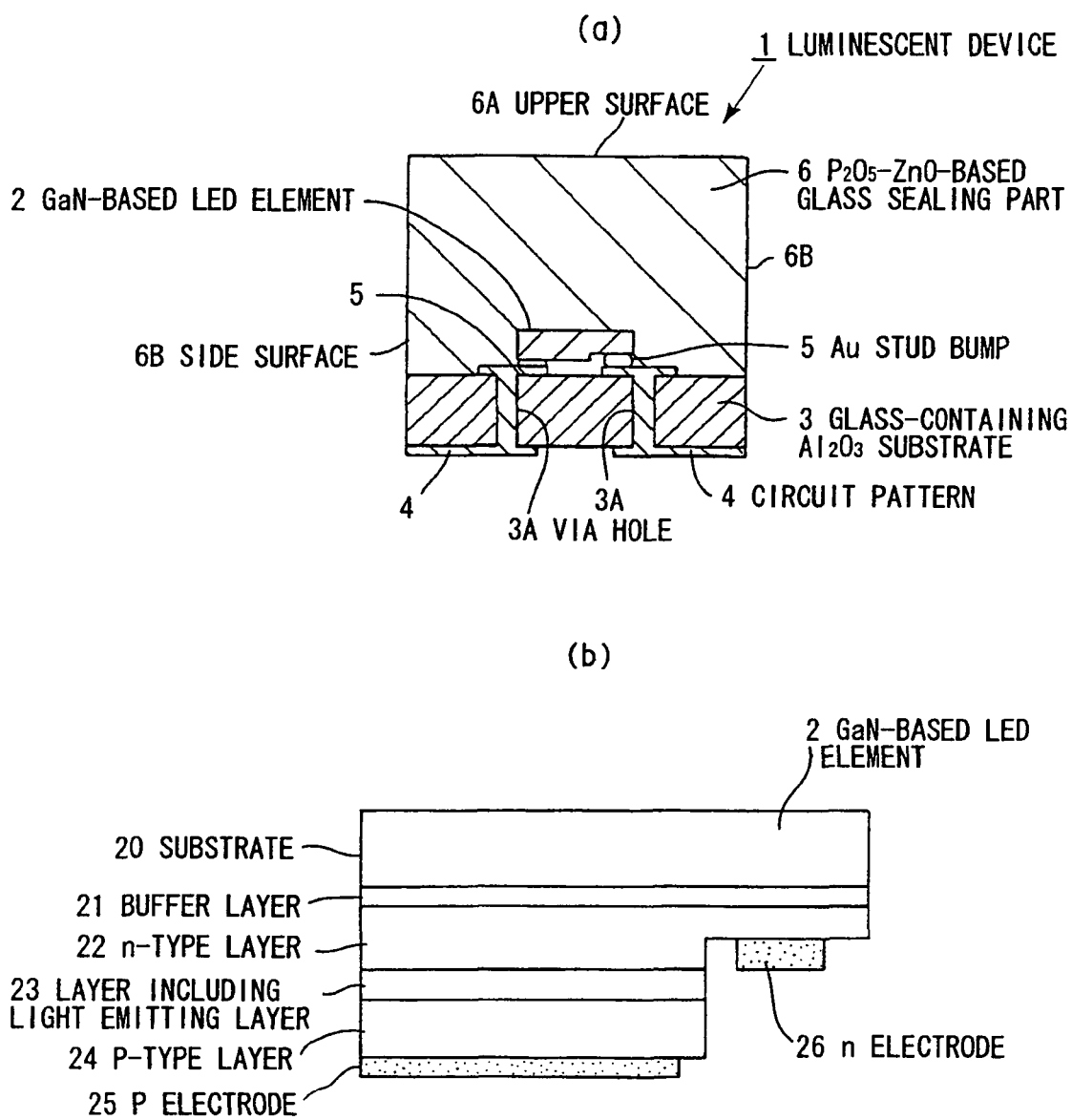
FIG. 1 is a luminescent device in a first embodiment of the invention, wherein (a) is a longitudinal sectional view of the luminescent device and (b) a side view of a GaN-based LED element as a light source.

FIG. 1 shows a luminescent device in the first embodiment of the invention, wherein (a) is a longitudinal sectional view of the luminescent device and (b) a side view of a GaN-based LED element as a light source. As shown in FIG. 1 (a), this luminescent device 1 includes a flip chip-type GaN-based LED element 2, a glass-containing $Al_2O_3$ substrate 3 with a GaN-based LED element 2 mounted thereon, a circuit pattern 4, which is made of tungsten (W)-nickel (Ni)-gold (Au) and is formed on the glass-containing $Al_2O_3$ substrate 3, an Au stud bump 5 for electrically connecting the GaN-based LED element 2 to the circuit pattern 4, and a $P_2O_5$—ZnO-based glass sealing part 6 which seals the GaN-based LED element 2 and is bonded to the glass-containing $Al_2O_3$ substrate 3.

As shown in FIG. 1 (b), the GaN-based LED element 2 is formed by successive crystal growth of a buffer layer 21, an n-type layer 22, a layer 23 including a light emitting layer, and a p-type layer 24 on the surface of a sapphire ($Al_2O_3$) substrate 20. The GaN-based LED element 2 includes a p-electrode 25 provided on the surface of the p-type layer 24 and an n-electrode 26 on the n-type layer 22 exposed by removing, through etching, a part from the p-type layer 24 to a part of the n-type layer 22. In this GaN-based LED element 2, epitaxial growth is carried out at 700° C. or above, and the heat resistant temperature is 600° C. or above. Therefore, the GaN-based LED element 2 is stable against the temperature at which sealing is carried out using low melting glass which is described later.

The p-electrode 25 also functions as a lower reflector that reflects light emitted from the layer 23 including a light emitting layer toward the substrate 20. The size is 0.34 mm 0.34 mm×0.09 mm in thickness.

The glass-containing $Al_2O_3$ substrate 3 has a coefficient of thermal expansion of $12.3 \times 10^{-6}/°$ C. and has via holes 3A. The via holes 3A function to conduct the circuit pattern 4 made of W formed by metallization of the surface and backside of the substrate.

The glass sealing part 6 is made of $P_2O_5$—ZnO-based low melting glass (coefficient of thermal expansion: $11.4 \times 10^{-6}/°$ C., yield point: 415° C., refractive index: 1.59, internal transmittance: 99% (470 nm)) and is in a rectangular form which has an upper face 6A and a side face 6B formed based on bonding of the glass sealing part to the glass-containing $Al_2O_3$ substrate 3 by hot pressing in a mold followed by dicer cutting.

The low melting glass is processed at an incomparably higher viscosity than a viscosity level which is generally regarded as a high viscosity in resins. Further, in the case of glass, even when the temperature exceeds the yield point by several tens of degrees, the viscosity is not lowered to the level of the general resin sealing. When the viscosity on a conventional resin molding level is contemplated, a temperature above the crystal growth temperature of the LED element is required, or deposition on the mold occurs. This renders sealing and molding difficult. For this reason, processing at $10^6$ poises or more is preferred.

The method for manufacturing this luminescent device 1 will be explained.

At the outset, a glass-containing $Al_2O_3$ substrate 3 having via holes 3A is provided. A W paste is screen printed on the surface of the glass-containing $Al_2O_3$ substrate 3 according to the circuit pattern. Next, the W paste printed glass-containing $Al_2O_3$ substrate 3 is heat treated at a temperature above 1000° C. to bake W to the substrate 3. Further, Ni plating and Au plating are provided on W to form the circuit pattern 4. Next, the GaN-based LED element 2 is electrically connected to the circuit pattern 4 (surface side) in the glass-containing $Al_2O_3$ substrate 3 through Au stud bumps 5. Next, a $P_2O_5$—ZnO-based low melting glass sheet is set parallel to the glass-containing $Al_2O_3$ substrate 3 with the GaN-based LED element 2 mounted thereon, and, in a nitrogen atmosphere, the pressure is brought to 60 kgf followed by hot pressing at temperature of 465° C. The viscosity of the low melting glass under the above conditions is $10^8$ to $10^9$ poises, and the low melting glass is bonded to the glass-containing $Al_2O_3$ substrate 3 through an oxide contained therein. The glass-containing $Al_2O_3$ substrate 3 integrated with the low melting glass is then set in a dicer for dicing to isolate the rectangular luminescent device 1.

The following effects can be attained by the first embodiment.

(1) Processing at a temperature satisfactorily below the crystal growth temperature can be realized by using low melting glass and hot pressing in a highly viscous state.

(2) High sealing strength can be provided by bonding the glass-containing $Al_2O_3$ substrate 3 to the glass sealing part 6 by a chemical bond through an oxide. Therefore, even a small package having a small bonding area can be realized.

(3) The coefficient of thermal expansion of the sealing glass is similar to the coefficient of thermal expansion of the glass-containing $Al_2O_3$ substrate. Therefore, bringing the temperature to room temperature or low temperature after bonding at a high temperature, a bonding failure such as separation or cracking is less likely to occur. Further, glass is not cracked upon exposure to tensile stress, and cracking is less likely to occur upon exposure to compressive stress. The coefficient of thermal expansion of the sealing glass is somewhat lower than that of the glass-containing $Al_2O_3$ substrate. According to an experiment conducted by the present inventor, neither separation nor cracking occurs in a 1000-cycle liquid phase thermal shock test of $-40°$ C.↔100° C. Further, the present inventor has conducted a basic confirmation experiment of bonding a glass piece having a size of 5 mm×5 mm to a ceramic substrate. As a result, in a combination of various coefficients of thermal expansion for both glass and ceramic substrates, when the thermal expansion coefficient ratio of the member having a lower coefficient of thermal expansion to the member having a higher coefficient of thermal expansion is not less than 0.85, crack-free bonding could be realized. The similar coefficient of thermal expansion means a thermal expansion coefficient difference in the above range, although this depends upon the rigidity and size of the member, or the stress absorbing layer in the eighth embodiment and the like.

(4) Flip chip bonding can eliminate the need to use any wire. Therefore, any trouble does not occur in electrodes even in the case of processing in a highly viscose state. The low melting glass during sealing is hard and has a viscosity of $10^8$ to $10^9$ poises. On the other hand, the epoxy resin before heat curing is liquid and has a viscosity of about 5 poises. Thus, they are greatly different from each other in physical properties. Accordingly, unlike sealing of the face up-type LED element in which the electrode on the element surface is electrically connected to an electric power supplying member such as a lead through a wire, it is possible to prevent such an unfavorable phenomenon that the wire is collapsed or deformed during glass sealing. Further, unlike sealing of the flip chip-type LED element in which the electrode on the surface of the element is subjected to flip chip bonding to an electric power supplying member such as a lead through a bump such as gold (Au), it is possible to prevent such an unfavorable phenomenon that, upon application of pressure to the LED element in its electric power supplying member direction based on the viscosity of the glass, collapse of the bump or short-circuiting between bumps occurs.

(5) When the low melting glass and the glass-containing $Al_2O_3$ substrate 3 are set parallel to each other followed by hot pressing in a highly viscose state, the low melting glass is parallely moved on and brought to intimate contact with the surface of the glass-containing $Al_2O_3$ substrate to seal the GaN-based LED element 2. Therefore, no void occurs.

(6) The circuit pattern 4 for wiring of the glass-containing $Al_2O_3$ substrate 3 is drawn to the backside through the via holes 3A. Therefore, a plurality of luminescent devises 1 can easily be mass-produced based on dicer cutting by simply subjecting a plurality of devices to sealing at a time with a low melting glass sheet without the need to take any special measure for preventing unfavorable phenomena such as the entry of glass into unnecessary places and covering electric terminals with the glass. The low melting glass is processed in a highly viscose state. Therefore, unlike the case of resin, there is no need to take a sufficient measure, and drawing of an external terminal to the backside suffices for coping with mass production without relying upon via holes.

(7) Flip chip mounting of the GaN-based LED element 2 can overcome problems involved in the realization of glass sealing and, at the same time, has the effect of realizing a microluminescent device 1 having a size of 0.5 mm square. These effects can be attained by virtue of unnecessary wire bonding space, the selection of the member for the glass sealing part 6 and the member for the glass-containing $Al_2O_3$ substrate 3 which are equal to each other in coefficient of thermal expansion and strong bonding based on a chemical bond which can prevent interfacial peeling even in the case of bonding in a small space.

Figure 2:
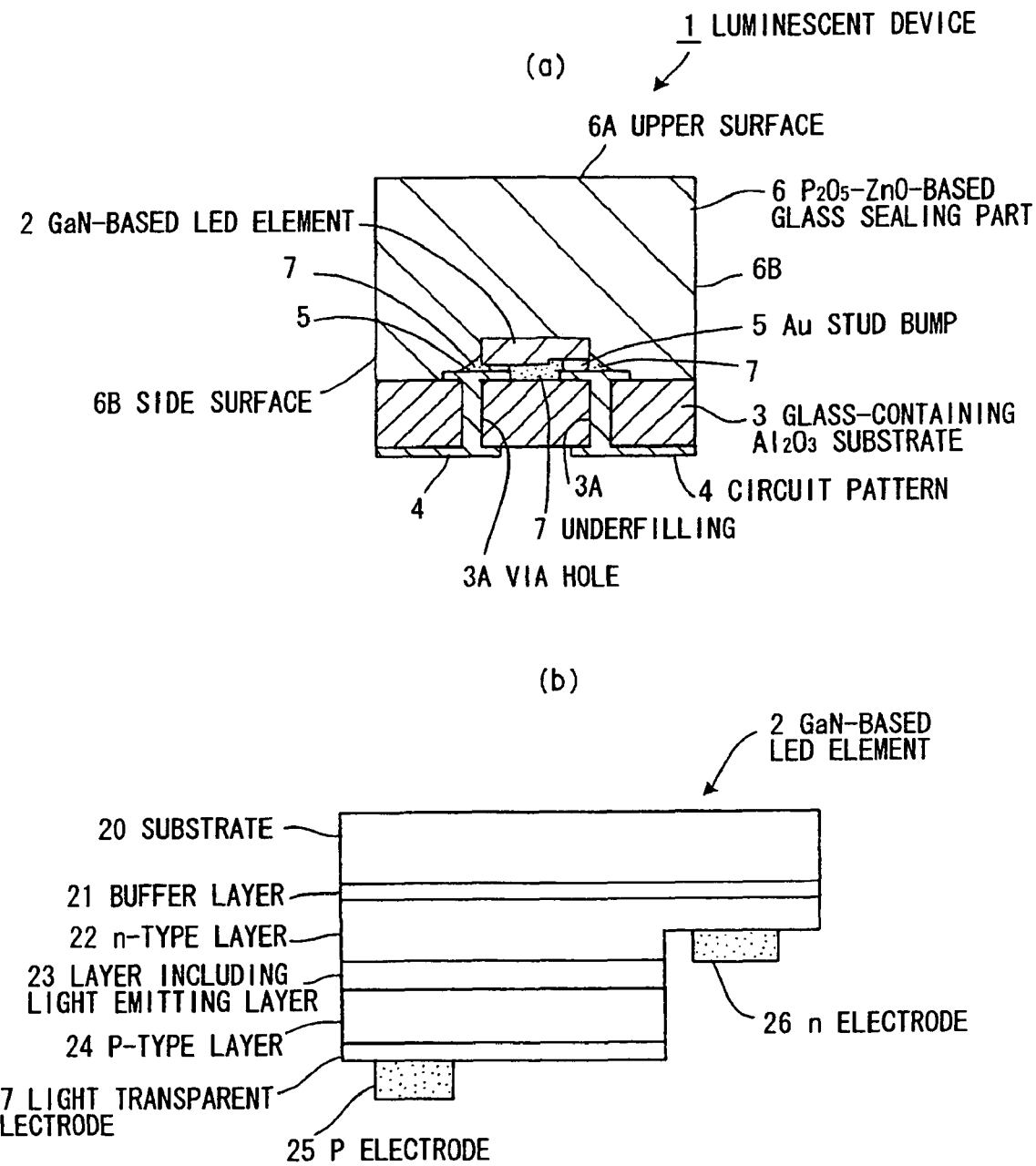
FIG. 2 is a first variant of the luminescent device in a first embodiment, wherein (a) is a longitudinal sectional view of the luminescent device and (b) a side view of a GaN-based LED element as a light source.

FIG. 2 shows a first variant of a luminescent device in the first embodiment, wherein (a) is a longitudinal sectional view of the luminescent device and (b) a side view of the GaN-based LED element as a light source. In the following explanation, common constituent parts are identified with the same reference numerals.

This luminescent device 1 is different from the first embodiment in that a face up-type GaN-based LED element 2 is connected to a circuit pattern 4 by flip chip boding and, in addition, a white underfilling 7 is provided for protecting the GaN-based LED element 2 in its electrode and the Au stud bump 5.

The underfilling 7 may be composed of a filling material with a good light reflectivity such as boron nitride (BN) and is provided by previously potting the material in a glass-containing $Al_2O_3$ substrate 3 before bonding of the GaN-based LED element 2 and conducting flip chip bonding of the GaN-based LED element 2 onto the underfilling.

As shown in FIG. 2 (b), the GaN-based LED element 2 includes a light transparent electrode 27 such as ITO (indium tin oxide) provided on a surface of a p-type layer 24, and a p-electrode 25 provided on a surface of the light transparent electrode 27.

In the first variant, even in the case of the face up-type GaN-based LED element 2, light reflected and diffused by the underfilling 7 is radiated from the substrate 20 of the GaN-based LED element 2, contributing to improved light takeout efficiency. In the second embodiment, the white underfilling 7 is selected for enhancing the light takeout efficiency. When the light takeout efficiency is immaterial, underfilling 7 having a color other than the white color may be used.

In the second variant, the surface of the glass sealing part 6 may be treated for improving the moisture resistance, resistance to acids and alkalis. In this case, surface treatment with $MgF_2$, $SiO_2$, or SiN is effective. Treatment for reducing interfacial reflection may also be carried out, for example, by antireflective multilayered film or the like. In this case, multilayered coating of $TiO_2+SiO_2$ is effective.

Figure 3:
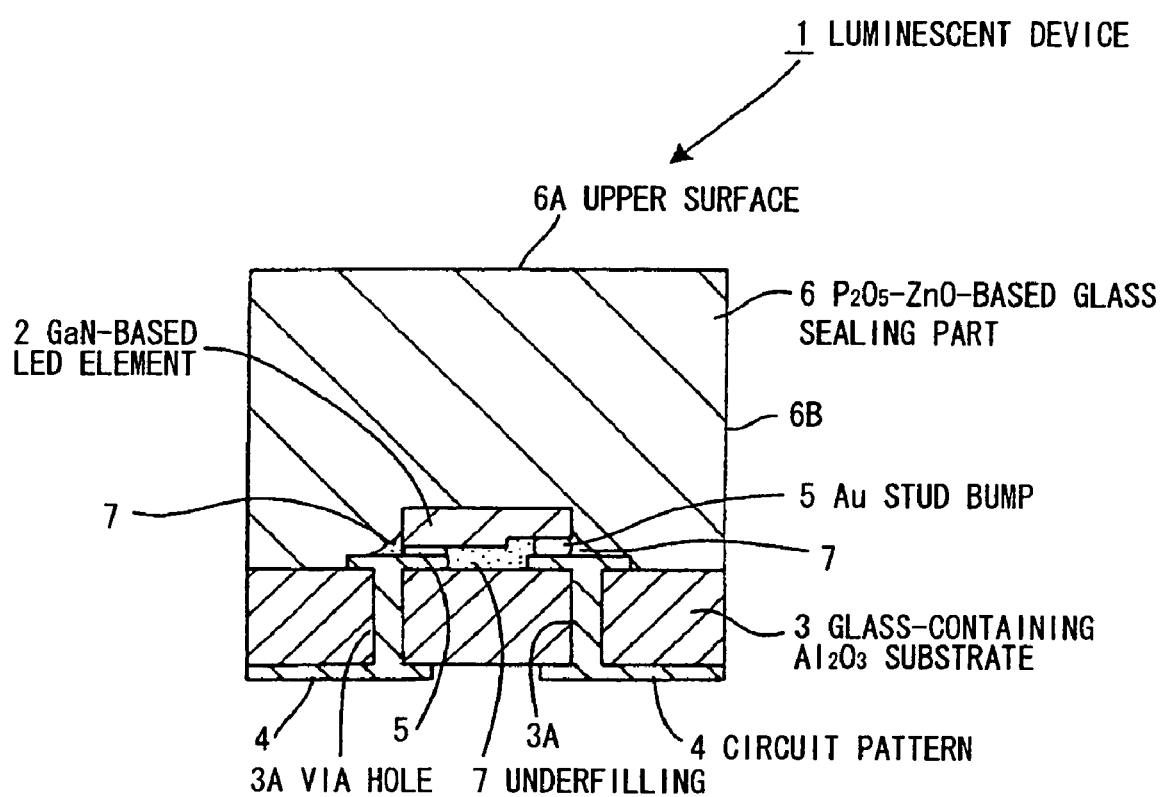
FIG. 3 is a longitudinal sectional view of a luminescent device using another underfilling as a third variant.

FIG. 3 is a longitudinal sectional view of another luminescent device using underfilling as a third variant. In the luminescent device 1 in the third variant, diamond which is highly thermally conductive is used as the underfilling 7 for protecting the electrode of the GaN-based LED element 2 and the Au stud bumps 5. Other examples of highly thermally conductive underfilling 7 include BN, aluminum nitride (AlN), and silicon carbide (SiC). They are used as a filling material with an average particle diameter of a few microns to be mixed into a heat resistant ceramic coating material.

Figure 4:
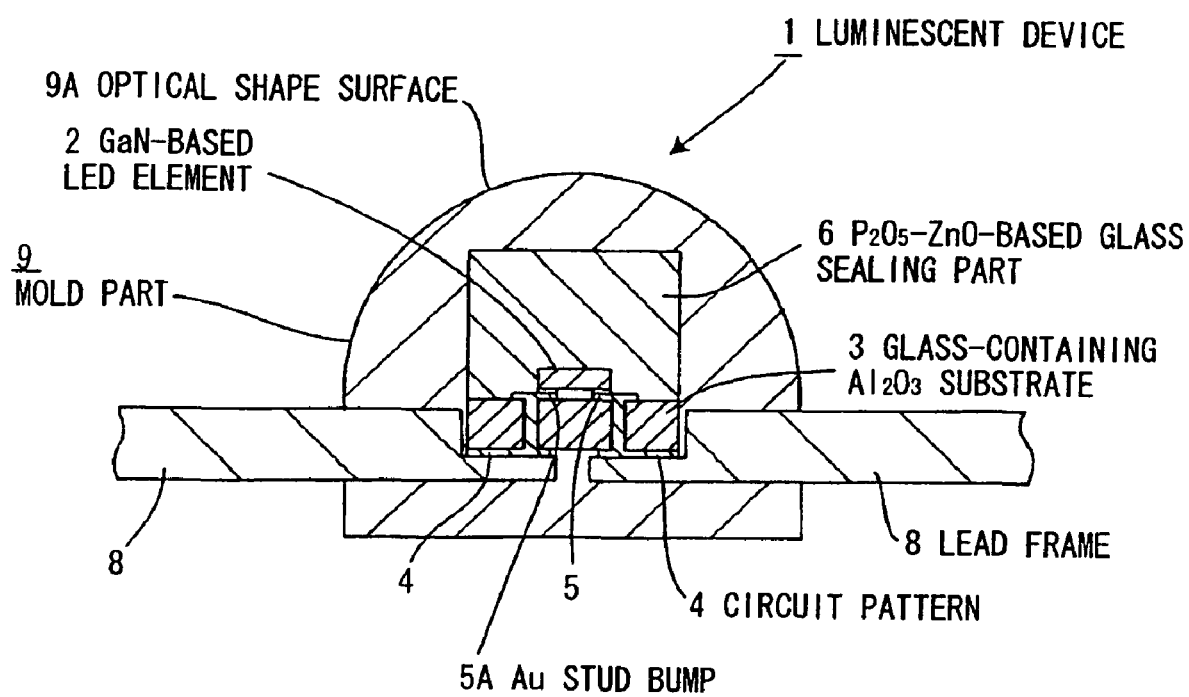
FIG. 4 is a longitudinal sectional view of a luminescent device provided with a mold part made of a resin material as a fourth variant.

FIG. 4 is a longitudinal sectional view of a luminescent device provided with a mold part made of a resin material as a fourth variant. In this luminescent device 1, the luminescent device 1 explained in the first embodiment is bonded to a lead frame 8, and, further, a mold part 9 the whole of which is made of an epoxy resin is provided.

The mold part 9 is provided with a semispherical optical shape face 9A formed by transfer molding.

According to this construction, an optical system can be easily formed in a glass sealing-type device, and, at the same time, the moisture resistance is further improved by surrounding the glass-containing $Al_2O_3$ substrate 3 and the glass sealing part 6 by the mold part 9. The mold part 9 may be made of a resin material other than the epoxy resin, for example, silicone resin. A molding technique other than the transfer molding, for example, potting molding may also be applied. The mold part may also be formed by an injection method using a resin material such as an acrylic resin or polycarbonate, and, in this case, the productivity can be improved.

Further, a phosphor may be incorporated in the mold part 9. The phosphor may be, for example, a YAG phosphor, a silicate phosphor, or a mixture of the YAG phosphor and the silicate phosphor at a predetermined ratio.

Figure 5:
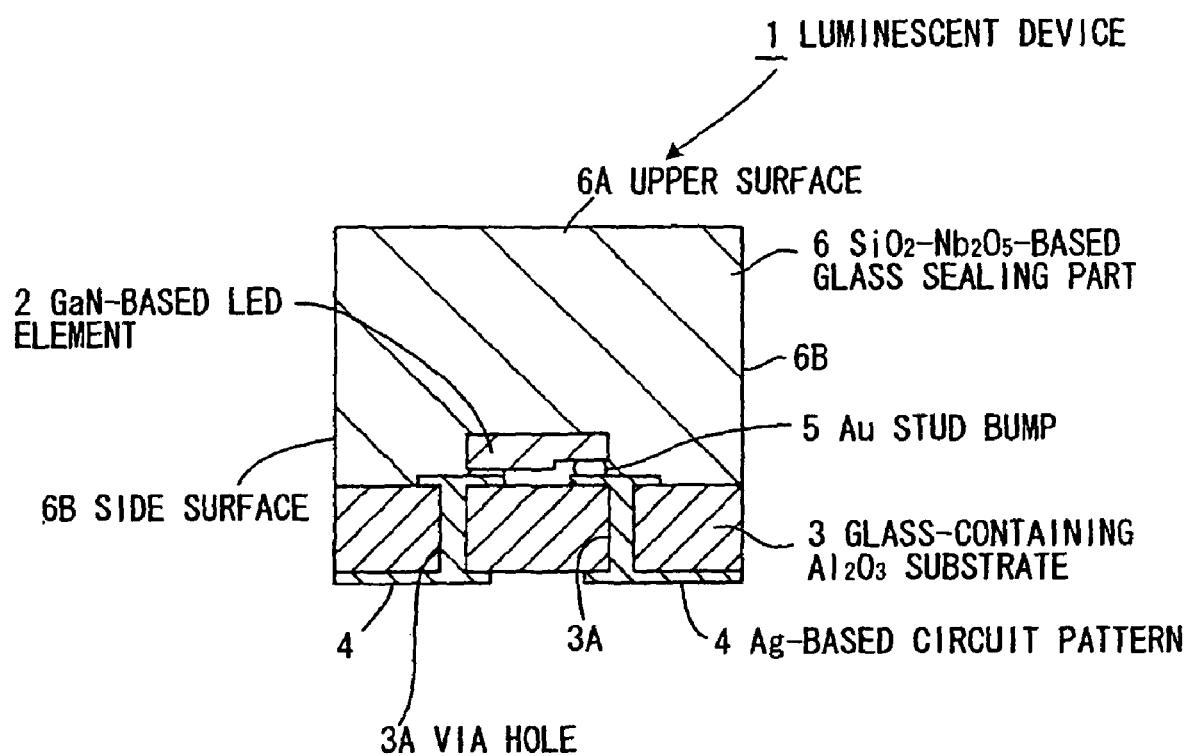
FIG. 5 is a longitudinal sectional view of a luminescent device in a second embodiment.

FIG. 5 is a longitudinal sectional view of a luminescent device in the second embodiment. This luminescent device 1 is different from the device in the first embodiment in that an $SiO_2$—$Nb_2O_5$-based glass sealing part 6 is provided instead of the glass material used in the luminescent device 1 in the first embodiment, and an Ag-based circuit pattern 4 is provided in the glass-containing $Al_2O_3$ substrate 3.

The $SiO_2$—$Nb_2O_5$-based glass sealing part 6 is made of $SiO_2$—$Nb_2O_5$-based low melting glass (coefficient of thermal expansion: $12.1\times10^{-6}/°$ C., yield point: 507° C., refractive index: 1.69, internal transmittance: 98% (470 nm)), and is molded into a rectangular form which has an upper face 6A and a side face 6B formed based on bonding of the glass sealing part to the glass-containing $Al_2O_3$ substrate 3 by hot pressing in a mold followed by dicer cutting.

The glass-containing $Al_2O_3$ substrate 3 has a coefficient of thermal expansion: $12.3\times10^{-6}/°$ C. and has via holes 3A. These via holes 3A are provided for continuity of an Ag circuit pattern 4 by electroplating on the surface and backside of the substrate.

In the second embodiment, the use of the $SiO_2$—$Nb_2O_5$-based low melting glass can reduce moisture permeability and can improve light takeout efficiency. Further, when the low melting glass having small moisture permeability is used, Ag, a highly reflective material, can be used even in the case where voltage is applied as in a circuit pattern in conducting flip chip mounting of a GaN-based LED element 2 or the like, and resin sealing is difficult due to a fear of migration as in the case of pattern spacing of a few tens of microns.

Figure 6:
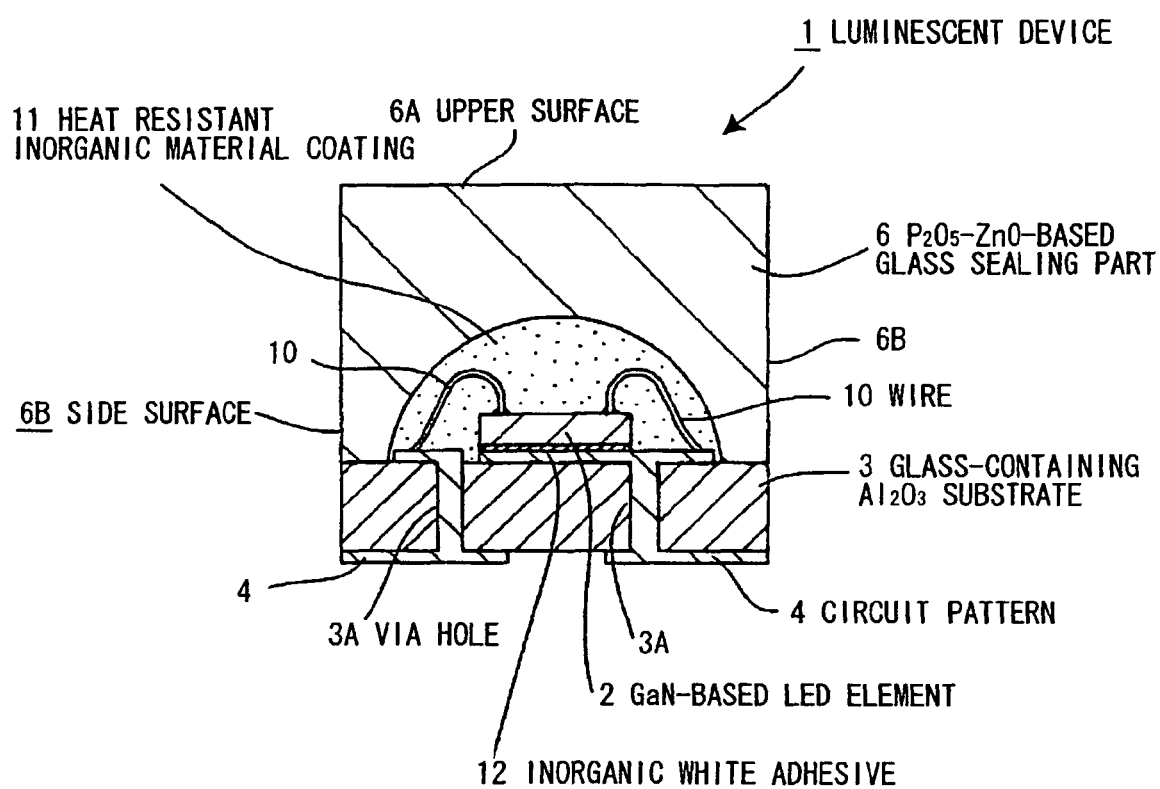
FIG. 6 is a longitudinal sectional view of a luminescent device in a third embodiment of the invention.

FIG. 6 is a longitudinal sectional view of a luminescent device in the third embodiment of the invention. This luminescent device 1 includes a face up-type GaN-based LED element 2, a glass-containing $Al_2O_3$ substrate 3 with the GaN-based LED element 2 mounted thereon, a circuit pattern 4 provided on the glass-containing $Al_2O_3$ substrate 3 made of W, an Au stud bump 5 for electrically connecting the GaN-based LED element 2 to a circuit pattern 4, a wire 10 made of Au for electrically connecting the GaN-based LED element 2 in its electrode to the circuit pattern 4, a heat resistant inorganic material coating 11 for surrounding and coating the GaN-based LED element 2, the wire 10, and the circuit pattern 4, an inorganic white adhesive 12 for binding the GaN-based LED element 2 to the circuit pattern 4, and a $P_2O_5$—ZnO-based glass sealing part 6 for sealing and bonding to the glass-containing $Al_2O_3$ substrate 3.

The heat resistant inorganic material coating 11 is a light transparent and porous $SiO_2$-based hard coating and functions to prevent deformation of the wire 10 in sealing of $P_2O_5$—ZnO-based glass.

The inorganic white adhesive 12 reflects light emitted from the GaN-based LED element 2 toward the substrate side and radiates the light from the electrode formed face.

The method for manufacturing this luminescent device 1 will be explained.

A glass-containing $Al_2O_3$ substrate 3 with via holes 3A is first provided. A W paste is screen printed on the surface of the glass-containing $Al_2O_3$ substrate 3 according to the circuit pattern. Next, the glass-containing $Al_2O_3$ substrate 3 with the W paste printed thereon is heat treated at 1500° C. to bake W to the substrate 3. Further, an Ni plating or an Au plating is provided on W to form a circuit pattern 4. Next, a GaN-based LED element 2 is bonded to the circuit pattern 4 (surface, side) in the glass-containing $Al_2O_3$ substrate 3 with the aid of an inorganic white adhesive 12. The GaN-based LED element 2 in its p-electrode and n-electrode is then electrically connected to the circuit pattern 4 through a wire 10. A SiO$_2$-based coating material is then potted so as to surround the GaN-based LED element 2 and the wire 10. The assembly is then heat treated at 150° C. to form a porous heat resistant inorganic material coating 11. Next, a P$_2$O$_5$—ZnO-based low melting glass is set parallel to the glass-containing Al$_2$O$_3$ substrate 3 with the GaN-based LED element 2 mounted thereon, and the assembly is hot pressed under conditions of pressure 60 kgf and temperature 415° C. or above. The glass-containing Al$_2$O$_3$ substrate 3 integrated with the low melting glass is then set in a dicer followed by dicing to isolate rectangular luminescent devices 1.

In the third embodiment, a light transparent heat resistant inorganic material coating 11 is provided on the wire 10. Therefore, glass sealing of the wire bonded GaN-based LED element 2 with the P$_2$O$_5$—ZnO-based low melting glass is possible in high yield and, thus, a glass sealing-type luminescent device 1 can be realized.

The glass sealing can be realized without the provision of the heat resistant inorganic material coating 11. In this case, however, deformation of the wire 10 is unavoidable. Therefore, electrical short-circuiting is likely to occur, and the yield is lowered. Further, the ball-shaped bonded part of the Au wire 10 is collapsed on the GaN-based LED element 2. Therefore, disadvantageously, electrical short-circuiting likely to occur, and, further, problems such as covering of an Au film on the surface of the element, resulting in inhibition of takeout of light.

Figure 7:
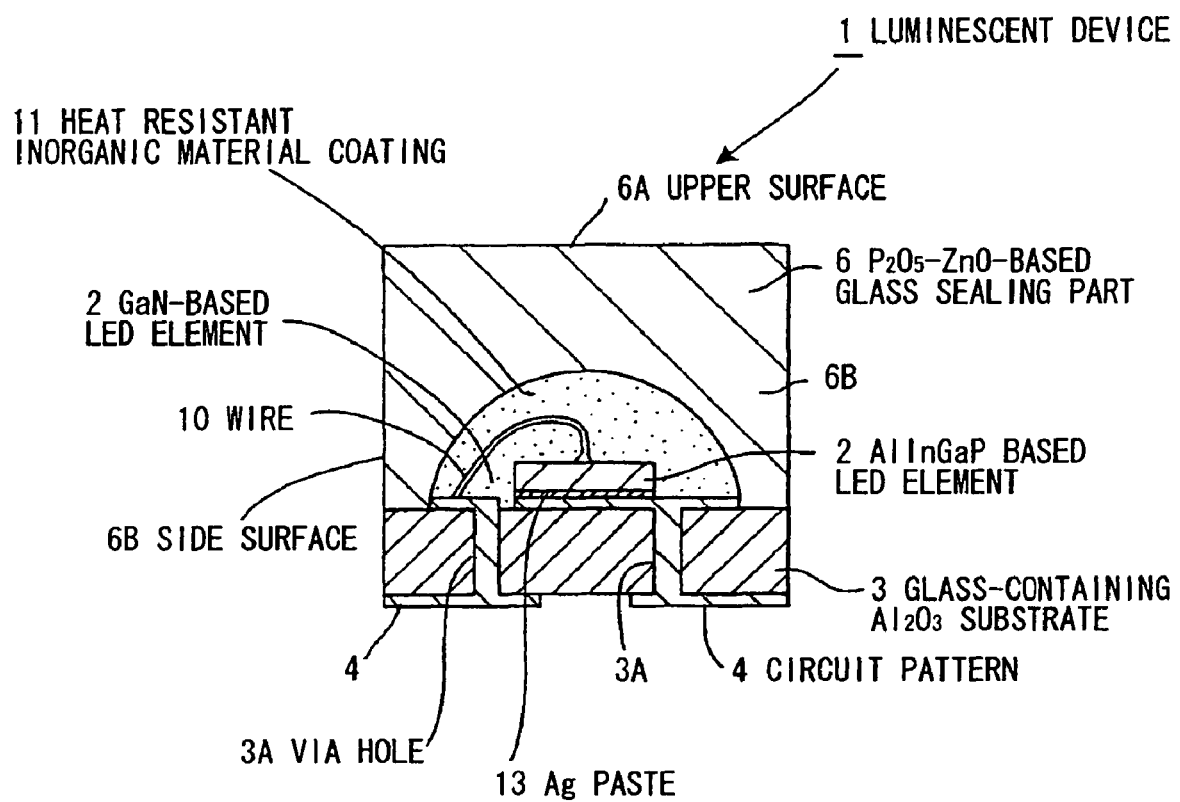
FIG. 7 is a longitudinal sectional view of a variant of the luminescent device in the third embodiment.

FIG. 7 is a longitudinal cross-sectional view showing a variant of the luminescent device in the third embodiment. This luminescent device 1 is different from the device in the third embodiment in that an AlInGaP-based LED element 2 having an-electrode on its upper and lower parts.

In the AlInGaP-based LED element 2, the upper electrode is electrically connected to the circuit pattern 4 through a wire 10, and the lower electrode is electrically connected to the circuit pattern 4 through an Ag paste 13.

Thus, also in the LED element with an-electrode provided on its upper and lower surfaces, a glass sealing-type luminescent device 1 can be realized in a high yield by applying a heat resistant inorganic material coating 11 and conducting glass sealing with P$_2$O$_5$—ZnO-based low melting glass.

Figure 8:
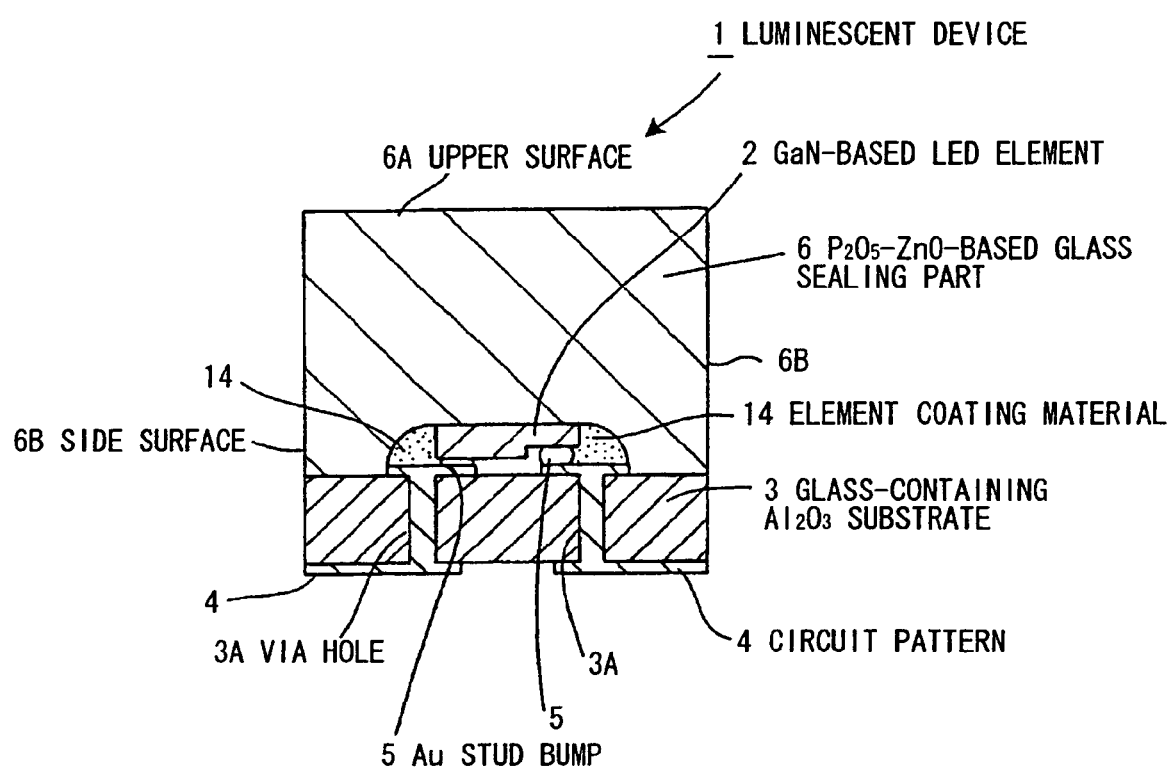
FIG. 8 is a longitudinal sectional view of a luminescent device in a fourth embodiment.

FIG. 8 is a longitudinal sectional view showing a luminescent device in the fourth embodiment. This luminescent device 1 is different from the device in the luminescent device 1 in the first embodiment in that the GaN-based LED element 2 has been formed based on scribing. The GaN-based LED element 2 formed based on scribing has a sharp concave-convex on its side face as the cut part, and, thus, the side face is covered by an element coating material 14.

The element coating material 14 may be, for example, an SiO$_2$-based coating material. The SiO$_2$-based coating material is coated so as to cover the side face of the GaN-based LED element 2, and the coating is heat treated at 150° C. for curing.

In the fourth embodiment, the sharp concave-convex part formed in the GaN-based LED element 2 by scribing is likely to be a starting point of cracking and is causative of void formation. Therefore, covering of the concave-convex part with the element coating material 14 for smoothing can prevent cracking. Further, void formation can also be prevented.

Figure 9:
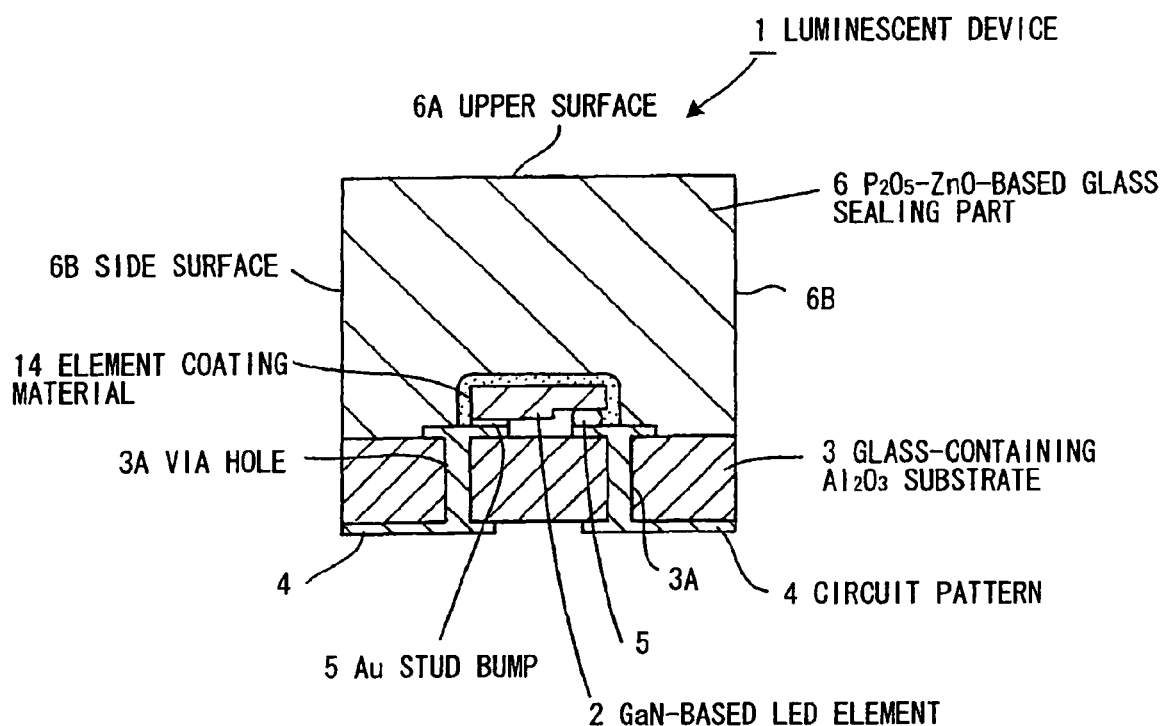
FIG. 9 is a longitudinal sectional view of a first variant of a luminescent device in a fourth embodiment.

FIG. 9 is a longitudinal sectional view showing a first variant of the luminescent device in the fourth embodiment. This luminescent device 1 is different from the device in the fourth embodiment in that the element coating material 14 made of a SiO$_2$-based coating material is provided so as to cover the whole periphery of the GaN-based LED element 2.

The element coating material 14 has a coefficient of thermal expansion intermediate between the coefficient of thermal expansion of the GaN-based LED element 2 and the coefficient of thermal expansion of the P$_2$O$_5$—ZnO-based low melting glass. The above-defined coefficient of thermal expansion of the element coating material 14 can prevent cracking, for example, even when glass having a large coefficient of thermal expansion is used or a large-size LED element is used.

In the first variant, cracking and void formation caused by the shape of the surface of the GaN-based LED element 2 can be suppressed, and, further, cracking derived from the difference in coefficient of thermal expansion between the GaN-based LED element 2 and the low melting glass can be prevented. When the efficiency of takeout of light emitted from the GaN-based LED element 2 is taken into consideration, the thickness of the element coating material 14 is preferably as small as possible.

Figure 10:
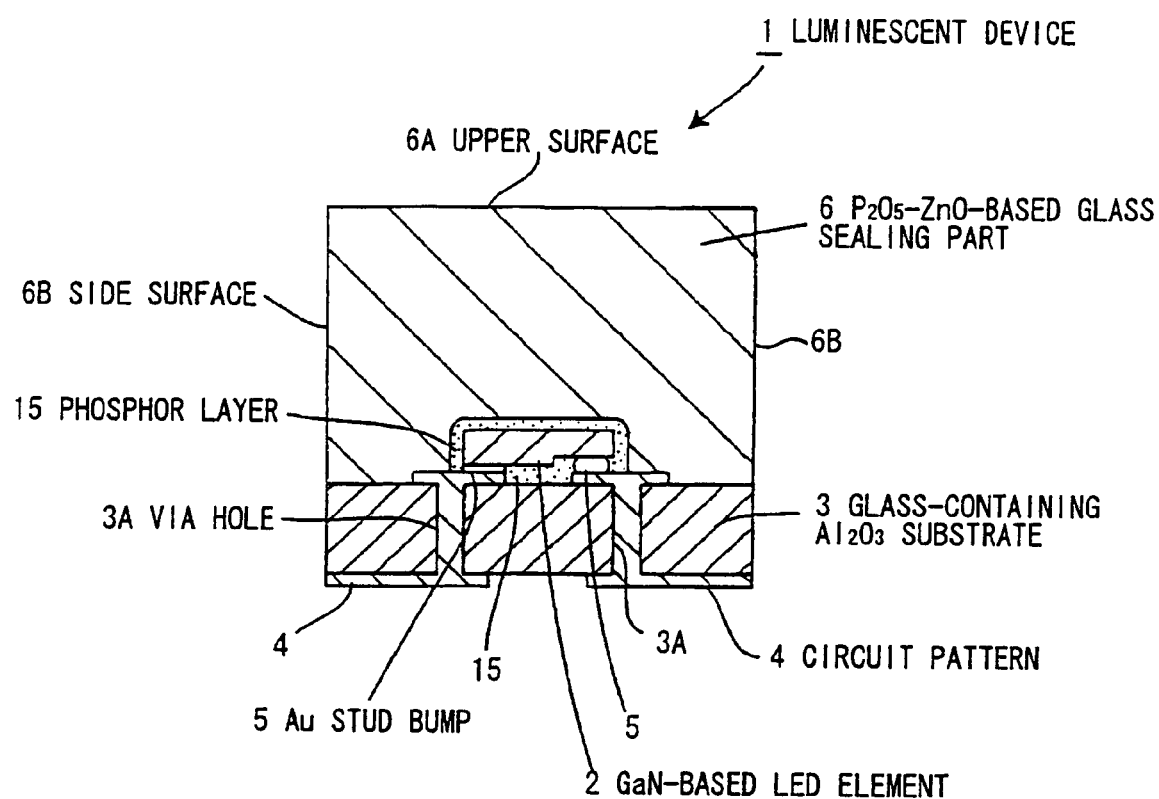
FIG. 10 is a longitudinal sectional view of a second variant of the luminescent device in the fourth embodiment.

FIG. 10 is a longitudinal sectional view showing a second variant of the luminescent device in the fourth embodiment. This luminescent device 1 is different from the device in the fourth embodiment in that a phosphor-containing phosphor layer 15 is provided so as to cover the whole periphery of the GaN-based LED element 2.

The phosphor layer 15 comprises a YAG-based phosphor as a phosphor mixed in the element coating material 14 made of a SiO$_2$-based coating material used in the first variant. A single type of phosphor or plural types of phosphors may be mixed in the element coating material 14. Other phosphors usable herein include silicate phosphors. Further, a mixture of the YAG-based phosphor with the silicate phosphor may be contained in the phosphor layer 15.

In the second variant, in addition to the favorable effects of the first variant, an additional effect can be attained. Specifically, since the phosphor is shielded from external moisture by glass sealing, a deterioration of the phosphor can be prevented, and stable wavelength conversion can be realized for a long period of time.

Figure 11:
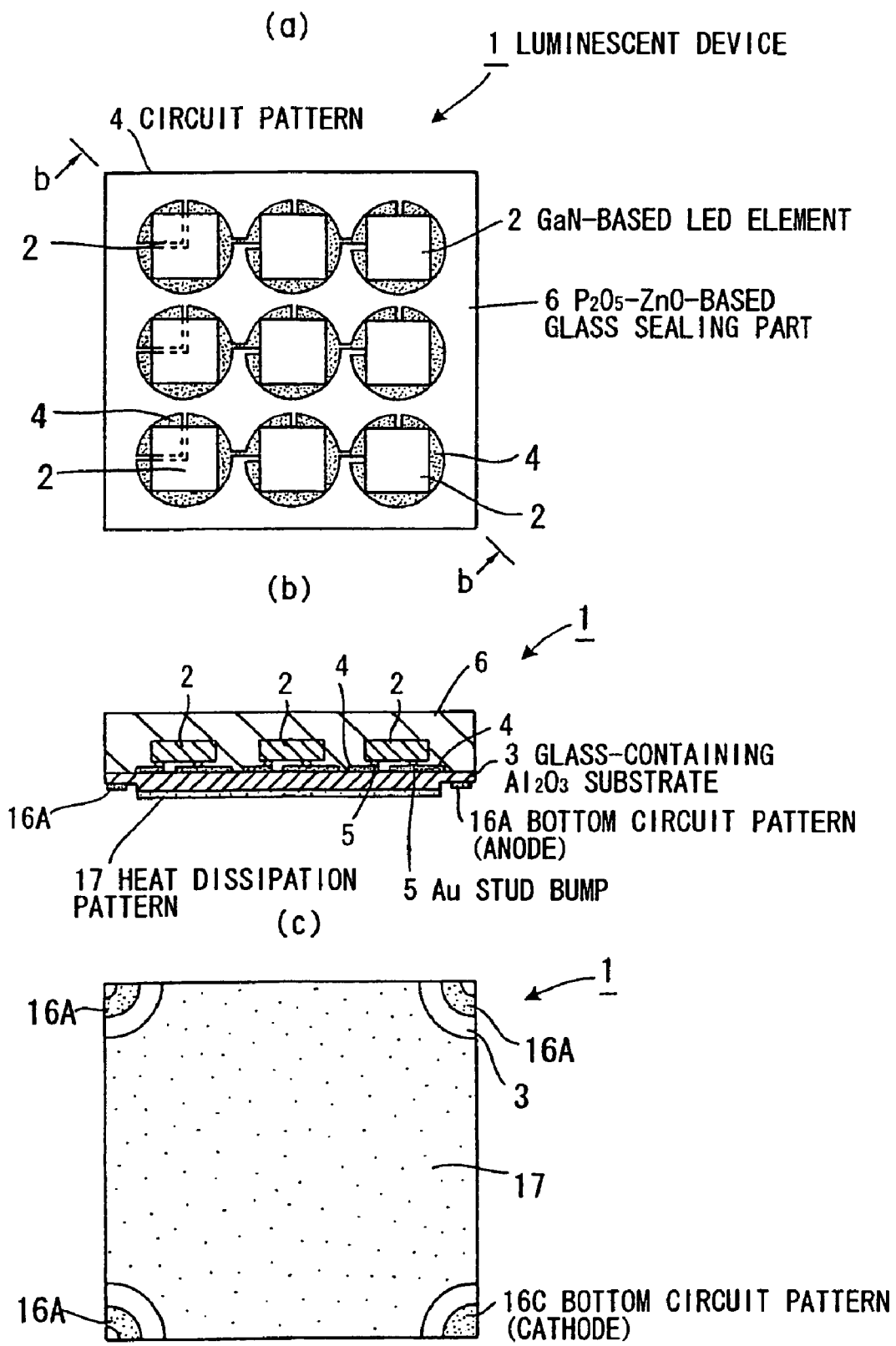
FIG. 11 is a diagram showing a luminescent device in a fifth embodiment, wherein (a) is a plan view of the luminescent device, (b) a side view of the luminescent device, and (c) a bottom view of the luminescent device.

FIG. 11 shows a luminescent device in the fifth embodiment, wherein (a) is a plan view of the luminescent device, (b) a side view of the luminescent device, and (c) a bottom view of the luminescent device. This luminescent device 1 includes a plurality of flip chip-type GaN-based LED elements 2, a squarely formed glass-containing Al$_2$O$_3$ substrate 3 having a multilayered structure with the GaN-based LED elements 2 mounted thereon, a circuit pattern 4, made of tungsten (W) provided on the surface of the glass-containing Al$_2$O$_3$ substrate 3 and within the layers (an Ni, Au plating being further applied on the pattern on the substrate surface), an Au stud bump 5 for electrically connecting the GaN-based LED element 2 to the circuit pattern 4, a P$_2$O$_5$—ZnO-based glass sealing part 6 for sealing of the GaN-based LED element 2 and, in addition, bonding to the glass-containing Al$_2$O$_3$ substrate 3, bottom circuit patterns 16A (anode), 16C (cathode) exposed from in-layer intermediate layer at four corners of the glass-containing Al$_2$O$_3$ substrate 3, and a heat dissipation pattern 17 made of a copper foil for dissipating heat based on heat generation of the GaN-based LED element 2 into the exterior of the assembly. In this case, nine in total of GaN-based LED elements 2 are arrayed (3×3) on the circuit pattern 4 patterned on the substrate surface so as to have a circular outer shape through the Au stud bump 5.

The glass-containing Al$_2$O$_3$ substrate 3 has a multilayered structure with in-layer wiring made of W, and, three GaN-based LED elements 2 in a column-wise direction shown in FIG. 11 (b) are connected in series to form an element group. The anode in the element group is connected to one of the bottom circuit patterns 16A, and the cathode in the element group is connected to the bottom circuit pattern 16C. Further, to the cathode is connected the cathode in element groups formed for other two columns.

In the fifth embodiment, also when a plurality of GaN-based LED elements 2 are used, a series/parallel circuit can easily be formed by using a ceramic multilayered substrate, and, further, in electroplating, drawing of the wiring is also easy. Rapid thermal conduction of heat, produced based on light emission from densely mounted nine GaN-based LED elements 2, from the heat dissipation metal pattern to a heat sink or the like can be realized by drawing an external electrical connection terminal from the intermediate layer and providing a metal pattern for heat dissipation on the bottom face.

Figure 12:
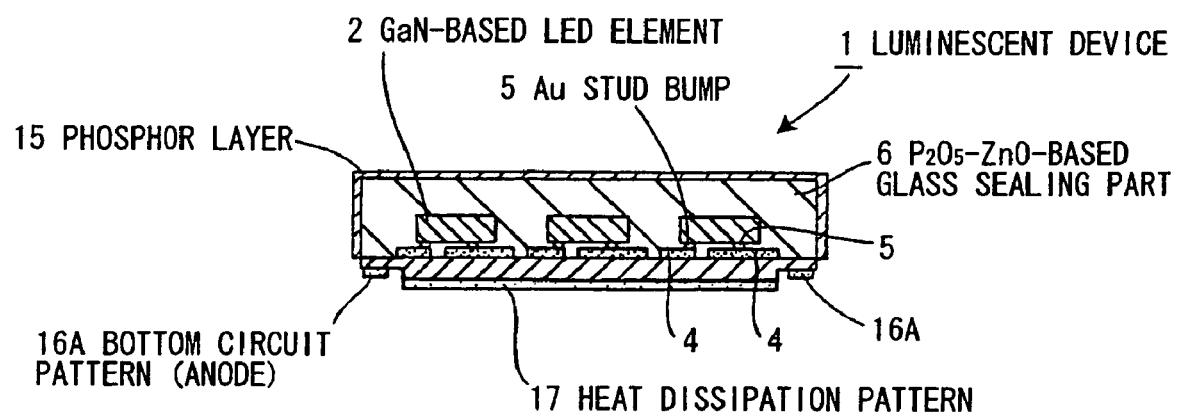
FIG. 12 is a longitudinal sectional view of a first variant of the luminescent device in the fifth embodiment.

FIG. 12 is a longitudinal sectional view showing a first variant of the luminescent device in the fifth embodiment. This luminescent device 1 is different from the device in the fifth embodiment in that a phosphor layer 15 is provided on the surface of the $P_2O_5$—ZnO-based glass sealing part 6 to constitute a wavelength conversion-type luminescent device 1.

In the first variant, the provision of the phosphor layer 15 surrounding the whole GaN-based LED element 2 in the $P_2O_5$—ZnO-based glass sealing part 6 can realize a high-light output white luminescent device 1. Further, even though there is a variation in individual LED element characteristics in the multi-element-type luminescent device 1, the difference is less likely to be conspicuous and, thus, a luminescent device 1 having uniform luminescent characteristics can be realized.

Figure 13:
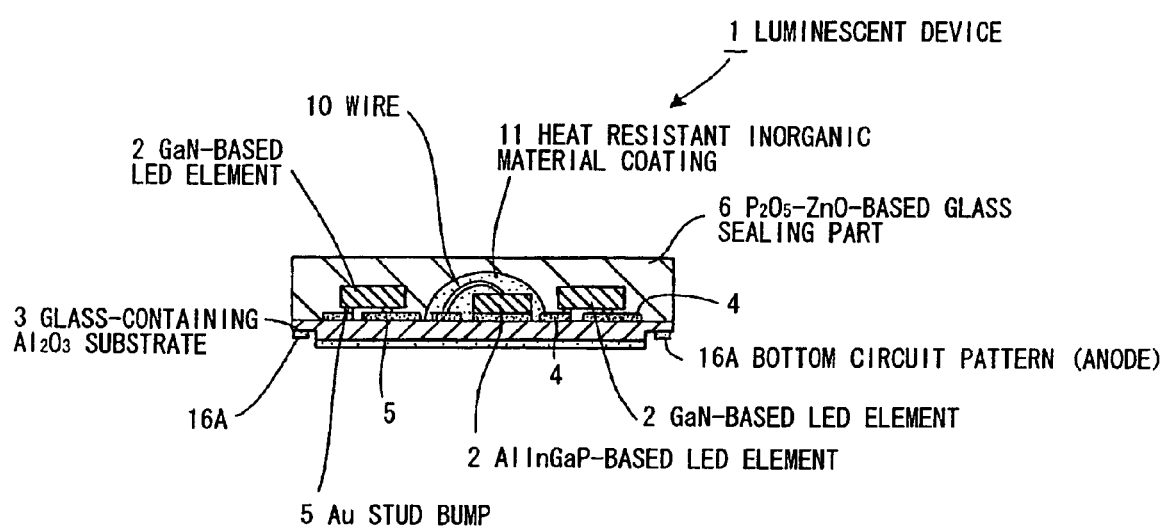
FIG. 13 is a longitudinal sectional view of a second variant of the luminescent device in the fifth embodiment.

FIG. 13 is a longitudinal sectional view showing a second variant of the luminescent device in the fifth embodiment. This luminescent device 1 is different from the device in the fifth embodiment in that a blue or green light emitting flip chip-type GaN-based LED element 2 and a red light emitting upper/lower electrode-type AlInGaP-based LED element 2 are provided together followed by sealing by a $P_2O_5$—ZnO-based glass sealing part 6. The AlInGaP-based LED element 2, together with the wire 10, is surrounded by the heat resistant inorganic material coating 11.

In the second variant, even when the flip chip-type LED element and the upper/lower electrode-type LED element are provided together, glass sealing by the $P_2O_5$—ZnO-based low melting glass is possible. A combination of luminescent colors of the LED elements 2 may also be desirably set.

Figure 14:
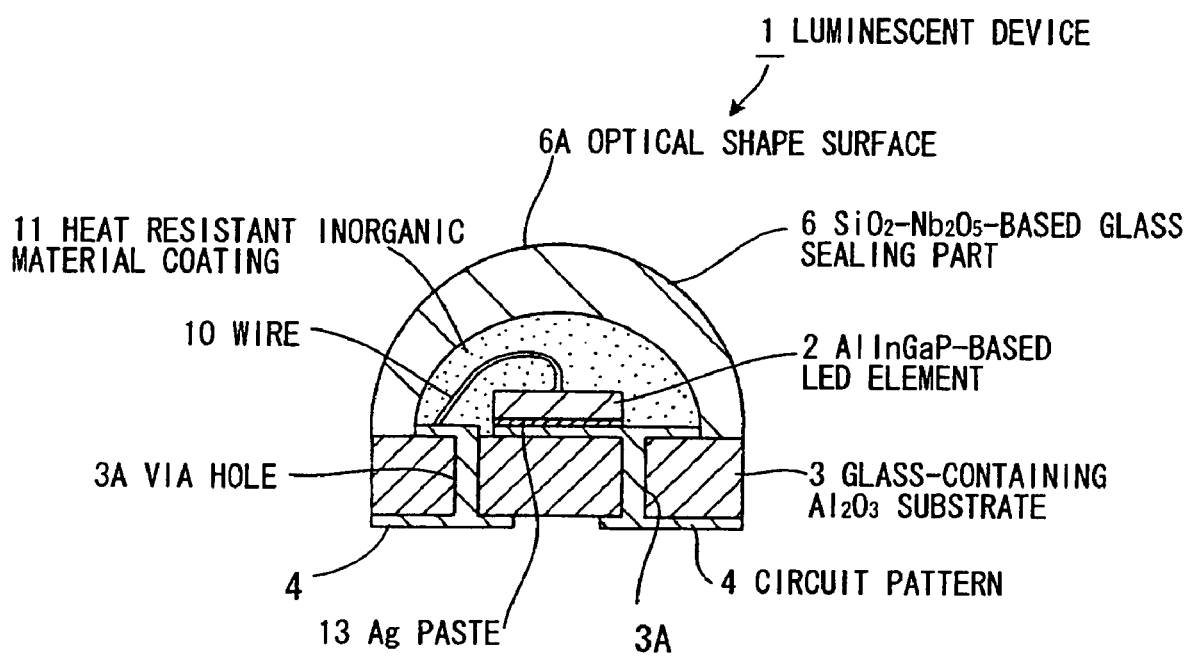
FIG. 14 is a cross-sectional view of a luminescent device in a sixth embodiment.

FIG. 14 is a cross-sectional view of a luminescent device in the sixth embodiment. This luminescent device 1 includes an AlInGaP-based LED element 2 having an-electrode on its upper and lower parts, a glass-containing $Al_2O_3$ substrate 3 with the AlInGaP-based LED element 2 mounted thereon, a circuit pattern 4 formed on the glass-containing $Al_2O_3$ substrate 3 made of W, an Au wire 10 for electrically connecting the AlInGaP-based LED element 2 in its electrode to the circuit pattern 4, a high refractive index material coating 11A of $TiO_2$ (refractive index: 2.4) for surrounding and coating the AlInGaP-based LED element 2, the wire 10, and the circuit pattern 4, an Ag paste 13 for bonding and electrically connecting the AlInGaP-based LED element 2 to the circuit pattern 4, and an $SiO_2$—$Nb_2O_5$-based glass sealing part 6 for sealing the AlInGaP-based LED element 2 and bonded to glass-containing $Al_2O_3$ substrate 3.

The $SiO_2$—$Nb_2O_5$-based glass sealing part 6 is made of $SiO_2$—$Nb_2O_5$-based low melting glass (coefficient of thermal expansion: $10.2 \times 10^{-6}/° C.$, yield point: 543° C., refractive index: 1.92, internal transmittance: 81% (470 nm), 91% (520 nm (in thickness 10 mm))) and has a semispherical optical shape face 6D. In this $SiO_2$—$Nb_2O_5$-based glass sealing part 6, light, which is emitted from the AlInGaP-based LED element 2, is passed through the high refractive index material coating 11A and reaches this sealing part 6, enters the glass interface substantially perpendicularly to minimize interface reflection and is radiated to the exterior of the assembly. The optical shape face 6D may be of a form other than the semisphere so far as light emitted from the AlInGaP-based LED element 2 enters at a critical angle or less to the interface of the glass sealing part 6. Specifically, the optical shape face 6D may be in a hexahedron or octahedron form.

In the sixth embodiment, the AlInGaP-based LED element 2 is surrounded by the high refractive index material coating 11A made of $TiO_2$ with a refractive index of 2.4 and is sealed by the $SiO_2$—$Nb_2O_5$-based glass sealing part 6 having a refractive index of 1.92. Therefore, the occurrence of interface reflection loss at the interface of the high refractive index material coating 11A and the $SiO_2$—$Nb_2O_5$-based glass sealing part 6 can be suppressed, and the efficiency of takeout of light from the LED element as the high refractive index medium can be improved.

Further, since the $SiO_2$—$Nb_2O_5$-based glass sealing part 6 is formed in a convex form, light emitted from the AlInGaP-based LED element 2 enters the interface of the glass sealing part 6 and the air at an angle corresponding to near vertical incidence, resulting in enhanced external radiation efficiency.

FIG. 15 shows a first variant of the luminescent device in the sixth embodiment, wherein (a) is a longitudinal sectional view of the luminescent device and (b) a side view of a GaN-based LED element as a light source. This luminescent device 1 is different from the device in the sixth embodiment in that a GaN-based LED element 2 provided with an SiC substrate 29 is used instead of the AlInGaP-based LED element 2 and, further, an optical shape face 6D made of an $SiO_2$ film 6E having a quarter-wavelength thickness is provided on the surface of the $SiO_2$—$Nb_2O_5$-based glass sealing part 6.

The SiC substrate 29 has on its bottom face an n-electrode 26 which is electrically connected to the circuit pattern 4 through an Ag paste 13.

In the first variant, the provision of the $SiO_2$ film 6E having a quarter-wavelength thickness on the optical shape face 6D can reduce reflection because light led to the optical shape face 6D interferes in the $SiO_2$ film 6E.

FIG. 16 shows a second variant of the luminescent device in the sixth embodiment, wherein (a) is a longitudinal sectional view of the luminescent device and (b) a side view of a GaN-based LED element as a light source. This luminescent device 1 is different from the device in the sixth embodiment in that a flip chip-type GaN-based LED element 2 provided with a GaN substrate 30 is used instead of the AlInGaP-based LED element 2.

In the second variant, by virtue of the use of the GaN-based LED element 2 provided with the GaN substrate 30, light can be efficiently led to the substrate surface without interface reflection within the LED element. The light led to the surface of the substrate is radiated to the exterior of the device from the optical shape face 6D through the $SiO_2$—$Nb_2O_5$-based glass sealing part 6, whereby high external radiation efficiency can be realized.

FIG. 17 shows a luminescent device in the seventh embodiment, wherein (a) is a longitudinal sectional view of the luminescent device and (b) a side view of a GaN-based LED element as a light source. This luminescent device 1 is different from the devices in the first to sixth embodiments in that, instead of the glass-containing $Al_2O_3$, $Al_2O_3$ is used as the substrate and a sealing glass material corresponding to the coefficient of thermal expansion of $Al_2O_3$ is used. FIG. 17 illustrates the state before splitting into individual devices. As shown in FIG. 17 (a), each of the luminescent devices 1 includes a flip chip-type GaN-based LED element 2, an $Al_2O_3$ substrate 3 with the GaN-based LED element 2 mounted thereon, a circuit pattern 4 provided on the $Al_2O_3$ substrate 3, an Au stud bump 5 for electrically connecting the GaN-based LED element 2 to the circuit pattern 4, and a $B_2O_3$—F-based glass sealing part 6 for sealing the GaN-based LED element 2 and bonded to the $Al_2O_3$ substrate 3.

As shown in FIG. 17 (b), in order to prevent damage to the Au stud bump 5 in the sealing of the $B_2O_3$—F-based glass and interelectrode short-circuiting, underfilling 7 is filled into a part between the GaN-based LED element 2 and the $Al_2O_3$ substrate 3.

The $Al_2O_3$ substrate 3 has via holes 3A, and the circuit pattern 4 on the surface is electrically connected to the circuit pattern 4 on the backside through the via holes 3A. Grooves 3B as a substrate splitting position are formed at predetermined intervals.

In the circuit pattern 4, bonding patterns 4A, 4B for enhancing the strength of bonding to the $B_2O_3$—F-based glass sealing part 6 are provided on the surface on which the GaN-based LED element 2 is to be mounted, and the bonding pattern 4B serves also as a part of the circuit pattern 4 drawn out to the backside of the $Al_2O_3$ substrate 3.

The $B_2O_3$—F-based glass sealing part 6 is made of $B_2O_3$—F-based low melting glass (coefficient of thermal expansion: $6.9\times10^{-6}/°$ C., yield point: 539° C., refractive index: 1.75, internal transmittance: 98% (470 nm)) and is bonded to the surface of the $Al_2O_3$ substrate 3 by hot pressing a preform glass on which an optical shape face 6D and a small thickness part 6B have previously been provided by preforming. The small thickness part 6B is formed in such a thickness that damage such as cracking does not extend to the adjacent luminescent device 1 upon the application of a load to scribing part for splitting.

In the luminescent device 1, after the GaN-based LED element 2 is mounted and sealed by the $B_2O_3$—F-based glass sealing part 6, a load is applied using the groove 3B in the $Al_2O_3$ substrate 3 as the splitting position, whereby the $Al_2O_3$ substrate 3 is broken based on stress concentration and, at the same time, the $B_2O_3$—F-based glass sealing part 6 is split at the small thickness part 6B.

In the seventh embodiment, the use of a commonly widely used $Al_2O_3$ substrate can reduce white light absorption and can improve light takeout efficiency. Further, the $Al_2O_3$ substrate is easily available and is inexpensive. Furthermore, since splitting into individual luminescent devices 1 is carried out by applying a load to the scribing part, mass productivity is excellent. In the splitting into individual luminescent devices 1 by dicing, upon cutting by a dicer, residual stain occurs in the glass and, consequently, cracking sometimes occurs in the $B_2O_3$—F-based glass sealing part 6 upon exposure to heat shock. On the other hand, in the luminescent device 1 split based on scribing, residual strain is small and, thus, a failure such as cracking is less likely to occur.

$SiO_2$—$B_2O_3$—$La_2O_3$-based low melting glass (coefficient of thermal expansion: $8.3\times10^{-6}/°$ C., yield point: 559° C., refractive index: 1.81, internal transmittance: 99% (470 nm)) may also be used as low melting glass other than the $B_2O_3$—F-based glass.

Regarding a splitting method other than the scribing, splitting using a laser beam may also be adopted.

Figure 18:
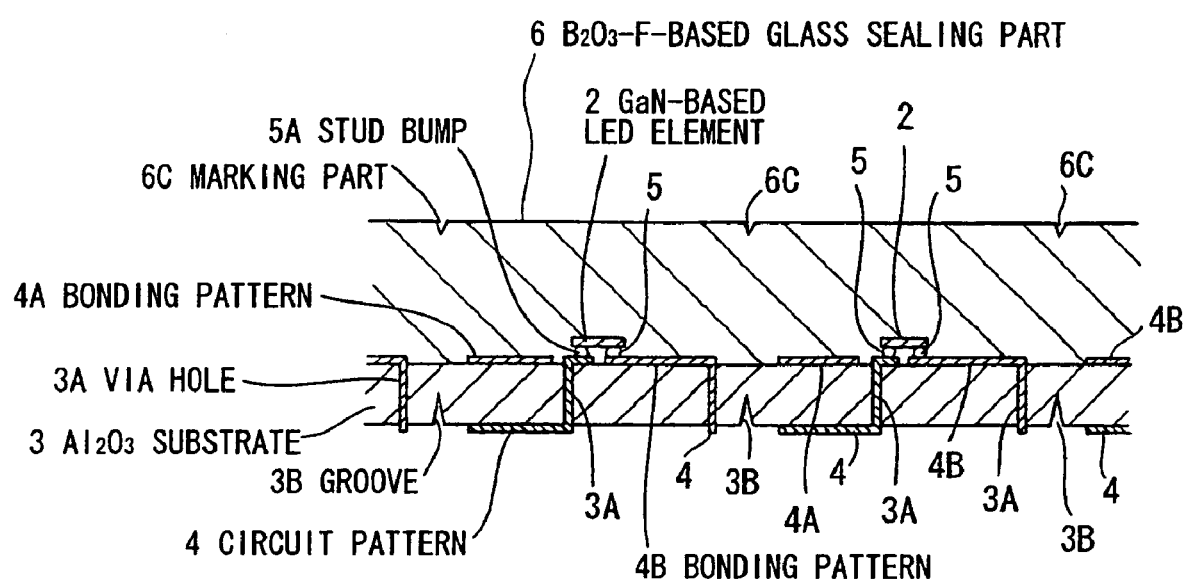
FIG. 18 is a longitudinal sectional view of a first variant of the luminescent device in the seventh embodiment.

FIG. 18 is a longitudinal sectional view showing a first variant of the luminescent device in the seventh embodiment. This luminescent device 1 is different from the device in the seventh embodiment in that the $B_2O_3$—F-based glass sealing part 6 is formed by flat $B_2O_3$—F-based low melting glass.

The $B_2O_3$—F-based $SiO_2$—$B_2O_3$ glass sealing part 6 has a scribing part 6C at a position opposite to the groove 3B provided in the $Al_2O_3$ substrate 3, and, upon the application of a load, the scribing part 6C cooperates with the groove 3B to cause stress concentration, whereby the $B_2O_3$—F-based glass sealing part 6 and the $Al_2O_3$ substrate 3 are split.

The first variant renders the preform of the $B_2O_3$—F-based glass sealing part 6 unnecessary to simplify the manufacturing process, contributing to excellent productivity.

Further, $SiO_2$—$B_2O_3$-based low melting glass can also be used as other low melting glass applicable to the glass sealing part 6.

FIG. 19 is a luminescent device of the eighth embodiment, wherein (a) is a longitudinal sectional view of the luminescent device and (b) a side view of a GaN-based LED element as a light source. This luminescent device 1 is different from the device in the seventh embodiment in that this device is provided with BN underfilling 7 having excellent thermal conductivity on the lower part of the GaN-based LED element 2, an AlN substrate 3 with the GaN-based LED element 2 mounted thereon, and an $SiO_2$—$B_2O_3$-based glass sealing part 6, having a coefficient of thermal expansion similar to AlN, for sealing the GaN-based LED element 2 and bonded to the AlN substrate 3.

The $SiO_2$—$B_2O_3$-based glass sealing part 6 is made of $SiO_2$—$B_2O_3$-based low melting, glass (coefficient of thermal expansion: $4.9\times10^{-6}/°$ C., yield point: 558° C., refractive index: 1.61, internal transmittance: 96% (380 nm)) and has a coefficient of thermal expansion substantially equal to the coefficient of thermal expansion ($5\times10^{-6}/°$ C.) of the GaN-based LED element 2.

In the eighth embodiment, heat produced based on light emission from the GaN-based LED element 2 is passed through highly thermally conductive underfilling 7 and Au stud bump 5, is conveyed to the AlN substrate 3 as a high heat dissipation material and is then efficiently dissipated to the outside of the device. Further, since main members such as the GaN-based LED element 2, the AlN substrate 3, and the $SiO_2$—$B_2O_3$-based glass sealing part 6 are substantially equal to one another in coefficient of thermal expansion, separation and deterioration in sealing properties derived from the difference in coefficient of thermal expansion can be prevented.

For example, even when there is a difference in coefficient of thermal expansion between the main members, the provision of a construction capable of relaxing the stress can absorb the internal stress and can prevent deterioration in sealing properties and separation.

Figure 20:
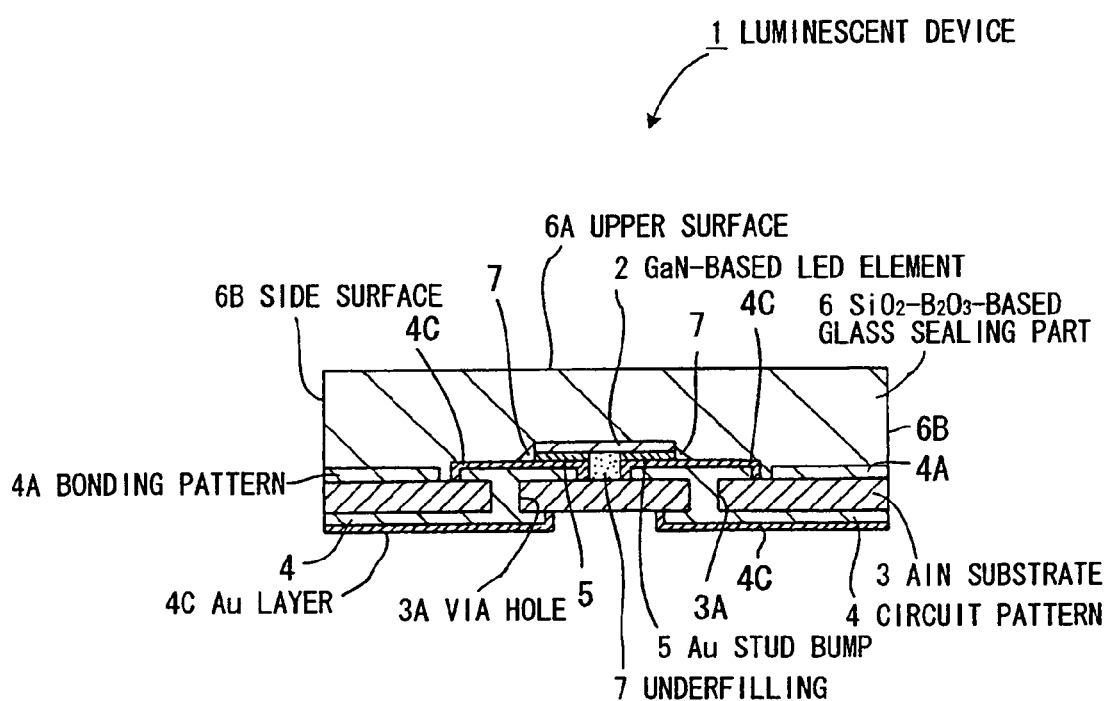
FIG. 20 is a longitudinal sectional view of a variant of the luminescent device in the eighth embodiment.

FIG. 20 is a longitudinal sectional view showing a variant of the luminescent device in the eighth embodiment. This luminescent device 1 is different from the device in the seventh embodiment in that a soft metal layer for absorbing the internal stress is provided on the surface of the GaN-based LED element 2 mounted circuit pattern 4.

Figure 21:
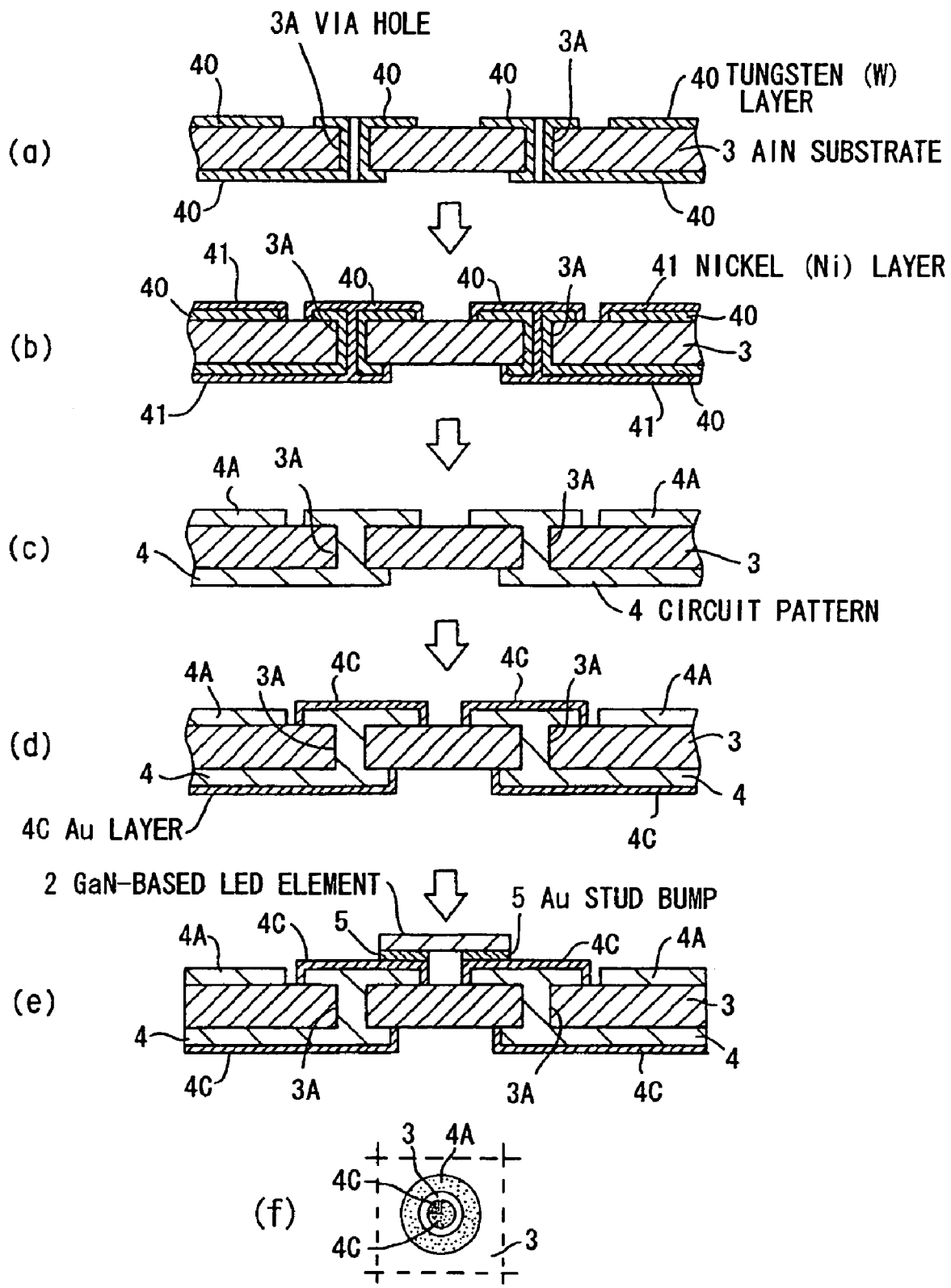
FIGS. 21 (a) to (e) are a diagram showing a formation process for the formation of a circuit pattern with an Au layer on an AlN substrate.

FIGS. 21 (a) to (e) are diagrams showing a process for forming a circuit pattern on the AlN substrate. At the outset, as shown in (a), a W-containing paste is screen printed according to the circuit pattern on both sides of the AlN substrate 3 with via holes 3A previously formed therein. Next, the AlN substrate 3 is sintered at a temperature above 1500° C. to bake W to the AlN substrate 3. Thus, W is strongly bonded to the AlN substrate 3. Alternatively, W may be formed by sputtering. Further, instead of W, a high melting metal such as Mo may be used. Next, as shown in (b), a nickel (Ni) layer 26 is provided by plating on the circuit pattern 4 on the surface side of the AlN substrate 3. Next, as shown in (c), the AlN substrate 3 is heated at about 700° C. to react Ni with W. Thus, the circuit pattern 4 is strongly bonded onto the AlN substrate 3. Next, as shown in (d), an Au layer 4C is formed by electroplating on the surface of the circuit pattern 4. As shown in (e), the GaN-based LED element 2 is then mounted at a predetermined position through an Au stud bump 5.

$SiO_2$—$B_2O_3$-based low melting glass is hot pressed on the AlN substrate 3 with the GaN-based LED element 2 mounted on the circuit pattern 4, followed by splitting into individual luminescent devices 1 based on scribing.

In the above variant, the strong circuit pattern 4 can be bonded to the AlN substrate 3. Further, the provision of the Au pattern 4C for mounting the GaN-based LED element 2 on the circuit pattern 4 through the Au stud bump and the provision of the Ni pattern 4A for bonding to the low melting glass can realize stud bump mounting and, at the same time, can relax stress. In the glass, bonding is carried out through an oxide, and bonding to Au does not occur, but on the other hand, bonding to Ni takes place through an Ni oxide film on the Ni surface. Further, good bonding can also be realized between the glass and AlN. The thermal conductivity of the AlN substrate is so high that a difference in temperature between the AlN substrate and the glass is likely to occur, for example, immediately after lighting of the GaN-based LED element 2. Even in such a situation, stable glass sealing properties can be realized as a result of stress relaxation based on the elastic deformation of the Au layer 4C can be provided.

Figure 22:
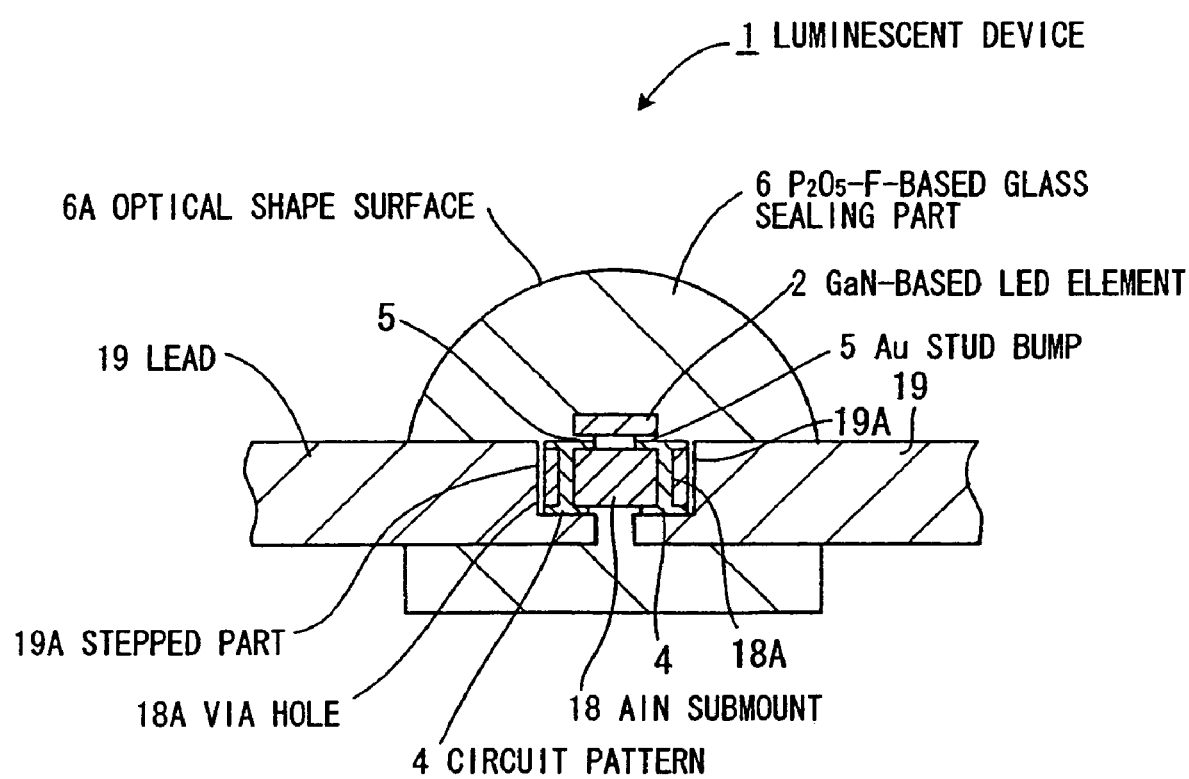
FIG. 22 is a longitudinal sectional view of a luminescent device in a ninth embodiment.

FIG. 22 is a longitudinal sectional view of a luminescent device in the ninth embodiment. This luminescent device 1 includes a flip chip-type GaN-based LED element 2, an AlN submount 18 on which the GaN-based LED element 2 is mounted, a W circuit pattern 4 formed on the AlN submount 18, a lead 19 made of a copper alloy having a stepped part 19A on which the AlN submount 18 is mounted, an Au stud bump 5 for electrically connecting the GaN-based LED element 2 to the circuit pattern 4, and a $P_2O_5$—F-based glass sealing part 6 for surrounding and integrally sealing the GaN-based LED element 2 and the lead 19.

The AlN submount 18 has a metallized circuit pattern.

The $P_2O_5$—F-based glass sealing part 6 is made of $P_2O_5$—F-based low melting glass (coefficient of thermal expansion: $16.9\times10^{-6}/°$ C., yield point: 363° C., refractive index: 1.54, internal transmittance: 99% (470 nm)), and an optical shape face 6D, which is formed in a semispherical form and functions to radiate light to a desired radiation range, is formed based on hot pressing.

Two $P_2O_5$—F-based low melting glass sheets are set parallel to each other so as to sandwich a lead 19, formed in the lead frame, therebetween, and the assembly is hot pressed in a nitrogen atmosphere under conditions of pressure 10 kgf and temperature 410° C. or above. Under the above conditions, the viscosity of the low melting glass is $10^8$ to $10^9$ poises.

Figure 23:
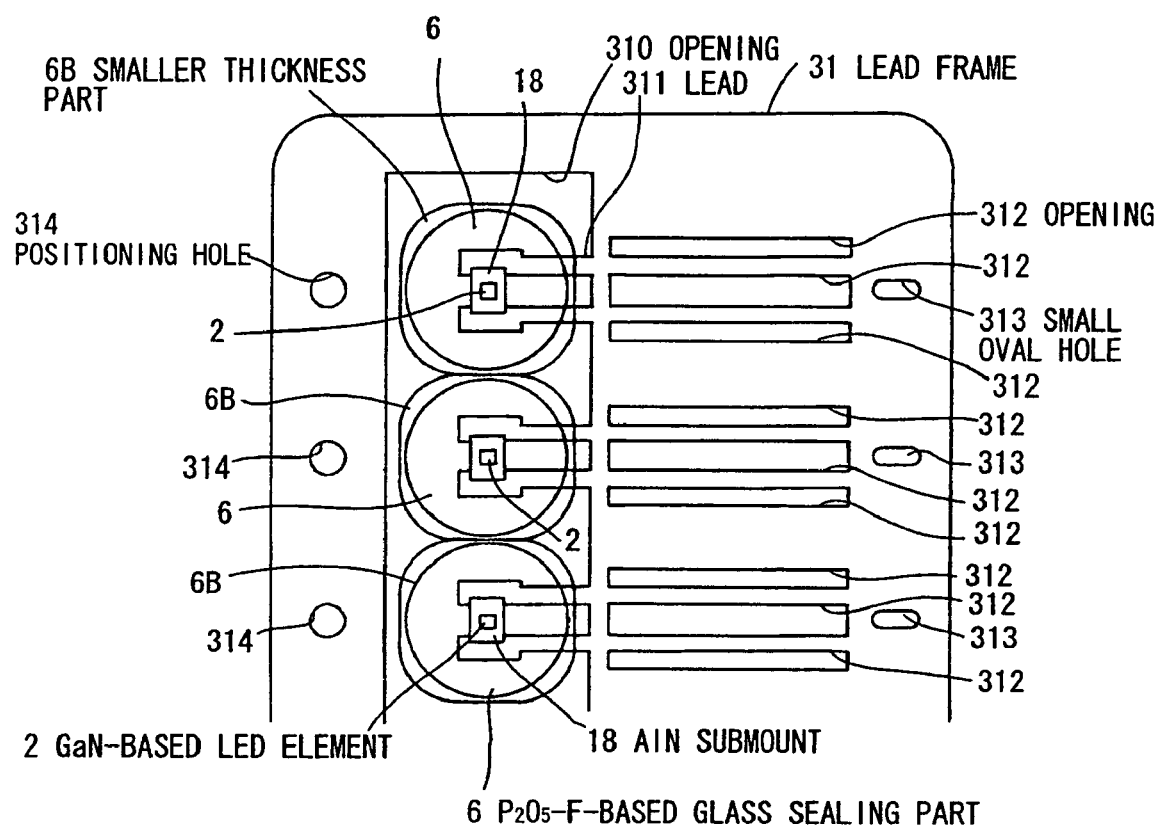
FIG. 23 is a diagram illustrating the state of glass sealing of a lead frame based on hot pressing.

FIG. 23 is a diagram illustrating the state of glass sealing of the lead frame by hot pressing. In this drawing, a lead frame 31 is shown in which a pair of leads 311 made of a copper alloy sheet are led out in a single direction. This lead frame 31 includes a lead 311 for fixing an AlN submount 18, an opening 312 provided on the support side of the lead 311, an oval hole 313 for absorbing thermal deformation of the lead frame 31, and a positioning hole 314 for positioning the feed position of the lead frame 31. The periphery of the lead 311 is removed as an opening 310 in punching out the copper alloy sheet.

The method for manufacturing the luminescent device 1 will be explained.

A lead frame 31 with a lead 19 having a stepped part 19A for mounting the AlN submount 18 is first formed. An AlN submount 18 with a circuit pattern 4 formed thereon is then bonded to the lead frame 31. Next, a GaN-based LED element 2 is bonded by flip chip binding through an Au stud bump 5 to the circuit pattern 4 provided on the surface of the AlN submount 18. Next, $P_2O_5$—F-based low melting glass is set parallel to each other on and under the lead frame 31. The $P_2O_5$—F-based low melting glass is then hot pressed using a mold (not shown). The $P_2O_5$—F-based low melting glass is molded individually in the small thickness part 6B and the $P_2O_5$—F-based glass sealing part 6 based on hot pressing. Next, the lead 311 is cut for isolation of luminescent devices from the lead frame 31.

The following effects can be attained by the ninth embodiment.

(1) Hot pressing is carried out using the $P_2O_5$—F-based low melting glass in a highly viscose state. Therefore, glass sealing at a temperature below the crystal growth temperature is possible.

(2) Since hot pressing is carried out in a nitrogen atmosphere, each member is less likely to be oxidized.

(3) Since two glass sheets are set so as to sandwich a lead therebetween, sealing can be carried out in a highly viscose state.

(4) Since the $P_2O_5$—F-based low melting glass and the copper alloy lead are substantially equal to each other in coefficient of thermal expansion, bonding failures such as separation and cracking are less likely to occur. Further, even though there is a small difference in coefficient of thermal expansion, the internal stress can be absorbed based on the plasticity of copper as a soft metal. In the first to eighth embodiments, a ceramic substrate with a circuit pattern formed thereon was used as electric power supplying means. The coefficient of thermal expansion of generally available ceramic substrates is somewhat lower than that of the low melting glass. Although the correlation is not necessarily great, there is a tendency that materials having a weak intermolecular bond have a lower melting point and, at the same time, have a higher coefficient of thermal expansion. On the other hand, when a metal lead is used as the electric power supplying means, even a lower melting point glass with a coefficient of thermal expansion of not less than $15\times10^{-6}/°$ C. can realize a luminescent device 1. When a material having a high coefficient of thermal expansion is selected as the low melting glass, the difference in coefficient of thermal expansion between the glass and the GaN-based LED element becomes large. Therefore, in this case, preferably, the measure for this difference is also carried out.

(5) Since flip chip mounting is adopted, damage to the electrode part is less likely to occur.

(6) In the structure, cracking derived from the difference in coefficient of thermal expansion between members is less likely to occur. Specifically, a stepped part having shape corresponding to the AlN submount is formed in the lead, and, in the direction of the length of the AlN submount, the stress can be relaxed by the plasticity of the soft metal lead. Further, glass is likely to cause cracking upon exposure to tensile stress and is less likely to cause cracking upon exposure to compressive stress. A GaN-based LED element having a lower coefficient of thermal expansion is located at the center part, and the periphery thereof is surrounded by the lead having a higher coefficient of thermal expansion and the $P_2O_5$—F-based low melting glass. Therefore, the stress is vertically applied to each face of the GaN-based LED element, and compressive stress occurs in the glass. Thus, even when the coefficient of thermal expansion of the low melting glass is larger than that of the LED element and the submount, glass sealing can be realized.

(7) Heat generated from the GaN-based LED element is rapidly radiated to the outside of the device through the AlN submount and the lead. Further, since the coefficient of thermal expansion of the glass is superior to the resin sealing material by a factor of about 10, heat dissipation from the glass is not negligible.

(8) A large quantity of luminescent devices can be manufactured at a time by conducting hot pressing to the lead frame for individual glass sealing of leads and conducting tie bar cutting from the lead frame, and, thus, excellent mass productivity can be realized.

The material for constituting the submount is not limited to AlN and may be sapphire ($Al_2O_3$). When $Al_2O_3$ is used, the difference in coefficient of thermal expansion between $Al_2O_3$ and the glass material is small and, thus, the occurrence of cracking and separation can be suppressed.

Figure 24:
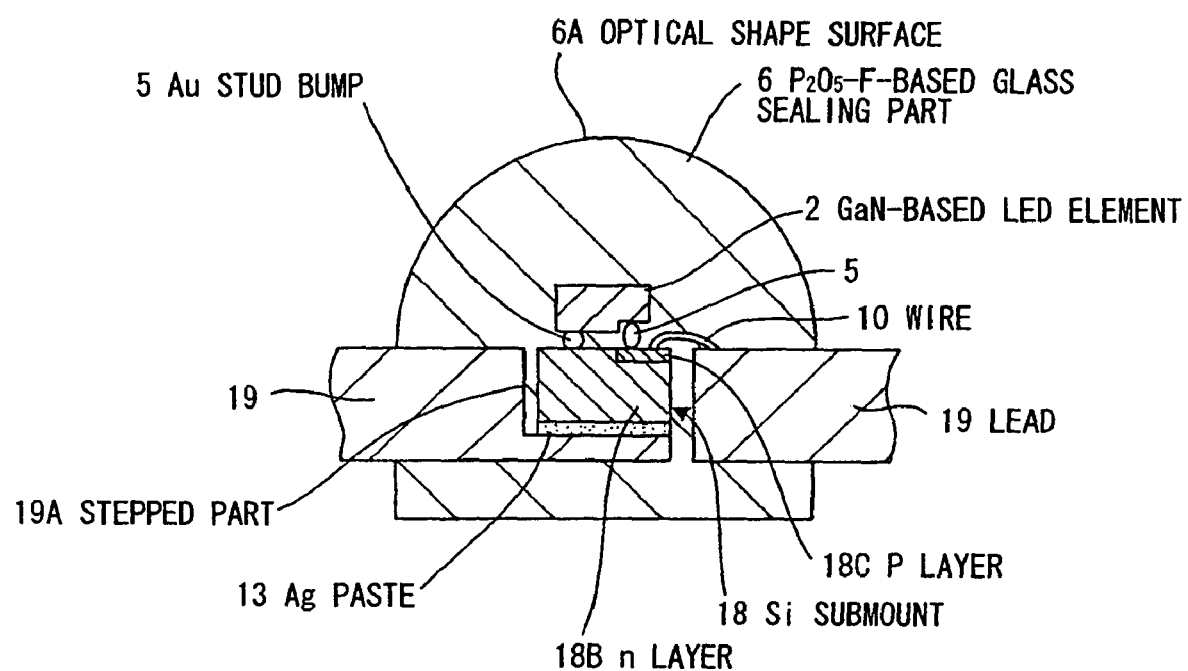
FIG. 24 is a diagram illustrating the state of a GaN-based LED element 2 loaded on a Si submount which functions as a Zener diode.

Further, as shown in FIG. 24, a construction may be adopted in which a GaN-based LED element 2 is loaded on a Si submount 18 which functions as a Zener diode by an n layer 188 and a p layer 18C. In this case, the GaN-based LED element can be protected against electrostatic discharge damage. For the wire 10 for electrically connecting the p layer 18C in the Si submount 18 to the lead 19, damage caused by glass sealing can be avoided by protection with a protecting member such as the above-described heat resistant inorganic material coating 11.

For the two glass sheets for sandwiching the lead therebetween, white glass may be used on the lower side. In this case, light emitted to the lower side can be reflected and radiated to the optical shape formation side.

The two glass sheets for sandwiching the lead therebetween may be different from each other in viscosity. Specifically, $P_2O_5$—F-based low melting glass (coefficient of thermal expansion: $17.3 \times 10^{-6}/°$ C., yield point: 310° C., refractive index: 1.51, internal transmittance: 99% (470 nm)) is used as the upper glass, and $P_2O_5$—F-based low melting glass (coefficient of thermal expansion: $16.9 \times 10^{-6}/°$ C., yield point: 363° C., refractive index: 1.54, internal transmittance: 99% (470 nm)) is used as the lower glass. In this case, at the time of hot pressing, the upper side is higher viscosity, and the lower side is lower viscosity. This facilitates molding.

FIG. 25 is a luminescent device in the tenth embodiment, wherein (a) is a plan view, (b) a cross-sectional view taken on line A-A of (a), and (c) a perspective view of the lower glass. This luminescent device 1 includes a face up-type GaN-based LED element 2, a lead 19 having a lead cup part 19B on which the GaN-based LED element 2 is mounted, a wire 10 for electrically connecting the GaN-based LED element 2 to the lead 19, a silicone coating 35 for covering and protecting the GaN-based LED element 2 and the wire 10, and a $P_2O_5$—F-based glass sealing part 6 for integrally sealing the lead 19 through the preformed upper glass 60A and lower glass 60B.

The lead cup part 19B is provided in a cone form by an inclined face 190 and a bottom face 191 and is received in a lead receiving groove 60C of the lower glass 60B shown in (c). The lead receiving groove 60C is formed in preforming the lower glass 60B using a mold.

The method for manufacturing the luminescent device 1 will be explained.

At the outset, a lead frame (not shown) of copper provided with a pair of leads 19 having a silver plated surface is provided. Next, a GaN-based LED element 2 is mounted on the lead 19 in its lead cup part 19B. The GaN-based LED element 2 is bonded to the lead cup face 19B on its bottom face 191.

The pair of leads 19 are then electrically connected to the GaN-based LED element 2 on its electrode through a wire 10. In such a state that the pair of leads 19 has been electrically connected to the GaN-based LED element 2, the assembly is received in the lead receiving groove 60C in the preformed lower glass 60B. A silicone resin coating 35 is then potted so as to cover the pair of leads 19 and the GaN-based LED element 2. The upper glass 60A is then provided and is integrated with the lower glass 60B based on hot pressing. The luminescent device 1 is cut out from the lead frame.

The following effects can be attained by the tenth embodiment.

In the silicone resin, the molecular bond is cleaved by heat at about 400° C. or above, and, consequently, gas is evolved. Since the silicone resin coating 35 can be processed at 360° C. without heat decomposition, heat applied during the glass sealing can be absorbed in the silicone resin to relax the stress. Further, the use of the preformed lower glass 60B for receiving the lead cup part 19B can stabilize glass sealing state of the pair of leads 19. A large quantity of luminescent devices can be manufactured at a time by conducting hot pressing to the lead frame for individual glass sealing of leads and conducting tie bar cutting from the lead frame, and, thus, excellent mass productivity can be realized.

Figure 26:
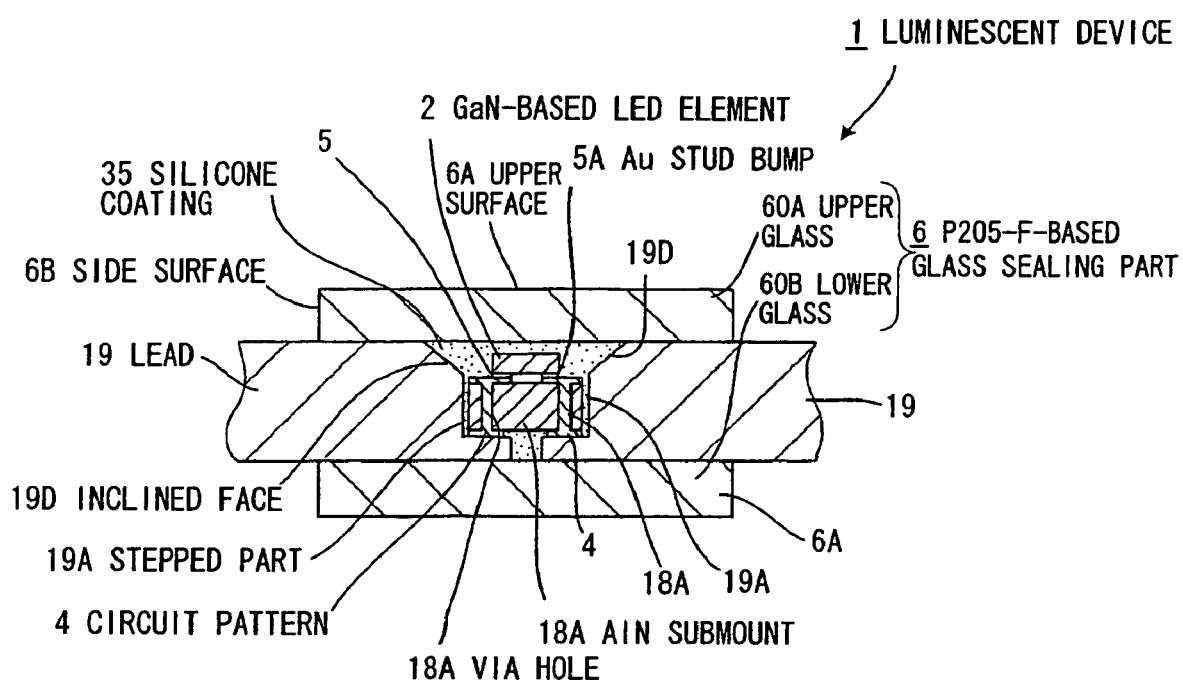
FIG. 26 is a cross-sectional view of a first variant of the luminescent device in the tenth embodiment.

FIG. 26 is a cross-sectional view showing a first variant of the luminescent device in the tenth embodiment. This luminescent device 1 is different from the device in the tenth embodiment in that the luminescent device 1 includes a flip chip-type GaN-based LED element 2 (0.3 mm×0.3 mm), an AlN submount 18 on which the GaN-based LED element 2 is mounted, and a pair of lead frames 19 having a stepped part 19A for receiving the AlN submount 18.

The pair of lead frames 19 has an inclined face 19D above the stepped part 19A, and light emitted from the GaN-based LED element 2 is reflected from the inclined face 19D for external radiation.

The AlN submount 18 has via holes 18A for electrically connecting the circuit pattern 4 provided on the surface to the circuit pattern 4 provided on the backside.

The method for manufacturing the luminescent device 1 will be explained.

A lead frame (not shown) provided with a pair of leads is first provided. Next, an AlN submount 18 is electrically connected through an Ag paste so as to be located in a stepped part 19A in the lead 19. A GaN-based LED element 2 is then bonded to the AlN submount 18 through an Au stud bump 5. In such a state that the pair of leads 19 are electrically connected to the GaN-based LED element 2, the assembly is then received in the lead receiving groove 60C of the preformed lower glass 60B. Next, a silicone coating 35 is potted so as to cover the pair of leads 19 and the GaN-based LED element 2. An upper glass 60A is then provided and is integrated with a lower glass 60B by hot pressing. The luminescent device 1 is then cut out from the lead frame.

In the first variant, light can be efficiently taken out from the substrate side by using the flip chip-type GaN-based LED element 2.

Figure 27:
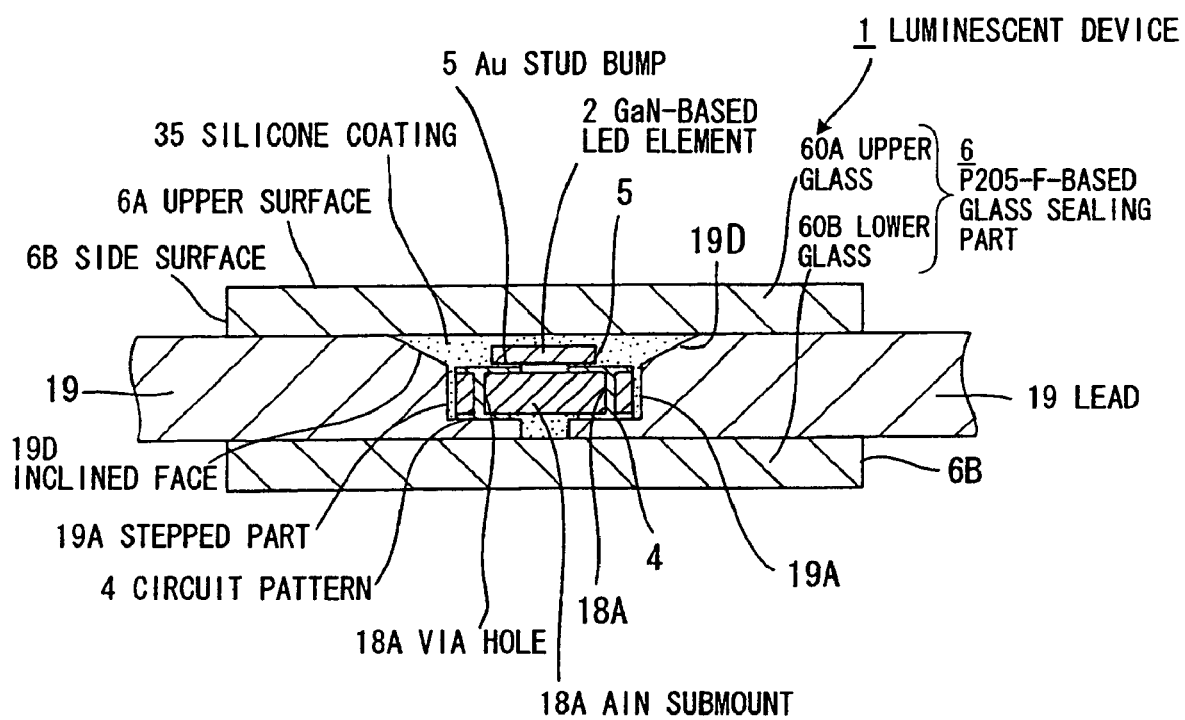
FIG. 27 is a cross-sectional view of a second variant of the luminescent device in the tenth embodiment.

FIG. 27 is a cross-sectional view of a second variant of the luminescent device in the tenth embodiment. This luminescent device 1 is different from the device in the tenth embodiment in that the luminescent device 1 includes a flip chip-type GaN-based LED element (large size) 2, an AlN submount 18 on which the GaN-based LED element 2 is mounted, and a pair of lead frames 19 having a stepped part 19A for receiving the AlN submount 18. The size of the large-size GaN-based LED element 2 is 1 mm×1 mm.

In the second variant, the construction using a large-size chip has been explained. Since the chip size is large, the difference in coefficient of thermal expansion between the $P_2O_5$—F-based glass AlN submount 18 and the $P_2O_5$—F-based glass sealing part 6 is large. Even in this case, good sealing properties are obtained.

FIG. 28 shows a luminescent device in the eleventh embodiment, wherein (a) is a side view and (b) a perspective view illustrating glass sealing. As shown in FIG. 28(a), in this luminescent device 1, a tubular body 60D made of $P_2O_5$—F-based glass is heated to glass-seal the GaN-based LED element 2, the wire 10, and the pair of leads 19.

As shown in FIG. 28(b), the tubular body 60D is formed of a partially cut-out tubular glass. The tubular body 60D is heated by a heating device such as a burner (not shown) to melt the glass for glass sealing of the GaN-based LED element 2, the wire 10, and the pair of leads 19.

In the eleventh embodiment, the GaN-based LED element 2, the wire 10, and the pair of leads 19 can be glass-sealed based on the surface tension of the melted glass. In this embodiment, glass sealing is carried out by depositing the melted glass. Alternatively, hot pressing may be carried out in such a state that the glass is in a melted state.

Figure 29:
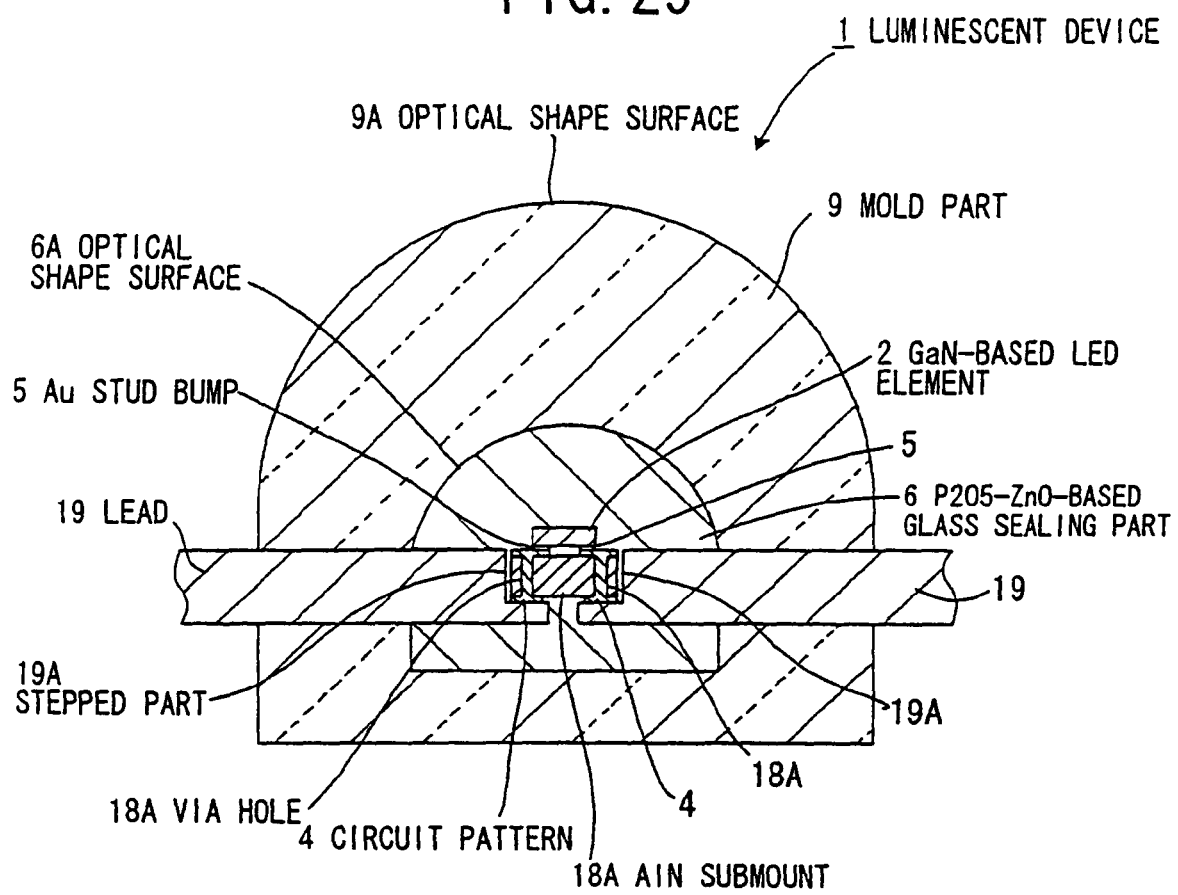
FIG. 29 is a longitudinal sectional view of a luminescent device in a twelfth embodiment.

FIG. 29 is a longitudinal sectional view of a luminescent device in the twelfth embodiment. This luminescent device 1 is different from the luminescent device 1 in the ninth embodiment in that a mold part 9 made of an epoxy resin is provided.

The mold part 9 has a semispherical optical shape face 9A and is formed by transfer molding.

According to this construction, an optical system can easily be formed in the glass sealing-type device, and, at the same time, the moisture resistance is further improved by surrounding the glass sealing part 6 by the mold part 9. The lead-out part is not directly from the glass, and, thus, cracking or breaking of glass caused by stress or the like at the time of bending of the lead can be advantageously prevented. The mold part 9 may be made of other resin material other than the epoxy resin, for example, a silicone resin, and molding methods other than transfer molding, for example, potting molding, can also be applied. Alternatively, the mold part 9 may be formed by an injection method using a resin material such as acrylic or polycarbonate resin, and, in this case, the productivity can be improved.

Embodiments shown in FIGS. 30 to 55 will be explained in detail.

(Optical Element)

Optical elements include light emitting diodes, laser diodes, and other light emitting elements and photodetectors. The wavelength of light to be received and the wavelength of light to be emitted in the optical element are not particularly limited, and, for example, group III nitride-based compound semiconductor elements useful for lights ranging from ultraviolet light to green light, and GaAs-based semiconductor elements useful for red lights may be used.

Group III nitride-based compound semiconductor light emitting elements which emit short wavelengths pose a significant problem associated with the sealing member. Group III nitride-based compound semiconductors are represented by general formula $Al_XGa_YIn_{1-X-Y}N$ where $0<X\leq1$, $0\leq Y\leq 1$, and $0\leq X+Y\leq 1$. Among them, Al-containing group III nitride-based compound semiconductors include the so-called binary systems of AlN, and the so-called ternary systems of $Al_xGa_{1-x}N$ and $Al_xIn_{1-x}N$ where $0<x<1$. In the group III nitride-based compound semiconductors and GaN, at least a part of the group III elements may be replaced with boron (B), thallium (Tl) or the like. At least a part of nitrogen (N) may also be replaced with phosphorus (P), arsenic (As), antimony (Sb), bismuth (Bi) or the like.

The group III nitride-based compound semiconductor may contain any dopant. n-type impurities usable herein include silicon (Si), germanium (Ge), selenium (Se), tellurium (Te), and carbon (C). p-type impurities usable herein include magnesium (Mg), zinc (Zn), beryllium (Be), calcium (Ca), strontium (Sr), and barium (Ba). After doping with the p-type impurity, the group III nitride-based compound semiconductor may be exposed to electron beams, plasma, or heat in an oven. This, however, is not indispensable.

The group III nitride-based compound semiconductor layer is formed by an MOCVD (metal-organic vapor phase epitaxy) method. All the semiconductor layers constituting the element are not always required to be formed by the MOCVD method, and the MOCVD method may be used in combination with a molecular beam epitaxy method (MBE method), a halide vapor-phase epitaxy method (HVPE method), sputtering, ion plating or the like.

Regarding the construction of the light emitting element, a homo structure, hetero structure, or double hetero structure with MIS junction, PIN junction or pn junction may be adopted. In the light emitting layer, a quantum well structure (a single quantum well structure or a multiple quantum well structure) may also be adopted. The group III nitride-based compound semiconductor light emitting element may be of a face-up type in which the main light receiving/emitting direction (electrode face) is an optical axis direction in the optical device, and a flip-chip type in which the main light receiving/emitting direction is a direction opposite to the optical axis direction and reflected light is utilized.

The heat resistant temperature of the group III nitride-based compound semiconductor element is about 600° C., and the heat resistant temperature of the GaAs-based semiconductor element is about 600° C., and both the semiconductor elements are stable against the temperature at which the low pelting glass is molded.

(Electric Power Receiving and Supplying Means)

The optical device includes electric power receiving and supplying means. The electric power receiving and supplying means is an electric component that functions to supply electric power to the light emitting element and to take out electric power produced in a photodetector upon exposure to light. The electric power receiving and supplying means includes a lead for connecting the optical device to electric wiring and a bonding wire for wiring the lead and the optical element. The bonding wire is in many cases made of a gold wire or a gold alloy wire. The heat resistant temperature of the bonding wire per se and bonding between the bonding wire and the lead or the optical element is 600° C. or above, and both the bonding wire per se and the bonding are stable against the temperature at which the low melting glass is molded.

(First Sealing Member)

The first sealing member covers the optical element and at least a part of the electric power receiving and supplying means. In this invention, $SiO_2$—$Nb_2O_5$-based, $B_2O_3$—F-based, $P_2O_5$—F-based, $P_2O_5$—ZnO-based, $SiO_2$—$B_2O_3$—$La_2O_3$-based or $SiO_2$—$B_2O_3$-based glass is selected as the first sealing member.

All of these types of low melting glass can be pressed at 350 to 600° C. The first sealing member in this invention can also be formed by spontaneous welding.

A phosphor material can also be dispersed in the first sealing material. An inorganic phosphor material powder may be used as the phosphor material and may be mixed in the low melting glass. Further, the low melting glass may also be doped with a rare earth ion to render the glass fluorescent. Any desired luminescent color including white light can be provided by properly combining a light emitting element with a phosphor material.

In the combination of the first sealing member with the optical element, preferably, the first sealing member has an Abbe number of 40 or less and a refractive index of 1.6 or more, and the optical element has a receiving/emission wavelength of not more than 546.1 nm (wavelength of e-radiation of Na). Specifically, for the external quantum efficiency of light emitted within the high refractive index material, a higher refractive index of the sealing material relative to the wavelength of light to be emitted is more advantageous. The refractive index of the optical material is defined by d-radiation of Na. In general, however, the refractive index increased with decreasing the wavelength, and the level of a change in refractive index with the wavelength of light is expressed by the Abbe number. In particular, in a short-wavelength emission-type light emitting element which poses a problem in conventional resin sealing, the selection of a material which is highly refractive in d-radiation of Na and undergoes a large change in refractive index with wavelength, can prevent a lowering in light output caused by yellowing of the resin and, in addition, can realize sealing with a material having a high refractive index for short wavelength light, and thus, high external quantum efficiency can be provided.

$SiO_2$—$Nb_2O_5$-based glass may be mentioned as low melting glass having such optical characteristics. Among others, $SiO_2$—$Nb_2O_5$—$Na_2O$ glass is preferred.

Preferably, in the light emitting element, the first sealing member is disposed in at least a light receiving/emission direction to cover the light emitting element for reliably preventing discoloration in this direction.

The first sealing member may be in any form without particular limitation and properly designed according to optical characteristics required of the optical device. In the case of a light emitting element, the first sealing member disposed in the light release direction is preferably in a convex-lens form.

(Second Sealing Member)

In this invention, the optical element is sometimes sealed with a plurality of sealing members including the above first sealing member. Here the second sealing member covers the optical element from a part opposite to the main light receiving/emission direction.

As with the first sealing member, the second sealing member may also be made of low melting glass selected from $SiO_2$—$Nb_2O_5$-based, $B_2O_3$—F-based, $P_2O_5$—F-based, $P_2O_5$—ZnO-based, $SiO_2$—$B_2O_3$—$La_2O_5$-based or $SiO_2$—$B_2O_3$-based glass. The second sealing member and the first sealing member may be the same or different.

When the members are different low melting glass materials, preferably, the refractive index of the first sealing member (provided in the main light receiving/emission direction of the optical element) is higher than the refractive index of the second sealing member. According to this construction, when a light emitting element is used as the optical element, the critical angle at the interface of the light emitting element and the sealing member is increased to improve the light efficiency.

As with the first sealing member, the second sealing member made of low melting glass can be formed by press molding or spontaneous welding.

As with the first sealing member, a phosphor material may also be dispersed in the second sealing member made of low melting glass.

The second sealing member may be made of a nontransparent material. In addition to low melting glass, for example, metal plates and ceramic plates may be mentioned as the second sealing member. In this case, preferably, the second sealing member is made of a material which can efficiently reflect light. When the second sealing member is made of a material other than the low melting glass, preferably, the coefficient of linear expansion of the first sealing member is between the coefficient of linear expansion of the second sealing member and the coefficient of linear expansion of the optical element. According to this construction, even when the optical device is heat treated in a solder reflow oven or the like, the internal stress of the optical device based on the difference in coefficient of linear expansion between dissimilar materials can be reduced.

This invention will be explained with reference to the following examples.

Example 1

Figure 30:
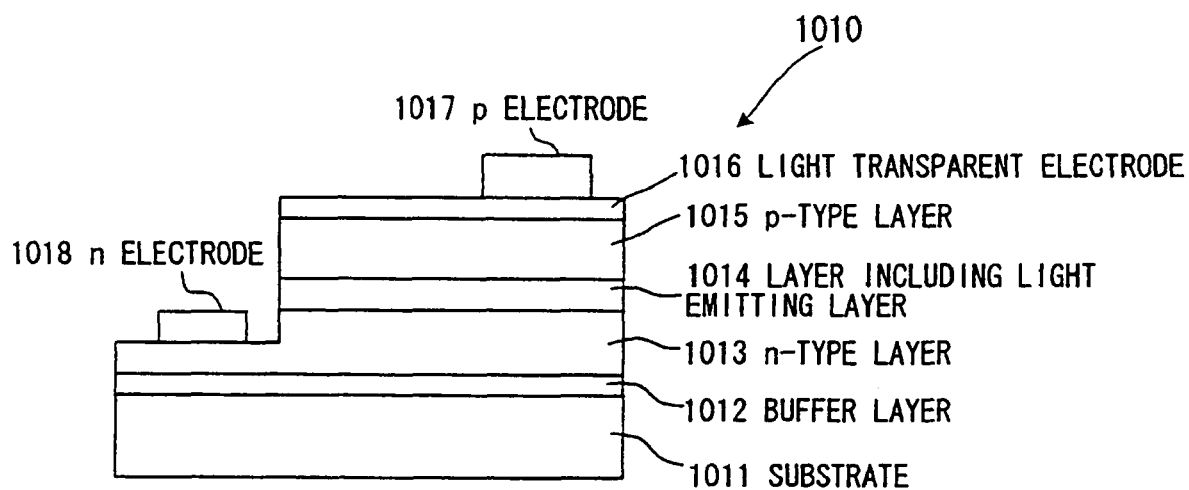
FIG. 30 is a cross-sectional view showing the construction of a face up-type light emitting element used in a working example of the invention.

In this example, a face-up-type group III nitride-based compound semiconductor light emitting element 1010 shown in FIG. 30 was used as an optical element. This light emitting element emits blue light.

The specifications of each layer constituting the light emitting element 1010 are as follows.

Layers: Composition
p-type layer 1015: p-GaN:Mg
Layer 1014 including light emitting layer: Including InGaN layer
n-type layer 1013: n-GaN:Si
Buffer layer 1012: AlN
Substrate 1011: Sapphire The n-type layer 1013 made of GaN doped with Si as an n-type impurity is formed on the substrate 1011 through the buffer layer 1012. In this example, sapphire is used as the substrate 1011. The material for the substrate 1011, however, is not limited to sapphire, and examples of materials usable herein include sapphire, spinel, silicon carbide, zinc oxide, magnesium oxide, manganese oxide, zirconium boride, and group III nitride-based compound semiconductor single crystals. The buffer layer is formed by MOCVD using AlN. The material for the buffer layer, however, is not limited to AlN, and other materials such as GaN, InN, AlGaN, InGaN and AlInGaN may also be used. For example, a molecular beam epitaxy method (MBE method), a halide vapor-phase epitaxy method (HVPE method), sputtering, or ion plating may be used for the formation of the buffer layer. When the substrate is made of a group III nitride-based compound semiconductor, the provision of the buffer layer can be omitted.

The substrate and the buffer layer can be if necessary removed after semiconductor element formation.

In this example, the n-type layer 1013 is made of GaN. Alternatively, the n-type layer 1013 may be made of AlGaN, InGaN or AlInGaN.

Further, the n-type layer 1013 has been doped with Si as an n-type impurity. Other n-type impurities usable herein include Ge, Se, Te, and C.

The layer 1014 including a light emitting layer may comprise a quantum well structure (a multiple quantum well structure or a single quantum well structure), and the structure of the light emitting element may be of single hetero type, double hetero type, and homojunction type.

The layer 1014 including a light emitting layer may also include, on its p-type layer 1015 side, a group III nitride-based compound semiconductor layer with a broad bandgap doped with Mg or the like. This can effectively prevent electrons injected into the layer 1014 including a light emitting layer from diffusing into the p-type layer 1015.

The p-type layer 1015 made of GaN doped with Mg as a p-type impurity is formed on the layer 1014 including a light emitting layer. The p-type layer 1015 may also be made of AlGaN, InGaN or InAlGaN. Zn, Be, Ca, Sr, or Ba may also be used as the p-type impurity. After the introduction of the p-type impurity, the resistance can be lowered by a well-known method such as electron beam irradiation, heating in an oven, or plasma irradiation. In the light emitting element having the above construction, each group III nitride-based compound semiconductor layer may be formed by MOCVD under conventional conditions, or alternatively may be formed by a method such as a molecular beam epitaxy method (MBE method), a halide vapor-phase epitaxy method (HVPE method), sputtering, or ion plating.

An n-electrode 1018 has a two-layer structure of an Al layer and a V layer. After the formation of the p-type layer 1015, the p-type layer 1015, the layer 1014 including a light emitting layer, and a part of the n-type layer 1013 are removed by etching to expose the n-type layer 1013, and the n-electrode 1018 is formed by vapor deposition on the exposed n-type layer 1013.

A light transparent electrode 1016, which is a gold-containing thin film, is stacked on the p-type layer 1015. A p-electrode 1017 is also made of a gold-containing material and is formed by vapor deposition on the light transparent electrode 1016. After the formation of the individual layers and electrodes by the above steps, the step of isolating chips is carried out.

Figure 31:
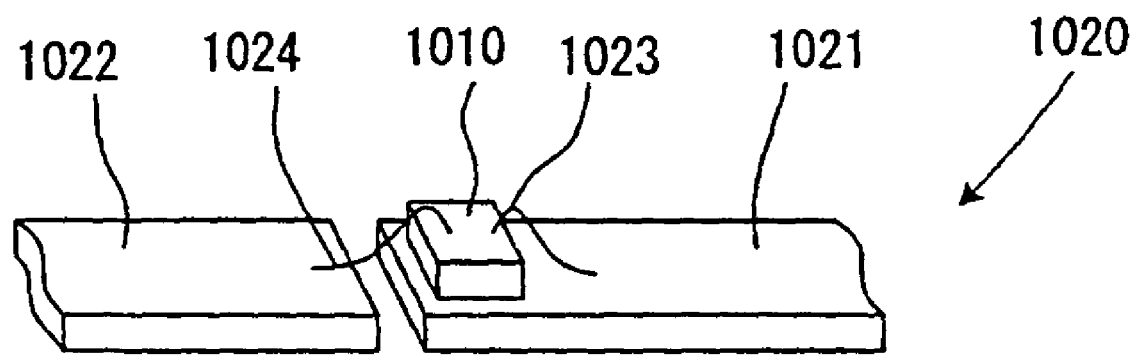
FIG. 31 is a perspective view showing an assembly of a light emitting element and a lead.

As shown in FIG. 31, in the light emitting element 1010, a light emitting element 1010 is fixed onto a mount lead 1021 as electric power receiving and supplying means, and bonding wires 1023, 1024 are suspended from the upper electrodes in the light emitting element 1010 respectively to a mount lead 1021 and a sublead 1022 as other electric power receiving and supplying means. The surface of the mount lead 1021 is plated with silver from the viewpoint of efficiently reflecting light from the light emitting element 1010. In order to ensure light reflection efficiency, the light emitting element 1010 can also be fixed onto the mount lead 1021 with the aid of an inorganic white adhesive. Further, a high level of heat dissipation can be imparted by using a copper alloy close to pure copper. A gold wire is used as the bonding wire.

Figure 32:
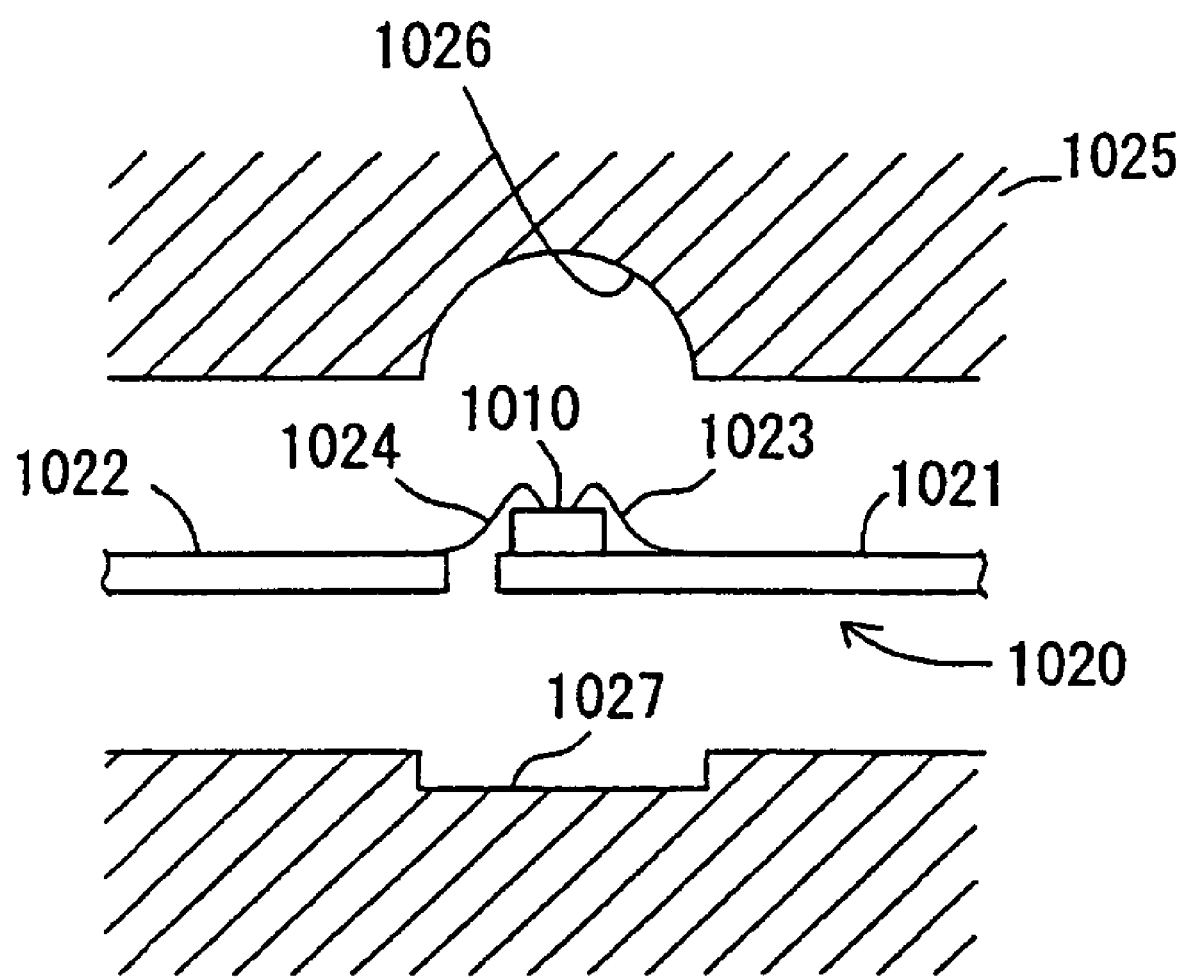
FIG. 32 is a cross-sectional view showing a method for manufacturing an optical device.

An assembly 1020 shown in FIG. 30 is set as a core in a pressing mold 1025 as shown in FIG. 32. Low melting glass is previously set in each of concave parts 1026, 1027 in the pressing mold 1025, and the mold 1025 is then closed to mold a sealing member 1028 (first sealing member) shown in FIG. 33. In this example, $P_2O_5$—F-based glass (Sumita Optical Glass, Inc.: trade name K-PG325) was selected as the low melting glass, and the molding temperature was brought to 430° C.

Figure 33:
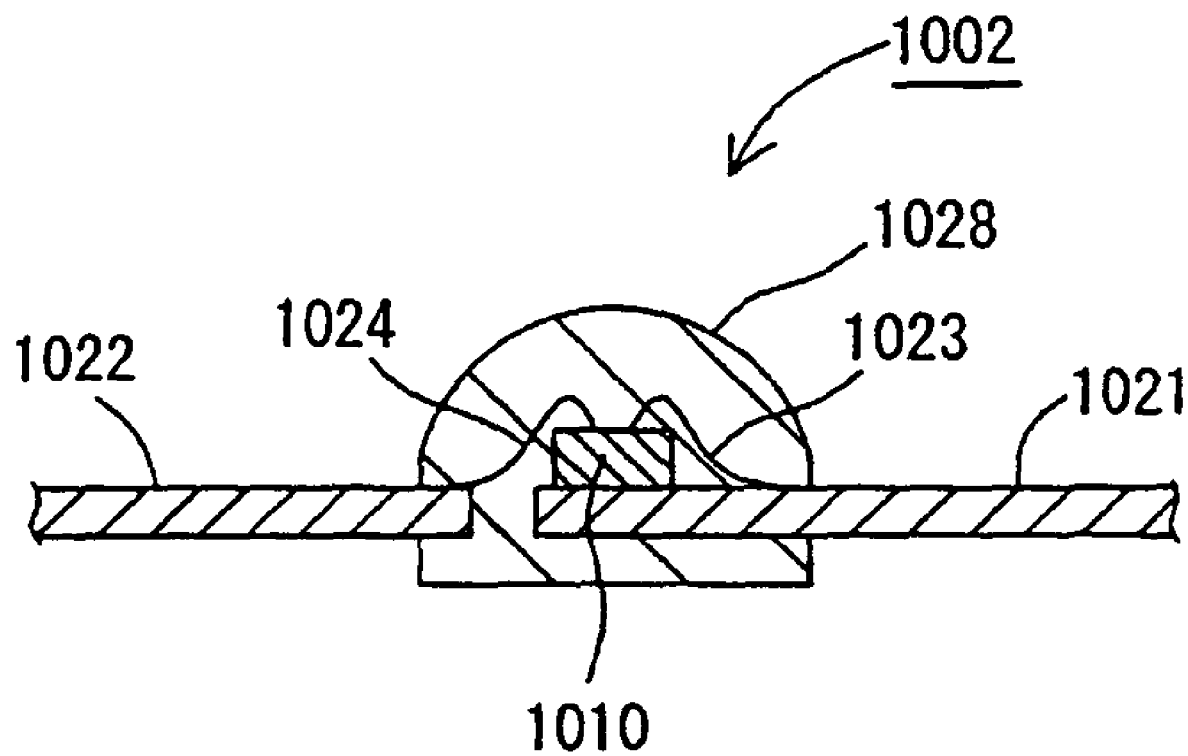
FIG. 33 is a cross-sectional view of an optical device in a working example.

As a result, as shown in FIG. 33, the whole light emitting element 1010 and a part of the lead parts 1021, 1022 are covered by a hemispherical sealing member 1028. The shape of the sealing member 1028 can be properly designed according to optical properties required of the optical device 1002, and, for example, the sealing member 1028 may have a shell shape.

Example 2

Figure 34:
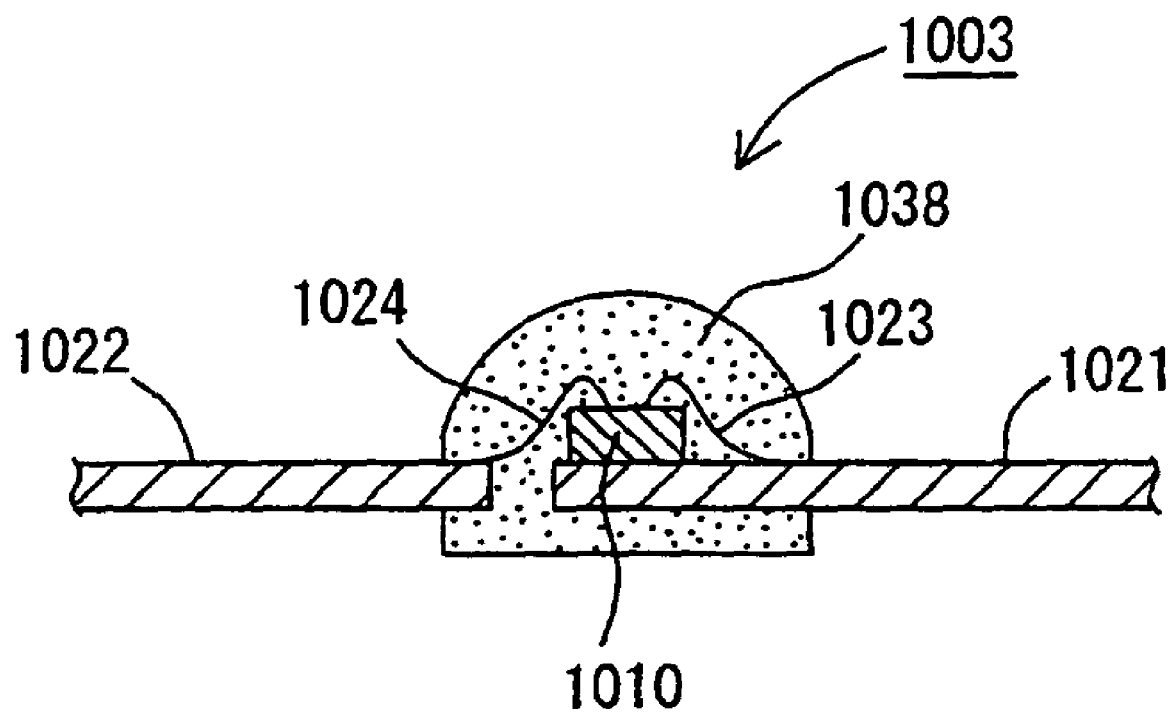
FIG. 34 is a cross-sectional view of an optical device in another working example.

An optical device 1003 shown in FIG. 34 has the same construction as the optical device 1001 shown in FIG. 33, except that the low melting glass contains a fluorescent material. In FIGS. 33 and 34, like parts are identified with the same reference numerals, and the explanation thereof will be omitted. In this example, the sealing member 1038 is made of low melting glass doped with a rare earth element as the fluorescent material.

The incorporation of an optional fluorescent material in the low melting glass can realize control of the color of light emitted from the optical device 1003.

Example 3

Figure 35:
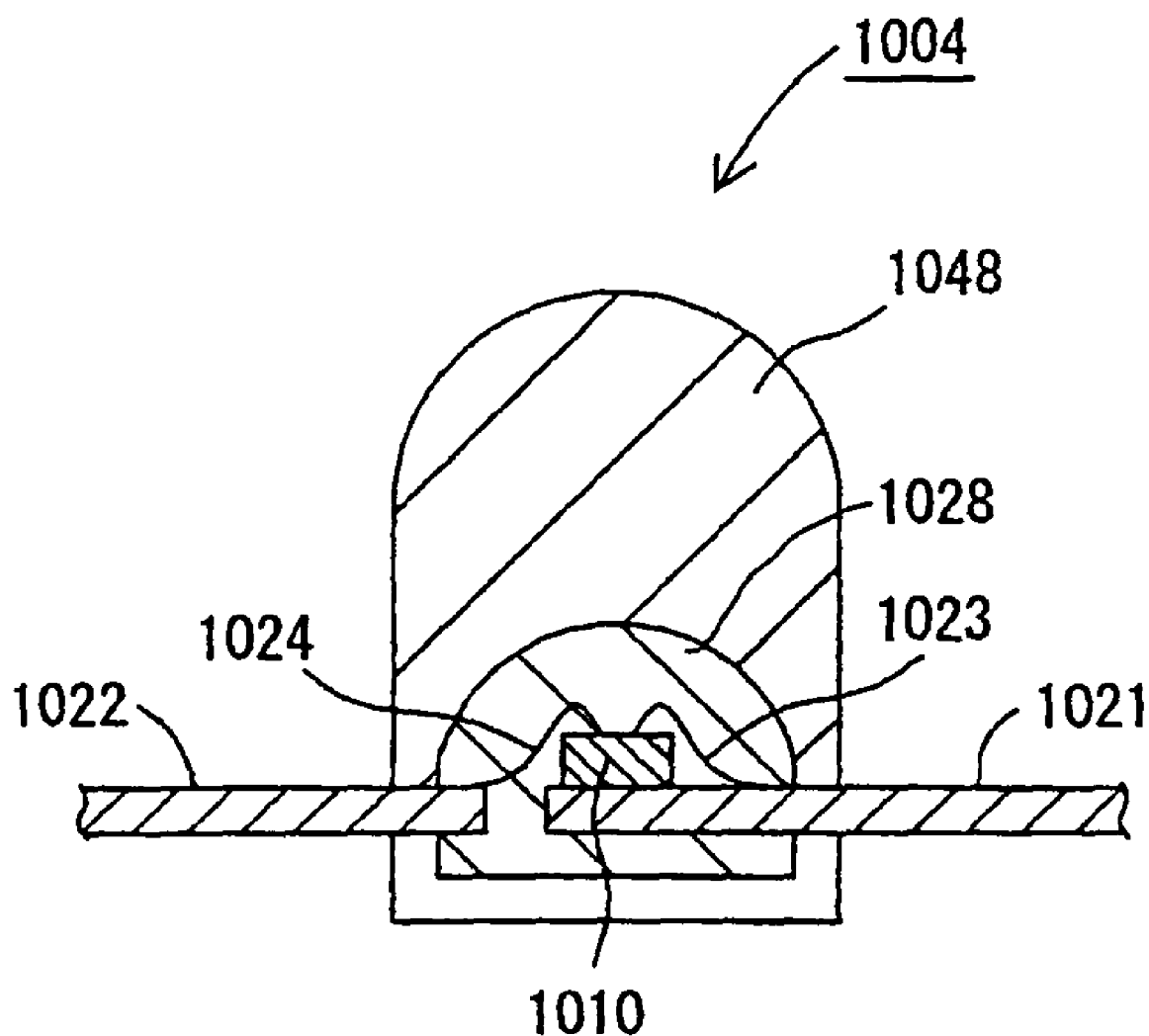
FIG. 35 is a cross-sectional view of an optical device in still another working example.

An optical device 1004 shown in FIG. 35 has the same construction as the optical device 1002 shown in FIG. 4, except that the sealing member 1028 is covered by a shell-shaped cover 1048. This cover 1048 is made of an epoxy resin or other light transparent resin and is formed by molding. The provision of the cover 1048 can provide a large optical device. Thus, a wide variety of optical systems can be provided by preparing a glass sealing body having a standard shape and then using a resin for which equipment of mold and molding work are easier. In this case, the density of light emitted from the light emitting element is high, and a glass material is provided around the light emitting element which causes a temperature rise. Therefore, deterioration in the optical output can be suppressed to such a level that is negligible. The sealing member 1038 shown in FIG. 34 can also be covered by this cover 1048. Further, each of sealing members 1058, 1068, 1069, 1079 shown in FIGS. 36, 38, and 39 which will be described later can also be covered by this cover 1048. This cover 1048 can contain a fluorescent material.

Example 4

Figure 36:
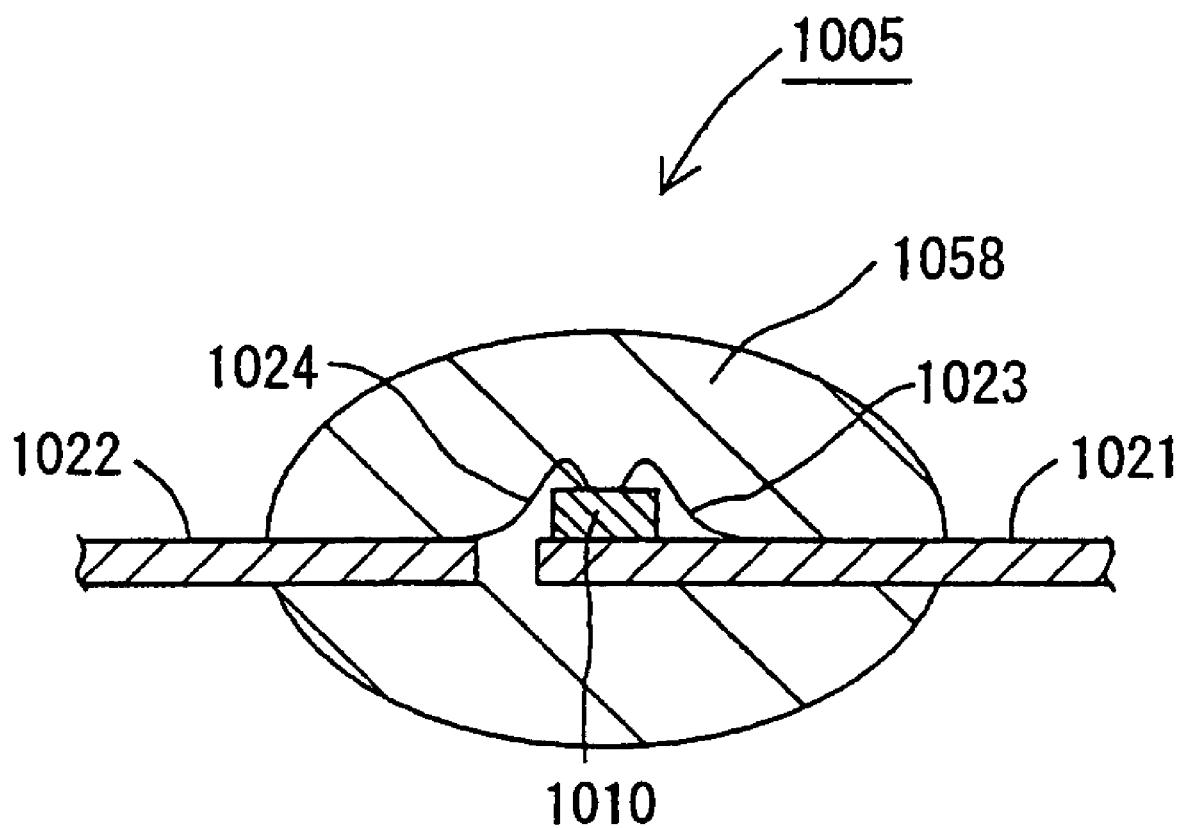
FIG. 36 is a cross-sectional view of an optical device in a further working example.

An optical device 1005 shown in FIG. 36 includes a sealing member 1058 formed by spontaneous adhesion. In FIGS. 33 and 36, like parts are identified with the same reference characters, and the explanation thereof will be omitted.

Figure 37:
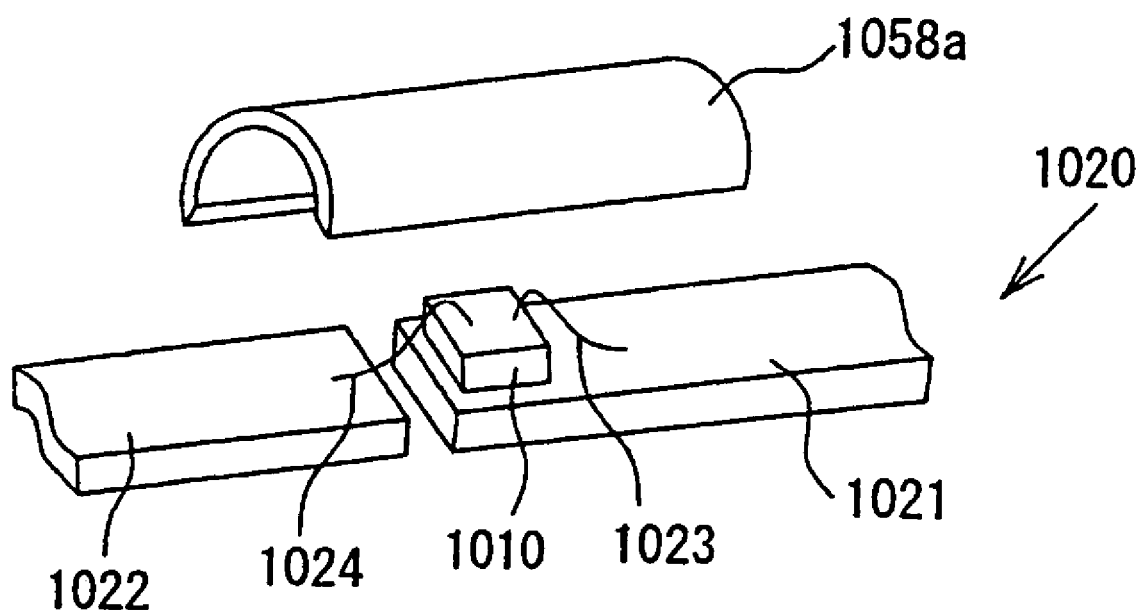
FIG. 37 is a perspective view illustrating a method for manufacturing an optical device.

The sealing member 1058 is formed as follows. As shown in FIG. 37, a cylindrical body 1058a made of low melting glass is provided and put on an assembly 1020 of a light emitting element 1010 and lead parts 1021, 1022. This is placed in an oven to soften the cylindrical body 1058a. As a result, the cylindrical body 1058a covers, in a lens form by the surface tension of the material, the assembly 1020.

According to this example, the need to use the pressing mold can be eliminated, and, thus, optical devices can be provided at low cost.

Example 5

Figure 38:
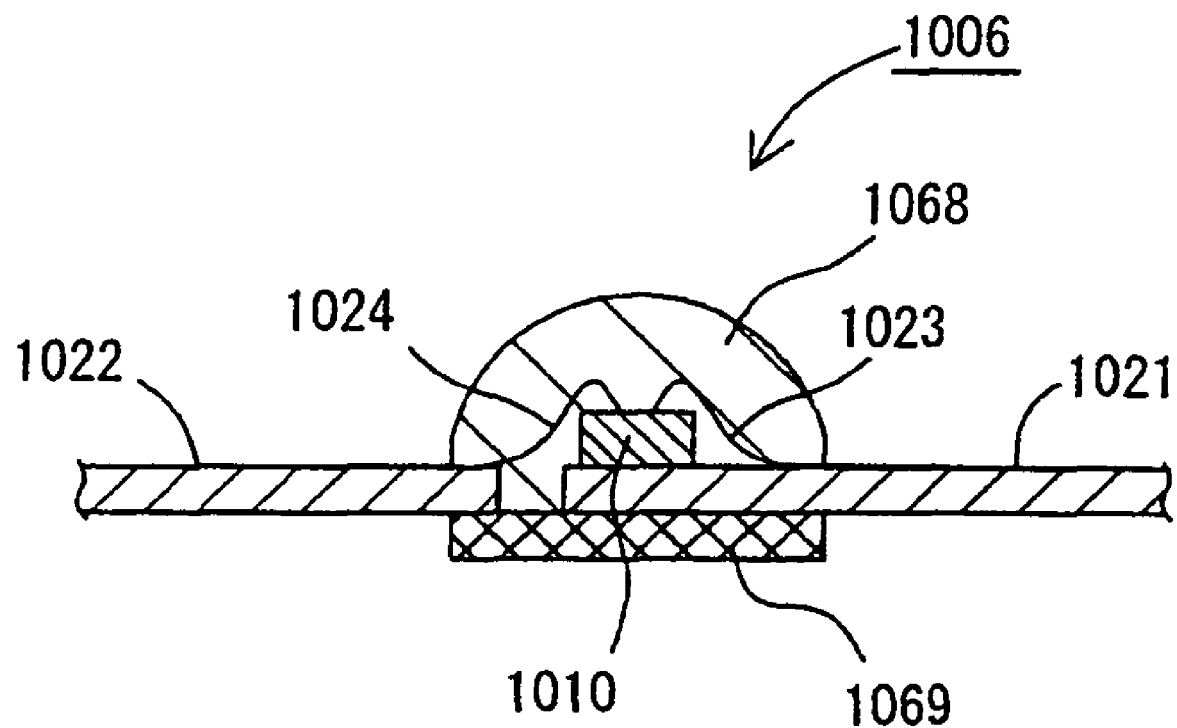
FIG. 38 is a cross-sectional view of an optical device in another working example.

An optical device 1006 shown in FIG. 38 has the same construction as the optical device shown in FIG. 33, except that the light emitting element 1010 and the lead parts 1021, 1022 are covered by dissimilar types of low melting glass. In FIGS. 33 and 38, like parts are identified with the same reference characters, and the explanation thereof will be omitted.

In the optical device shown in FIG. 38, as with the optical device described above, a blue light emitting element is used as the light emitting element. However, the upper side (a main light emission direction) of the light emitting element 1010 is sealed with a first sealing member 6108 made of $SiO_2$—$Nb_2O_5$-based glass (refractive index 1.8, Abbe number 25), and the lower side (a direction opposite to the main light emission direction) of the light emitting element 1010 is sealed with a second sealing member 1069 made of $P_2O_5$—F-based glass. From the viewpoint of improving light takeout efficiency, a material having a high refractive index is selected as the material for the first sealing member 1068. Further, the restriction on the manufacture caused by this is relaxed by the second sealing member, and this construction can be actually prepared. As a result, the refractive index of the first sealing member 1068 is higher than that of the second sealing member 1069. A material having a small Abbe number is selected as the material for the first sealing member 1068 so that the actual refractive index of the first sealing member 1068 is larger than the blue light emitting element.

The optical device 1006 shown in FIG. 38 can be formed by using the mold 1025 shown in FIG. 32. In this case, the material filled into the concave part 1026 is different from the material filled into the concave part 1027.

When a red light emitting element is used, a material having a high refractive index and a large Abbe number is selected as the material for the first sealing member 1068, whereby a high refractive index can be actually selected. An example of this material is $SiO_2$—$B_2O_3$—$La_2O_3$-based glass having a refractive index of 1.8 and an Abbe number of 45.

Example 6

Figure 39:
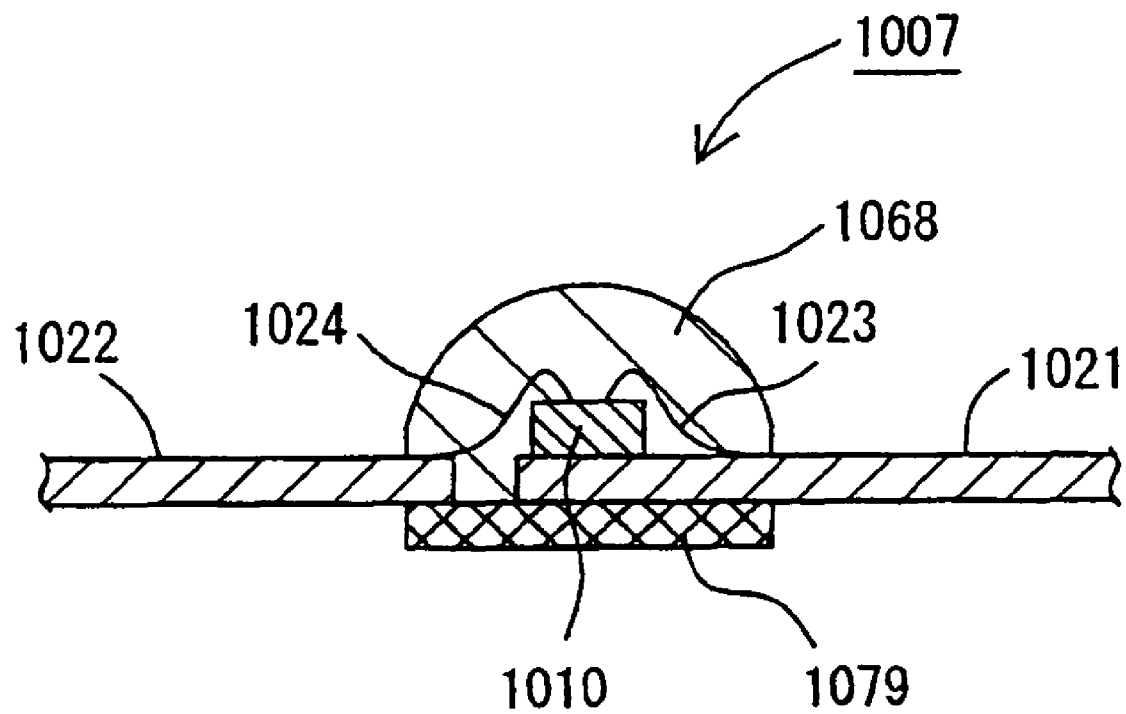
FIG. 39 is a cross-sectional view of an optical device in still another working example.

An optical device 1007 shown in FIG. 39 has the same construction as the optical device shown in FIG. 38, except that a metallic thin sheet (Al thin sheet) was used as the second sealing member 1079. In FIGS. 38 and 39, like parts are identified with the same reference characters, and the explanation thereof will be omitted. Light can be efficiently reflected from the light emitting element 1010 by using a metallic material as the second sealing member. The second sealing member 1079 entirely functions as a reflector plate. In addition to the metallic thin sheet, for example, a resin sheet or the like may be used.

Figure 40:
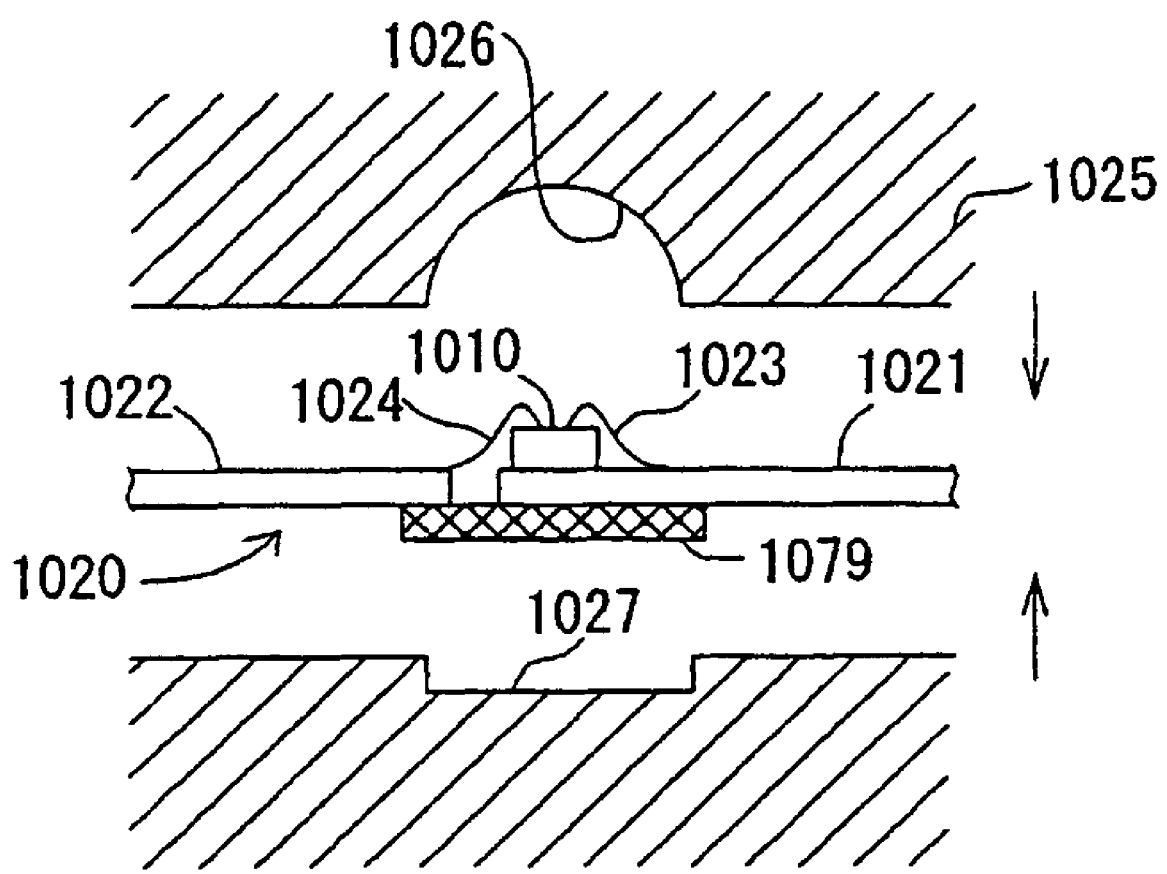
FIG. 40 is a cross-sectional view illustrating a method for manufacturing an optical device.

This optical device 1007 is manufactured as follows. As shown in FIG. 40, the metallic thin sheet 1079 is applied to the backside of an assembly 1020 of the light emitting element 1010 and the lead parts 1021, 1022. This assembly 1020 is set as a core in the mold 1025. In this case, the low melting glass is filled into only the upper concave part 1026 in the pressing mold 1025. Thereafter, the mold is clamped to provide the optical device 1007 shown in FIG. 39.

As in this example, when the material for the first sealing member 1068 and the material for the second sealing member 1079 are different from each other, preferably, the value of the coefficient of linear expansion of the first sealing member is intermediate between the coefficient of linear expansion of the second sealing member and the coefficient of linear expansion of the light emitting element.

Example 7

Figure 41:
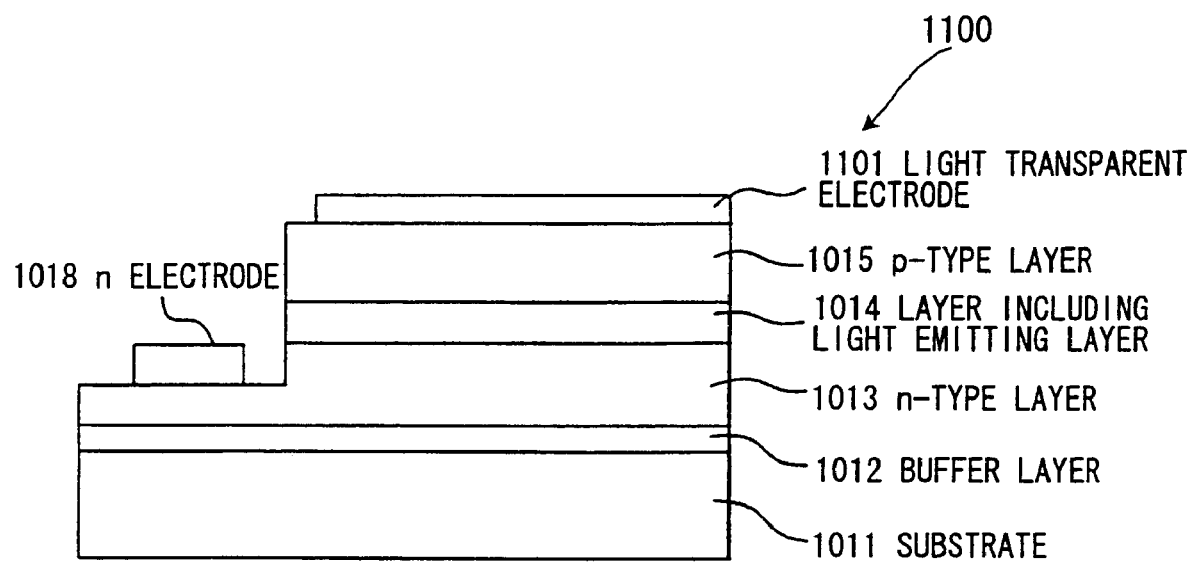
FIG. 41 is a cross-sectional view showing the construction of a flip chip-type light emitting element.
Figure 42:
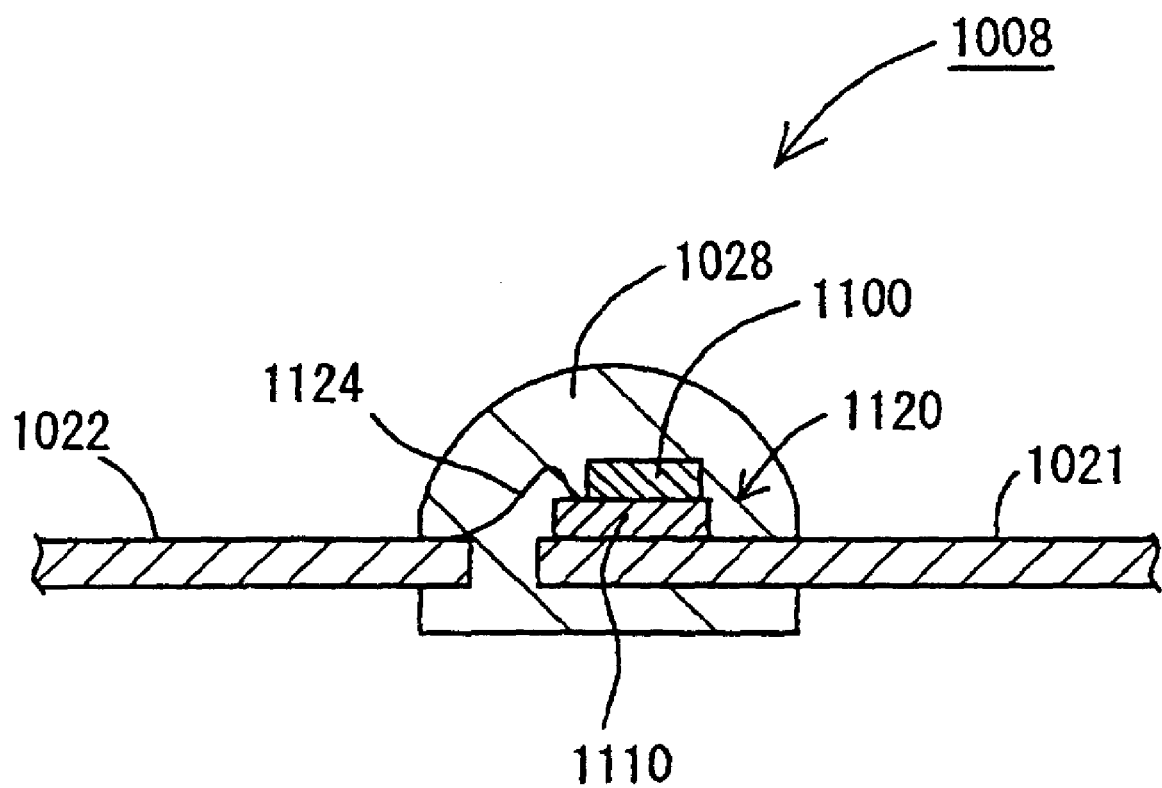
FIG. 42 is a cross-sectional view showing an example of an optical device using a light emitting element.
Figure 43:
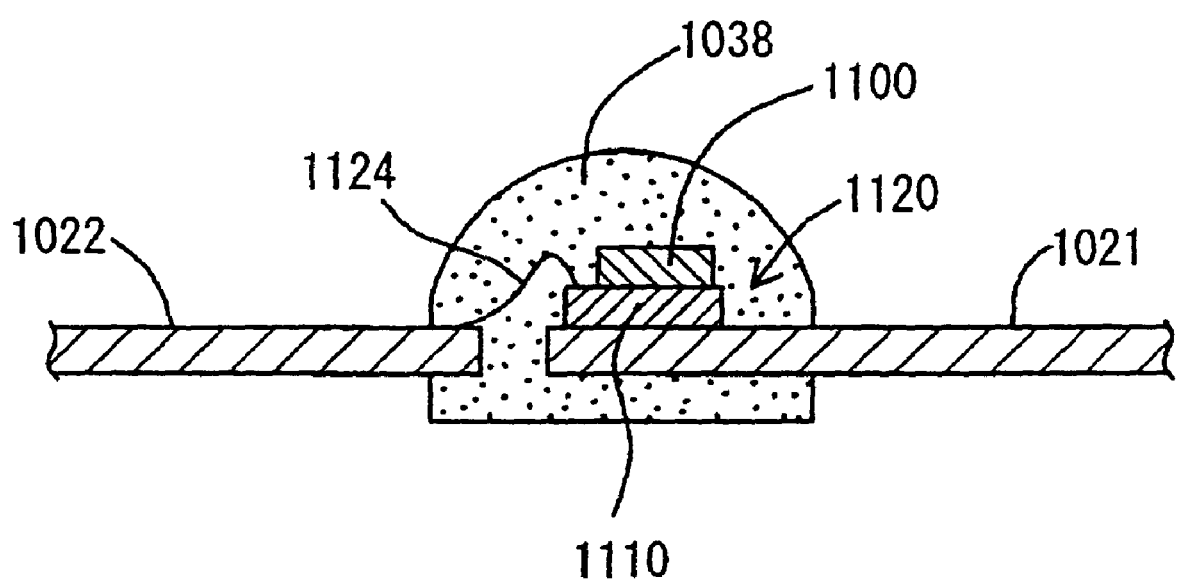
FIG. 43 is a cross-sectional view of an optical device in another working example.
Figure 44:
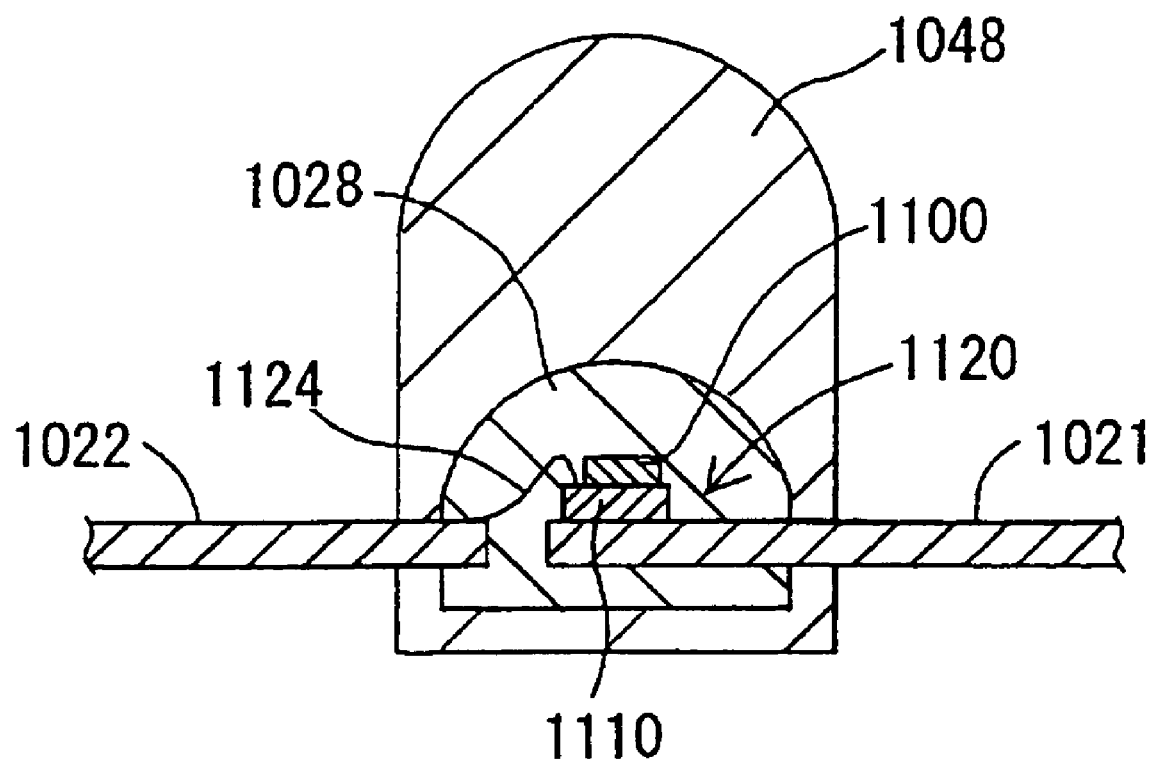
FIG. 44 is a cross-sectional view of an optical device in still another working example.
Figure 45:
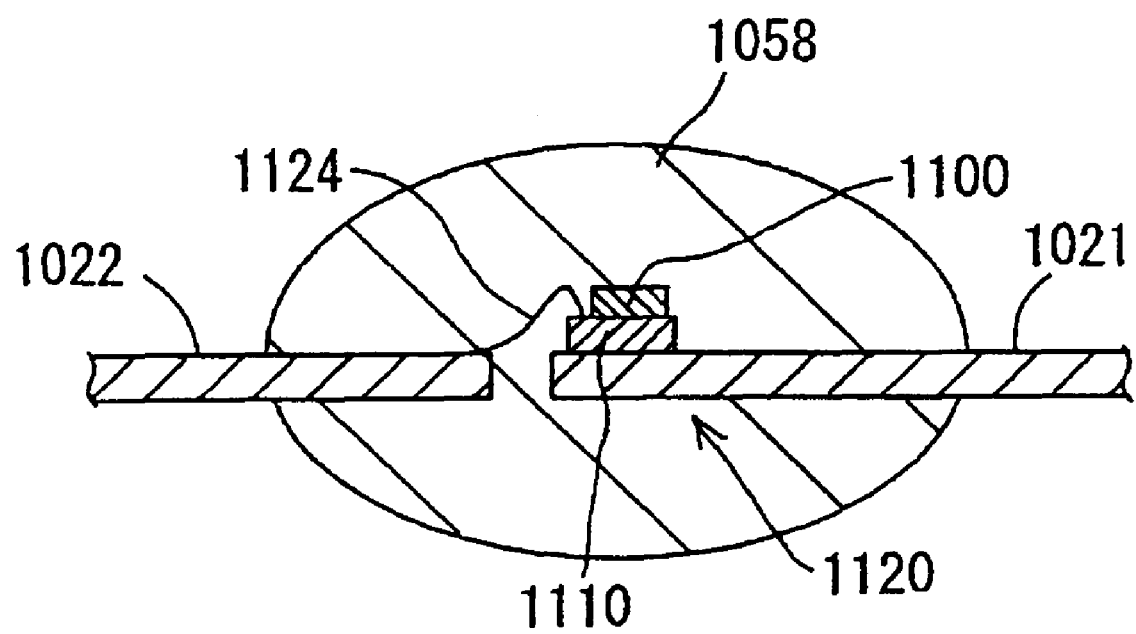
FIG. 45 is a cross-sectional view of an optical device in a further working example.
Figure 46:
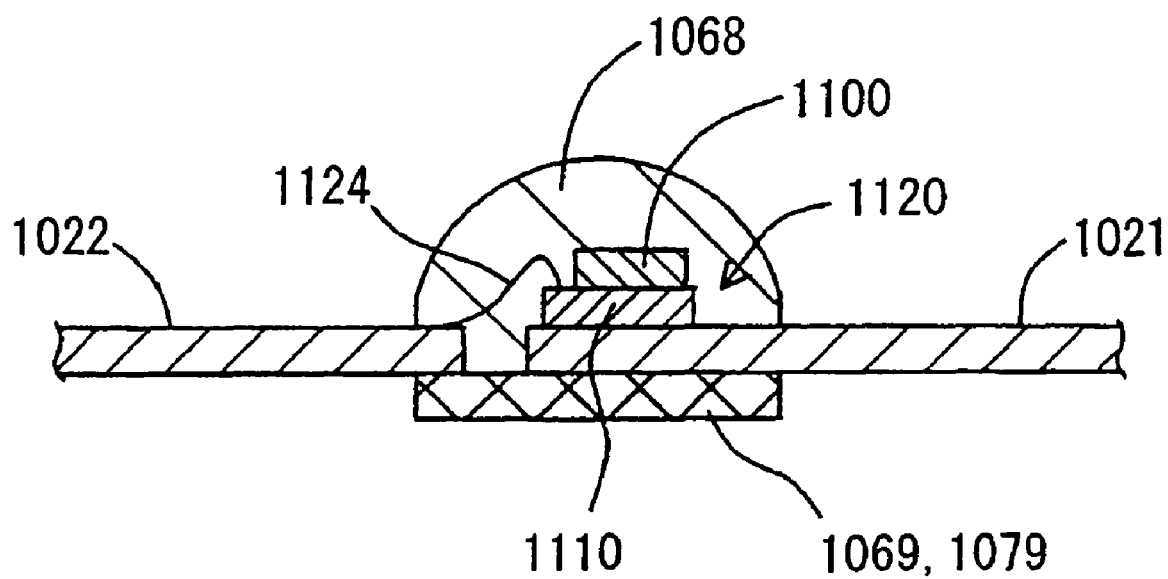
FIG. 46 is a cross-sectional view of an optical device in another working example.

In this example, a flip chip-type light emitting element 1100 is used. As shown in FIG. 41, the flip chip-type light emitting element has the same construction as the light emitting element shown in FIG. 30, except that, in stead of the light transparent electrode 1016 and the p-electrode 1017, a p-electrode 1101 as a thick film is stacked on the whole area of the p-type layer 1015. In FIGS. 30 and 41, like parts are identified with the same reference characters, and the explanation thereof will be omitted.

The flip chip-type light emitting element 1100 is mounted on a mount lead 1021 through a submount 1110. The submount 1110 and the sublead 1022 are wire connected through a bonding wire 1124 to form an assembly 1120. A circuit pattern is formed in this submount 1110; and electrodes 1018, 1101 in the light emitting element 1100 are electrically connected to lead parts 1021, 1022 directly or through a bonding wire 1124. In the same manner as in Example 1, a sealing member 1028 is formed using this assembly 1120 as a core to provide an optical device 1008 shown in FIG. 42. In a luminescent device provided with the flip chip-type light emitting element, the necessary number of bonding wires which are delicate in the sealing step is only one. Therefore, the process control becomes easy, and, further, the production yield is improved. Further, since the bonding wire is not in proximity to the light emitting element in its light emitting face, the bonding wire does not affect external radiation efficiency.

The same elements as in Example 1 are identified with the same reference characters for simplification of explanation.

The sealing members explained in Examples 2 to 6 can be applied to the assembly 1120 of the flip chip-type light emitting element 1100 shown in FIG. 41. Embodiments thereof are shown in FIGS. 42 to 45. For simplification of the explanation, the same elements as described above are identified with the same reference characters, and the explanation thereof will be omitted.

Example 8

Figure 47:
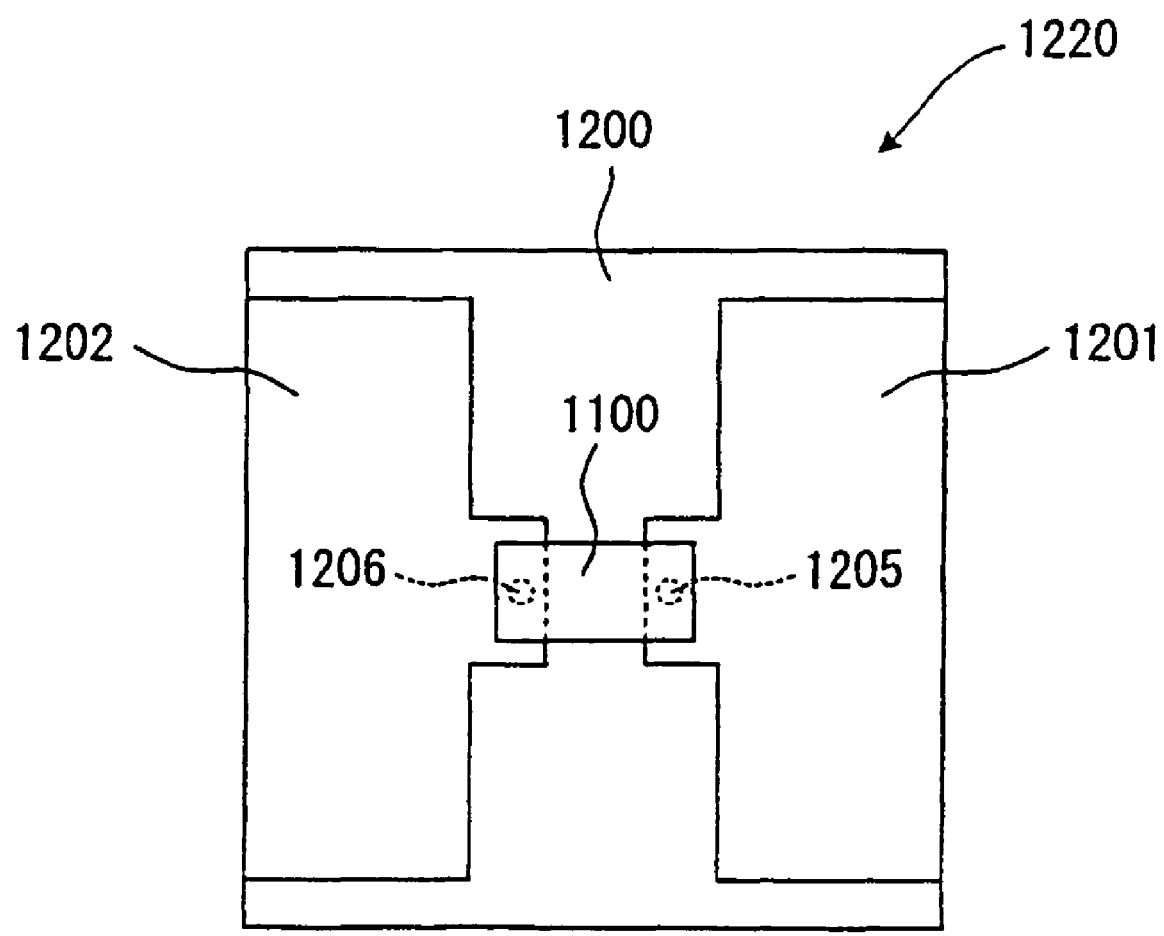
FIG. 47 is a plan view showing another embodiment of an assembly of a flip chip-type light emitting element and electric power receiving and supplying means.
Figure 48:
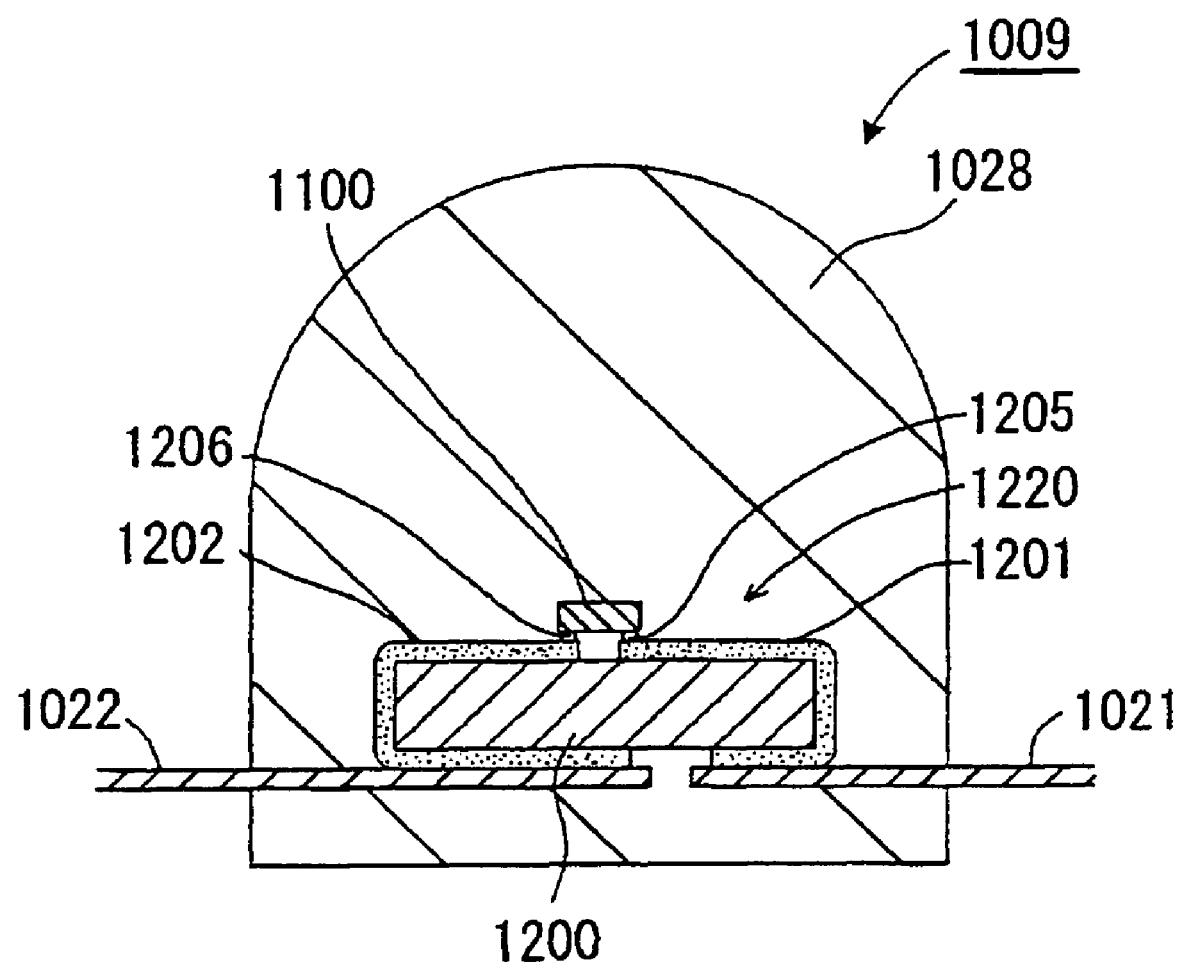
FIG. 48 is a cross-sectional view of an example of an optical device comprising an assembly.

In this example, as shown in FIG. 47, circuit patterns 1201, 1202 as electric power receiving and supplying means are formed on the surface of an inorganic material substrate 1200 made of AlN or the like. A flip chip-type light emitting element 1100 is mounted on the circuit patterns 1201, 1202 through bumps 1205, 1206. The substrate 1200 is mounted on lead parts 1021, 1022 through a eutectic material. In the same manner as in Example 1, a sealing member 1028 is formed using this assembly 1220 as a core to provide an optical device 1009 shown in FIG. 48.

The same elements as in Example 1 are identified with the same reference characters for simplification of the explanation thereof.

Figure 49:
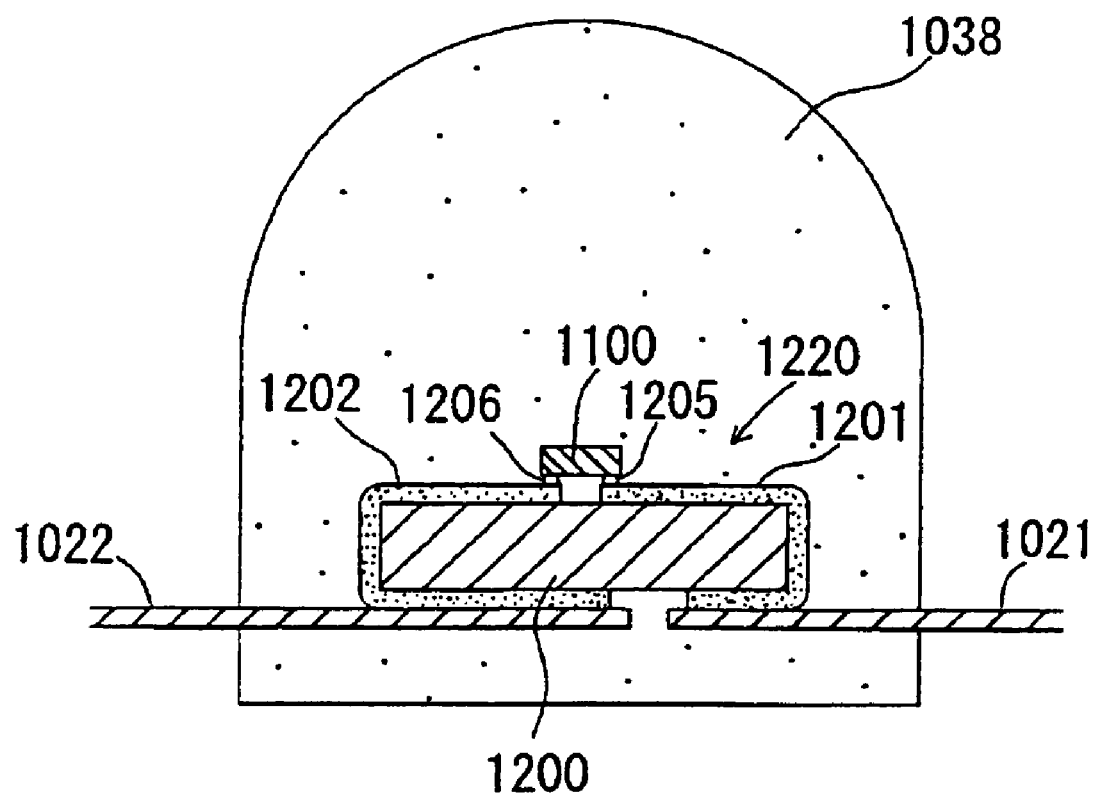
FIG. 49 is a cross-sectional view of an optical device in another working example.
Figure 50:
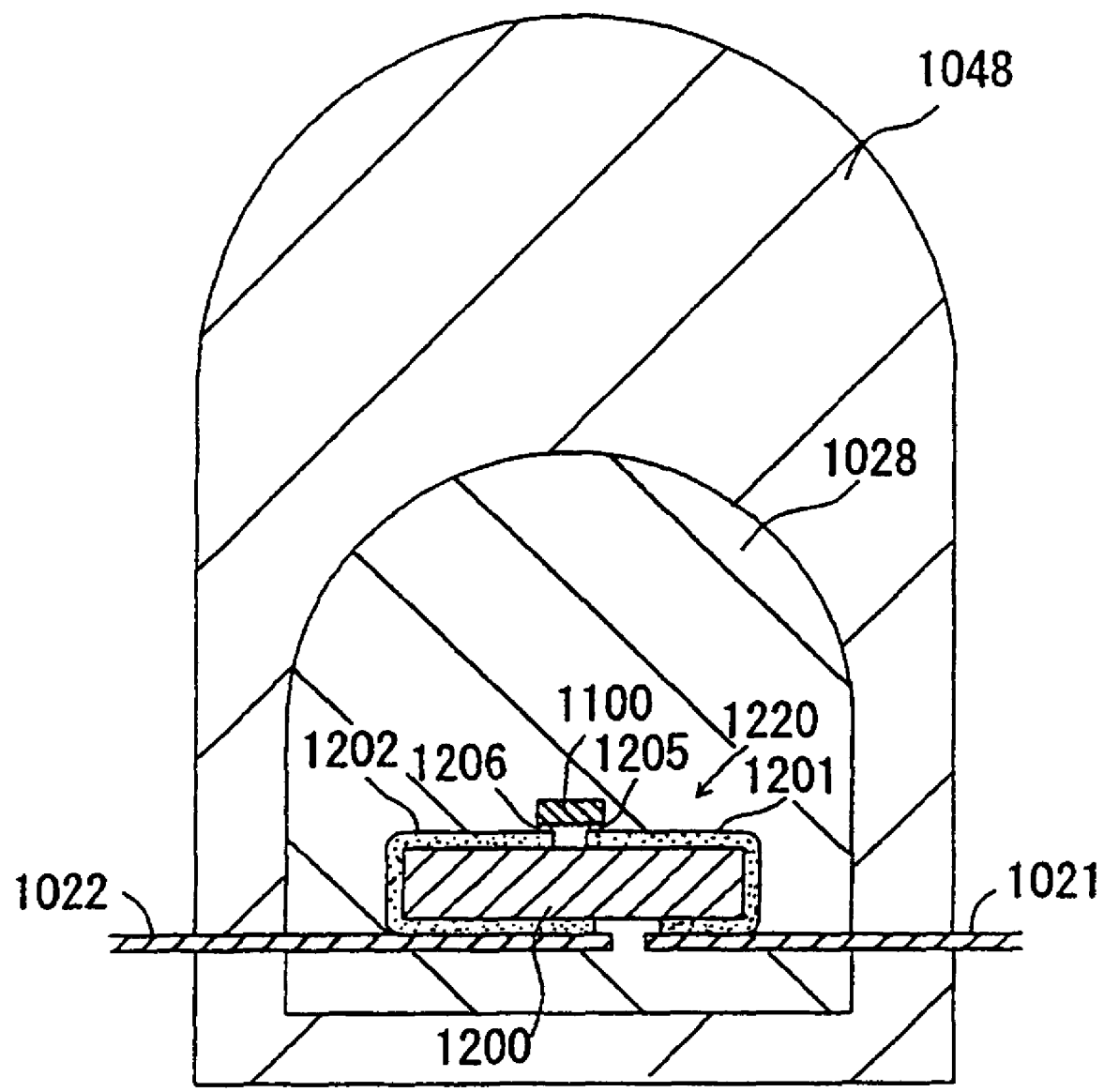
FIG. 50 is a cross-sectional view of an optical device in still another working example.
Figure 51:
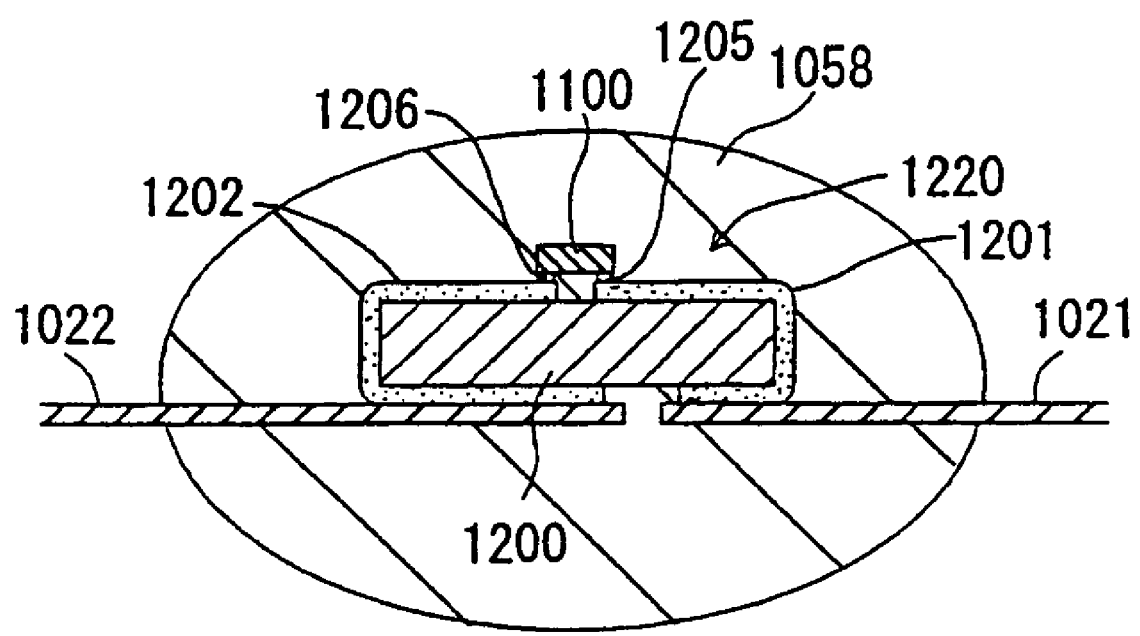
FIG. 51 is a cross-sectional view of an optical device in a further working example.

The sealing members explained in Examples 2 to 6 can be applied to the assembly 1220 shown in FIG. 47. Embodiments thereof are shown in FIGS. 49 to 51. In FIGS. 49 to 51, for simplification of the explanation, the same elements as described above are identified with the same reference characters, and the explanation thereof is omitted.

Figure 52:
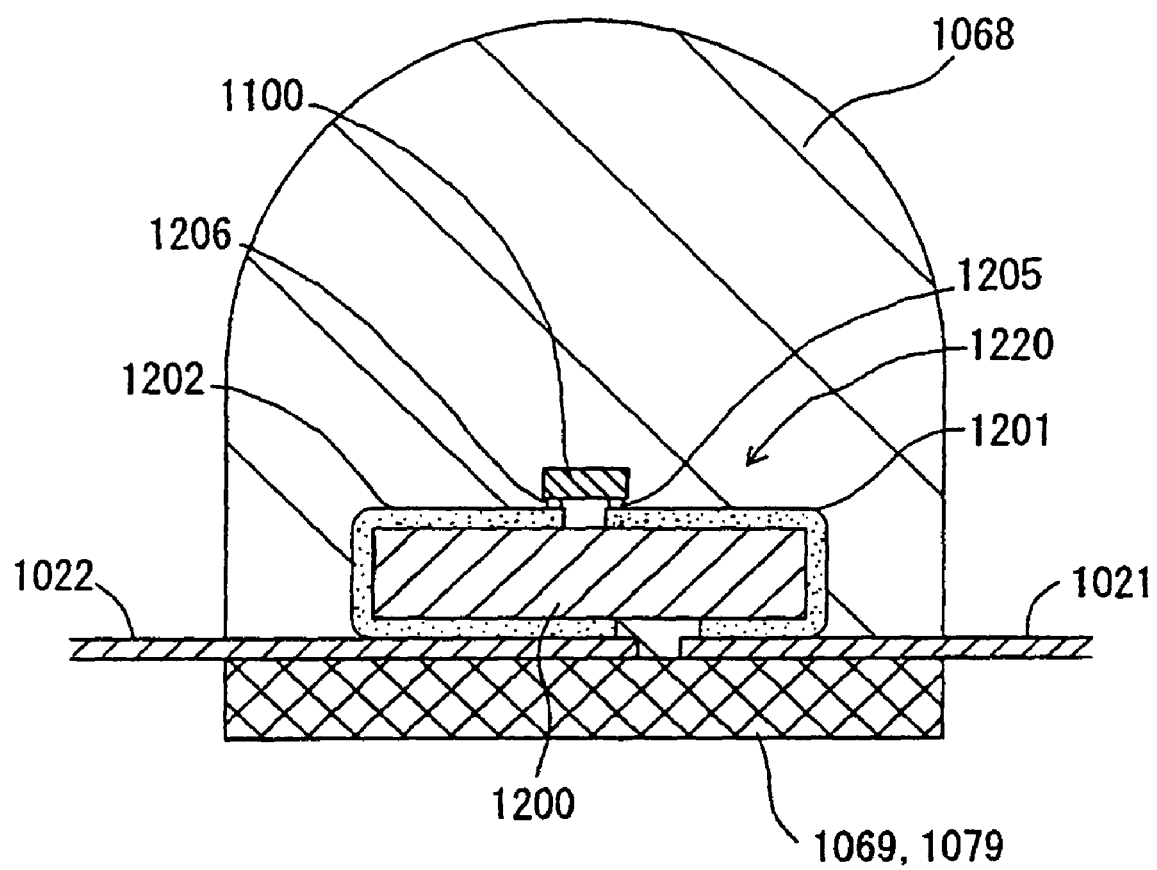
FIG. 52 is a cross-sectional view of an optical device in another working example.
Figure 53:
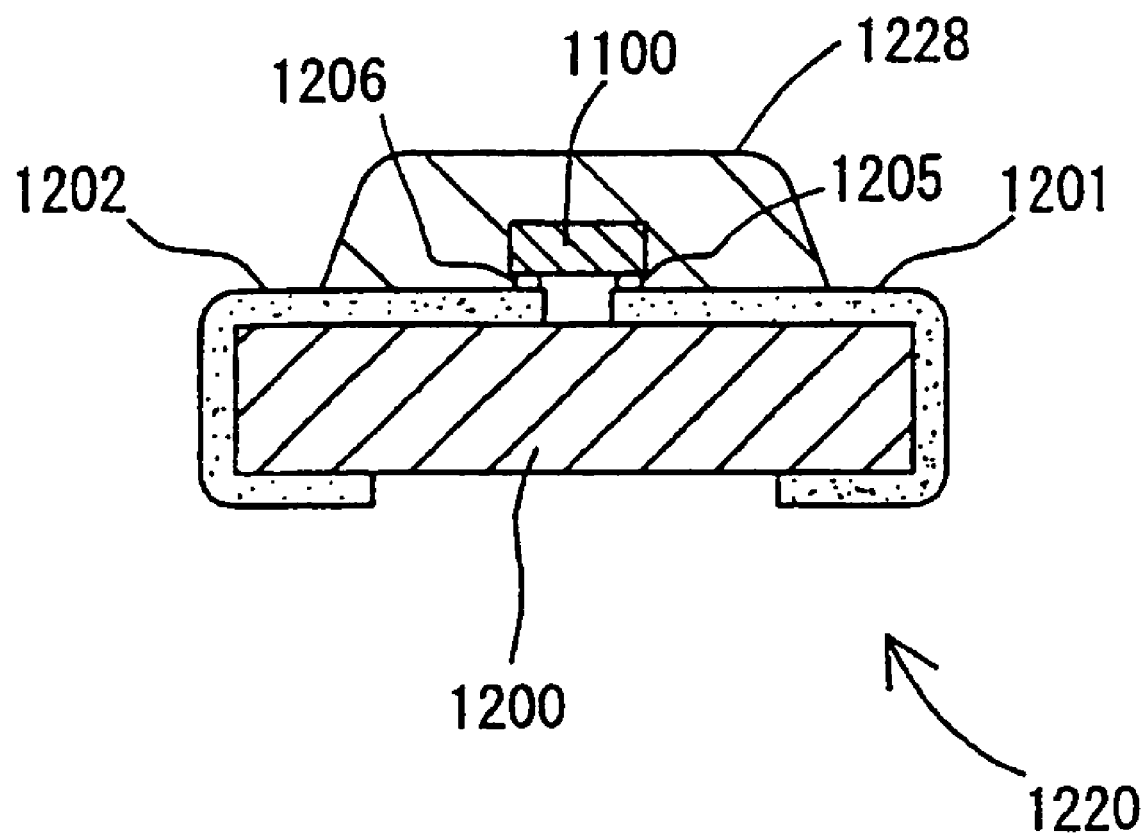
FIG. 53 is a cross-sectional view of an optical device in still another working example.

In the above embodiments, the whole assembly 1220 is covered by a sealing member. Alternatively, as shown in FIG. 52, the light emitting element 1100 and a part of the circuit patterns 1201, 1202 may be covered by a sealing member 1228. The optical device shown in FIG. 53 can be used as chip LED.

In the optical device in this example, the thermally or mechanically weak bonding wire is absent, and any organic material is not included in the device. Therefore, the low melting glass can be press molded at a higher temperature. Further, stability against heat treatment in a reflow oven or the like can be improved. Accordingly, the device can be manufactured more easily, and the range of choice of the applicable low melting glass can also be broadened. Thus, the optical device can be provided at lower cost.

Without limitation to the eutectic material, the optical element can be mounted through a gold bump. Also in this case, a stable wireless device consisting of inorganic materials only can be formed.

Example 9

Figure 54:
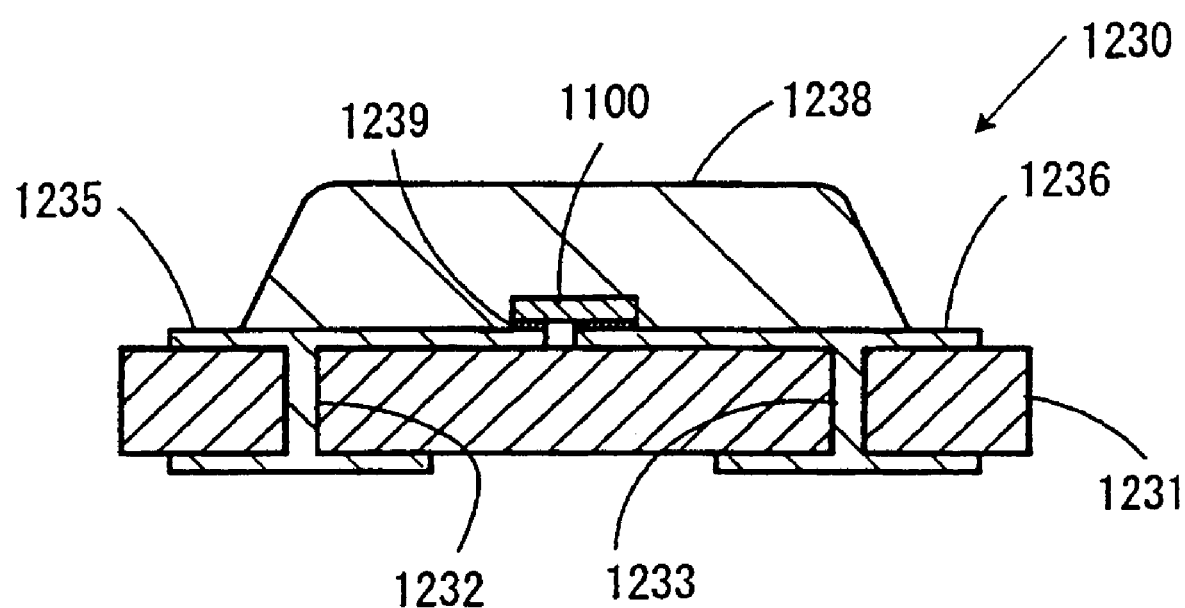
FIG. 54 is a cross-sectional view of an optical device in a further working example.
Figure 55:
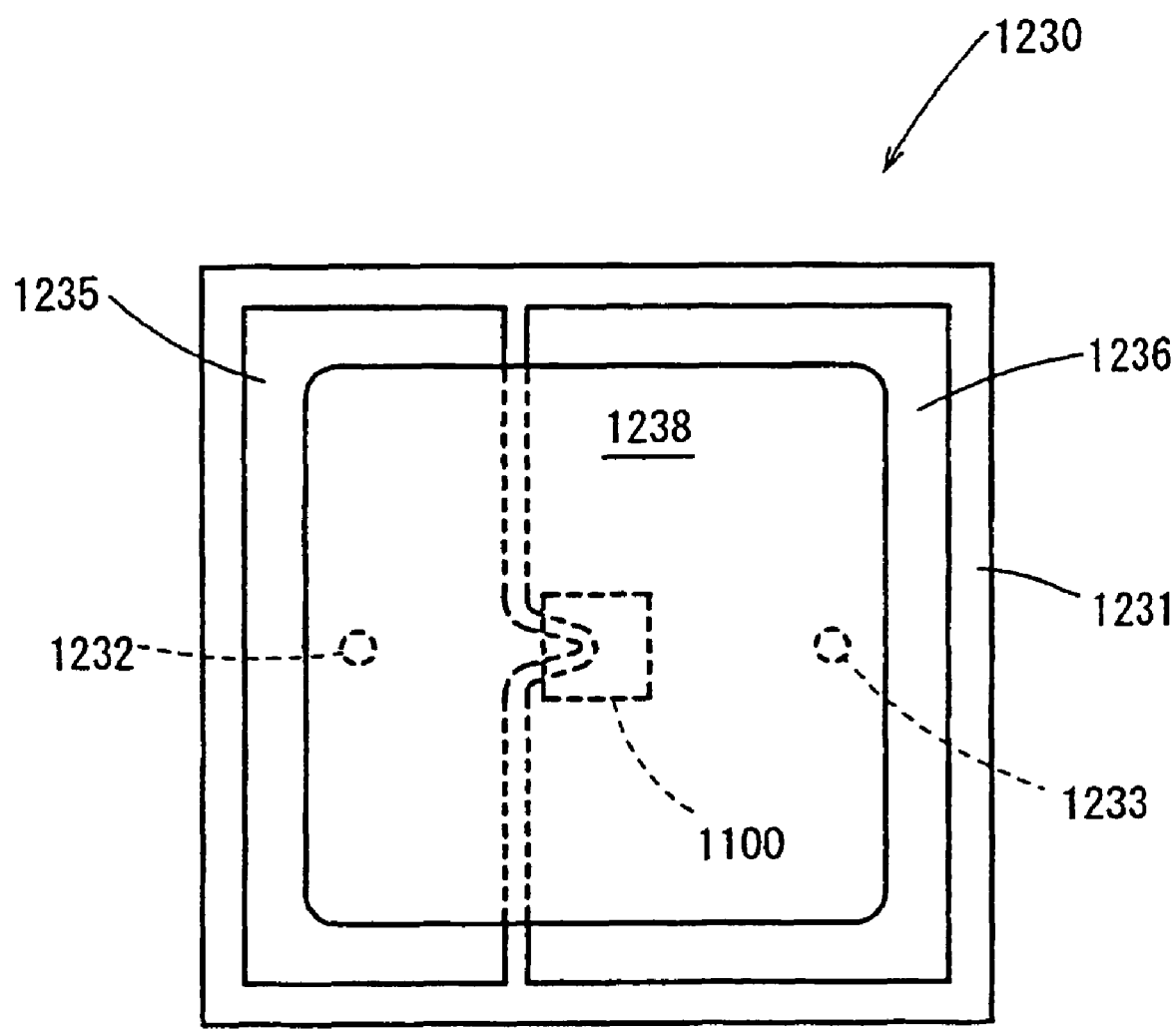
FIG. 55 is a plan view of an optical device in another working example.

An optical device in this example is shown in FIG. 54 (cross-sectional view) and FIG. 55 (plan view).

This optical device 1230 includes a flip chip-type light emitting element 1100, an AlN substrate 1231, a metal pattern 1236, and a sealing member 1238.

In this example, the substrate 1231 is made of AlN. However, any material can be used so far as at least the mounting face of the light emitting element 1100 is made of an insulating material such as AlN. For example, the substrate may be such that the base part of the substrate is made of an aluminum plate and AlN is stacked onto the surface of the aluminum plate. In addition to AlN, for example, $Al_2O_3$ may be used as the insulating material.

Through-holes 1231, 1232 are provided in the substrate 1231.

Substantially the whole area of the mounting face of the substrate 1231 is covered by metal patterns 1235, 1236. In this example, the metal patterns 1235, 1236 are formed by a metallization method. Therefore, the bonding force between the metal patterns 1235, 1236 and the substrate 1231 is high, and increasing the area of contact between the substrate 1231 and the metal patterns 1235, 1236 can further improve the bonding strength between the substrate and the metal patterns. In this example, the metal patterns 1235, 1236 comprise tungsten plated with nickel, and, in the light emitting element mount part and the metal pattern exposed part (part not sealed with low melting glass), gold plating is further provided. The metal material has a high level of strength of bonding to the insulating material on the substrate mount face and the sealing member of low melting glass. Further, since the glass and the metal material are substantially identical to each other in coefficient of linear thermal expansion (approximately 10 to $20 \times 10^{-6}$ (1/° C.)), the thermal shrinkage-derived stress is less likely to occur. The form of the metal pattern and the forming material may be properly selected depending upon the material of the substrate mount face and the material of the sealing member.

The metal patterns 1235, 1236 function as electric power receiving and supplying means for the light emitting element 1100. Alternatively, separately from the electric power receiving and supplying means, the metal pattern may be formed to ensure bonding strength between the substrate and the sealing member.

The flip chip-type light emitting element 1100 on its electrode face (lower side face in the drawing) is plated with a eutectic material. This is passed into a general-purpose reflow oven to solder the light emitting element 1100 to the metal patterns 1235, 1236.

Here since the eutectic material plating is widely and thinly applied on the surface of the electrode in the light emitting element 1100, heat dissipation to the substrate side is excellent. Further, even when the spacing between the p-electrode and the n-electrode is small as in the flip chip-type light emitting element, there is no fear of short-circuiting.

The sealing member 1238 is made of low melting glass transparent to wavelength in the light emitting element 1100. Low melting glass selected from $SiO_2$—$Nb_2O_5$-based, $B_2O_3$—F-based, $P_2O_3$—F-based, $P_2O_5$—ZnO-based, $SiO_2$—$B_2O_3$—$La_2O_3$-based and $SiO_2$—$B_2O_3$-based low melting glasses can be adopted as the low melting glass.

The sealing member 1238 may be molded under the reduced pressure in a nitrogen atmosphere.

According to the optical device 1230, the adhesion between the low melting glass constituting the sealing member 1238 and the metal constituting the metal patterns 1235, 1236 is high, and, further, a high level of adhesion between the above metal and the AlN substrate 1231 is also ensured. Therefore, the sealing member 1238 is strongly bonded to the substrate 1231, and interfacial peeling hardly occurs. Further, in this optical device, the thermally or mechanically brittle bonding wire is absent, and, in addition, no organic material is contained in the device. Therefore, the low melting glass can be pressed at higher temperatures. Further, the device is stable against heat treatment in a reflow oven or the like. Accordingly, the device can be manufactured more easily, and the range of choice of the applicable low melting glass can also be broadened.

Embodiments shown in FIGS. 56 to 64 will be explained in detail.

(Optical Element)

Optical elements include light emitting diodes, laser diodes, and other light emitting elements and photodetectors. The wavelength of light to be received and the wavelength of light to be emitted in the optical element are not particularly limited, and, for example, group III nitride-based compound semiconductor elements useful for lights ranging from ultraviolet light to green light, and GaAs-based semiconductor elements useful for red lights may be used. Other optical elements usable herein include those made of SiC, AlInGaP and the like.

Group III nitride-based compound semiconductor light emitting elements which emit short wavelengths pose a significant problem associated with the sealing member. Group III nitride-based compound semiconductors are represented by general formula $Al_xGa_yIn_{1-x-y}N$ where $0 < x \leq 1$, $0 \leq y \leq 1$, and $0 \leq x+y \leq 1$. Among them, Al-containing group III nitride-based compound semiconductors include the so-called binary systems of AlN, and the so-called ternary systems of $Al_xGa_{1-x}N$ and $Al_xIn_{1-x}N$ where $0 < x < 1$. In the group III nitride-based compound semiconductors and GaN, at least a part of the group III elements may be replaced with boron (B), thallium (Tl) or the like. At least a part of nitrogen (N) may also be replaced with phosphorus (P), arsenic (As), antimony (Sb), bismuth (Bi) or the like.

The group III nitride-based compound semiconductor may contain any dopant. n-type impurities usable herein include silicon (Si), germanium (Ge), selenium (Se), tellurium (Te), and carbon (C). p-type impurities usable herein include magnesium (Mg), zinc (Zn), beryllium (Be), calcium (Ca), strontium (Sr), and barium (Ba). After doping with the p-type impurity, the group III nitride-based compound semiconductor may be exposed to electron beams, plasma, or heat in an oven. This, however, is not indispensable.

The group III nitride-based compound semiconductor layer is formed by an MOCVD (metal-organic vapor phase epitaxy) method. All the semiconductor layers constituting the element are not always required to be formed by the MOCVD method, and the MOCVD method may be used in combination with a molecular beam epitaxy method (MBE method), a halide vapor-phase epitaxy method (HVPE method), sputtering, ion plating or the like.

Regarding the construction of the light emitting element, a homo structure, hetero structure, or double hetero structure with MIS junction, PIN junction or pn junction may be adopted. In the light emitting layer, a quantum well structure (a single quantum well structure or a multiple quantum well structure) may also be adopted. The group III nitride-based compound semiconductor light emitting element may be of a face-up type in which the main light receiving/emitting direction (electrode face) is an optical axis direction in the optical device, and a flip-chip type in which the main light receiving/emitting direction is a direction opposite to the optical axis direction and reflected light is utilized.

The epitaxial growth temperature of the group III nitride-based compound semiconductor element is about 1050° C., and, regarding the epitaxial growth temperature of the GaAs-based semiconductor element, the heat resistant temperature is 600° C. or above. In both the cases, the use of low melting glass can realize processing without heat damage.

(Inorganic Material Substrate)

In the optical device of this invention, the above-mentioned optical element is mounted on an inorganic material substrate. The base material and the form of the inorganic material substrate may be properly selected depending upon applications of the optical device. For example, rectangular plates of AlN, $Al_2O_3$, glass-containing $Al_2O_3$ or the like may be used.

Any substrate may be used so far as at least the surface of the substrate is made of the base material. For example, a substrate may be used in which the center part is made of Al or Al alloy, and the surface thereof is surrounded by AlN.

(Metal Pattern)

A metal pattern is formed on the inorganic material substrate and functions to electrically connect each electrode in the optical element to an external circuit for receiving electric power from the optical element or supplying electric power to the optical element. Specifically, when the optical element is a light emitting element, electric power is applied from an external circuit to the optical element, while when the optical element is a photodetector, electric power generated in the optical element is output to an external circuit.

In addition to electric power supplying/receiving function, the metal pattern according to the invention functions also as an adhesive layer for stable adhesion of the inorganic sealing member to the inorganic material substrate. The sealing member is disposed so as to surround the optical element. Therefore, when the metal pattern is also formed in an area surrounding the optical element, the area of the metal pattern interposed between the sealing member and the inorganic material substrate can be maximized. The metal pattern surrounding the optical element is not limited to a continuous pattern and may be noncontinuous. The whole noncontinuous metal pattern is not always required to bear the electric power supplying/receiving function.

The metal pattern further functions to reflect light. Therefore, when the metal pattern is provided so as to surround the optical element, light emitted from the optical element can be wholly reflected from the metal pattern, contributing to improved light takeout efficiency. For example, a black substrate of AlN disadvantageously absorbs light emitted from the optical element, and a substrate of $Al_2O_3$ is disadvantageously transparent to light emitted from the optical element. In this case, when the optical element is surrounded by the metal pattern, the light emitted from the optical element can be efficiently reflected from the metal pattern and can be led to the outside of the device.

The material for metal pattern formation is properly selected depending upon the material for the sealing member and the material for the inorganic material substrate so that the material for metal pattern formation is bonded with good boding strength to the sealing member and the inorganic material substrate. The metal pattern may have a multilayered structure. For example, W, W\Ni (Ni being stacked on W), W\Ni\Ag (Ni and Ag being stacked in that order on W), and copper foils may be adopted as the material for metal pattern formation.

Upon heating, the W layer enters in a wedge form into the sealing member and the inorganic material in the substrate to form strong bonding between the sealing member and the inorganic material in the substrate. When the Ni layer is formed on the W layer, upon heating, a chemical bond is formed between the Ni layer and the sealing member, whereby the Ni layer and the sealing member are strongly boned to each other.

The Ag layer is a high-reflectance layer for improving the light reflection efficiency of the metal pattern and is preferably partially formed on a peripheral site of the optical element. Further, an Au layer may be formed as bonding means on the optical element mount part. The optical element can be bonded to the metal pattern through the Au layer.

An Au bump may be used as bonding means. In addition to the Au bump, mount bonding means using a eutectic material such as solder bumps or solder plating may also be used.

From the reducing the heat distortion level of the substrate, the metal pattern is preferably formed on substantially the whole area of the optical element mount face (surface) of the substrate.

When the metal pattern is formed so as to extend to the backside of the substrate, a through-hole (via hole) is formed in the substrate, and the material for the metal pattern can be extended through the hole to connect the pattern on the substrate surface to the pattern on the backside of the substrate. An electric terminal is drawn from the optical element mount face of the substrate to the backside thereof. Therefore, there is no need particular to provide a part, not covered by the sealing member of the optical element for the electric terminal, on the optical element mount face side of the substrate, and the whole area can be sealed with a plate-shaped sealing member. Therefore, the mass productivity is excellent. In this case, when any through-hole is not provided in the substrate, the sealing member of the optical element on the optical element mount face side does not reach the backside thereof.

The method for metal pattern formation is not particularly limited. In the working example, a paste of W was screen printed on an inorganic material substrate, and the print was then fired to form a metal pattern of W on the inorganic material substrate. This W layer was plated with an Ni layer to form a metal pattern of W\Ni, followed by heat treatment. In the case of W\Ni\Ag, the Ni layer formed by plating is further plated with Ag.

Alternatively, these metal layers may be formed by sputtering or other well known methods.

(Sealing Member)

The inorganic sealing member is not particularly limited so far as it is transparent to the wavelength of received or emitted light in the optical element and can protect the optical element. When the fact that the heat resistant temperature of the optical element is about 600° C. is taken into consideration, however, the adoption of low melting glass having a melting point (softening point) below the heat resistant temperature is preferred.

In addition to lead glass and chalcogenide glass, $SiO_2$—$Nb_2O_5$-based, $B_2O_3$—F-based, $P_2O_5$—F-based, $P_2O_5$—ZnO-based, $SiO_2$—$B_2O_3$—$La_2O_3$-based or $SiO_2$—$B_2O_3$-based glasses may be adopted as the low melting glass. All of these low melting glasses can be pressed at 350 to 600° C.

A fluorescent material can also be dispersed in the sealing member. An inorganic fluorescent material powder can be used as the fluorescent material and can be mixed into the low melting glass. Further, rare earth ions can be doped into the low melting glass to yield fluorescence. A proper combination of a light emitting element with a fluorescent material can produce desired luminescent colors including white light.

In the combination of the sealing member with the optical element, preferably, the Abbe number of the sealing member is 40 or less, the refractive index is 1.6 or more, and the wavelength of light reception and light emission of the optical element is brought to not more than 546.1 nm (wavelength of e radiation of Na). Specifically, regarding the external quantum efficiency of light emitted within the high refractive index material, a higher refractive index of the sealing material with respect to the wavelength of emitted light is more advantageous. The refractive index of the optical material is defined by d radiation of Na. In general, however, the refractive index increases with reducing the wavelength, and the level of a change in refractive index as a function of light wavelength is indicated by the Abbe number. In particular, in the light emitting element of short wavelength emission which poses a problem associated with the conventional resin sealing, selecting a material which is high in refractive index in d radiation of Na and causes a significant change in refractive index with respect to the wavelength can prevent a lowering in output of light caused by yellowing of the resin. In addition, in essence, regarding short wavelength light, sealing with a high refractive index material can be realized, and high external quantum efficiency can be provided.

$SiO_2$—$Nb_2O_5$-based glass may be mentioned as the low melting glass having the above optical properties. Among others, $SiO_2$—$Nb_2O_5$—$Na_2O$ glass is preferred.

When a sealing member of a low melting glass sheet is put on an optical element followed by heating for softening, the light emitting element can be surrounded by the sealing member. This heating is preferably carried out under a reduced pressure atmosphere to prevent the entry of air into between the sealing member and the optical element. Upon heating, a chemical reaction takes place at the interface of the low melting glass and the metal pattern, whereby both the materials are strongly bonded to each other.

The following examples further illustrate this invention.

Example 10

Figure 56:
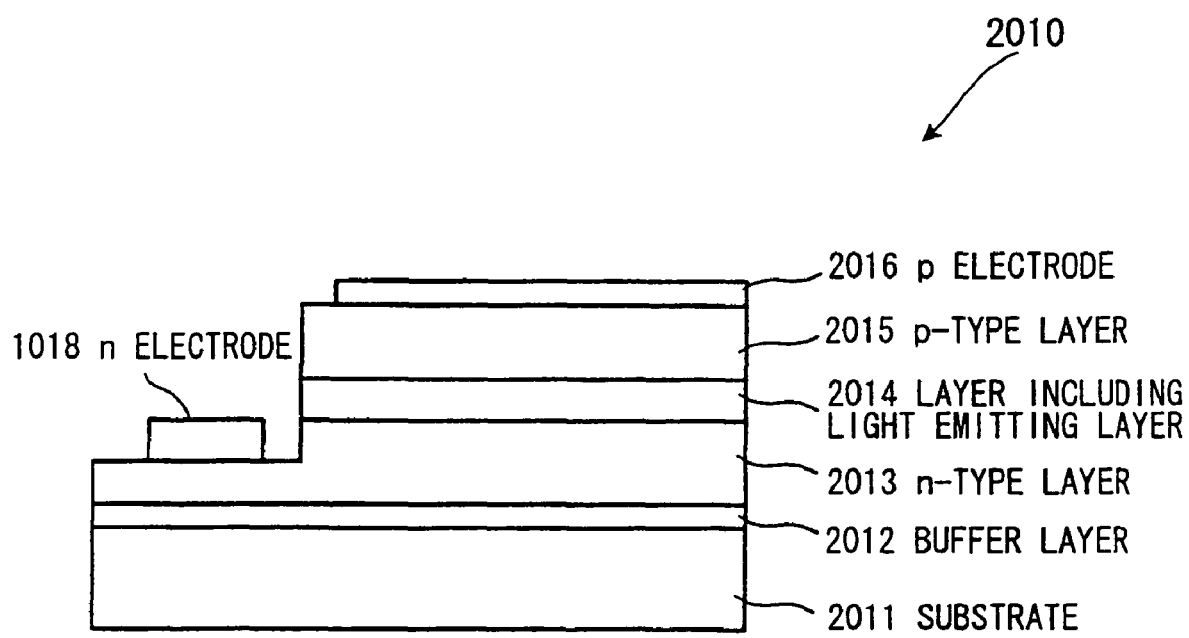
FIG. 56 is a cross-sectional view showing a structure of an optical element.

In this example, a flip chip-type group III nitride-based compound semiconductor light emitting element 2010 shown in FIG. 56 was used as an optical element. This light emitting element emits blue light.

The specifications of each layer constituting the light emitting element 2010 are as follows.
Layers: Composition
p-type layer 2015: p-GaN:Mg
Layer 2014 including light emitting layer: Including InGaN layer
n-type layer 2013: n-GaN:Si
Buffer layer 2012: AlN
Substrate 2011: Sapphire The n-type layer 2013 made of GaN doped with Si as an n-type impurity is formed on the substrate 2011 through the buffer layer 12. In this example, sapphire is used as the substrate 2011. The material for the substrate 2011, however, is not limited to sapphire, and examples of materials usable herein include sapphire, spinel, silicon carbide, zinc oxide, magnesium oxide, manganese oxide, zirconium boride, and group III nitride-based compound semiconductor single crystals. The buffer layer is formed by MOCVD using AlN. The material for the buffer layer, however, is not limited to AlN, and other materials such as GaN, InN, AlGaN, InGaN and AlInGaN may also be used. For example, a molecular beam epitaxy method (MBE method), a halide vapor-phase epitaxy method (HVPE method), sputtering, or ion plating may be used for the formation of the buffer layer. When the substrate is made of a group III nitride-based compound semiconductor, the provision of the buffer layer can be omitted.

The substrate and the buffer layer can be if necessary removed after semiconductor element formation.

In this example, the n-type layer 2013 is made of GaN. Alternatively, the n-type layer 2013 may be made of AlGaN, InGaN or AlInGaN.

Further, the n-type layer 2013 has been doped with Si as an n-type impurity. Other n-type impurities usable herein include Ge, Se, Te, and C.

The layer 2014 including a light emitting layer may comprise a quantum well structure (a multiple quantum well structure or a single quantum well structure), and the structure of the light emitting element may be of single hetero type, double hetero type, and homojunction type.

The layer 2014 including a light emitting layer may also include, on its p-type layer 2015 side, a group III nitride-based compound semiconductor layer with a broad bandgap doped with Mg or the like. This can effectively prevent electrons injected into the layer 2014 including a light emitting layer from diffusing into the p-type layer 2015.

The p-type layer 2015 made of GaN doped with Mg as a p-type impurity is formed on the layer 2014 including a light emitting layer. The p-type layer 2015 may also be made of AlGaN, InGaN or InAlGaN. Zn, Be, Ca, Sr, or Ba may also be used as the p-type impurity. After the introduction of the p-type impurity, the resistance can be lowered by a well-known method such as electron beam irradiation, heating in an oven, or plasma irradiation.

In the light emitting element having the above construction, each group III nitride-based compound semiconductor layer may be formed by MOCVD under conventional conditions, or alternatively may be formed by a method such as a molecular beam epitaxy method (MBE method), a halide vapor-phase epitaxy method (HVPE method), sputtering, or ion plating.

An n-electrode 2018 has a two-layer structure of an Al layer and a V layer. After the formation of the p-type layer 2015, the p-type layer 2015, the layer 2014 including a light emitting layer, and a part of the n-type layer 2013 are removed by etching to expose the n-type layer 2013, and the n-electrode 2018 is then formed on the exposed n-type layer 2013 by vapor deposition.

A p-electrode 2016 is stacked on the p-type layer 2015 by vapor deposition. After the formation of the individual layers and electrodes by the above steps, the step of isolating chips is carried out.

Next, an inorganic material substrate for mounting this light emitting element 2010 is provided.

A W-containing paste is screen printed on both sides of the inorganic material substrate 2021 of AlN before firing to form patterns 2023, 2024 shown in FIG. 57. As shown in FIG. 57(b), a through-hole 2025 is formed in the substrate 2021. A pattern 2023 of the mount face (surface) is electrically connected to a pattern 2024 on the backside through the through-hole 2025.

Thereafter, AlN is sintered at a temperature above 1500° C., and the W paste is baked onto the substrate 2021, whereby W is strongly bonded to the substrate. This W can also be formed by sputtering. Alternatively, instead of W, a high melting metal such as Mo may be used.

Next, the top of the W pattern 2023 on the surface side of the substrate 2021 is plated with an Ni layer 2026, and the assembly is heated at approximately 700° C. to react Ni with W, whereby the metal pattern is strongly bonded onto the AlN substrate 2021.

Next, as shown in FIG. 58, the light emitting element 2010 is mounted on a predetermined position through gold bumps 2027, 2028. The bump 2027 is connected to the n-electrode 2018 in the light emitting element 2010, and the bump 2028 is connected to the p-electrode 2016 in the light emitting element 2010. The light emitting element 2010 in such a state as shown in FIG. 58 (a), the light emitting element 2010 is surrounded by the metal pattern 2023.

Figure 59:
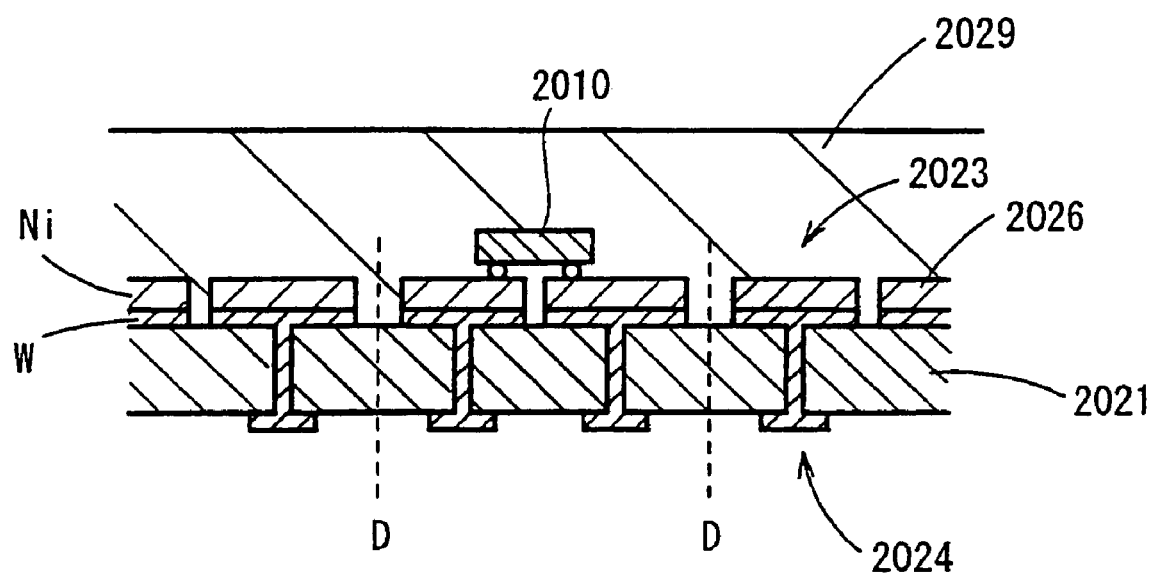
FIG. 59 is a diagram showing the construction of an optical device in Example 10.

Next, as shown in FIG. 59, a low melting glass sheet as the sealing member is put on the surface side of the substrate 2021. This assembly is heated in a reduced pressure atmosphere for fusing to seal the light emitting element 2010, whereby Ni on the surface of the metal pattern is strongly chemically bonded to the low melting glass 2029 through the oxide on the Ni surface. Further, the occurrence of residual air bubbles at the time of sealing can be prevented.

When the light emitting element 2010 is of a flip chip type, the bonding wire can be omitted. Also in this respect, the mechanical stability is good. Thus, the optical device having the above construction is suitable for a mass production process.

Finally, the substrate 2021 is divided at a parting line D to provide the optical device of this example.

Example 11

An optical device of another example is shown in FIGS. 60 to 63.

Figure 60:
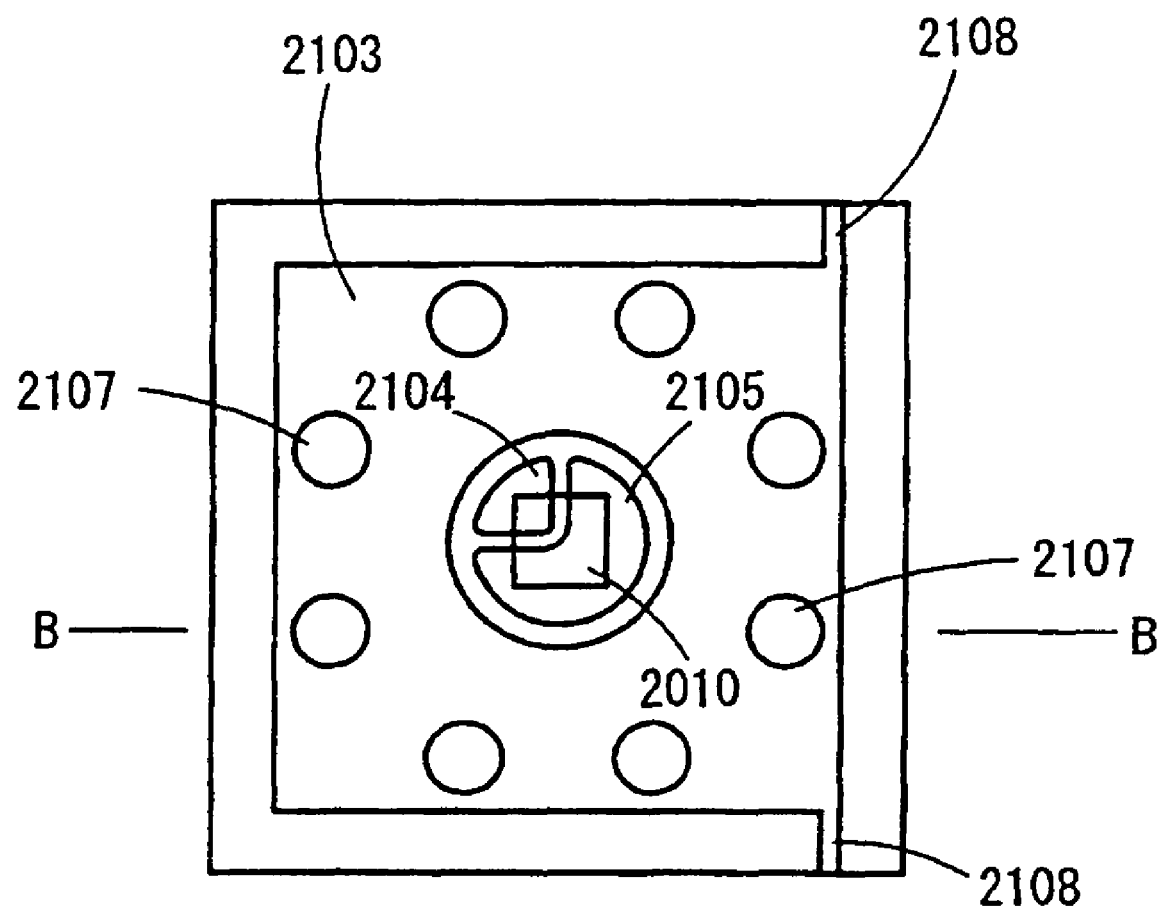
FIG. 60 is a plan view showing the construction of an optical device in another working example.
Figure 61:
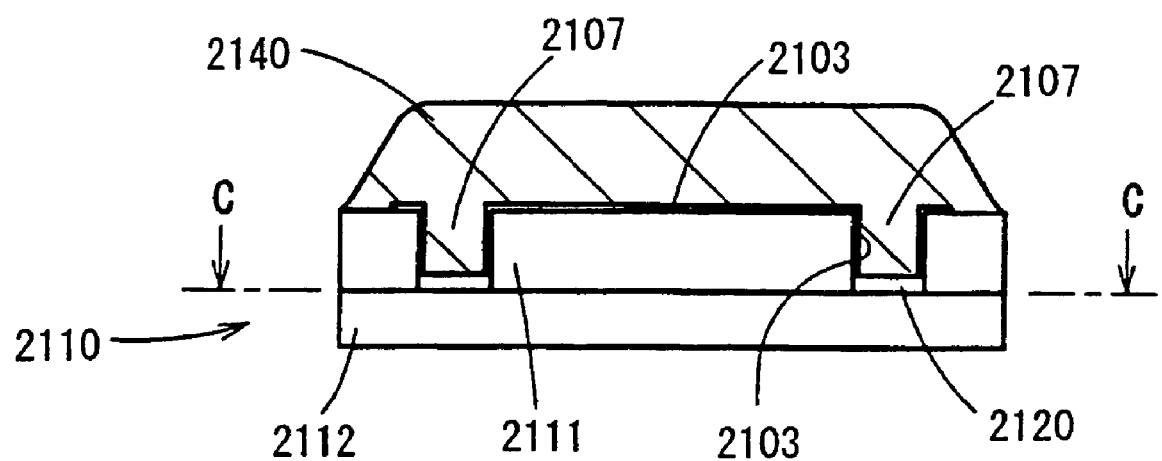
FIG. 61 is a cross-sectional view taken on line B-B of FIG. 60.

FIG. 60 is a plan view of this optical device. In this optical device, the pattern on the substrate surface (mount face) side is divided into a first part (a circular part) 2103 and a second part (a bonded part) 2104, 2105. A plurality of holes 2107 are formed in the first part 2103. An electrically conductive part 2108 extended to the periphery of the substrate is formed in the first part 2103. This electrically conductive part 2108 is used for the application of an electric field during plating.

The first part 2103 is a laminate of a W layer and an Ni layer formed in the same manner as in Example 10, and a strong bond among substrate 2110—first part 2103—sealing member 2140 is provided by applying an inorganic sealing member thereto. The second part 2104, 2105 of Cu formed by plating is extended through a first substrate 2111.

In the substrate 2110 in this example, $Al_2O_3$ is used as the base material, and the first substrate 2111 is applied to the second substrate 2112. AlN, glass-containing $Al_2O_3$ and other inorganic materials may be used as the base material for each of the substrates. The base material for the first substrate 2111 may be different from the base material for the second substrate 2112.

Through-holes 2107 are formed in the base material for the first substrate 2111, and a metal layer in the first part 2103 as the metal pattern, is also stacked on circumferential face of the holes 2107.

Figure 62:
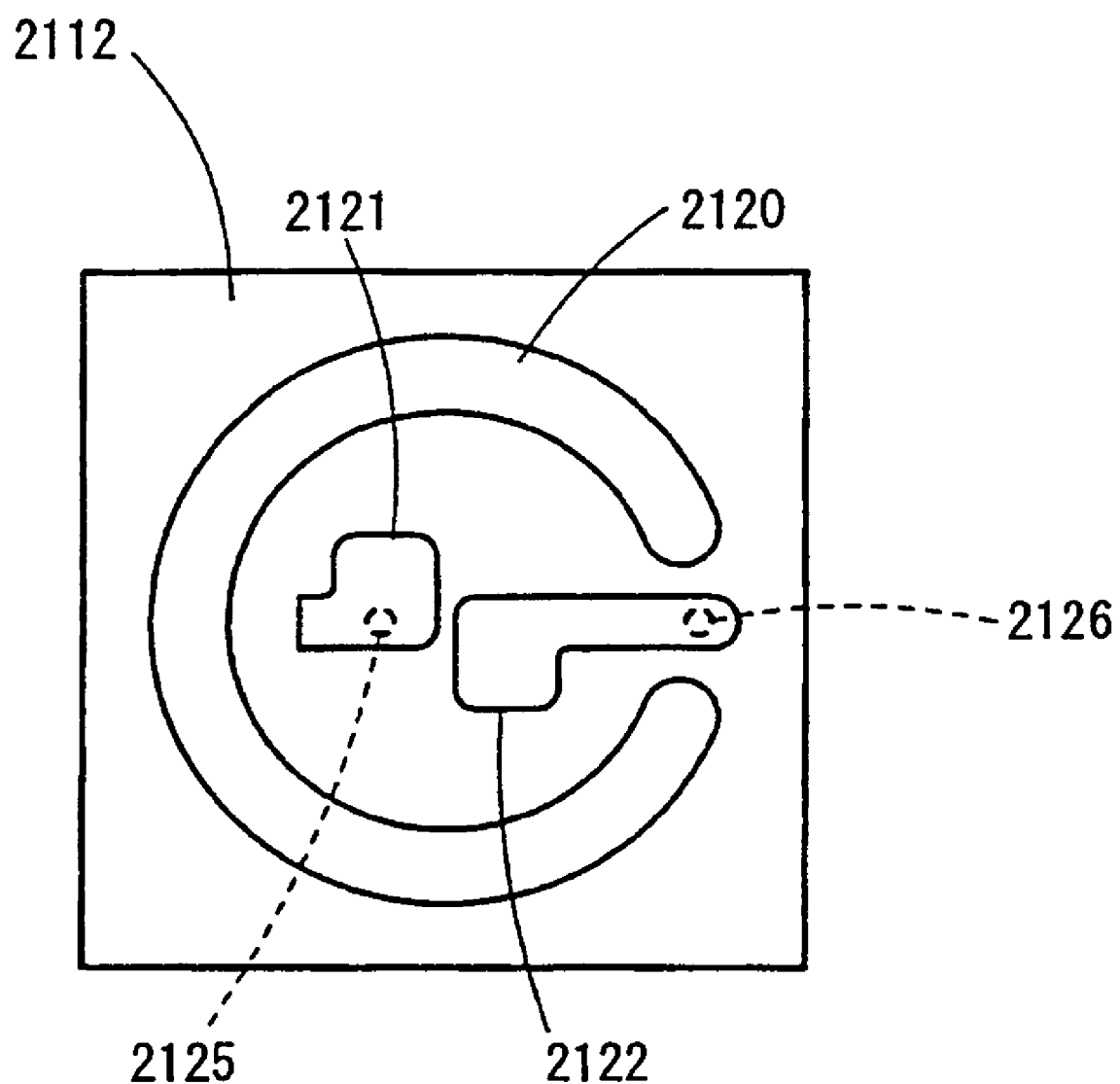
FIG. 62 is a cross-sectional view taken on line C-C (arrow tipped) of FIG. 61.
Figure 63:
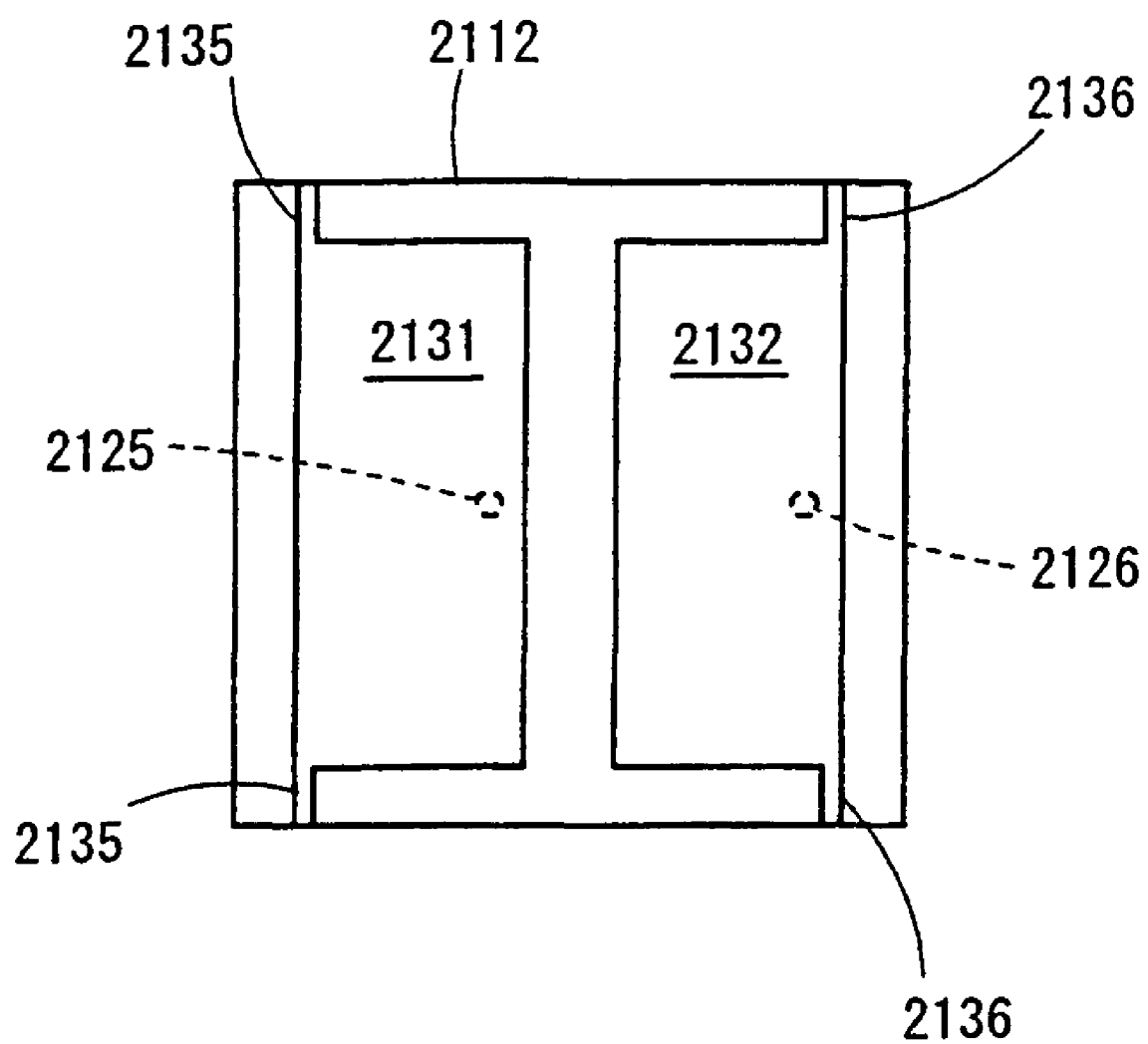
FIG. 63 is a bottom view.

Metal patterns 2120, 2121, 212 shown in FIG. 62 are formed on the surface of the second substrate 2112. The circular metal pattern 2120 with a notch is located so as to face the hole 2107 in the first substrate 111. As with the first part 2103 in the first metal pattern, this metal pattern 2120 is formed of a laminate of a W layer and a Ni layer. According to the metal pattern 2120 having the above construction, a satisfactory strength of bonding to an inorganic material (such as low melting glass) of the sealing member which has entered the bottom of the hole 2107 can be provided.

Metal patterns 2121, 2122 formed at the center of the second substrate 2112 are provided at positions which face respectively to the second parts 2104, 2105 in the metal pattern of the first substrate 2111. When the first substrate 2111 is applied to the second substrate 2112, the metal patterns 2121, 2122 are electrically connected to the second parts 2104, 2105, respectively. In the metal patterns 2121, 2122, an Au layer was further stacked on a laminate of a W layer and a Ni layer. The provision of the Au layer can improve the strength of bonding between the metal patterns 2121, 2122 and the second parts 2104, 2105.

Through-holes 2125, 2126 are formed in the second substrate 2112. Wide-area metal patterns 2131, 2132 are formed on the backside of the second substrate 2112. The metal pattern 2121 on the surface side of the second substrate 2112 is electrically connected to the metal pattern 2131 on the backside through the electrically conductive metal material filled into the through-hole 2125, whereby the supply of electric power to or reception of electric power from one of the electrodes in the element 2010 can be carried out from the metal pattern 2131 through the metal pattern 2104 on the surface of the first substrate 2111. Likewise, the metal pattern 2122 on the surface side of the second substrate 2112 is electrically connected to the metal pattern 2132 on the backside through the electrically conductive metal material filled into the through-hole 2126, whereby the supply of electric power to or reception of electric power from the other electrode in the element 2010 can be carried out from the metal pattern 2132 through the metal pattern 2105 on the surface of the first substrate 2111.

Electrically conductive parts 2135, 2136 are formed respectively in the metal patterns 2131, 2132 formed on the backside of the second substrate 2112. The electrically conductive parts 2135, 2136 are used at the time of plating of the metal patterns 2131, 2132.

In the metal patterns 2131, 2132 on the backside of the second substrate 2112, an Au layer was further stacked on a laminate of a W layer and a Ni layer. The provision of the Au layer can improve the strength of bonding between the metal patterns 2131, 2132 and an external electrode. The metal material within the through-holes 2125 and 2126 is formed together with the formation of the metal patterns 2131, 2132 and the metal patterns 2121, 2122 on the surface side.

In this example, the first substrate 2111 is separately provided from the second substrate 2112. They are then bonded to each other to form an inorganic material substrate 2110. The first substrate 2111 and the second substrate 2112 are bonded to each other by any method without particular limitation, for example, with the aid of an adhesive.

When the substrate 2110 is divided, a metal pattern can be formed in the parted face, resulting in improved degree of freedom of circuit design. When the hole 2107 is extended through the substrate 2110, in the case of some sealing member material, the material is adhered to the lower mold supporting the substrate 2110, leading to a fear of deterioration in demolding. As in this example, when the hole 2107 has a closed end, the contact between the material for the sealing member and the lower mold can be prevented. Further, when the hole 2107 is a through-hole, negative pressure for releasing air between the sealing member and the substrate surface cannot be applied to the whole area of the substrate without difficulties. On the other hand, when the hole 2107 has a closed end, even in the case where air stays between the sealing member and the substrate, air refuges in the hole, the occurrence of air bubbles between the sealing member and the substrate can be prevented. Clogging of one opening part in the through-hole in the first substrate 2111 with the second substrate 2112 to form the closed-end hole 2107 is superior in mass productivity to the formation of a closed-end hole in a single timber.

The sealing member 2140 made of an inorganic light transparent material is covered on the surface of the substrate 2110. The material for the sealing member 2140 is of course strongly bonded to the metal pattern 2103 on the surface of the substrate 2110, and, at the same time, in this example, the material for the sealing member 2140 sneaks in the hole 2107, resulting in physical engagement between the material for the sealing member 2140 and the substrate 2110, whereby, even when there is a large difference in coefficient of thermal expansion between the sealing member 2140 and the substrate 2110, the deformation of both the materials can be physically suppressed and, consequently, the separation of the sealing member 2140 from the substrate 2110 can be more reliably prevented.

Thus, since the provision of concaves and convexes on the substrate surface covered by the sealing member can cause physical engagement between the sealing member and the substrate, the separation of the sealing member from the substrate can be more reliably prevented. In addition to the closed-end hole of this example, a groove or through-hole can also be used as the concave-convex. Further, roughening of the substrate surface (Ra=not less than 0.5 μm) can realize physical engagement between both the materials. When the surface of the base material in the substrate is roughened, the roughness is reflected into the surface of the metal pattern when the metal pattern is formed on the substrate. Further, the concave-convex can also be formed by providing holes only in the metal pattern 2103, that is, the formation of the metal pattern 2103, for example, in a lattice form.

The action of the concave-convex is also effective in the case where the sealing member made of an inorganic light transparent material is covered directly on the base material of the inorganic material substrate without through any metal pattern.

Figure 64:
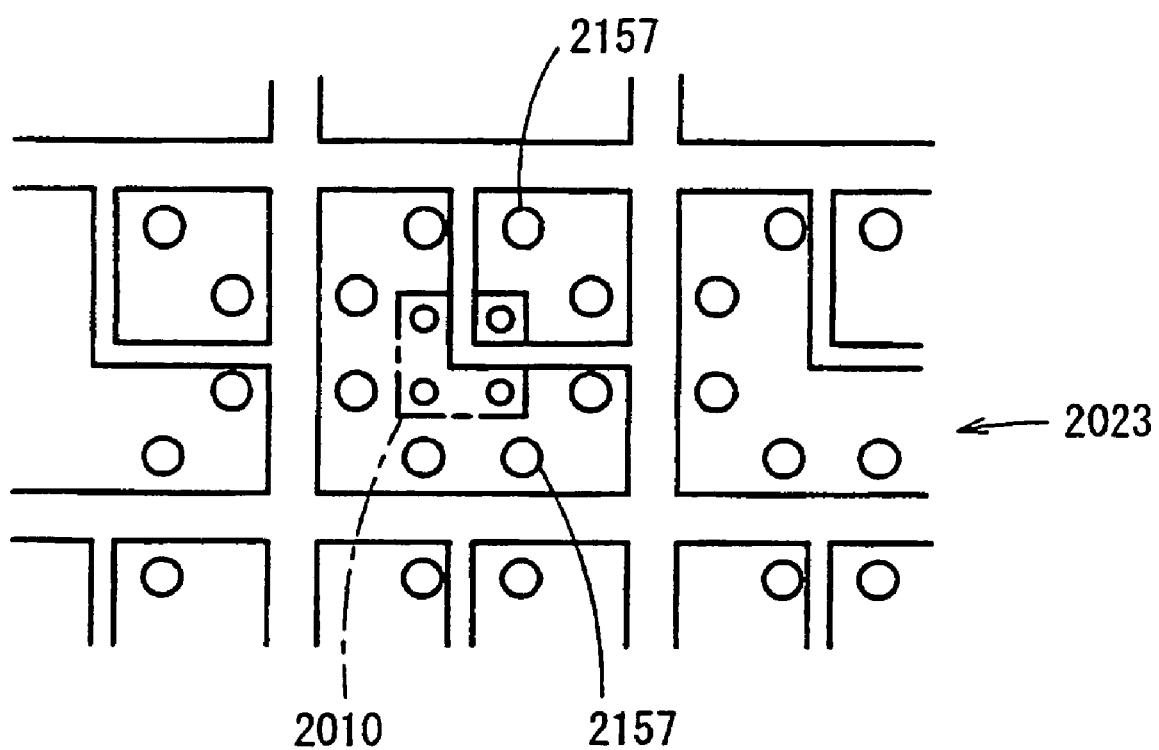
FIG. 64 is a plan view of an optical device in another working example.

FIG. 64 shows an example in which a closed-end hole 2257 is formed in the substrate of the optical element of Example 10. As shown in FIGS. 64 and 60, preferably the holes, that is, concaves-convexes, are evenly distributed on the surface of the substrate from the viewpoint of ensuring engagement between the sealing materials and the concaves-convexes in the whole area of the substrate surface to prevent the separation of the sealing material from the concave-convex.

Embodiments shown in FIGS. 65 to 74 will be explained in detail.

(Optical Element)

Optical elements include light emitting diodes, laser diodes, and other light emitting elements and photodetectors. The wavelength of light to be received and the wavelength of light to be emitted in the optical element are not particularly limited, and, for example, group III nitride-based compound semiconductor elements useful for lights ranging from ultraviolet light to green light, and GaAs-based semiconductor elements useful for red lights may be used. Other optical elements usable herein include those made of SiC, AlInGaP and the like.

Group III nitride-based compound semiconductor light emitting elements which emit short wavelengths pose a significant problem associated with the sealing member. Group III nitride-based compound semiconductors are represented by general formula $Al_xGa_yIn_{1-x-y}N$ where $0<X\leq1$, $0\leq Y\leq1$, and $0\leq X+Y\leq1$. Among them, Al-containing group III nitride-based compound semiconductors include the so-called binary systems of AlN, and the so-called ternary systems of $Al_xGa_{1-x}N$ and $Al_xIn_{1-x}N$ where $0<x<1$. In the group III nitride-based compound semiconductors and GaN, at least a part of the group III elements may be replaced with boron (B), thallium (Tl) or the like. At least a part of nitrogen (N) may also be replaced with phosphorus (P), arsenic (As), antimony (Sb), bismuth (Bi) or the like.

The group III nitride-based compound semiconductor may contain any dopant. n-type impurities usable herein include silicon (Si), germanium (Ge), selenium (Se), tellurium (Te), and carbon (C). p-type impurities usable herein include magnesium (Mg), zinc (Zn), beryllium (Be), calcium (Ca), strontium (Sr), and barium (Ba). After doping with the p-type impurity, the group III nitride-based compound semiconductor may be exposed to electron beams, plasma, or heat in an oven. This, however, is not indispensable.

The group III nitride-based compound semiconductor layer is formed by an MOCVD (metal-organic vapor phase epitaxy) method. All the semiconductor layers constituting the element are not always required to be formed by the MOCVD method, and the MOCVD method may be used in combination with a molecular beam epitaxy method (MBE method), a halide vapor-phase epitaxy method (HVPE method), sputtering, ion plating or the like.

Regarding the construction of the light emitting element, a homo structure, hetero structure, or double hetero structure with MIS junction, PIN junction or pn junction may be adopted. In the light emitting layer, a quantum well structure (a single quantum well structure or a multiple quantum well structure) may also be adopted. The group III nitride-based compound semiconductor light emitting element may be of a face-up type in which the main light receiving/emitting direction (electrode face) is an optical axis direction in the optical device, and a flip-chip type in which the main light receiving/emitting direction is a direction opposite to the optical axis direction and reflected light is utilized.

The epitaxial growth temperature of the group III nitride-based compound semiconductor element is about 1050° C., and, regarding the epitaxial growth temperature of the GaAs-based semiconductor element, the heat resistant temperature is 600° C. or above. In both the cases, the use of low melting glass can realize processing without heat damage.

(Inorganic Material Substrate)

In the optical device of this invention, the above-mentioned optical element is mounted on an inorganic material substrate. The base material and the form of the inorganic material substrate may be properly selected depending upon applications of the optical device. For example, rectangular plates of AlN, $Al_2O_3$, glass-containing $Al_2O_3$ or the like may be used.

Any substrate may be used so far as at least the surface of the substrate is made of the base material. For example, a substrate may be used in which the center part is made of Al or Al alloy, and the surface thereof is surrounded by AlN.

(Metal Pattern)

A first metal pattern and a second metal pattern are formed on an inorganic material substrate.

The first metal pattern electrically connects each electrode in the optical element to an external circuit, whereby electric power is received from and supplied to the optical element. Specifically, when the optical element is a light emitting element, electric power is applied to the optical element from the external circuit. On the other hand, when the optical element is a photodetector, electric power generated in the optical element is taken out to the external circuit.

The second metal pattern functions as an adhesive layer for stably bonding the inorganic sealing member to the inorganic material substrate. Since the sealing member is disposed so as to surround the optical element, the second metal pattern is also disposed so as to surround the first metal pattern on which the optical element is mounted. This can maximize the area of the second metal pattern interposed between the sealing member and the inorganic material substrate. The second metal pattern is not limited to a continuous pattern and may be noncontinuous.

The first metal pattern may be continuous to the second metal pattern. When the first metal pattern is insulated from the second metal pattern, however, electric field plating of materials optimal for respective functions can be carried out by independently applying the electric field.

The metal layer also functions to reflect light, and, thus, light from the optical element can be fully reflected to improve light takeout efficiency by surrounding the optical element with the first metal pattern and the second metal pattern. For example, a black substrate of AlN disadvantageously absorbs light from the optical element, and a substrate of $Al_2O_3$ is disadvantageously transparent to light emitted from the optical element. In this case, when the optical element is surrounded by the metal pattern, the light from the optical element can be efficiently reflected from the metal pattern and can be led to the outside of the device.

In order to improve reflection efficiency of light, preferably, the surface of the first metal pattern formed closer to the optical element is made of a metal layer with a high refractive index such as an Ag layer or the like.

In the material for first metal pattern formation, the surface layer should be compatible with a bonding material for bonding the optical element. For example, when Au bumps are used as the bonding material, the surface layer in the first metal pattern is made of Au or Ag. Layers other than the surface layer are preferably made of a material common to these layers and the second metal pattern from the viewpoint of improving productivity.

In addition to Au bumps, eutectic materials such as solder bumps and solder plating can be used as a bonding material for bonding the optical element to the substrate.

The Ag layer has high light reflectance and, thus, in the first metal pattern, is preferably partially formed in the site on the periphery of the optical element.

The material for the second metal pattern formation is properly selected depending upon the material for the sealing member and the material for the inorganic material substrate so that the material for metal pattern formation is bonded with good boding strength to the sealing member and the inorganic material substrate. The metal pattern may have a multilayered structure. For example, W, W\Ni (Ni being stacked on W), W\Ni\Ag (Ni and Ag being stacked in that order on W), and copper foils (strength of bonding to the glass-containing $Al_2O_3$ substrate can be provided through an oxide, and the substrate has a coefficient of thermal expansion ($13 \times 10^{-6}$ (1/° C.)) close to the inorganic sealing member) may be adopted as the material for metal pattern formation.

Upon heating, the W layer enters in a wedge form into the sealing member and the inorganic material in the substrate to form strong bonding between the sealing member and the inorganic material in the substrate. When the Ni layer is formed on the W layer, upon heating, a chemical bond is formed between the Ni layer and the sealing member, whereby the Ni layer and the sealing member are strongly boned to each other.

The surface of the second metal pattern is preferably made of a material having good wettability by the sealing member in a softened state. At least one of Ni, Cr, Ti, Cu or alloys thereof may be mentioned as this type of material.

The second metal pattern for joining the substrate surface to the sealing member is preferably formed in the largest possible area on the substrate surface.

The second metal pattern which should occupy a large area on the substrate surface is preferably made of a material having a coefficient of thermal expansion intermediate between the coefficient of thermal expansion of the sealing member (coefficient of thermal expansion: small) and the coefficient of the thermal expansion of the inorganic material substrate (coefficient of thermal expansion: large). This can reduce the difference in coefficient of thermal expansion between the sealing member and the inorganic material substrate. Upon cooling of the high temperature state adopted in covering optical element with the sealing member to room temperature, the sealing member and the inorganic material substrate are shrunken on a level depending upon the coefficient of thermal expansion of each of the sealing member and the inorganic material substrate. When there is a significant difference in coefficient of thermal expansion between the sealing member and the inorganic material substrate, however, there is a fear of causing deformation of the substrate or separation of the sealing member from the substrate. The interposition of a second metal pattern intermediate between the coefficient of the substrate and the coefficient of the sealing member can relax stress based on the difference in coefficient of thermal expansion between the substrate and the sealing member.

When the sealing member and the substrate are made of low melting glass and AlN, respectively, the coefficient of thermal expansion is $17.3 \times 10^{-6}$/° C. for low melting glass and $4.5 \times 10^{-6}$/° C. for AlN. In this case, Ni (coefficient of thermal expansion: $12.8 \times 10^{-6}$/° C.) having a coefficient of thermal expansion intermediate between the sealing member and the substrate is preferably adopted as a material for metal pattern formation.

From the viewpoint of reducing the thermal deformation level of the substrate, the formation of the second metal pattern on a large area of the optical element mount face (surface) of the substrate is preferred. More preferably, a metal pattern made of an identical or similar material is also formed in a large area on the backside of the substrate to further suppress the thermal deformation of the substrate.

In forming the metal pattern material on the substrate surface so as to extend to the backside of the substrate, the pattern on the substrate surface can be connected to the pattern on the backside of the substrate by providing a through-hole (via hole) in the substrate and filling the material for the metal pattern into the through-hole. Since the electric terminal is drawn from the optical element mount face of the substrate to the backside, there is no particular need to provide a portion, not covered by the sealing member of the optical element, for the electric terminal on the optical element mount face side of the substrate and the whole area can be sealed with a sealing member sheet. Therefore, the mass productivity is excellent. In this case, when no through-hole is provided in the substrate, the sealing member of the optical element on the optical element mount face side does not reach the backside. When the through-hole is formed on the optical element mount position, the heat from the optical element can be released to the outside of the device through the metal pattern material within the through-hole. This can improve heat dissipation efficiency and is particularly suitable for the group III nitride-based compound semiconductor light emitting element having a large calorific value.

The method for first and second metal pattern formation is not particularly limited. In the working example, however, a paste of W was screen printed on an inorganic material substrate, and the print was then fired to form a metal pattern of W on the inorganic material substrate. This W layer was plated with a Ni layer to form a metal pattern of W\Ni, followed by heat treatment. In the case of W\Ni\Ag, the Ni layer formed by plating is further plated with Ag.

Alternatively, these metal layers may be formed by sputtering or other well known methods.

A metallic thin film such as a Cu foil can also be bonded onto the backside of the substrate where a complicated and accurate pattern form is not required.

(Sealing Member)

The inorganic sealing member is not particularly limited so far as it is transparent to the wavelength of received or emitted light in the optical element and can protect the optical element. When the fact that the heat resistant temperature of the optical element is about 600° C. is taken into consideration, however, the adoption of low melting glass having a melting point (softening point) below the heat resistant temperature is preferred.

In addition to lead glass and chalcogenide glass, $SiO_2$—$Nb_2O_5$-based, $B_2O_3$—F-based, $P_2O_5$—F-based, $P_2O_5$—ZnO-based, $SiO_2$—$B_2O_3$—$La_2O_3$-based or $SiO_2$—$B_2O_3$-based glasses may be adopted as the low melting glass. All of these low melting glasses can be pressed at 350 to 600° C.

A fluorescent material can also be dispersed in the sealing member. An inorganic fluorescent material powder can be used as the fluorescent material and can be mixed into the low melting glass. Further, rare earth ions can be doped into the low melting glass to yield fluorescence. A proper combination of a light emitting element with a fluorescent material can produce desired luminescent colors including white light.

In the combination of the sealing member with the optical element, preferably, the Abbe number of the sealing member is 40 or less, the refractive index is 1.6 or more, and the wavelength of light reception and light emission of the optical element is brought to not more than 546.1 nm (wavelength of e radiation of Na). Specifically, regarding the external quantum efficiency of light emitted within the high refractive index material, a higher refractive index of the sealing material with respect to the wavelength of emitted light is more advantageous. The refractive index of the optical material is defined by d radiation of Na. In general, the refractive index increases with reducing the wavelength, and the level of a change in refractive index as a function of light wavelength is indicated by the Abbe number. In particular, in the light emitting element of short wavelength emission which poses a problem associated with the conventional resin sealing, selecting a material which is high in refractive index in d radiation of Na and causes a significant change in refractive index with respect to the wavelength can prevent a lowering in output of light caused by yellowing of the resin. In addition, in essence, regarding short wavelength light, sealing with a high refractive index material can be realized, and high external quantum efficiency can be provided.

$SiO_2$—$Nb_2O_5$-based glass may be mentioned as the low melting glass having the above optical properties. Among others, $SiO_2$—$Nb_2O_5$—$Na_2O$ glass is preferred.

When a sealing member of a low melting glass sheet is put on an optical element followed by heating for softening, the light emitting element can be surrounded by the sealing member. This heating is preferably carried out under a reduced pressure atmosphere to prevent the entry of air into between the sealing member and the optical element. Upon heating, a chemical reaction takes place at the interface of the low melting glass and the second metal pattern, whereby both the materials are strongly bonded to each other.

Concaves-convexes may be formed in the sealing member in a softened state put on top of the optical element. For example, a concave part (thin thickness part) can be provided in the sealing member along the splitting line of the inorganic material substrate to facilitate the splitting work. Further, in this case, the sealing member is formed in a fine lattice form by convex parts corresponding to chips and concaves along the splitting lines. The thermal deformation does not correspond to the size of the sheet before concave-convex formation but to the size of the fine lattice, and, thus, the thermal deformation of the sealing member can be reduced. Even when there is a significant difference in coefficient of thermal expansion between the sealing member and the substrate, the separation between the substrate and the sealing member can be prevented. Further, a problem of the warpage of the substrate can be reduced.

When the convex part of the sealing member is formed in a convex lens form, light from the light emitting element can be allowed to focus in an optical axis direction. Further, light from the outside of the device can be allowed to focus on the photodetector. In this case, a high refractive index material is preferably used as the material for the sealing member.

The sealing member in a softened state is preferably applied to the optical element under the reduced pressure from the viewpoint of preventing air from being trapped within the sealing member. Concaves and convexes in the sealing member can be formed by applying a sealing member sheet to the optical element and then pressing the assembly during a period in which the sealing member is maintained in a softened state, or reheating the assembly to soften the sealing member for pressing.

This invention will be explained with reference to the following examples.

Example 12

Figure 65:
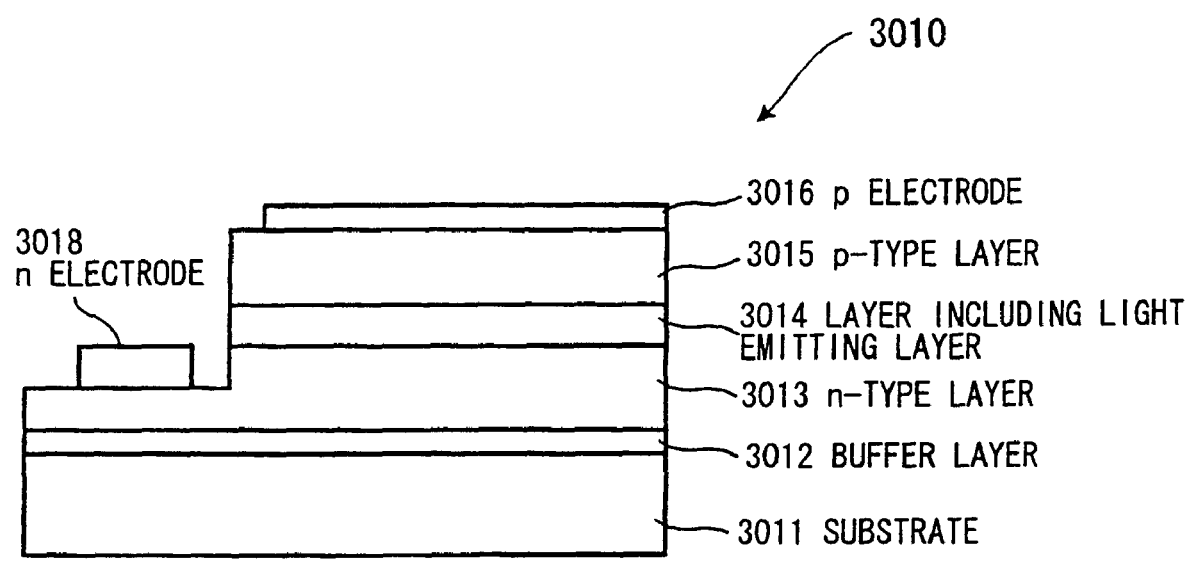
FIG. 65 is a cross-sectional view showing a structure of an optical element in a working example.

In this example, a flip chip-type group III nitride-based compound semiconductor light emitting element 3010 shown in FIG. 65 was used as an optical element. This light emitting element emits blue light.

The specifications of each layer constituting the light emitting element 3010 are as follows.
Layers: Composition
p-type layer 3015: p-GaN:Mg
Layer 3014 including light emitting layer: Including InGaN layer
n-type layer 3013: n-GaN:Si
Buffer layer 3012: AlN
Substrate 3011: Sapphire The n-type layer 3013 made of GaN doped with Si as an n-type impurity is formed on the substrate 3011 through the buffer layer 3012. In this example, sapphire is used as the substrate 3011. The material for the substrate 3011, however, is not limited to sapphire, and examples of materials usable herein include sapphire, spinel, silicon carbide, zinc oxide, magnesium oxide, manganese oxide, zirconium boride, and group III nitride-based compound semiconductor single crystals. The buffer layer is formed by MOCVD using AlN. The material for the buffer layer, however, is not limited to AlN, and other materials such as GaN, InN, AlGaN, InGaN and AlInGaN may also be used. For example, a molecular beam epitaxy method (MBE method), a halide vapor-phase epitaxy method (HVPE method), sputtering, or ion plating may be used for the formation of the buffer layer. When the substrate is made of a group III nitride-based compound semiconductor, the provision of the buffer layer can be omitted.

The substrate and the buffer layer can be if necessary removed after semiconductor element formation.

In this example, the n-type layer 3013 is made of GaN. Alternatively, the n-type layer 3013 may be made of AlGaN, InGaN or AlInGaN.

Further, the n-type layer 3013 has been doped with Si as an n-type impurity. Other n-type impurities usable herein include Ge, Se, Te, and C.

The layer 3014 including a light emitting layer may comprise a quantum well structure (a multiple quantum well structure or a single quantum well structure), and the structure of the light emitting element may be of single hetero type, double hetero type, and homojunction type.

The layer 3014 including a light emitting layer may also include, on its p-type layer 3015 side, a group III nitride-based compound semiconductor layer with a broad bandgap doped with Mg or the like. This can effectively prevent electrons injected into the layer 3014 including a light emitting layer from diffusing into the p-type layer 3015.

The p-type layer 3015 made of GaN doped with Mg as a p-type impurity is formed on the layer 3014 including a light emitting layer. The p-type layer 3015 may also be made of AlGaN, InGaN or InAlGaN. Zn, Be, Ca, Sr, or Ba may also be used as the p-type impurity. After the introduction of the p-type impurity, the resistance can be lowered by a well-known method such as electron beam irradiation, heating in an oven, or plasma irradiation.

In the light emitting element having the above construction, each group III nitride-based compound semiconductor layer may be formed by MOCVD under conventional conditions, or alternatively may be formed by a method such as a molecular beam epitaxy method (MBE method), a halide vapor-phase epitaxy method (HVPE method), sputtering, or ion plating.

An n-electrode 3018 has a two-layer structure of an Al layer and a V layer. After the formation of the p-type layer 3015, the p-type layer 15, the layer 3014 including a light emitting layer, and a part of the n-type layer 3013 are removed by etching to expose the n-type layer 3013, and the n-electrode 3018 is formed by vapor deposition on the exposed n-type layer 3013.

A p-electrode 3016 is stacked on the p-type layer 3015 by vapor deposition. After the formation of the individual layers and electrodes by the above steps, the step of isolating chips is carried out.

Next, an inorganic material substrate for mounting the light emitting element 3010 is provided.

Figure 66:
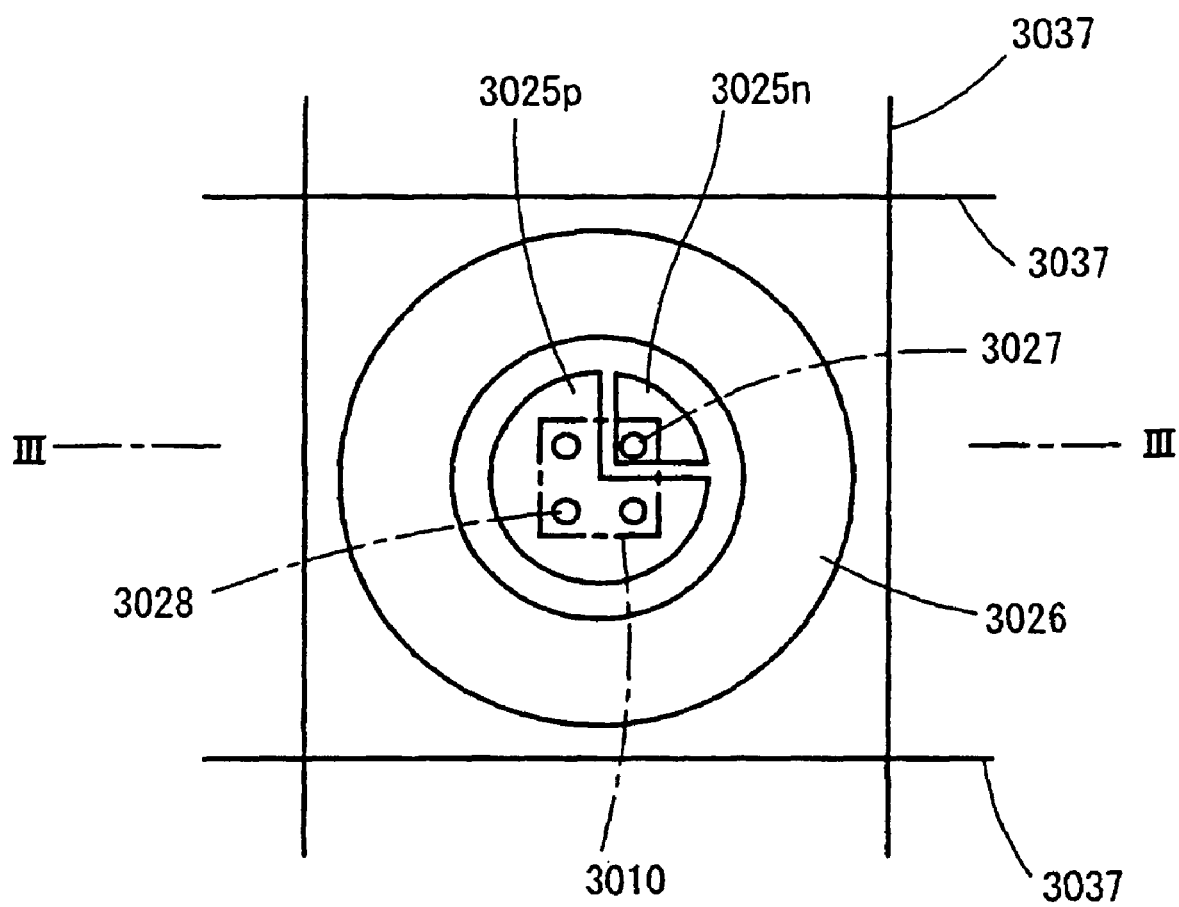
FIG. 66 is a plan view of an optical device in Example 12.
Figure 67:
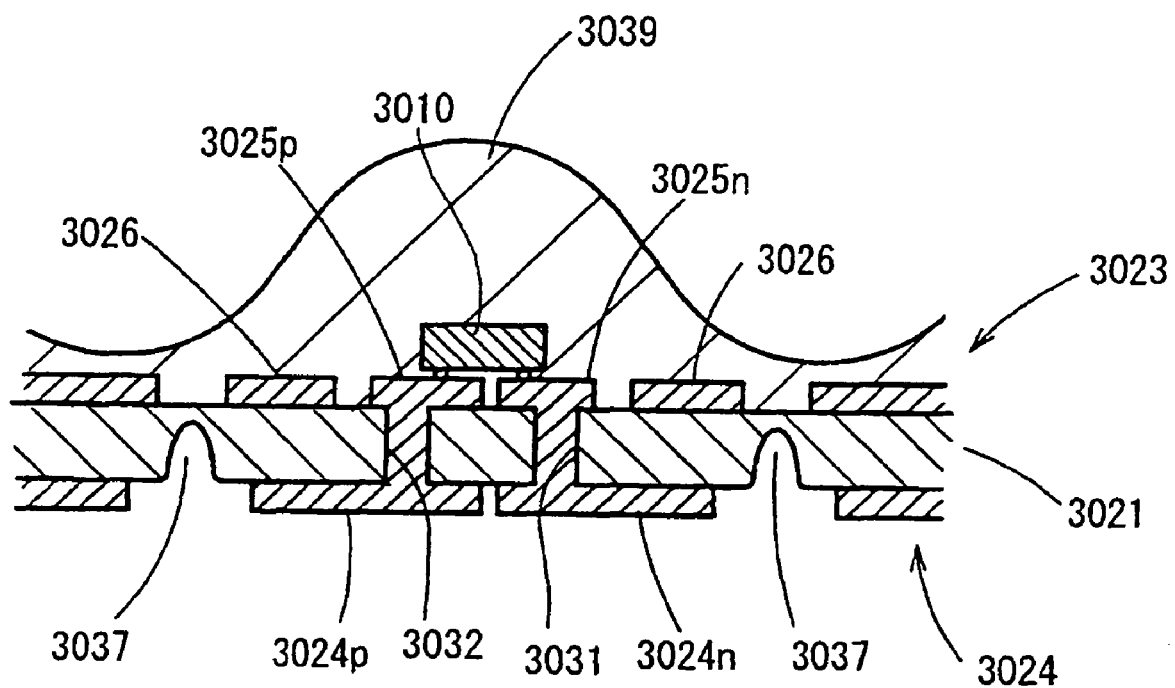
FIG. 67 is a cross-sectional view taken on line III-III of FIG. 66.
Figure 68:
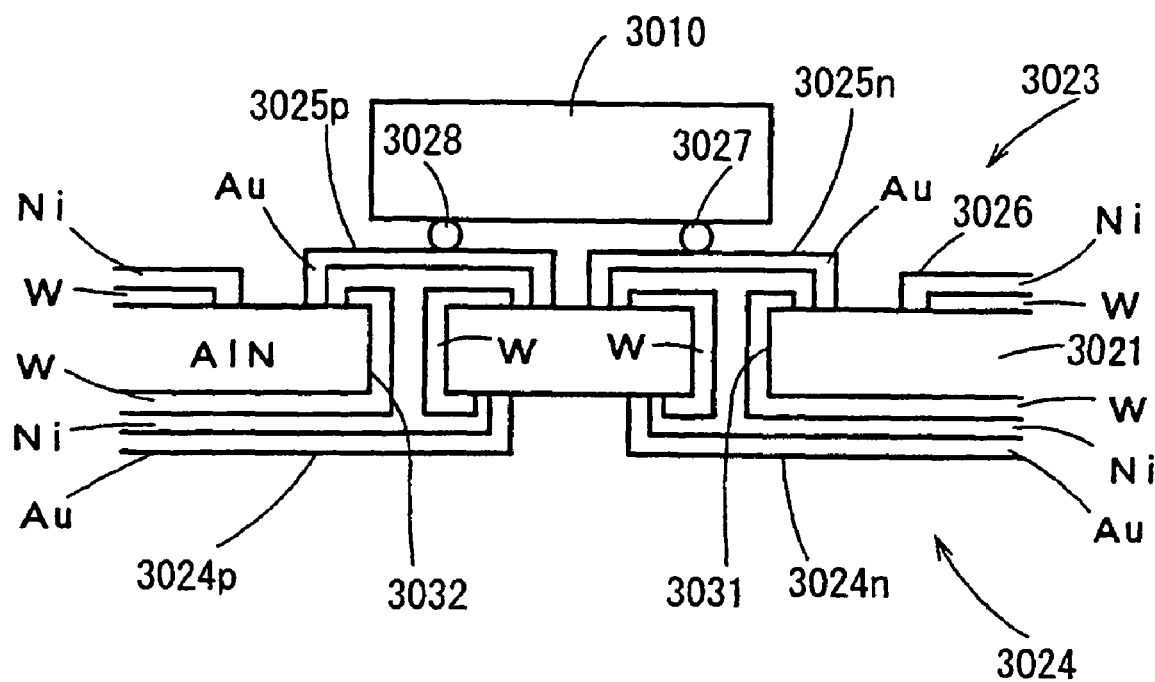
FIG. 68 is an enlarged view of the principal part of FIG. 67.

A base material for an inorganic material substrate 3021 in this example is AlN, and metal patterns 3023, 3024 are provided on respective upper and lower sides thereof. As shown in FIG. 66, the upper pattern 3023 comprises first metal patterns 3025n, 3025p and a second metal pattern 26. The first metal pattern 3025n is connected to the optical element 3010 in its n-electrode 3018 through the Au bump 3027. The first metal pattern 3025p is connected to the optical element in its p-electrode 3016 through an Au bump 3028. As shown in FIG. 67, the first metal pattern 25n is electrically connected to the metal pattern 3024n on the backside of the substrate through a through-hole 3031 formed in the base material of the inorganic material substrate 3021. Likewise, the first metal pattern 3025p is electrically connected to a metal pattern 3024p on the backside of the substrate through a through-hole 3032. As shown in FIG. 68 (an enlarged view of the principal part of FIG. 67), the through-holes 3031, 3032 are filled with Cu by plating.

The second metal pattern 3026 is elongated from the first metal patterns 3025n, 3025p and is formed in a circular region surrounding the first metal patterns 3025n, 3025p.

Figure 69:
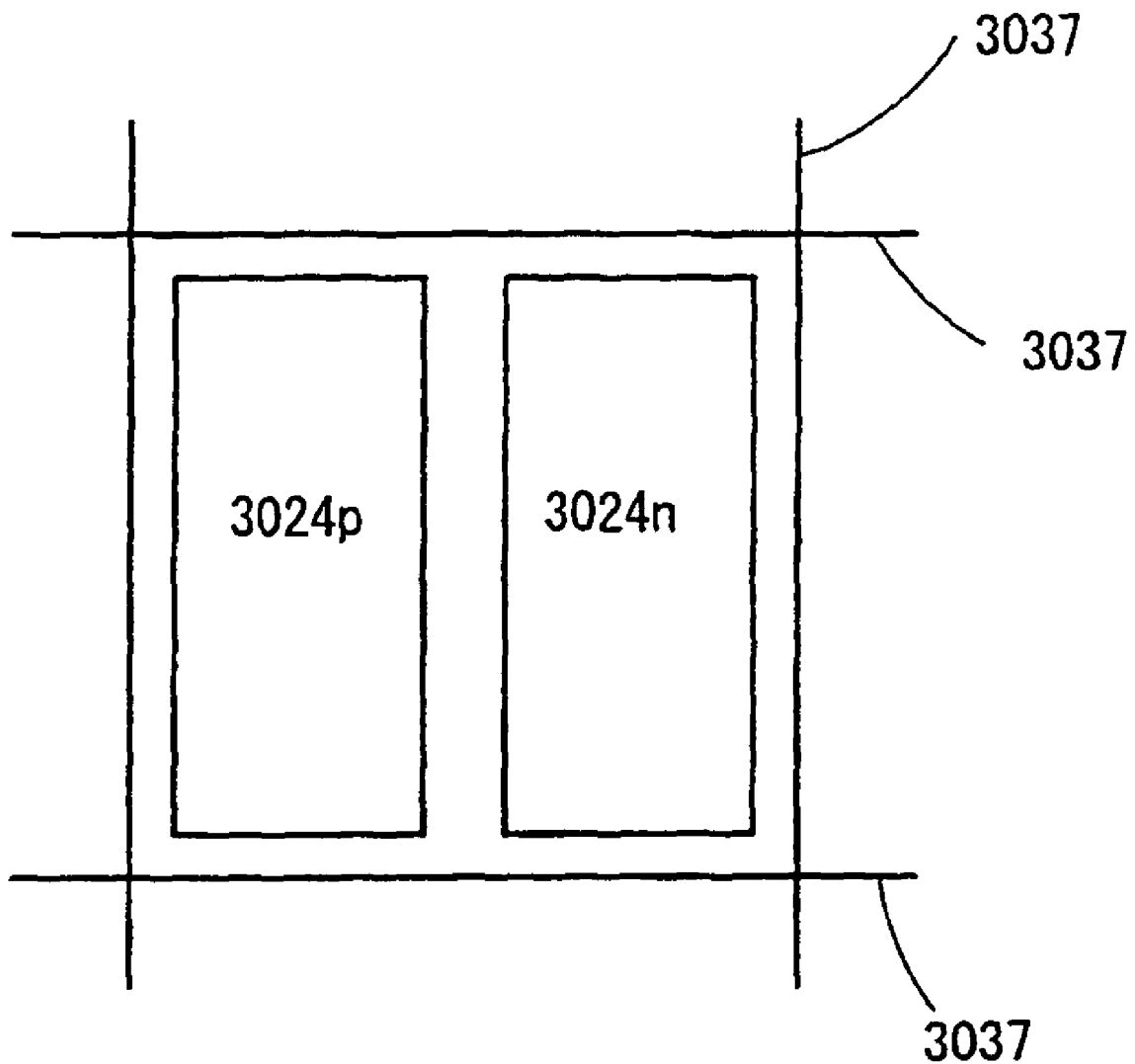
FIG. 69 is a bottom view of an optical device in a working example.

As shown in FIG. 69, the metal patterns 3024n and 3024p on the backside are preferably formed in the largest possible area. Thus, the deformation level of the substrate 3021 upon exposure to heat history can be brought to a value closer to the deformation level of the sealing member 3029 by bonding of the large-area pattern made of a metal material having a coefficient of thermal expansion intermediate between the sealing member and the substrate to the backside of the substrate 3021. Therefore, the warpage of the substrate 3021 and the separation between the sealing member and the substrate can be more reliably prevented.

Each metal pattern is formed as follows. At the outset, a W-containing paste is coated on both sides of the inorganic material substrate 3021 with through-holes before firing and the through-holes, for example, by screen printing. Thereafter, AlN is sintered at a temperature above 1500° C., and the W paste is baked onto the substrate 3021, whereby W is strongly bonded to the substrate. This W can also be formed by sputtering. Alternatively, instead of W, a high melting metal such as Mo may be used.

Next, a Ni layer is formed on the W pattern by plating, followed by heating at about 700° C. to react Ni with W, whereby the metal pattern is strongly bonded onto the AlN substrate 3021.

Ni is strongly chemically bonded to the sealing member made of an inorganic light transparent material. Since the inorganic material for the sealing member in a softened state has good wettability by Ni, the material for the sealing member comes into contact with the whole area of the second electrode pattern to prevent the occurrence of air bubbles and, at the same time, high bonding strength can be provided between the sealing member and the second electrode pattern.

In the first metal patterns 3025n, 3025p, preferably, good bonding to the top of the Ni layer through Au bumps can be realized, and a high reflectance Ag layer is formed. When light emitting element has a reflective face on its bottom, taking into consideration only bonding through Au bumps suffices for good results, and, for example, with respect to a blue light emitting element, an Au layer may be formed on the Ni layer.

Since through-holes 3031, 3032 are formed on positions just under the first metal patterns 3025n, 3025p, heat from the optical element 10 can be efficiently released to the outside of the device (backside of the substrate 3021) through the metal material within the through-holes.

Next, as shown in FIG. 67, the light emitting element 3010 is mounted at a predetermined position through Au bumps 3027, 3028. The bump 3027 is connected to the light emitting element 3010 in its n-electrode 3018, and the bump 3028 is connected to the light emitting element 3010 in its p-electrode 3016. In such a state as shown in FIG. 66, the light emitting element 3010 is surrounded by the first metal patterns 3025n and 3025p.

Next, as shown in FIG. 67, a low melting glass sheet as the sealing member is put on the surface side of the substrate 3021, and the assembly is heated in a reduced pressure atmosphere to fuse the low melting glass to the substrate 3021, thereby sealing the light emitting element 3010. Thus, Ni on the surface of the metal pattern and the low melting glass 3039 are chemically and strongly bonded to each other through an oxide on the Ni surface. Further, the occurrence of residual air bubbles at the time of sealing can be prevented.

When the low melting glass sheet has softened, preferably, the assembly is pressed to form concaves and convexes thereon. The concave part in the sealing member 3039 is allowed to conform to the splitting line 3037 (notch) in the substrate 3021, the substrate splitting work becomes easy. The convex part in the sealing member 3039 is preferably in a lens form to improve light takeout efficiency.

In the above series of production process, the light emitting element 3010 is connected to the first metal patterns 3025n and 3025p through gold bumps 3027, 3028 having a melting point above the processing temperature, and, thus, there is no fear of causing the bumps 3027, 3028 to be softened by the sealing temperature. Therefore, even when force is applied to the light emitting element during sealing work, the position of the light emitting element 3010 is not deviated from the predetermined position. When a flip chip-type light emitting element is adopted as the light emitting element 3010, the provision of the bonding wire is omitted. Also in this point, mechanical stability is ensured. Therefore, it can be said that the optical device having the above construction is suitable for a mass production process.

Further, the coefficient of thermal expansion of the Ni layer occupying a major part of the layer thickness of the metal pattern is $12.8 \times 10^{-6}/°$ C. which is intermediate between the coefficient of thermal expansion of AlN ($4.5 \times 10^{-6}/°$ C.) and the coefficient of thermal expansion of low melting glass 3039 ($17.3 \times 10^{-6}/°$ C.).

Thus, the interposition of the metal pattern between the inorganic sealing member 3039 and the inorganic material substrate 3021 can realize a strong bond between the sealing member 3039 and the substrate 3021 and, at the same time, can reduce stress caused by a difference in coefficient of thermal expansion between the sealing member 3039 and the substrate 3021. Therefore, unfavorable phenomena such as warpage and cracking in the substrate 3021 and separation of the sealing member 3039 from the substrate 3021 can be reliably prevented.

Finally, the substrate 3021 is split in the splitting line 3037 to provide optical devices of this example.

Variants of this example are shown in FIGS. 70 to 73. In FIG. 22 and FIGS. 70 to 73, like parts are identified with the same reference characters, and the explanation thereof will be omitted.

In the optical device shown in FIG. 69, the second metal pattern 3041 is in a rectangular circular form.

Figure 70:
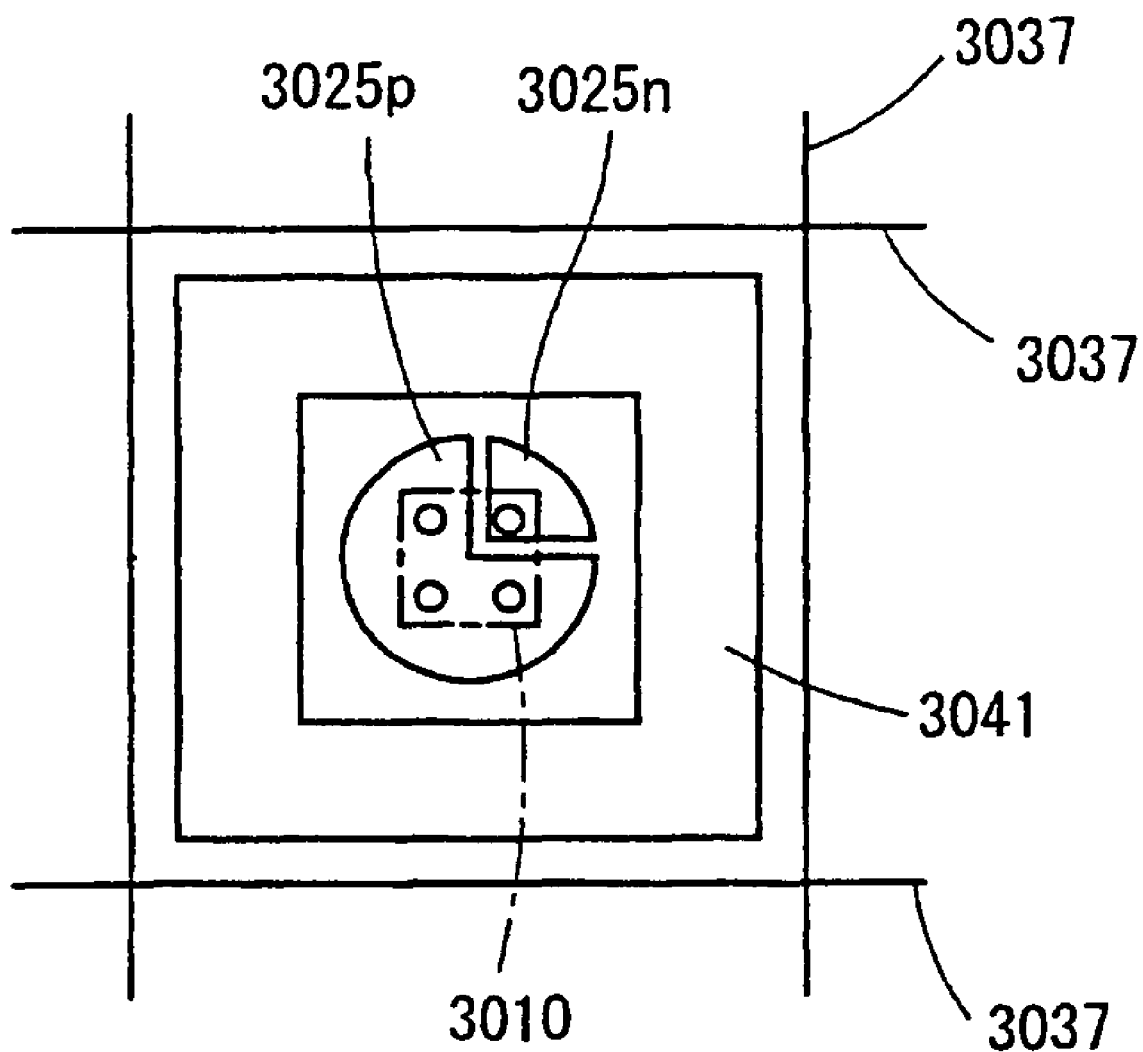
FIG. 70 is a diagram showing the construction of an optical device in another working example.
Figure 71:
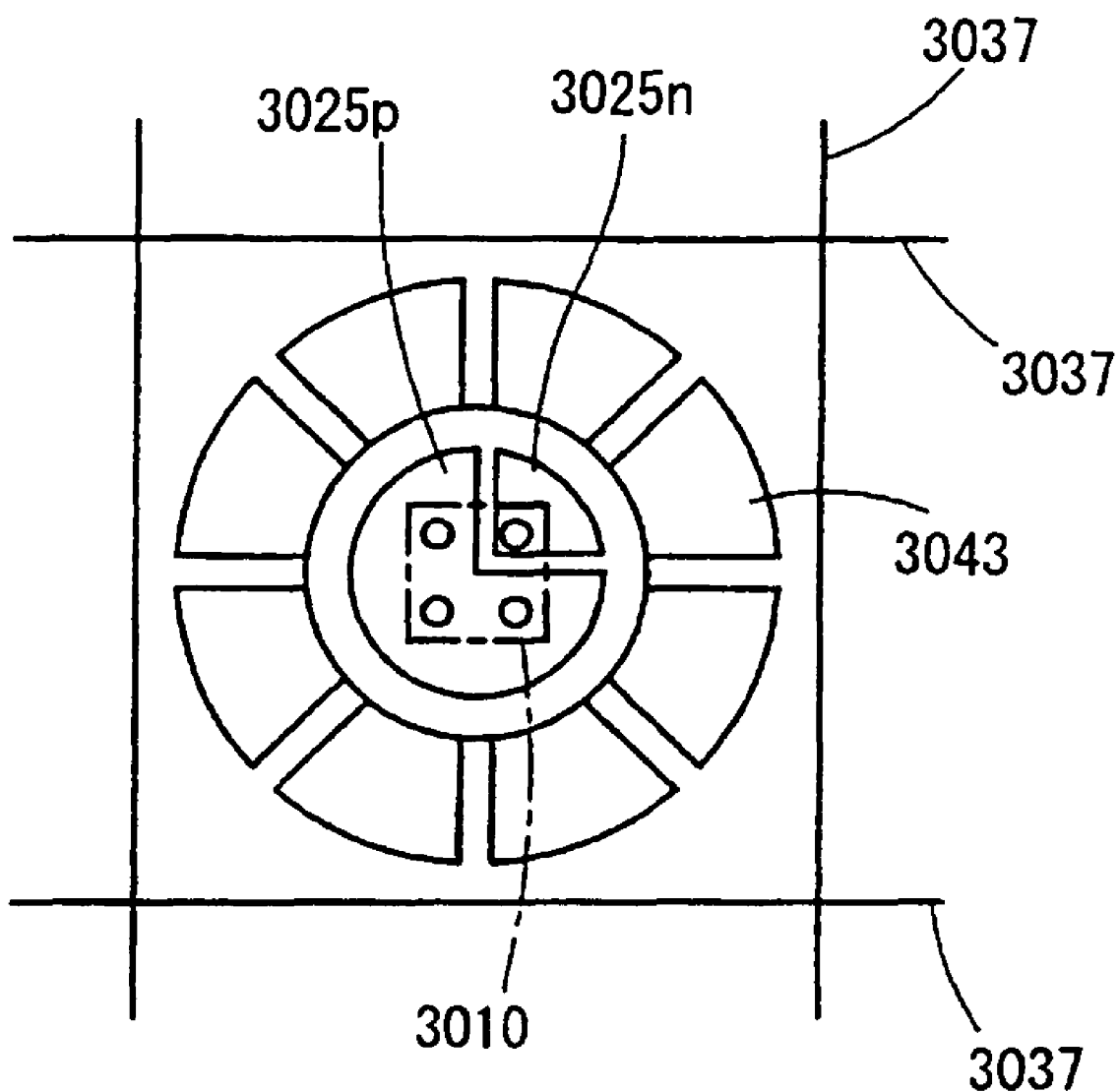
FIG. 71 is a diagram showing the construction of an optical device in still another working example.

In the optical device shown in FIG. 70, the second metal pattern 43 is noncontinuous.

Figure 72:
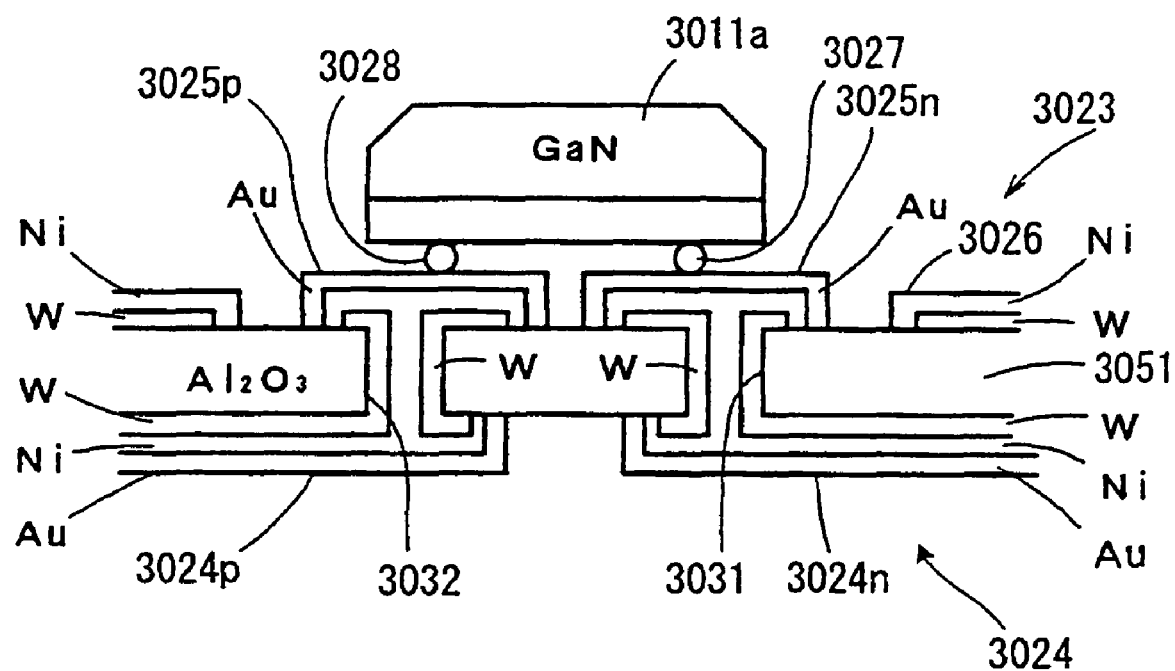
FIG. 72 is a diagram showing the construction of an optical device in another working example.

In the example shown in FIG. 72, instead of the sapphire substrate, a GaN substrate 3011a or SiC was adopted as the substrate for the flip chip-type light emitting element. Since the substrate for the element has a higher refractive index than the sapphire substrate, combining this substrate with a high refractive index sealing member (such as low melting glass) can improve light takeout efficiency.

Chamfering the peripheral part of the GaN substrate 3011a can further improve the efficiency of light takeout from the optical element 3010.

Further, in the example shown in FIG. 72, $Al_2O_3$ which has a larger coefficient of thermal expansion (coefficient of thermal expansion: $6.7 \times 10^{-6}$) and is more inexpensive than AlN was adopted as the base material for the inorganic material substrate 3051.

Figure 73:
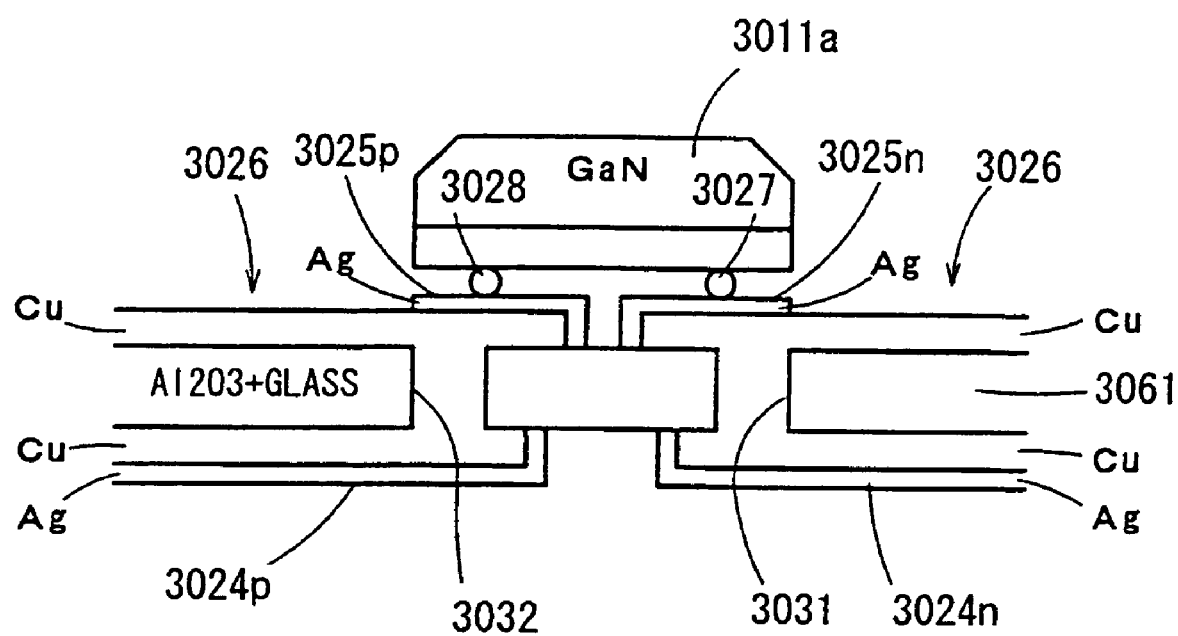
FIG. 73 is a diagram showing the construction of an optical device in still another working example.

In the example shown in FIG. 73, glass-containing $Al_2O_3$ was adopted as the base material for the inorganic material substrate 3061. Further, a Cu foil was adhered to the whole area of the substrate 3061. Cu was filled into the through-holes 3031 and 3032 by plating. Upon heating of the inorganic material substrate 3061 to 1000° C., Cu is chemically bonded to $Al_2O_3$. The formation of a Cu layer, having a coefficient of thermal expansion similar to the glass, in a large area on the backside of the glass-containing $Al_2O_3$ substrate can prevent problems of the warpage of the substrate and the separation between the sealing member and the substrate.

The base (Cu foil) for the first metal pattern is identical to the base (Cu foil) for the second metal pattern, and only light emitting element mount areas 3025n, 3025p are plated with Ag and Au. This can be easily carried out by masking the second metal pattern area.

For example, a construction may be adopted in which an identical base Cu foil is plated with Ni, and, with respect to a blue light emitting element, a reflective layer of a second metal pattern may be provided. Thus, the first metal patterns 3025n, 3025p may not be separated from the second metal pattern 3026.

Example 13

Figure 74:
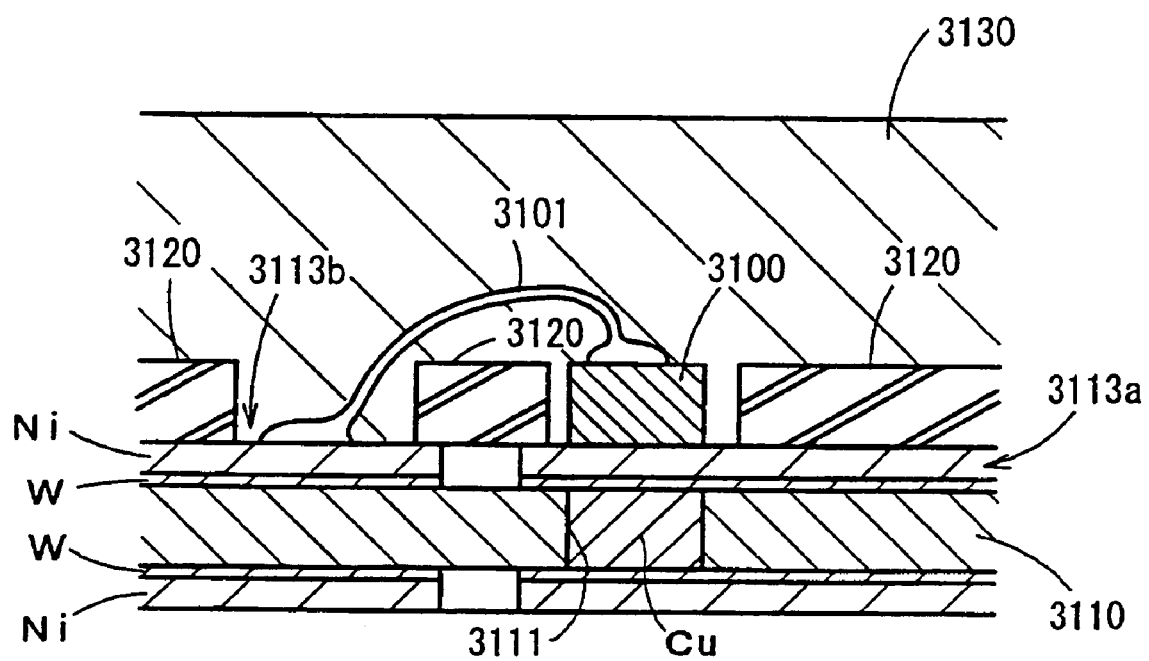
FIG. 74 is a diagram showing the construction of an optical device in a further working example.

An optical device of this example is shown in FIG. 74. A light emitting element 3100 used in this example is of a type which has an-electrode in its upper and lower parts. Therefore, the provision of the bonding wire 3101 is necessary.

A through-hole 3111 is formed in the inorganic material substrate 3110 made of AlN, and Cu is filled into the through-hole 3111 by plating. A metal pattern of W\Ni is formed in a large area on both sides of the substrate 3110. This metal pattern is formed in the same manner as in Example 12.

One electrode in the light emitting element 3100 is mounted on the first metal pattern 3113a on the through-hole 3111 from the viewpoint of improving heat lead-out efficiency. A bonding wire 3101 is drawn from the other electrode and is bonded to the second metal pattern 3113b.

On the other hand, a spacer sheet 3120 made of low melting glass is provided. Holes within which the light emitting element 3100 and the bonding wire 3101 are placed are formed in the spacer 3120. The spacer 3120 may be put on top of the substrate 3110 without interference to the light emitting element 3100 and the bonding wire 3101 (state shown in FIG. 74). In this state, a sealing member 3130 made of low melting glass is mounted. In this case, there is a fear of causing the bonding wire 3101 to be deformed by the material for the sealing member. This deformation, however, is regulated by the spacer 3120. Therefore, cutting or short-circuiting of the bonding wire 3101 can be prevented.

From the viewpoint of protecting the bonding wire 3101, preferably, the spacer 3120 sneaks to the lower side of the bonding wire 3101.

Next, embodiments shown in FIGS. 75 to 83 will be explained in detail.

(Light Emitting Element)

Light emitting elements include light emitting diodes, laser diodes, and other light emitting elements. The emission wavelength of the light emitting element is not particularly limited. For example, group III nitride-based compound semiconductor elements useful for lights ranging from ultraviolet light to green light, and GaAs-based semiconductor elements useful for red lights may be used. Other light emitting elements usable herein include those made of SiC, AlInGaP and the like.

As described above, the group III nitride-based compound semiconductor light emitting element provided with an insulating substrate has a problem associated with waste heat. When this light emitting element is used, for example, as a white light source, high output is particularly required.

Group III nitride-based compound semiconductors are represented by general formula $Al_XGa_YIn_{1-X-Y}N$ where $0<X\leq1$, $0\leq Y\leq1$, and $0\leq X+Y\leq1$. Among them, Al-containing group III nitride-based compound semiconductors include the so-called binary systems of AlN, and the so-called ternary systems of $Al_XGa_{1-x}N$ and $Al_XIn_{1-x}N$ where $0<x<1$. In the group III nitride-based compound semiconductors and GaN, at least a part of the group III elements may be replaced with boron (B), thallium (Tl) or the like. At least a part of nitrogen (N) may also be replaced with phosphorus (P), arsenic (As), antimony (Sb), bismuth (Bi) or the like.

The group III nitride-based compound semiconductor may contain any dopant. n-type impurities usable herein include silicon (Si), germanium (Ge), selenium (Se), tellurium (Te), and carbon (C). p-type impurities usable herein include magnesium (Mg), zinc (Zn), beryllium (Be), calcium (Ca), strontium (Sr), and barium (Ba). After doping with the p-type impurity, the group III nitride-based compound semiconductor may be exposed to electron beams, plasma, or heat in an oven. This, however, is not indispensable.

The group III nitride-based compound semiconductor layer is formed by an MOCVD (metal-organic vapor phase epitaxy) method. All the semiconductor layers constituting the element are not always required to be formed by the MOCVD method, and the MOCVD method may be used in combination with a molecular beam epitaxy method (MBE method), a halide vapor-phase epitaxy method (HVPE method), sputtering, ion plating or the like.

Regarding the construction of the light emitting element, a homo structure, hetero structure, or double hetero structure with MIS junction, PIN junction or pn junction may be adopted. In the light emitting layer, a quantum well structure (a single quantum well structure or a multiple quantum well structure) may also be adopted. The group III nitride-based compound semiconductor light emitting element may be of a face up-type in which the main light emitting direction (electrode face) is an optical axis direction in the luminescent device, and a flip chip-type in which the main light emitting direction is a direction opposite to the optical axis direction and reflected light is utilized.

(Submount)

The base material for the submount may be properly selected depending upon the applications of the luminescent device so far as it is highly thermally conductive. For example, inorganic materials such as AlN, $Al_2O_3$, SiC, $Si_3N_4$, and Si may be selected.

The inorganic material for the formation of the submount has a coefficient of thermal expansion intermediate between the semiconductor material in the light emitting element and the metal material in the lead frame. Accordingly, even when large heat history is applied during the manufacturing process of the luminescent device (for example, when the submount is soldered to the first and second lead frames), the stress caused by the coefficient of thermal expansion of the light emitting element and the lead frame can be relaxed.

The submount may be in any form so far as one end of the submount can be set in a first concave part formed in the first lead frame, and the other end can be set in a second concave part formed in the second lead frame.

When a flip chip-type light emitting element is adopted, the wire is omitted. Accordingly, the application of a large current to the light emitting element becomes possible. Consequently, high-brightness emission of the light emitting element can be realized and, in addition, the heat of the light emitting element can be efficiently dissipated. Further, the omission of the wire can improve the impact resistance of the luminescent device.

Instead of the wire, a wiring pattern such as a through-hole or a side metal is formed in the submount. Each electrode in the light emitting element mounted on the upper surface of the submount is electrically connected through this wiring pattern to the first lead frame and the second lead frame. The surface layer in the material for metal pattern formation should be compatible with the bonding material for bonding the light emitting element. For example, when Au bumps are used as the bonding material, the surface layer of the metal pattern is made of Au or Ag.

In addition to the Au bump, eutectic materials such as solder bumps or solder plating may be used as a bonding material for bonding the light emitting element to the wiring pattern in the submount.

(First Lead Frame and Second Lead Frame)

The first concave part is formed at the one end of the first lead frame, and the second concave part is formed at one end of the second lead frame. The first concave part and the second concave part can be formed by forming a groove by cutting or etching in the thickness-wise direction in the first and second lead frames. Alternatively, the first and second concave parts may be formed by pressing the material for the first lead frame and the material for the second lead frame. A method may also be adopted in which convex parts are provided on the surface of the first and second lead frames and a part surrounded by the convex parts is used as the concave part.

The concave part functions as a receiving seat for the submount, and the shape and the depth thereof are properly designed according to the submount.

One end of the submount is set to the first concave part, and the other end is set to the second concave part. The submount and the first and second lead frames are mechanically fixed, for example, by solder (for example, Pb—Sn or Au—Sn) or Ag paste made of a metallic eutectic material.

The submount mounting position is stabilized by reducing the margin between the submount and the peripheral wall of the first and second concaves, for example, when the submount and the first and second concave parts are in a substantially fitted state, whereby displacement of the light emitting element can be prevented. Thus, light distribution characteristics in the case where the light emitting element has been sealed with a lens-shaped sealing member are stabilized.

In such a state that the submount is set in the first and second concaves, when the submount is substantially level with the height of the first and second lead frames, light released laterally from the light emitting element can be easily controlled to improve the light takeout efficiency.

Further, when the submount is substantially level with the height of the first and second lead frames and the gap between the submount and the first and second lead frames is small (fitted state), that is, when the submount and the first and second lead frames are substantially flush with each other, the efficiency of reflection by the lead frames can also be improved.

This invention will be explained with reference to the following examples.

Figure 75:
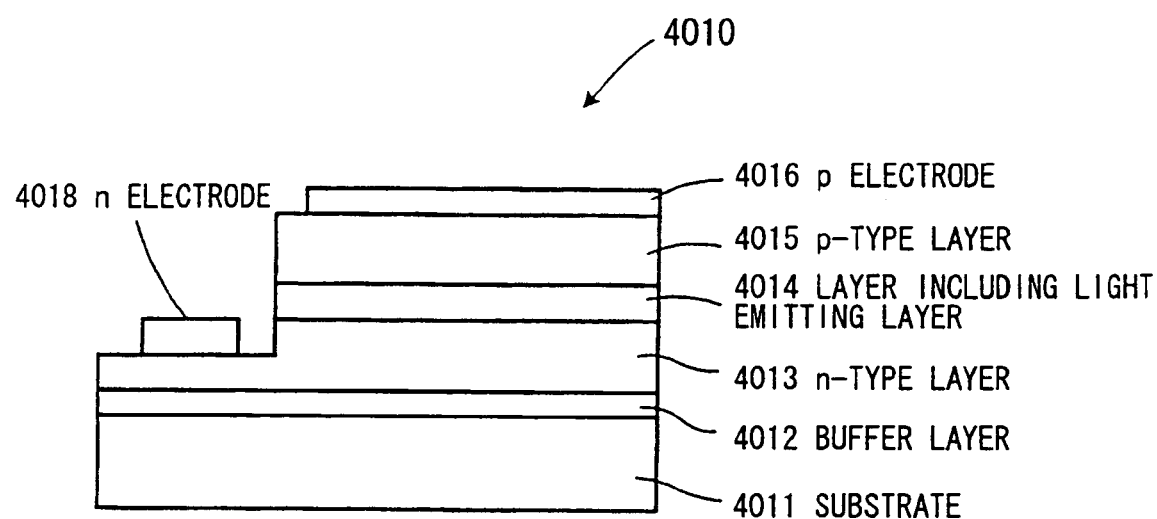
FIG. 75 is a cross-sectional view showing the construction of a light emitting element.
Figure 76:
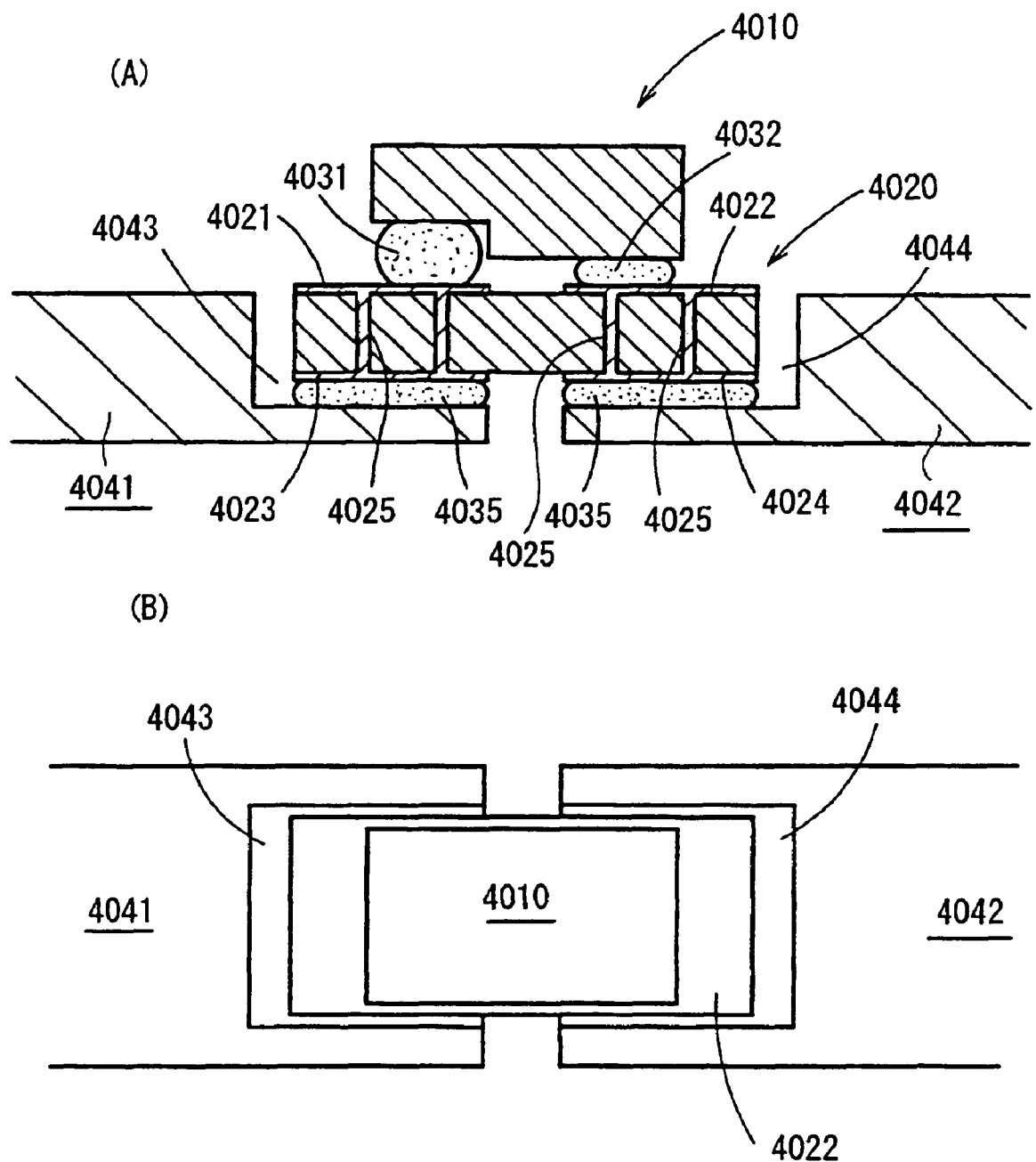
FIG. 76 is a diagram showing the construction of a luminescent device in a working example, wherein (A) is a cross-sectional view and (B) a plan view.

A light emitting element 10 is a group III nitride-based compound semiconductor light emitting element. FIG. 75 is a typical diagram showing the construction of this element. As shown in FIG. 75, in the light emitting element 4010, a plurality of group III nitride-based compound semiconductor layers are stacked on a sapphire substrate. Specifications of each layer constituting the light emitting element 4010 are as follows.

Layers: Composition
p-type semiconductor layer 4015: p-GaN:Mg
Layer 4014 including light emitting layer: Including InGaN layer
n-type semiconductor layer 4013: n-GaN:Si
Buffer layer 4012: AlN
Substrate 11: Sapphire The n-type semiconductor layer 4013 made of GaN doped with Si as an n-type impurity is formed on the substrate 4011 through the buffer layer 4012. In this example, sapphire is used as the substrate 4011. The material for the substrate 4011, however, is not limited to sapphire, and examples of materials usable herein include sapphire, spinel, silicon, silicon carbide, zinc oxide, gallium phosphide, gallium arsenide, magnesium oxide, manganese oxide, and group III nitride-based compound semiconductor single crystals. The buffer layer is formed by MOCVD using AlN. The material for the buffer layer, however, is not limited to AlN, and other materials such as GaN, InN, AlGaN, InGaN and AlInGaN may also be used. For example, a molecular beam epitaxy method (MBE method), a halide vapor-phase epitaxy method (HVPE method), sputtering, ion plating or electron shower may be used for the formation of the buffer layer. When the substrate is made of a group III nitride-based compound semiconductor, the provision of the buffer layer can be omitted.

The substrate and the buffer layer can be if necessary removed after semiconductor element formation.

In this example, the n-type semiconductor layer 4013 is made of GaN. Alternatively, the n-type semiconductor layer 4013 may be made of AlGaN, InGaN or AlInGaN.

Further, the n-type semiconductor layer 4013 has been doped with Si as an n-type impurity. Other n-type impurities usable herein include Ge, Se, Te, and C.

The n-type semiconductor layer 4013 may have a two-layer structure of a low-electron concentration n layer on the side of a layer 4014 including a light emitting layer and a high electron concentration n+ layer on the side of a buffer layer 12.

The layer 4014 including a light emitting layer may comprise a quantum well structure (a multiple quantum well structure or a single quantum well structure), and the structure of the light emitting element may be of single hetero type, double hetero type, and homojunction type.

The layer 4014 including a light emitting layer may also include, on its p-type semiconductor layer 4015 side, a group III nitride-based compound semiconductor layer with a broad bandgap doped with an acceptor such as Mg or the like. This can effectively prevent electrons injected into the layer 4014 including a light emitting layer from diffusing into the p-type layer 4015.

The p-type semiconductor layer 4015 made of GaN doped with Mg as a p-type impurity is formed on the layer 4014 including a light emitting layer. The p-type semiconductor layer 4015 may also be made of AlGaN, InGaN or InAlGaN. Zn, Be, Ca, Sr, or Ba may also be used as the p-type impurity.

Further, the p-type semiconductor layer 4015 may have a two-layer structure of a low hole concentration p-layer on the side of the layer 4014 including a light emitting layer and a high hole concentration p+ layer on the electrode side.

In the light emitting diode having the above construction, each group III nitride-based compound semiconductor layer may be formed by MOCVD under conventional conditions, or alternatively may be formed by a method such as a molecular beam epitaxy method (MBE method), a halide vapor-phase epitaxy method (HVPE method), sputtering, ion plating or electron shower.

An n-electrode 4018 has a two-layer structure of an Al layer and a V layer. After the formation of the p-type semiconductor layer 4015, the p-type semiconductor layer 4015, the layer 4014 including a light emitting layer, and a part of the n-type semiconductor layer 4013 are removed by etching, and the n-electrode 4018 is formed by vapor deposition on the n-type semiconductor layer 4013.

A p-electrode 4016 is a gold-containing film and is stacked on the p-type semiconductor layer 4015 by vapor deposition.

After the formation of the individual semiconductor layers and electrodes by the above steps, the step of isolating chips is carried out.

As shown in FIG. 76A, the submount 4020 is an insulating sheet-like member of AlN. Surface electrodes 4021, 4022 are formed on the upper surface, and backside electrodes 4023, 4024 are formed on the backside. These electrodes 4021, 4022, 4023, and 4024 comprise titanium, Ni, and Au stacked in that order, and continuity is made through a through-hole 4025 (filled with an electrically conductive metal).

In the submount 4020 in this example, the surface electrodes 4021, 4022 are made conductive to the backside electrodes 4023, 4024 through through-holes. The continuity between these electrodes may also be made by providing a metal layer (a side metal) on the side face of the submount 4020.

An n-electrode in the light emitting element 4010 is electrically connected to the surface electrode 4021 through an Au bump 4031, and a p-electrode is electrically connected to the surface electrode 4022 through an Au bump 4032. A solder ball may be used instead of the bump.

A groove 4043 and a groove 4044 are formed by cutting on the edge of the first lead frame 4041 and the edge of the second lead frame 4042 which are opposite to each other. The grooves 4043, 4044 have such a form that both ends of the submount 4020 can be fitted substantially without leaving any gap, whereby the position of the submount 4020 is specified. The first and second lead frames 4041, 4042 and the submount 4020 are fixed with the aid of solder (such as Sn—Ag-based cream solder) 4035.

In this example, the depth of the groove 4043 and the groove 4044 was regulated so that the surface of the first and second lead frames 4041, 4042 is substantially level with the surface of the submount 4020. This can facilitate the regulation of light (particularly laterally released light) emitted from the light emitting element 4010.

Further, a construction may also be adopted in which the depth of the groove is increased to reflect light emitted from the light emitting element 4010 by the side wall of the groove.

Figure 77:
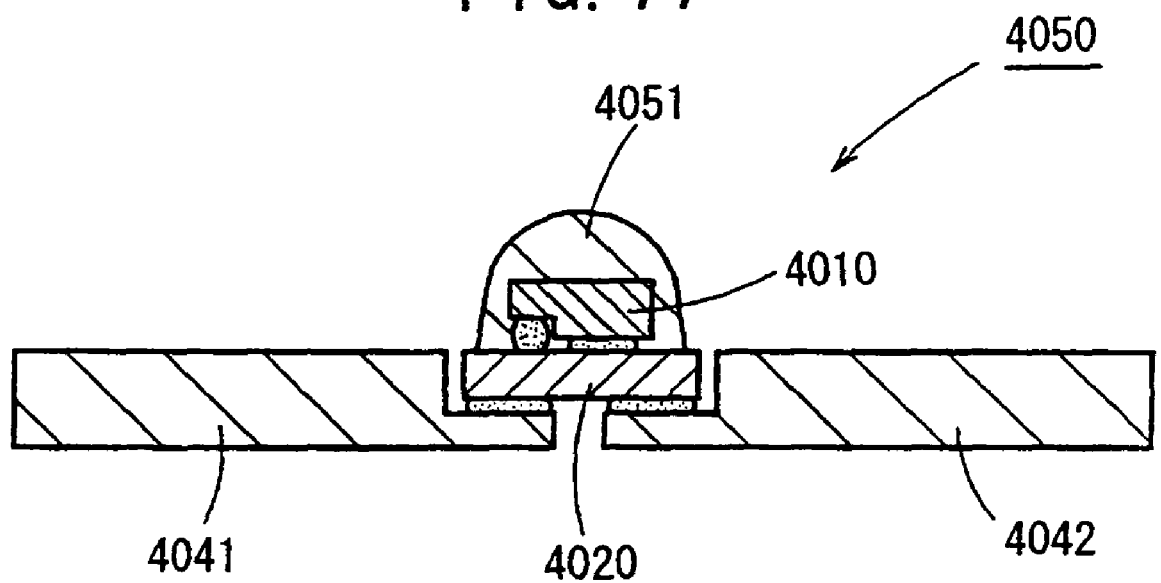
FIG. 77 is a cross-sectional view showing the construction of a luminescent device in a working example provided with a sealing member.

Thereafter, as shown in FIG. 77, the light emitting element 4010 is covered by the sealing member 4051 to prepare a luminescent device 4050 of this example. The inclusion of a fluorescent material in the sealing member 4051 can produce any desired luminescent color such as white. The sealing member 4051 is properly selected from those transparent to light emitted from the light emitting element, for example, depending upon applications of the luminescent device. Examples thereof include organic materials such as epoxy resins, polyimides, and silicone elastomers and inorganic materials such as low melting glass. In this example, the sealing member 4051 is molded using an imide resin which can withstand reflow, followed by soldering of the submount 4020 to the first and second lead frames 4041, 4042.

Figure 78:
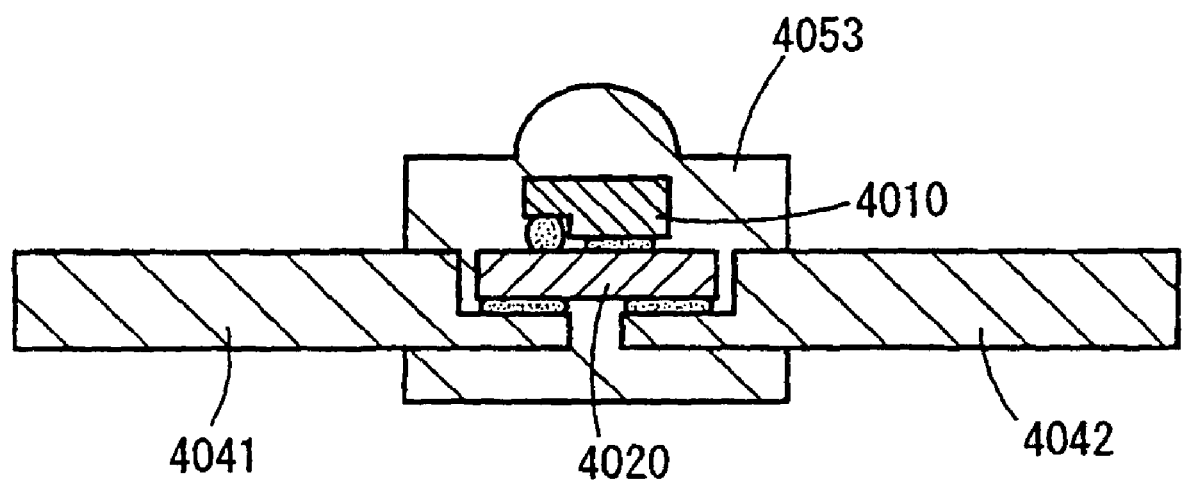
FIG. 78 is a cross-sectional view showing the construction of a luminescent device in a working example provided with a sealing member in another embodiment.
Figure 79:
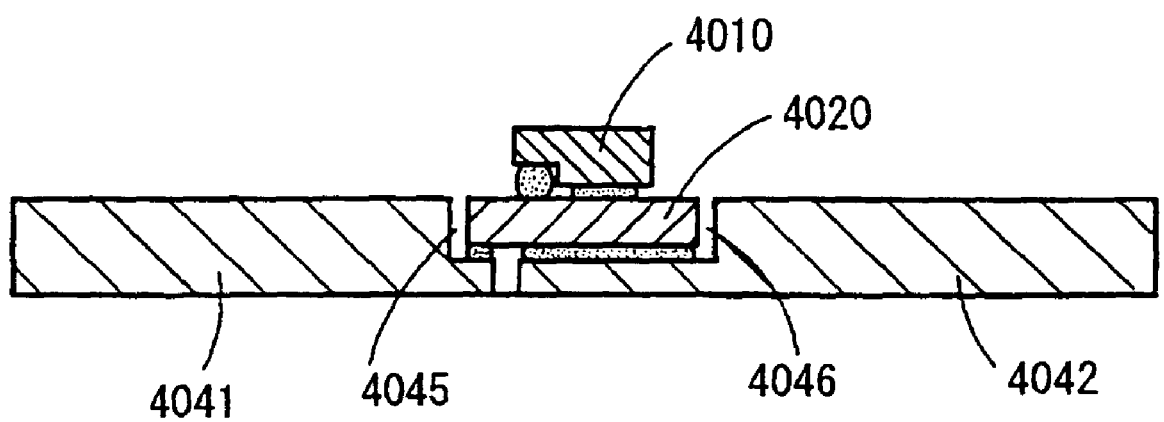
FIG. 79 is a cross-sectional view showing a lead frame in another embodiment.

Another embodiment of the sealing member 4053 is shown in FIG. 78. In this example, the end of the first and second lead frames 4041, 4042 and the submount 4020 are also covered by the sealing member 4053. The sealing member 4053 is formed by fixing the submount 4022 into the first and second lead frames 4041, 4042 and then conducting molding. An epoxy resin may be adopted as the molding material.

In the luminescent device 4050 in this example having the above construction, heat generated in the light emitting element 4010 is conveyed substantially evenly to the first and second lead frames 4041, 4042 through the submount 4020. Accordingly, the heat transfer path is satisfactorily ensured to improve heat dissipation efficiency.

The position of the submount 4020, that is, the position of the light emitting element 4010, is specified by the groove 4043 and the groove 4044. Therefore, stable light distribution characteristics can be realized in the luminescent device.

Variants of each element in this example will be explained. Parts identical to those shown in FIGS. 77 and 78 are identified with the same reference characters, and the explanation thereof will be omitted.

Figure 80:
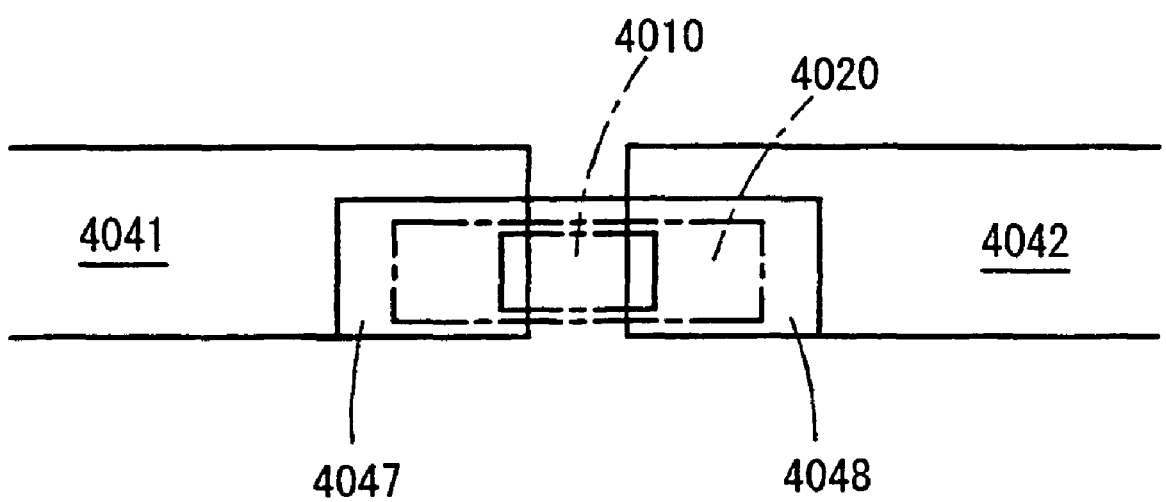
FIG. 80 is a plan view showing a lead frame in still another embodiment.

In the example shown in FIG. 80, the groove 4045 in the first lead frame 4041 is shorter, and the groove 4046 in the second lead frame 4042 is longer. According to this construction, the member (peripheral wall of the groove 4046) of the second lead frame 4042 is located just under the light emitting element 4010. Thus, the distance from the light emitting element 4010 to the lead frame is the shortest, and heat can be more efficiently released from the light emitting element 4010.

In the example shown in FIG. 80, the groove 4047 and the groove 4048 are open to the side face of the lead frames 4041, 4042. This can further facilitate setting of the submount 4020 in the groove 4047 and the groove 4048.

Figure 81:
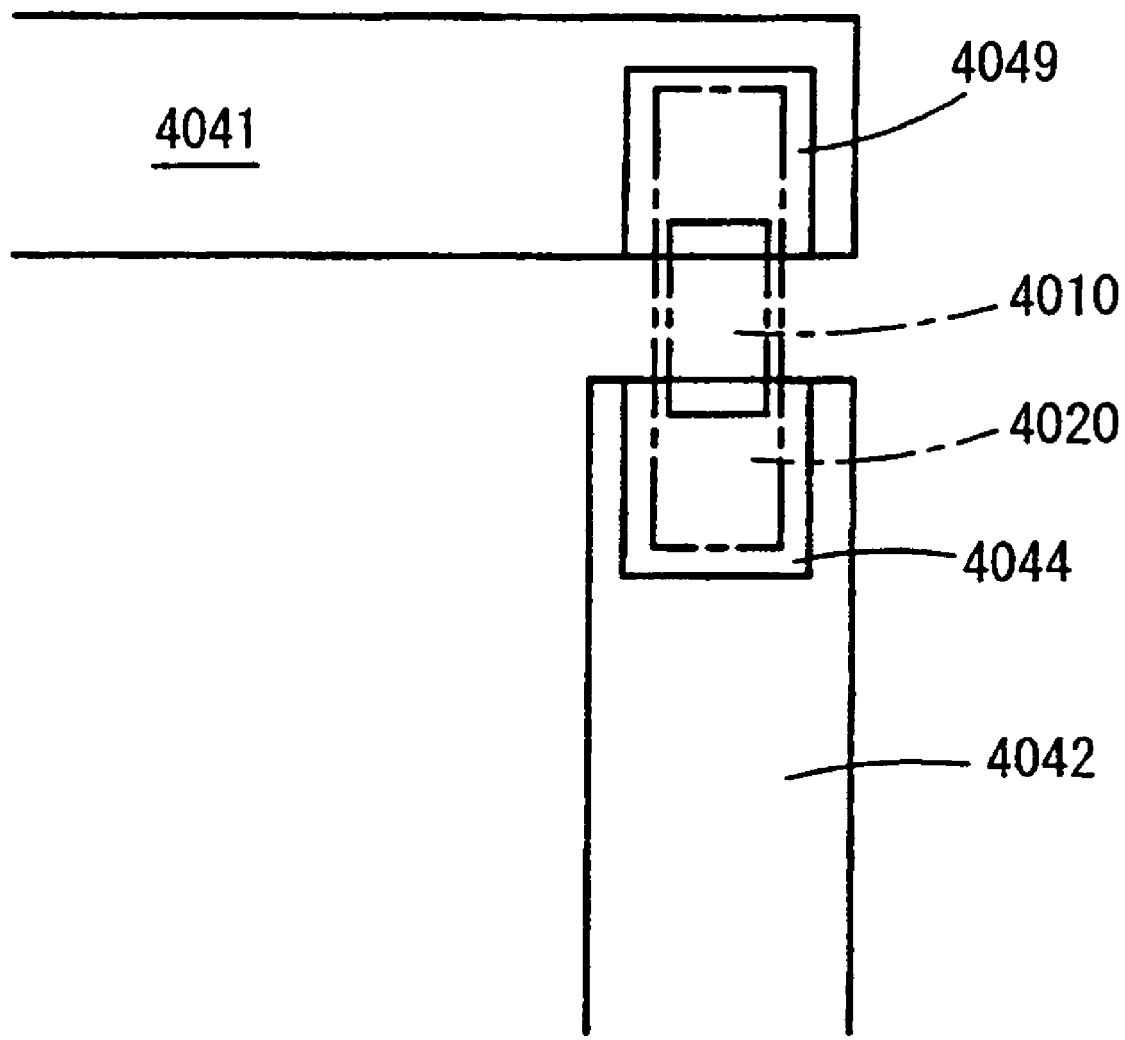
FIG. 81 is a plan view showing a lead frame in a further embodiment.

In the example shown in FIG. 81, a groove 4049 was formed in the side direction of the first lead frame 4041. As can be seen from this example, the direction and position of formation of the groove in the lead frame is any direction and position and may be properly selected depending upon the applications of the luminescent device.

Figure 82:
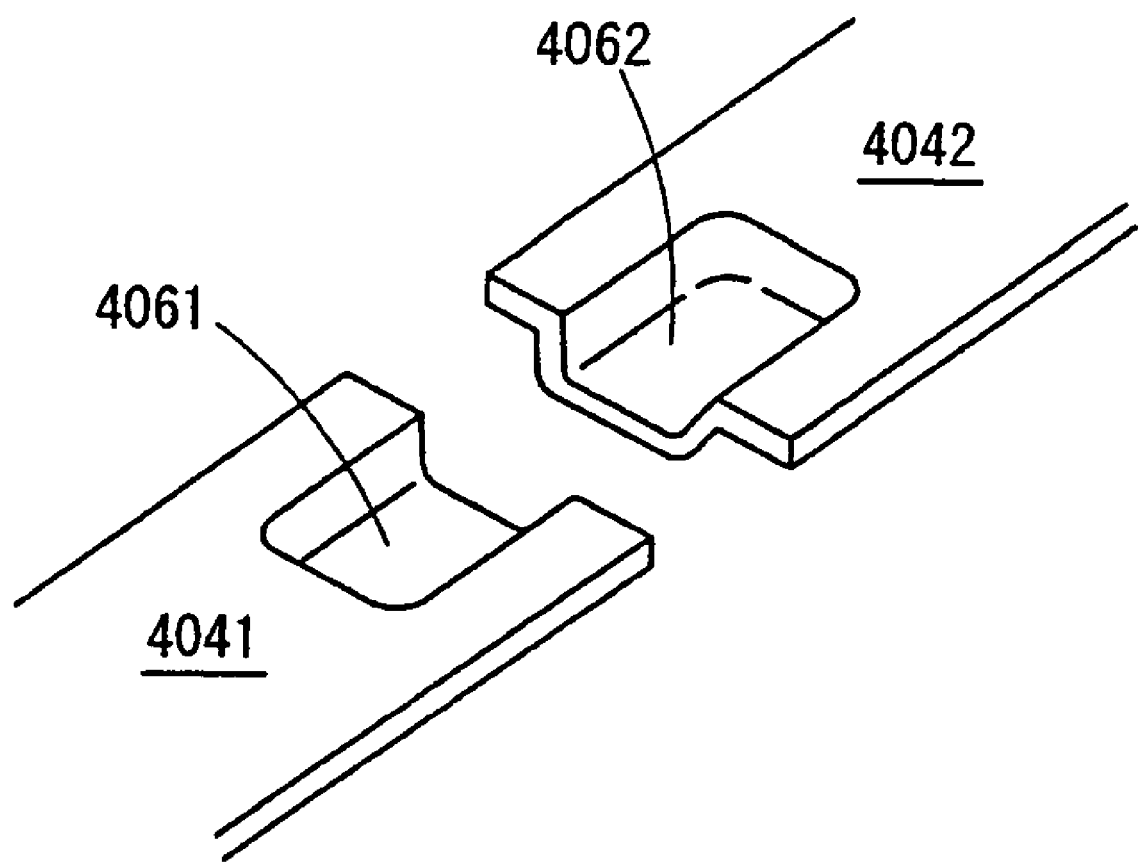
FIG. 82 is a perspective view showing a lead frame in a still further embodiment.

In the example shown in FIG. 82, concave parts 4061, 4062 are formed on the front end of the first and second lead frames 4041, 4042 by pressing. As with the embodiment shown in FIG. 76, a submount can be set in the concave parts 4061, 4062.

Figure 83:
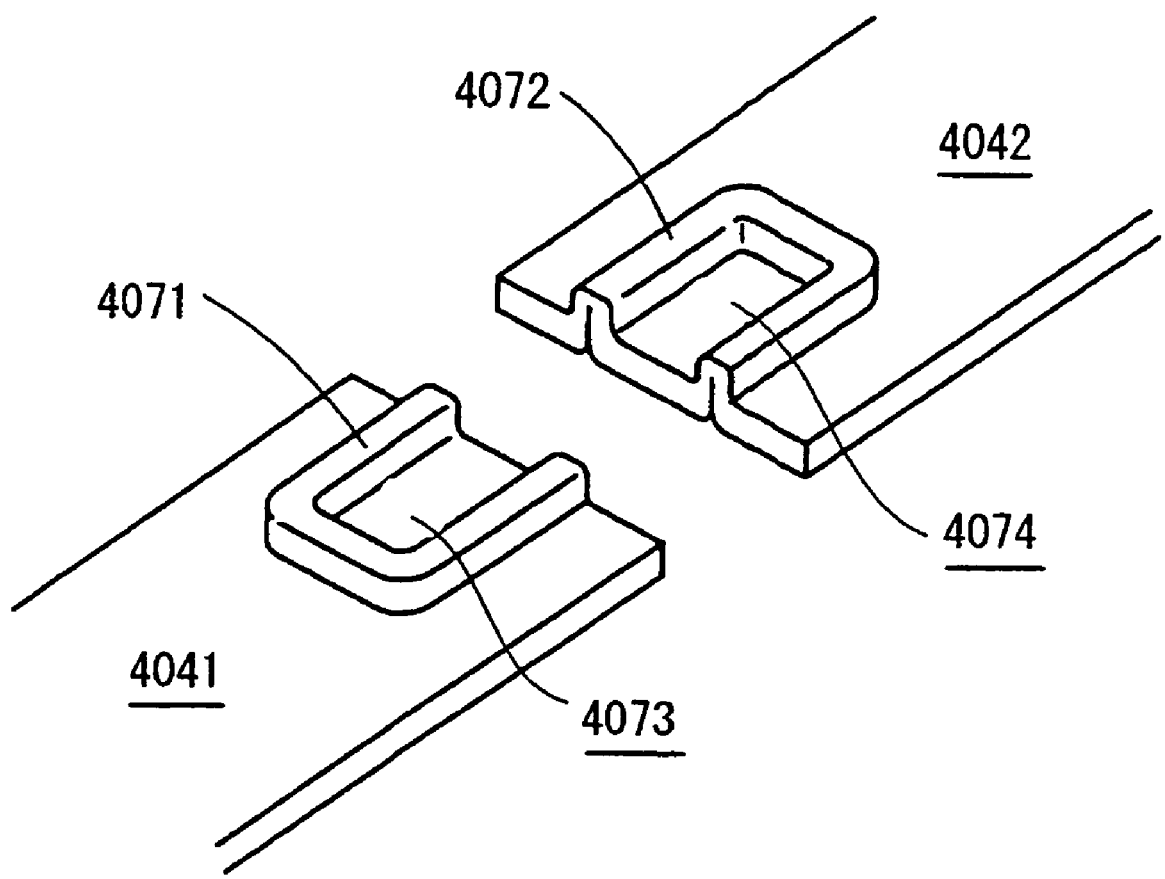
FIG. 83 is a perspective view showing a lead frame in another embodiment.

In the example shown in FIG. 83, ⊐-shaped convexes 4071, 4072 were formed by pressing on the front end of the first and second lead frames 4041, 4042. The parts surrounded by the convexes 4071, 4072 constitute concaves 4073, 4074. As with the embodiment shown in FIG. 76, a submount is set in the concave parts 4073, 4074.

Figure 84:
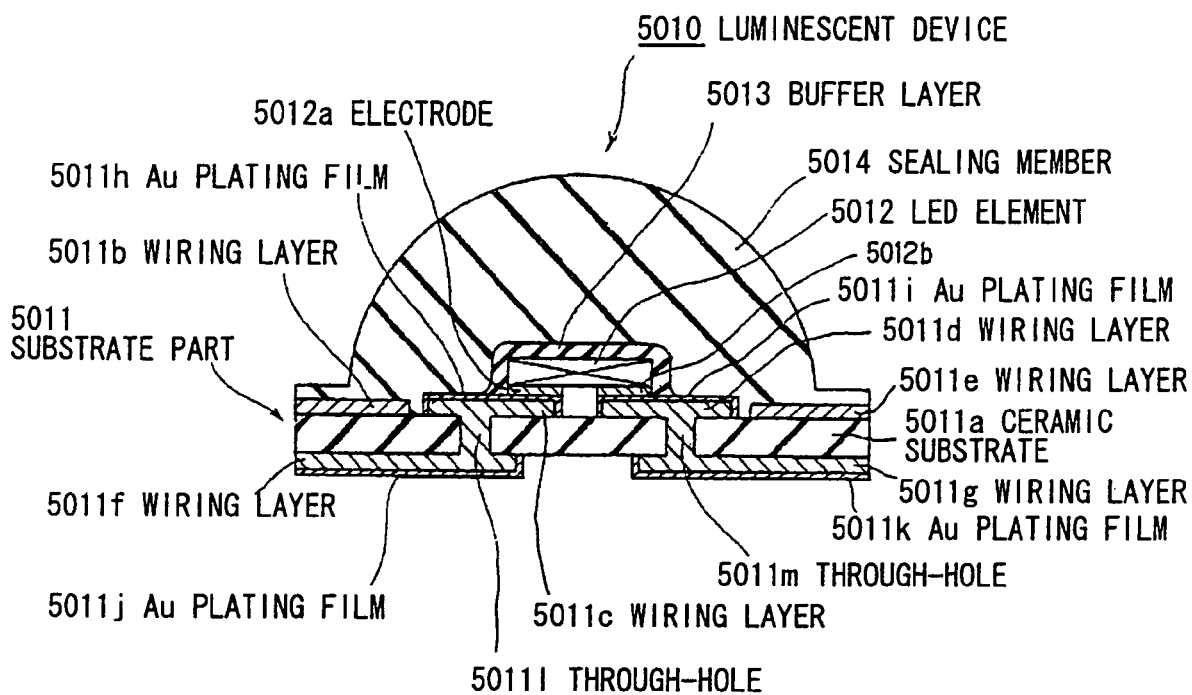
FIG. 84 is a cross-sectional view showing the construction of a luminescent device in a thirteenth embodiment.

FIG. 84 is a cross-sectional view showing the construction of the luminescent device in the thirteenth embodiment. This luminescent device 5010 includes a substrate part 5011 as a power supply member, an LED element 5012 mounted on the upper surface of the substrate part 5011, a buffer layer 5013 sealed so as to cover the LED element 5012 on the upper surface of the substrate part 5011, and a sealing member 5014 formed so as to cover the upper surface of the buffer layer 5013 and the substrate part 5011.

The substrate part 5011 includes a ceramic substrate 5011$a$ (an insulating substrate) with a high expansion coefficient, wiring layers 5011$b$, 5011$c$, 5011$d$ and 5011$e$ formed in a predetermined pattern on the upper surface of the ceramic substrate 5011$a$, wiring layers 5011$f$, 5011$g$ formed in a predetermined pattern on the lower surface of the ceramic substrate 5011$a$, an Au plating film 5011$h$ covered on the surface of the wiring layer 11$c$, an Au plating film 5011$i$ covered on the surface of the wiring layer 5011$d$, an Au plating film 5011$j$ covered on the surface of the wiring layer 5011$f$, an Au plating film 5011$k$ covered on the surface of the wiring layer 5011$g$, a through-hole 5111 for connecting the wiring layer 5011$b$ to the wiring layer 5011$f$, and a through-hole 5011$m$ for connecting the wiring layer 5011$d$ to the wiring layer 5011$g$.

The ceramic substrate 5011$a$ may be made of, for example, glass-containing $Al_2O_3$ material (coefficient of thermal expansion: $13.2 \times 10^{-6}/°C$.). The wiring layers 5011$b$, 5011$d$, 5011$j$, 5011$g$ function as electrodes for supplying electric power. The Au plating films 5011$h$, 5011$i$, 5011$j$, 5011$k$ are provided for improving connectivity, electrical conductivity, and corrosion resistance. In the substrate part 5011, before mounting the LED element 5012, the wiring layers 5011$b$ to 5011$g$, the Au plating films 5011$h$, 5011$i$, 5011$j$, the Au plating film 5011$k$, and the through-holes 5111, 5011$m$ should be previously formed in the ceramic substrate 5011$a$.

For example, the LED element 12 is made of a semiconductor such as GaN or AlInGaP, and the chip size is, for example, 0.3×0.3 mm (standard size) or 1×1 mm (large size). The buffer layer 5013 is made of a silicone resin. The sealing member 5014 is made of, for example, "K-PSK100" (coefficient of thermal expansion: $11.4 \times 10^{-6}/°C$.) manufactured by Sumita Optical Glass, Inc.

The sealing member 5014 is made of a glass material which is transparent to light and has a low melting point. The LED element 5012 has on its lower surface electrodes 5012$a$, 5012$b$ for power supply, and the electrodes 5012$a$, 5012$b$ are soldered onto a predetermined wiring layer in the substrate part 11.

Assembling of the luminescent device 10 will be explained.

At the outset, the LED element 5012 is positioned so that the electrodes 5012$a$, 5012$b$ are placed on the wiring layers 5011$c$, 5011$d$ in the substrate part 5011. The wiring layer 5011$c$ is soldered to the electrode 5012$a$, and the wiring layer 5011$d$ is soldered to the electrode 5012$b$.

Next, a liquid silicone resin material is dropped from just above the center part of the LED element 5012 for coating in a layer form on the upper surface and the whole side face of the LED element 5012 to form a buffer layer 13.

Next, in such a state that the buffer layer 5013 has been formed, the substrate part 5011 and the LED element 5002 are placed in an atmosphere of about 150° C. to subject the buffer layer 5013 to primary curing.

Next, a sealing member 5014 made of a glass material is sealed on the surface of the buffer layer 5013 and the surface of the substrate part 5011. A mold is used for sealing of the sealing member 5014, and molding into a semi-circular shape as shown in FIG. 84 is carried out in a predetermined temperature atmosphere by a press. Thus, the luminescent device 5010 is completed. During the glass sealing, in the silicone resin, the chemical bond is broken by heat to form $SiO_2$. In this case, however, any blackening phenomenon does not occur, and light absorption does not occur.

In the luminescent device 5010 having the above construction, for example, when the wiring layer 5011$f$ is located on the anode side of the LED element 5012, a positive side of a direct current source (not shown) is connected to the wiring layer 5011$f$, and a negative side is connected to the wiring layer 5011$g$. When a forward voltage is applied to the LED element 12 through the bump 2 electrically connected to a pad electrode 5108 and an n-type electrode 5109, carrier recombination of hole and electron occurs within the light emitting layer in the LED element 5012 resulting in light emission. Output light is radiated to the outside of the LED element 5012 through the sapphire substrate 5101. This light practically passes through the sealing member 5014 and goes to the outside of the sealing member 5014, and a part of the light is reflected from the inner surface and goes to the outside of the sealing member 5014.

The following effects can be attained by the thirteenth embodiment.

(1) Sealing of the whole area with the sealing member 5014 made of a glass material can reduce light attenuation caused by yellowing or coloring which is a problem associated with resin sealing.

(2) The provision of the buffer layer 5013 around the LED element 5012 can relax external force which is applied to the LED element 5012 through a high viscose glass material at the time of sealing of the sealing member 5014. That is, due to the interposition of the buffer layer 5013, the LED element 5012 does not come into direct contact with the sealing member 5014. Therefore, stress produced by heat expansion and heat shrinkage can be absorbed by the buffer layer 13.

(3) Glass sealing of the LED element 5012 through the buffer layer 5013 can prevent the occurrence of cracks near the LED element 5012. The construction in which the buffer layer 5013 is provided is particularly effective in a large (1 mm×1 mm) LED element 5012 in which the area of contact with the sealing member 5014 is large.

(4) Short-circuiting between-electrodes caused by collapse of the bump 5002 can be prevented by surrounding the LED element 5012 by the buffer layer 5013. Further, since the buffer layer 5013 can suppress the breaking of the bump shape, inclination of the optical axis of the LED element 5012 by glass sealing can be prevented.

(5) When the LED element 5012 is formed by scribing a wafer, fine concaves and convexes are formed on the side face of the scribed LED element 5012. In the glass sealing-type luminescent device 5010, the concaves and convexes cause a stress unequal part, at the interface of the LED element 5012 and the sealing member 5014, which is causative of microcracking. In this case, microcracking can be prevented upon heating shrinkage of the sealing member 5014 by providing a buffer layer 5021 on the side face as the scribing face of the LED element 5012.

Figure 85:
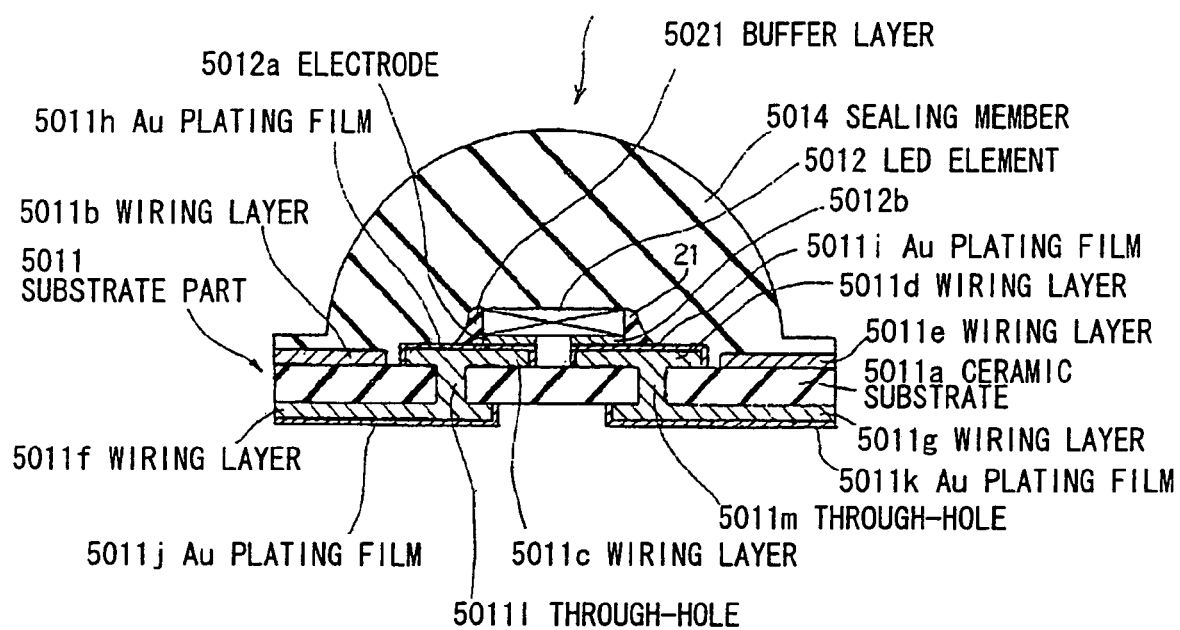
FIG. 85 is a cross-sectional view showing a variant of a luminescent device in the thirteenth embodiment.

FIG. 85 is a cross-sectional view showing a variant of the luminescent device in the thirteenth embodiment. This luminescent device 5020 is different from the luminescent device in the thirteenth embodiment in that the buffer layer 5021 is provided only on the side face of the LED element 5012. This construction also can reduce short-circuiting between-electrodes caused by collapse of the bump 5002 and stress attributable to heat shrinkage of the sealing member 5014. Further, since the buffer layer is not provided on the substrate side of the LED element 12, the takeout of light emitted from the LED element 5012 is not inhibited.

Figure 86:
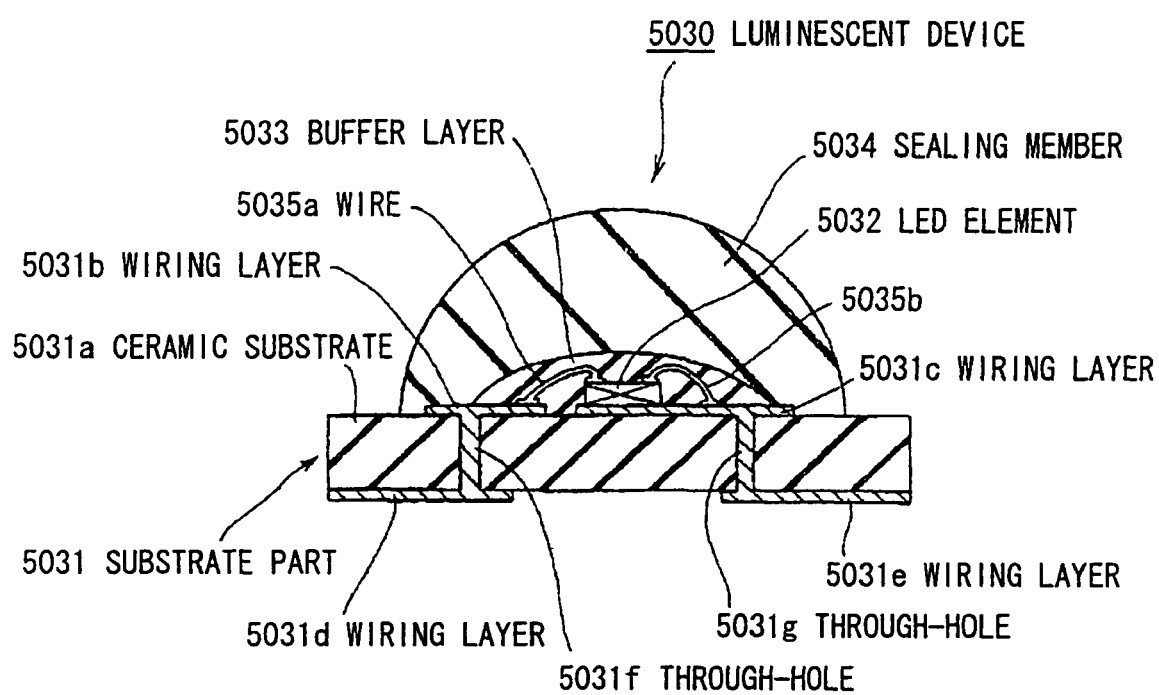
FIG. 86 is a cross-sectional view showing a luminescent device in a fourteenth embodiment.

FIG. 86 is a cross-sectional view showing a luminescent device in the fourteenth embodiment. A luminescent device 5030 shown in FIG. 86 is of a face up type and includes a substrate part 31 as a power supply member, an LED element 5032 mounted on the upper surface of the substrate part 31, a buffer layer 5033 sealed so as to cover the whole LED element 5032, a sealing member 5034 formed so as to cover the upper surface of the buffer layer 33 and the substrate part 31, and wires 5035a, 5035b for connecting the electrode on the LED element 5032 to the wiring layer on the substrate part 5031.

The substrate part 5031 includes a ceramic substrate 5031a as an insulating substrate using the same material as the substrate part 5011 shown in FIG. 84, wiring layers 5031b, 5031c formed in a predetermined pattern on the upper surface of the ceramic substrate 5031a, wiring layers 5031d, 5031e formed in a predetermined pattern on the lower surface of the ceramic substrate 5031a, a through-hole 5031f for connecting the wiring layer 5031b to the wiring layer 5031d, and a through-hole 5031g for connecting the wiring layer 5031c to the wiring layer 5031e. An Au plating film (not shown) is provided on the surface of the wiring layers 5031b to 5031e.

The ceramic substrate 5031a may be made of, for example, a glass-containing $Al_2O_3$ material. The wiring layers 5031b to 5031e function as an-electrode for supplying electric power. Regarding the substrate part 5031, before mounting the LED element 5032, the wiring layers 5031b to 5031e and the through-holes 5031f, 5031g should be previously formed on the ceramic substrate 5031a. The sealing member 5034 is made of a glass material which is transparent to light and has a low melting point.

The LED element 5032 is fixed on the wiring layer 5031c with the aid of an adhesive or the like. One electrode (not shown) on the upper surface of the LED element 5032 is connected to the wiring layer 5031b through a wire 5035a, and the other electrode (not shown) on the upper surface of the LED element 5032 is connected to the wiring layer 5031c through a wire 5035b.

The buffer layer 5033 is provided so as to cover the exposed surface of the LED element 5032 and the wires 5035a, 5035b.

The sealing member 5034 is molded in a semispherical shape so as to cover the surface of the buffer layer 5033, and the wiring layer exposed on the upper surface of the substrate part 5031 and a part of the exposed part of the substrate part 5031.

Assembling of the luminescent device 5030 will be explained.

At the outset, the substrate part 5031 comprising the wiring layers 5031b to 5031e and the through-holes 5031f, 5031g formed on the ceramic substrate 5031a is provided. The LED element 5032 is mounted on the wiring layer 5031c in its predetermined position.

Next, the LED element 5032 is bonded to the wiring layers 5031b, 5031c through the wires 5035a, 5035b.

Next, a liquid silicone material is dropped to a predetermined thickness so as to cover the exposed face of the LED element 5032 and the wires 5035a, 5035b.

The LED element 5032 and the wires 5035a, 5035b are placed in an atmosphere of about 150° C. to subject the buffer layer 5033 to primary curing. Thereafter, a sealing member 5034 is formed by molding of a glass material around the buffer layer 5033. Thus, the luminescent device 5030 is completed.

In this luminescent device 5030, for example, when the wiring layer 5031d is located on the anode side of the LED element 5032, a positive side of a direct current source (not shown) is connected to the wiring layer 5031d, and a negative side is connected to the wiring layer 5031e. Upon energization, the LED element 5032 emits light. This light goes out from the upper surface of the LED element 5032 in the drawing. A major part of the light is passed through the sealing member 5034 to the outside of the device, and another part of the light is internally reflected within the sealing member 5034 and then goes out to the outside of the sealing member 5034.

In the fourteenth embodiment, the buffer layer 5033 is provided around the LED element 5032 in the luminescent device 5030 on which the LED element 5032 is mounted in a face up manner. Therefore, an unfavorable phenomenon can be prevented in which, during sealing of the glass material, the wires 5035a, 5035b are deformed or collapsed resulting in short-circuiting between-electrodes. As with the first embodiment, cracking near the LED element 5012 attributable to a high level of thermal expansion of the sealing member 5034 can be prevented.

For example, when the buffer layer 5033 is not provided, setting the temperature after glass sealing to a high value causes damage to the LED element. Therefore, there is restriction on the temperature, and the glass sealing is carried out in such a state that the glass is highly viscous. As a result, the application of external force to the wires 5035a, 5035b is unavoidable, and it is difficult to maintain the wires 5035a, 5035b in a desired position. For example, when the wire 5035a is collapsed by pressing of the glass material, the wiring layers 5031b and 5031c cause short circuiting. In this case, light emission does not occur, and, in addition, there is an influence on the power supply side (not shown). Incidentally, this problem does not occur in the resin material.

In the face up-type LED element, the presence of the wire as the metal member on the upper surface per se functions as the buffer material. Disadvantageously, however, the wire collapses leading to an electrical short-circuiting problem. Therefore, even when any element like the buffer material is absent, the provision of any electrical short circuiting preventive element through the prevention of collapse and the like is important.

Figure 87:
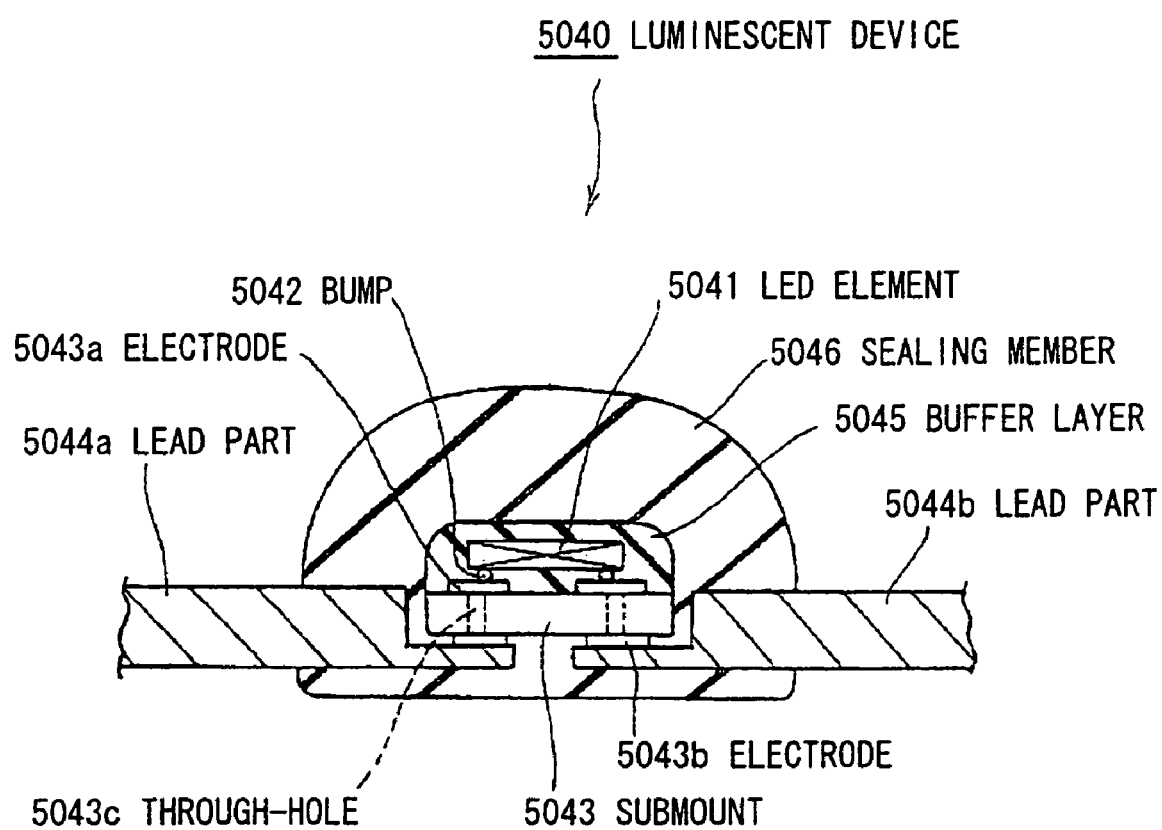
FIG. 87 is a cross-sectional view showing the construction of a luminescent device in a fifteenth embodiment.

FIG. 87 is a cross-sectional view showing a luminescent device in the fifteenth embodiment of the invention. In this luminescent device 5040, a submount 5043 on which an LED element 5041 is mounted is mounted on lead parts 5044a, 5044b. In FIG. 87, the submount is shown in a non-cross-sectional state.

This luminescent device 5040 includes an LED element 5041 in which a bump 5042 is provided on the mounting face, a submount 5043 on which the LED element 5041 is mounted, lead parts 5044a, 5044b as a power supply member on which the submount 5043 is mounted, a buffer layer 5045 provided so as to cover the exposed face of the LED element 5041, and a sealing member 5046 made of light transparent glass to seal the buffer layer 5045 and the periphery of the buffer layer 5045.

The submount 5043 is made of, for example, AlN (aluminum nitride) with a high level of thermal conductivity, and the electrode 5043a connected to the bump 5042 is formed on the mounting face side of the LED element 5041. An-electrode 5043b connected to a pair of lead parts 5044a, 5044b is formed on the opposite side (face on the lead frame side). A through-hole 5043c is provided within the submount 5043 to connect the electrode 5043a to the electrode 5043b.

Lead parts 5044a, 5044b are formed as a part of the lead frame so as to face each other while providing a predetermined gap therebetween on the inner side of the strip part on both sides, and a pair of lead parts are allocated to one LED element. A part of the front end part of the lead parts 5044a, 5044b is formed in a small thickness so as to provide a level difference, and the submount 5043 is mounted in this level different part.

The buffer layer 5045 is provided based on the same material and processing as the buffer layers 5013, 5021 and 5033 shown in the above-described other embodiments.

As with the above-described other embodiments, the sealing member 5046 is made of a glass material which is transparent to light and has a low melting point.

In this luminescent device 5040, when the lead part 5044a is a positive (+) power supply terminal, the current supplied to the lead part 5044a passes through the lead part 5044a, one electrode 5043b, one through-hole 5043c, one electrode 5043a, and one bump 42 and flows to the anode of the LED element 5041. The current output from the cathode of the LED element 41 passes through the other bump 5042, the other electrode 5043a, the other through-hole 5043c, and the other electrode 5043b and flows to the lead part 5044b, whereby the LED element 5041 emits light.

Assembling of the luminescent device 5040 will be explained.

At the outset, a submount 5043 on which electrodes 5043a, 5043b and a through-hole 5043c have been previously formed is provided. An LED element 5041 is mounted on the submount 5043 in its predetermined position through a bump 5042, whereby the LED element 5041 is electrically connected and mechanically fixed.

Next, the LED element 5041 mounted on the submount 5043 is disposed within a recess provided at the front end part of the lead parts 5044a, 5044b so that energization direction is identical.

Next, a liquid silicone material is dropped to a predetermined thickness so as to cover the periphery of the LED element 5041.

The LED element 5032, the submount 5043, and the lead parts 5044a, 5044b are placed in an atmosphere of about 150° C. to perform primary curing, thereby forming the buffer layer 5045 around the LED element 5032.

The glass sheet for forming the sealing member 5045 is disposed on and under the LED element 5041. Further, a mold is disposed, on the upper side and lower side of the LED element 5041.

Next, a glass sheet is molded into a predetermined form by pressing using the molds in an atmosphere of a predetermined temperature. Thus, a luminescent device 5040 is completed. Finally, the other end of the lead parts 5044a, 5044b is separated from the lead frame for isolation into individual luminescent devices 5040.

In the fifteenth embodiment, in sealing the LED element 5041 mounted on the submount 5043 with a high level of thermal conductivity by a glass material, the buffer layer 5045 can prevent cracking or separation around the LED element 5041 and the submount 5043 due to a difference in coefficient of thermal expansion.

In the luminescent device 5040, a phosphor may be mixed in the buffer layer 5045. In this case, wavelength conversion takes place based on mixing of excitation light emitted from the phosphor excited by light emitted from the LED element 5041 with light emitted from the LED element 5041. For example, Ce (cerium):YAG (yttrium aluminum garnet), which is excited by blue light emitted from the LED element 5041 and emits yellow light, may be mentioned as the phosphor.

Figure 88:
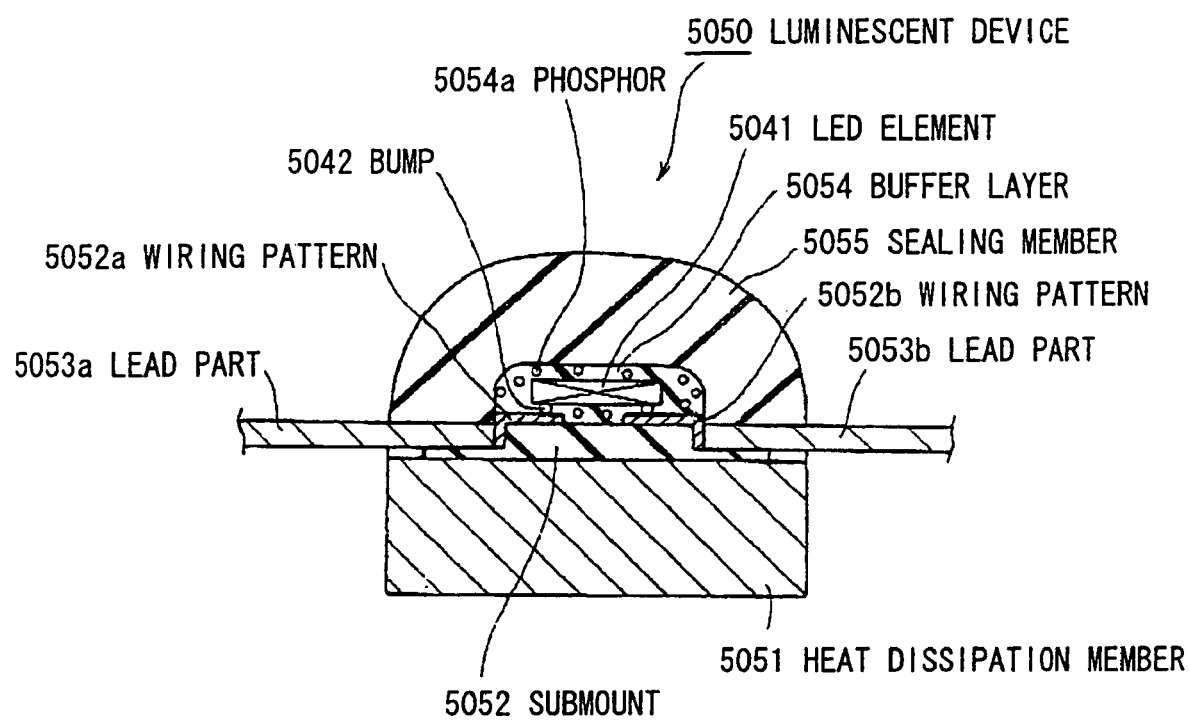
FIG. 88 is a cross-sectional view showing the construction of a luminescent device in a sixteenth embodiment.

FIG. 88 is a cross-sectional view showing a luminescent device in the sixteenth embodiment of the invention. This luminescent device 5050 has a construction comprising a heat dissipating member mounted on the luminescent device 5040 shown in FIG. 87. That is, this luminescent device is characterized in that a heat dissipating member 5051 using a metallic material having a high level of thermal conductivity such as copper is mounted on the lower part of the submount 5052 such as AlN.

The luminescent device 5050 includes a heat dissipating member 5051 which functions as a radiator, a submount 5052 mounted on the heat dissipating member 5051, lead parts 5053a, 5053b of which the front end is mounted on a level difference part on both ends of the submount 5052, an LED element 5041, which has a pair of bumps 5042 for power supply on its lower surface and is mounted on the submount 5052, a buffer layer 5054 provided so as to cover the exposed face of the LED element 5041, and a sealing member 5055 made of low-melting transparent glass for sealing the buffer layer 5054 and the periphery of the buffer layer 5054.

The submount 5052 is worked in a small thickness so as to cause a level difference in a predetermined range on both ends, and the front end of the lead parts 5053a, 5053b is mounted on the small thickness part. The front end is connected to the side face of the wiring patterns 5052a, 5052b by soldering or the like. Further, wiring patterns 5052a, 5052b in contact with a pair of bumps 5042 are provided on the submount 5052 from the upper surface toward the side face.

The buffer layer 5054 has stress buffering and wavelength conversion function imparted by mixing a phosphor in a Si-based alkoxide and sintering the mixture to form a phosphor-containing $SiO_2$ in a porous state as the buffer layer.

As explained in the fifteenth embodiment, Ce (cerium): YAG (yttrium aluminum garnet) and the like may be used as the phosphor.

The luminescent device 5050 in the sixteenth embodiment may be assembled as explained in the fifteenth embodiment, and, thus, overlapped explanation thereof will be omitted. That is, after the part above the submount 5052 in FIG. 88 is completed, the heat dissipating member 5051 may be mounted on the lower face with the aid of an adhesive.

The following effects can be attained by the sixteenth embodiment.

(1) Since the heat dissipating member 5051 for promoting heat dissipation is provided on the lower part of the submount 5052, heat generated upon lighting of the LED element 5041 can be efficiently diffused to the outside of the device, and the occurrence of thermal expansion and thermal shrinkage upon a temperature rise of the sealing member 5055 made of a glass material and the like can be suppressed to prevent the occurrence of cracking.

(2) Mixing the phosphor in the buffer layer 5054 can realize wavelength conversion and, at the same time, can improve light takeout efficiency.

In the above embodiments, a reflecting surface may be formed on the surface of the substrate parts 5011, 5031 and the lead parts 5044a, 5044b, 5053a, 5053b to enhance light outgoing efficiency.

A method may also be adopted in which a phosphor is mixed in a part of the LED elements 5012, 5032 within the sealing members 5014, 5034, that is, in the upper part of the LED elements 5012, 5032, or a phosphor for wavelength conversion may be mixed in the buffer layers 5013, 5033.

When the buffer layer 5054 is made of a $TiO_2$-based ceramic material, the refractive index is as high as 2.4. Therefore, efficiency of takeout of light from the LED element 5041 can be enhanced.

In the above embodiments, one LED element was provided within one sealing member. Alternatively, however, two or more LED elements may be provided to constitute a multi-emission-type luminescent device. In this case, a plurality of LED elements to be mounted may be different from each other in emission color, or alternatively the plurality of LED elements may be identical to each other in emission color. Further, regarding the drive mode of the LED elements, all of the plurality of LED elements may be connected in parallel, or alternatively a plurality of LED element groups may be connected in parallel. Further, a plurality of LED elements may be connected in series, or alternatively all the LED elements may be connected in series.

Further, "K-PSK100" manufactured by Sumita Optical Glass, Inc. was used as the sealing member 5014. The sealing member, however, is not limited to this only and may be other glass so far as the glass can be softened at such a temperature that can realize sealing without causing thermal damage to the light emitting element.

In the above embodiments, the form of the sealing members 5014, 5034, 5046, 5055 is semispherical. The invention, however, is not limited to the form shown in the drawings, and any form such as a form not having any lens part, a polygonal form, or a cylindrical form may be adopted.

Further, in molding the sealing members 5014, 5034, 5046, 5055, the molding method is not limited to pressing using a glass sheet. Other sealing methods, for example, a method in which fused glass is fed to a portion near the LED element and heat molding is carried out in a mold may be adopted.

Further, the buffer layer 5054 is not always required to be porous and may be any layer so far as it has cushioning effect, insulating properties and heat resistance, for example, it is brittle and absorbs stress, and the coefficient of thermal expansion is intermediate between that of the LED element and that of the sealing glass.

Figure 89:
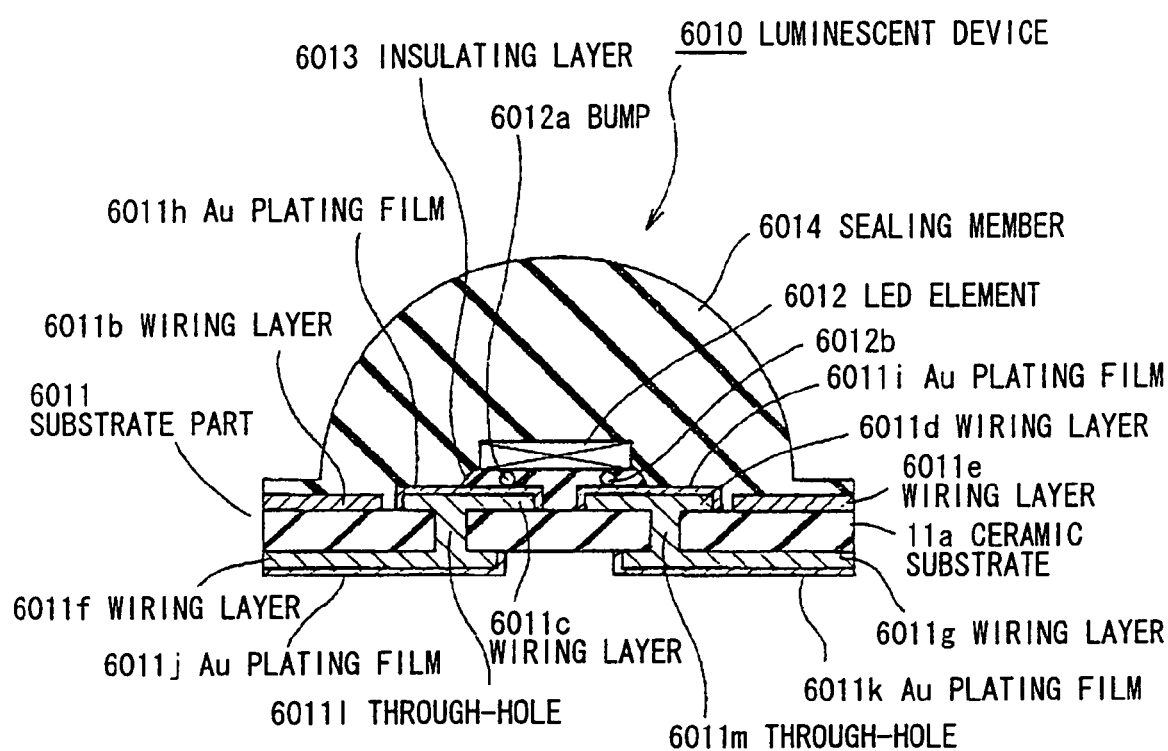
FIG. 89 is a cross-sectional view showing the construction of a luminescent device in a seventeenth embodiment.

FIG. 89 is a cross-sectional view showing the construction of the luminescent device in the seventeenth embodiment of the invention. This luminescent device 6010 includes a substrate part 6011 as a power supply member, an LED element 6012 which has at least a pair of bumps 6012a, 6012b for power supply made of Au and is mounted on the upper surface of the substrate part 6011, an insulating layer 6013 filled into between the lower face of the LED element 6012 and the substrate part 6011, and a sealing member 6014 formed so as to cover the LED element 6012 and the upper surface of the substrate part 6011.

The substrate part 6011 includes a ceramic substrate 6011a, wiring layers 6011b, 6011c, 6011d and 6011e formed in a predetermined pattern on the upper surface of the ceramic substrate 6011a, wiring layers 6011f, 6011g formed in a predetermined pattern on the lower surface of the ceramic substrate 6011a, an Au plating film 6011h covered on the surface of the wiring layer 6011c, an Au plating film 6011i covered on the surface of the wiring layer 6011d, an Au plating film 6011j covered on the surface of the wiring layer 6011f, an Au plating film 6011k coated on the surface of the wiring layer 6011g, a through-hole 6111 for connecting the wiring layer 6011b to the wiring layer 6011f, and a through-hole 6011m for connecting the wiring layer 6011d to the wiring layer 6011g.

The ceramic substrate 6011a may be made of, for example, glass-containing $Al_2O_3$ material (coefficient of thermal expansion: $13.2\times10^{-6}/°C$.). The wiring layers 6011c, 6011d, 6011f, 6011g function as electrodes for supplying electric power. The Au plating films 6011h, 6011i, 6011j, 6011k are provided for improving connectivity, electrical conductivity, and corrosion resistance. In the substrate part 6011, before mounting the LED element 6012, the wiring layers 6011b to 6011g, the Au plating films 6011h, 6011i, 6011j, the Au plating film 6011k, and the through-holes 6011l, 6011m are previously formed in the ceramic substrate 6011a.

For example, the LED element 6012 is made of a semiconductor such as GaN or AlInGaP, and the chip size is, for example, 0.3×0.3 mm (standard size) or 1×1 mm (large size). The LED element 6012 has on its lower surface electrodes 6012a, 6012b for power supply, and the electrodes 6012a, 6012b are soldered to a predetermined wiring layer in the substrate part 6011.

The insulating layer 6013 is made of a silicone material, or diamond, BN, SiC or AlN power containing insulating material. When a silicone resin is used as the silicone material, upon exposure to a high temperature involved in sealing of the sealing member 6014, the chemical bond is cleaved to form $SiO_2$ which functions as a heat resistant insulator. Instead of $SiO_2$ formed from the silicone resin, ceramics formed from Si-based, Ti-based or other alkoxides may also be used. The diamond has a high level of thermal conductivity. BN, SiC, and AlN are inferior to diamond in thermal conductivity but are more inexpensive. Diamond, BN, and SiC are transparent or white and have a feature of low light absorption.

The sealing member 6014 is made of a glass material which is transparent to light and has a low melting point, and, for example, "K-PSK100" manufactured by Sumita Optical Glass, Inc. (coefficient of thermal expansion: $11.4\times10^{-6}/°C$.) may be used. According to an experiment conducted by the inventors, in order to provide good bonding between ceramic and glass, the ceramic substrate 6011a and the sealing member 6014 should be substantially identical to each other in coefficient of thermal expansion (the thermal expansion coefficient difference ratio being within 15%), and, in this case, the thermal expansion coefficient ratio is 0.86.

Assembling of the luminescent device 6010 will be explained.

Positioning is carried out so that bumps 6012a, 6012b of Au are put on the wiring layers 6011c, 6011d. The LED element 6012 is provided on the substrate part 6011, and the insulating layer 13 is then formed, for example, by dropping or filling.

Next, the LED element 6012, the exposed area of the insulating layer 6013, and the exposed area of the substrate part 6011 are sealed with the sealing member 6014 by the glass material. A mold is used for sealing of the sealing member 6014, and molding into a semicircular form as shown in FIG. 89 is carried out at a predetermined temperature atmosphere by pressing. In this sealing, the silicone material as the insulating layer 6013 is converted to $SiO_2$, and the lower surface of the LED element 6012 and the bumps 6012a, 6012b are fixed. Therefore, for example, the deformation of bumps 6012a, 6012b and short-circuiting between bumps can be avoided. Thus, the luminescent device 6010 is completed.

In this luminescent device 6010, for example, when the wiring layer 6011f is located on the anode side of the LED element 6012, a positive side of a direct current source (not shown) is connected to the wiring layer 6011f, and a negative side is connected to the wiring layer 6011g. When a forward voltage is applied to the LED element 6012 through the bump 6002 electrically connected to a p-type electrode and an n-type electrode (not shown), in the active layer of the LED element 6012, carrier recombination of hole and electron occurs, resulting in light emission. Output light is radiated to the outside of the LED element 6012. This light practically passes through the sealing member 6014 and goes to the outside of the sealing member 6014, and a part of the light is reflected from the inner surface and goes to the outside of the sealing member 6014.

The following effects can be attained by the seventeenth embodiment.

(1) Sealing of the whole area with the sealing member 6014 made of a glass material can reduce light attenuation caused by yellowing or coloring which is a problem associated with resin sealing.

(2) By virtue of the provision of the heat resistant insulating layer 13 on the lower side of the LED element 6012, during sealing of the sealing member 14, an unfavorable phenomenon can be prevented in which the sealing member 6014 presses in a high temperature state the bumps 6012a, 6012b to damage the LED element 6012. That is, deformation or breaking of bumps 6012a, 6012b under high temperature and high pressure conditions of the sealing member 14 which causes short-circuiting between bumps can be prevented.

(3) When a diamond, BN, SiC or AlN powder-containing insulating material is used, the effect of dissipating heat generated from the LED element 6012 can be expected. Therefore, heat dissipating properties can be improved.

Figure 90:
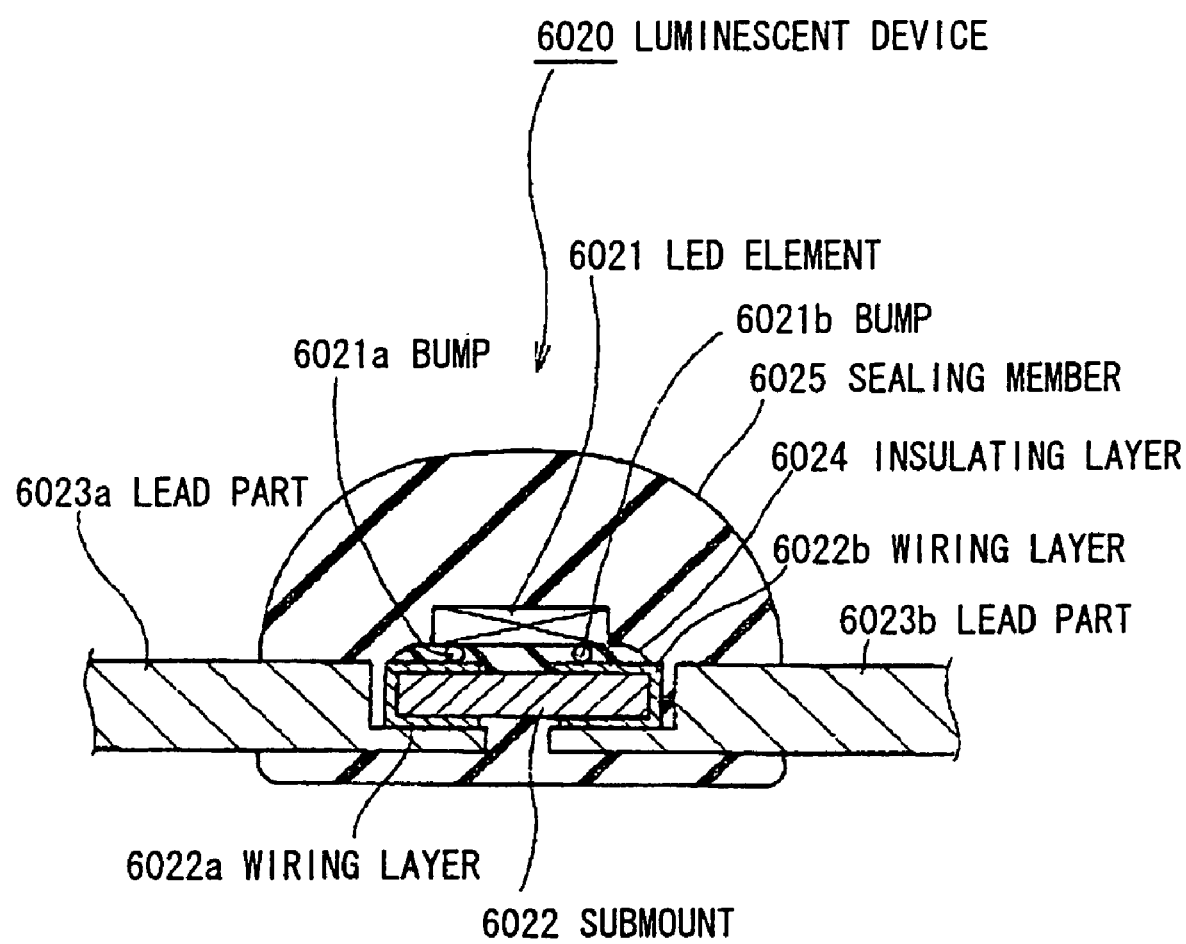
FIG. 90 is a cross-sectional view showing the construction of a luminescent device in an eighteenth embodiment.

FIG. 90 is a cross-sectional view showing the construction of a luminescent device in the eighteenth embodiment. This luminescent device 6020 is of a metal lead type in which a light emitting element is mounted on a lead frame using a submount 6022. The luminescent device 6020 includes an LED element 6021 in which bumps 6021a, 6021b are provided on the mounting face, a submount 6022 on which this LED element 6021 is mounted, lead parts 6023a, 6023b as a power supply member on which the submount 6022 is mounted, an insulating layer 6024 filled into between the upper surface of lead parts 6023a, 6023b and the lower surface of the LED element 6021, and a sealing member 6025 made of a light transparent glass for sealing the end of the insulating layer 6024 and the front end of the lead parts 6023a, 6023b including the surface of the LED element 6021.

The submount 6022 is made of, for example, AlN (aluminum nitride) with a high level of heat conductivity. A wiring layer 6022a connected to one bump 6021a is provided on the upper face, side face, and lower face so as to provide a ⊐-shaped form, and, on the opposite side, the wiring layer 6022b connected to the bump 6021b is provided on the upper face, side face, and lower face so as to provide a ⊐-shaped form.

If necessary, the submount 6022 may incorporate a circuit such as a Zener diode for element destruction preventive purposes. Further, instead of the wiring layers 6022a, 6022b, wiring means comprising a combination of electrodes provided on the upper and lower faces with a through-hole for communication of the upper and lower electrodes with each other may be used.

The lead parts 6023a, 6023b are made of a copper-based or iron-based metal and are provided so as to face each other while providing a predetermined space therebetween on the inner side of the strip part on both sides as a part of a lead frame (not shown), and a pair of lead parts are provided for each one LED element. A part of the front end of the lead parts 6023a, 6023b is formed in a small thickness so as to form a level difference, and a submount 6022 is mounted in this level difference part.

As with the insulating layer 6013 in the seventeenth embodiment, the insulating layer 6024 may be made of a silicone material, or a diamond or AlN powder-containing insulating material. For example, the process of conversion of the silicone material to $SiO_2$ by cleaving of the chemical bond upon sealing of the sealing member 6025, and the heat dissipating effect attained by using a diamond, BN, SiC, or AlN powder-containing insulating material are the same as those in the case of the insulating layer 6013.

As with the above embodiments, the sealing member 6025 is made of a glass material which is transparent to light and has a low melting point.

In this luminescent device 6020, when the lead part 6023a is a positive (+) power supply terminal, current supplied to the lead part 6023a is passed through the lead part 6023a, the wiring layer 6022a, and the bump 6021a and flows to the anode of the LED element 6021. Further, the current output from the cathode of the LED element 21 is passed through the bump 6021b and the wiring layer 6022b and flows to the lead part 6023b, whereby the LED element 6021 emits light.

Assembling of the luminescent device 6020 will be explained.

At the outset, a submount 6022 with wiring layers 6022a, 6022b previously formed thereon is provided. Bumps 6021a, 6021b are formed at predetermined positions on the submount 6022. The LED element 6021 is mounted thereon. The bump 6021a and bump 6021b are connected to the wiring layer 6022a and the wiring layer 6022b, respectively, for electrical connection and mechanical fixation.

Next, the LED element 6021 mounted on the submount 6022 is disposed within the recess at the front end of the lead parts 6023a, 6023b so that the energization direction is made identical. Alternatively, after the LED element 21 is mounted on the submount 6022, the submount 6022 may be mounted on the lead parts 6023a, 6023b.

Next, a silicone material as the insulating layer 6024 is filled into between the lower face of the LED element 6021 and the upper face of the submount 6022 (this filling may be carried out before mounting the submount 22 on the lead parts 6023a, 6023b). In this state, the assembly is carried in the mold. A glass sheet (not shown) for the formation of the sealing member 25 is disposed on and under the LED element 6021, and molding into a semispherical shape is carried out at a predetermined temperature by pressing. In this sealing, the silicone material is converted to $SiO_2$ to form an insulating layer 6024 which fixes the lower face of the LED element 6021 and the bumps 6012a, 6012b. Therefore, for example, the deformation of bumps 6012a, 6012b and short-circuiting between bumps can be avoided. Thus, the luminescent device 6020 is completed. Finally, the other end of the lead parts 6023a, 6023b is isolated from a lead frame (not shown) into individual luminescent devices 6020.

In the eighteenth embodiment, the use of lead parts 6023a, 6023b having excellent adhesion to the glass material and the provision of the insulating layer 6024 on the lower side of the LED element 6021 can avoid damage to the LED element 6021 by the sealing member 6025 at the time of sealing of the sealing member 6025, and, thus, deformation, movement, short-circuiting or the like in the bumps 6021a, 6021b can be prevented. Further, sealing of the whole assembly with the sealing member 6025 made of a glass material can prevent light attenuation caused by yellowing or coloration as in the case where the sealing member is made of a resin material.

Figure 91:
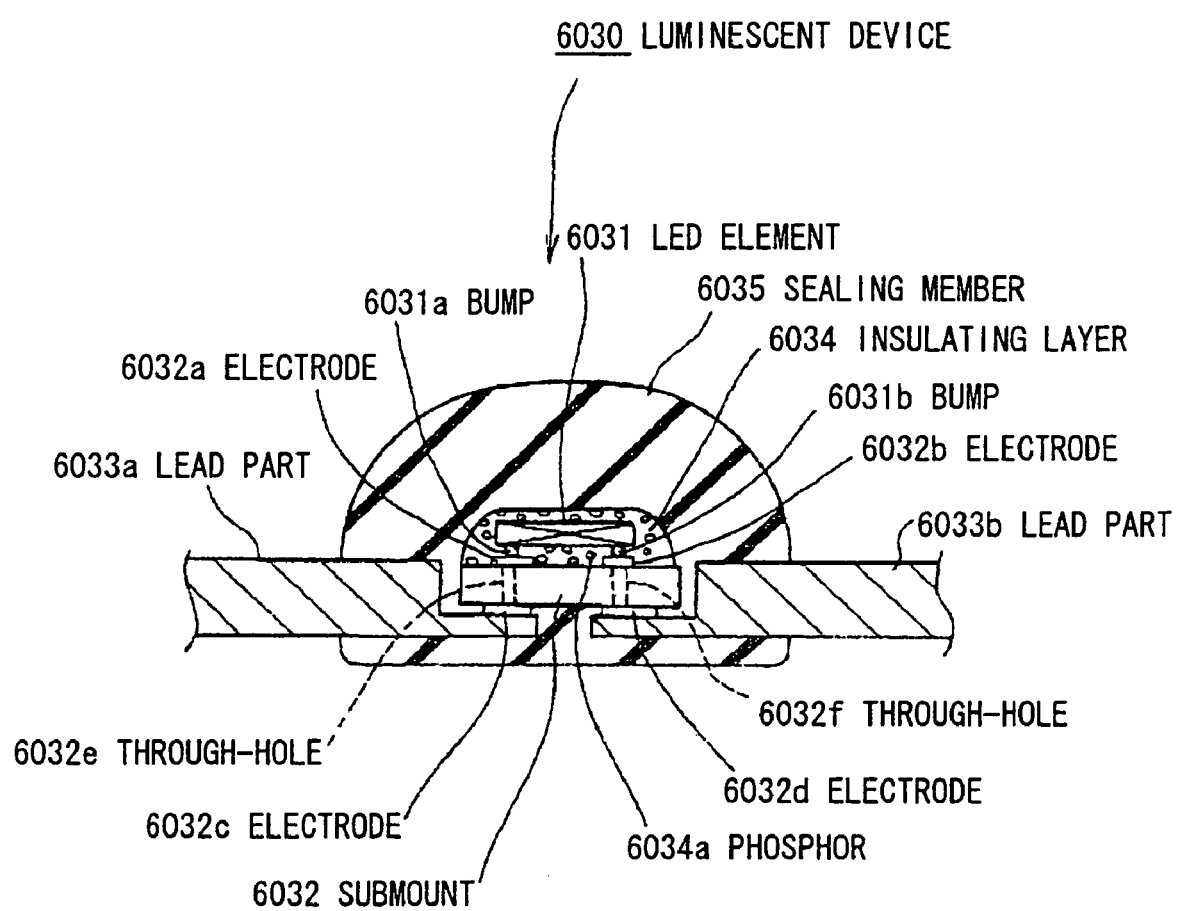
FIG. 91 is a cross-sectional view showing the construction of a luminescent device in a nineteenth embodiment.

FIG. 91 is a cross-sectional view showing a luminescent device in the nineteenth embodiment. As with the eighteenth embodiment, this luminescent device 6030 is of a metal lead type in which a light emitting element is mounted on a lead frame using a submount. Here as with FIG. 90, only the construction of the principal part is shown, and, further, a submount 6032 is shown in a non-cross sectional state. This embodiment is different from the eighteenth embodiment in the structure of the submount and the construction and formation area of the insulating layer.

This luminescent device 30 includes an LED element 6031 provided with bumps 6031a, 6031b on its mounting face, a submount 6032 on which the LED element 6031 is mounted, lead parts 6033a, 6033b as a power supply member in which the submount 6032 is mounted at the front end thereof, an insulating layer 6034 in which a phosphor 6034a has been mixed and which is formed by filling or dropping so as to cover the whole area of the LED element 6031, and a sealing member 6035 made of a light transparent glass for sealing the front end of the lead parts 6033a, 6033b including the upper face of the LED element 6031.

The submount 6032 is made of, for example, AlN (aluminum nitride) with a high level of thermal conductivity, and electrodes 6032a, 6032b connected to the bumps 6031a, 6031b are formed on the mounting face side of the LED element 6031. Electrodes 6032c, 6032d connected to a pair of lead parts 6033a, 6033b are formed on the opposite face (lead frame side). Through-holes 6032e, 6032f are provided within the submount 6032 for connection of the electrode 6032a to the electrode 6032c and connection of the electrode 6032c to the electrode 6032d.

The lead parts 6033a, 6033b are made of a copper-based or iron-based metal and are provided so as to face each other while providing a predetermined space therebetween on the inner side of the strip part on both sides as a part of a lead frame (not shown), and a pair of lead parts are provided for each one LED element. A part of the front end of the lead parts 6033a, 6033b is formed in a small thickness so as to form a level difference, and a submount 6032 is mounted in this level difference part.

The insulating layer 6034 is composed mainly of a silicone material, and a phosphor 6034a is mixed in the silicone material. The formation process of SiO$_2$ by cleaving of the chemical bond of the silicone material upon sealing of the sealing member 6025, and, for example, the heat dissipating effect attained by using a diamond or AlN powder-containing insulating material are the same as those in the case of the insulating layer 6013.

For example, when the LED element 6021 is a blue light emitting element, Ce (cerium):YAG (yttrium aluminum garnet), which is excited by blue light emitted from the LED element and emits yellow light, is used as the phosphor 6034a.

As with the above embodiments, the sealing member 6035 is made of a glass material which is transparent to light and has a low melting point.

In this luminescent device 6030, when the lead part 6033a is a positive (+) power supply terminal, current supplied to the lead part 6033a is passed through the lead part 6033a, the electrode 6032c, the through-hole 6032e, the electrode 6032a, and the bump 6031a and flows to the anode of the LED element 6031. Further, the current output from the cathode of the LED element 6031 is passed through the bump 6031b, the electrode 6032b, the through-hole 6032f, and the electrode 6032d and flows to the lead part 6033b, whereby the LED element 6031 emits light.

Assembling of the luminescent device 6030 will be explained.

At the outset, a submount 6032 with electrodes 6032a to 6032d and through-holes 6032e, 6032f previously formed thereon is provided. Bumps 6031a, 6031b are formed at predetermined positions on the submount 6032. The LED element 6031 is mounted thereon, whereby the LED element 6031 is electrically connected to the electrodes 6032a, 6032b through the bumps 6031a, 6031b and, at the same time, is mechanically fixed.

Next, the LED element 6031 mounted on the submount 6032 is disposed within the recess at the front end of the lead parts 6033a, 6033b so that the energization direction is made identical. Alternatively, after the submount 6032 is mounted on the lead parts 6033a, 6033b, the LED element 6031 may be mounted on the submount 6032.

Next, an insulating layer 6034 with a phosphor 6034a mixed therein is formed so as to extend to the upper face, side face, and upper face of the submount 6032 by dropping or filling.

The assembly is carried in the mold. A glass sheet (not shown) for the formation of the sealing member 35 is disposed on and under the LED element 6031, and molding into a semispherical shape is carried out at a predetermined temperature by pressing. Thus, the luminescent device 6030 is completed. In this sealing, the silicone material is converted to SiO$_2$ to form an insulating layer 6034 which fixes the lower face of the LED element 6031 and the bumps 6031a, 6031b. Therefore, for example, the deformation of bump 6012a and short-circuiting between bumps can be avoided. Finally, the other end of the lead parts 6033a, 6033b is isolated from a lead frame into individual luminescent devices.

The following effects are attained by the nineteenth embodiment.

(1) The provision of the insulating layer 6034 can avoid damage to the LED element 6031 by the sealing member 6035 at the time of sealing of the sealing member 6035, and, thus, deformation, movement, short-circuiting or the like in the bumps 6031a, 6031b can be prevented.

(2) Since the phosphor 6034a is mixed in the insulating layer 6034, light absorption by the electrode on the lead part (or the wiring layer on the submount) can be reduced. In general, Au plating is provided on the electrode and the wiring layer. This Au plating has a high level of blue or purple light absorption. The provision of the phosphor-mixed insulating layer 6034, however, can realize wavelength conversion of light emitted from the side face of the LED element to prevent light absorption on the Au plating face.

(3) Wavelength conversion is also possible for light emitted from the upper face of the LED element 6031.

Further, since the whole assembly is sealed with the sealing member 6035 made of a glass material, light attenuation caused by yellowing or coloring, which is a problem in the case where the sealing member is a resin material, can be prevented.

Instead of the submount 6032, a submount 6022 having " ⊐ "-shaped wiring layers 6022a, 6022b shown in FIG.

90 may be used. Contrary to this, instead of the submount 6022 shown in FIG. 90, the submount 6032 shown in FIG. 91 may be used.

Figure 92:
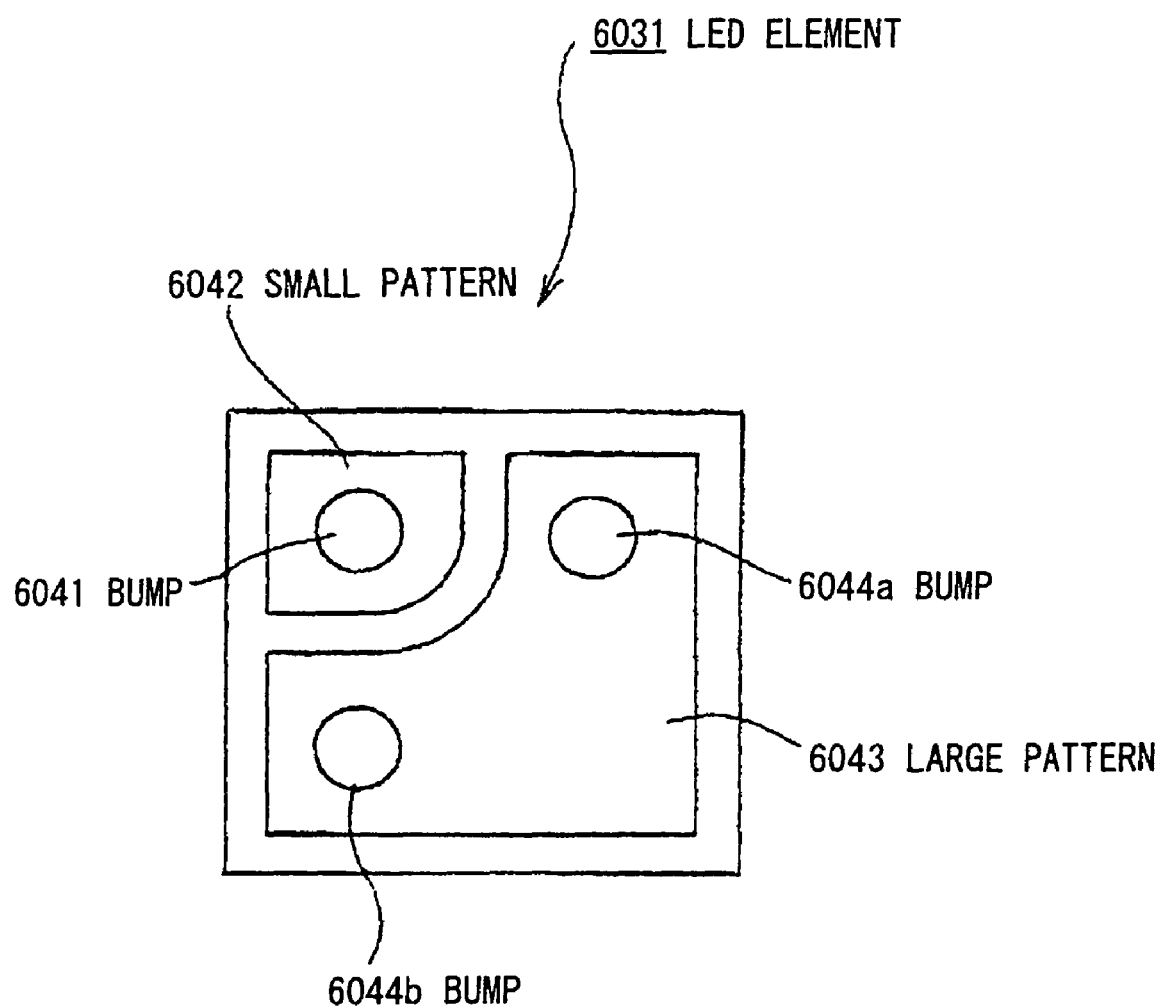
FIG. 92 is a plan view showing a bump formed face of an LED element of a standard size.

FIG. 92 is a plan view showing the bump forming face of an LED element of a standard size. This LED element 6031 is an LED element having a size of 0.3 mm square and includes a small pattern 6042 with a bump 6041 connected to an n-electrode mounted thereon, a large pattern 6043 connected to a p-electrode, and bumps 6044a, 6044b mounted on this large pattern 6043. The higher the output of the LED element 6031 is, the larger the current is. Accordingly, plural bumps are provided on the p-electrode side so as to cope with a large current capacity.

Figure 93:
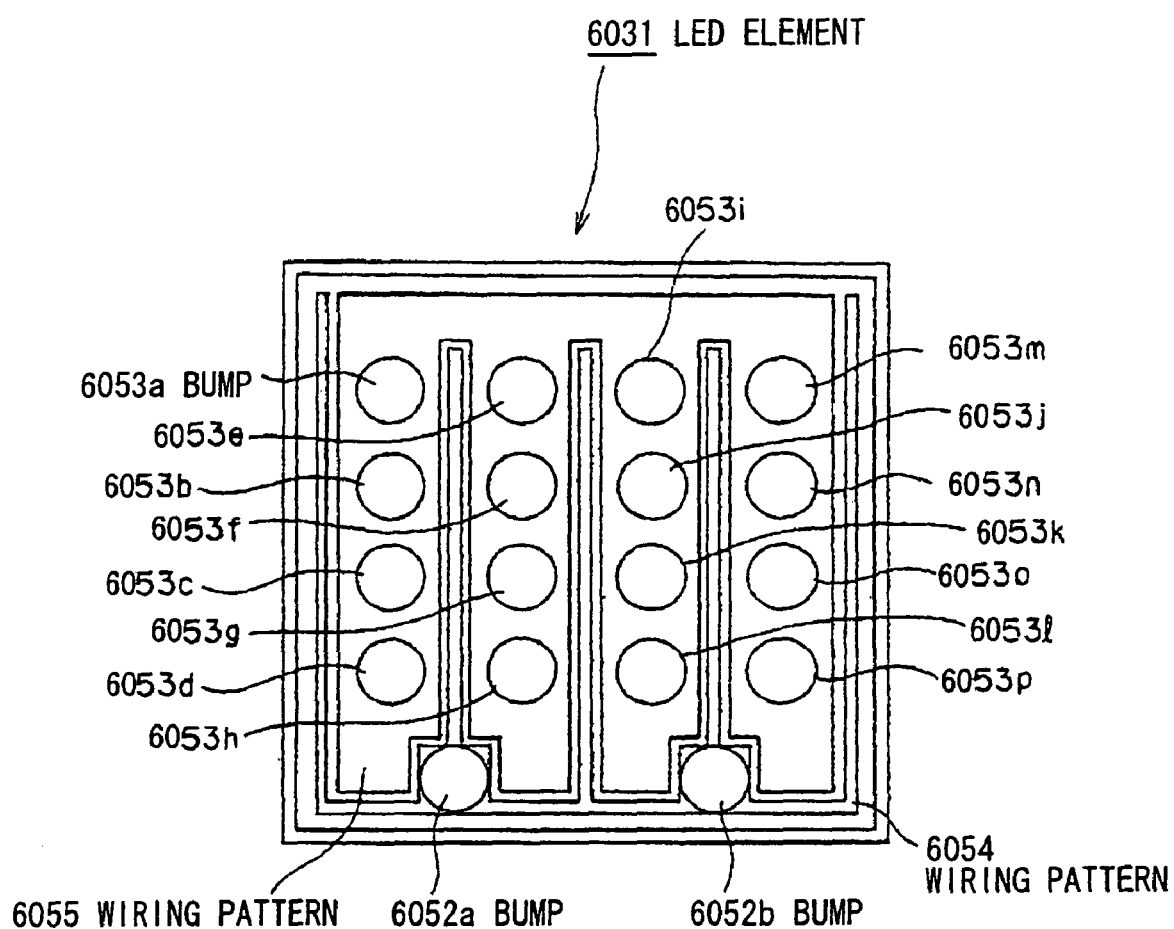
FIG. 93 is a plan view showing a bump formed face of an LED element of a large size.

FIG. 93 is a plan view showing the bump forming face of the large-size LED element. This LED element 6031 is an LED element having a size of 1 mm square and includes a wiring pattern 6054 on which bumps 6052a, 6052b are provided, and a wiring pattern 6055 on which bumps 6053a to 6053p are provided. Since the large-size LED element has a larger emission area than the standard size, larger current flows. Accordingly, in order to have uniform light emission on the light emitting face, depending upon the form, area of the wiring patterns 6054, 6055, for each wiring pattern, plural bumps are provided as electrode contacts.

As shown in FIGS. 92 and 93, in the LED element for electrical connection through bumps, the bumps are likely to collapse upon exposure to temperature and pressure at the time of glass sealing. In particular, as shown in FIG. 93, when a number of bumps 6053a to 6053p are provided, the distance between bumps is so small that deformation of bumps is more likely to cause short-circuiting. In this LED element 6031, the insulating layer 6034 covers the bump forming face to ensure insulation between the bumps and can withstand the pressure applied at the time of glass sealing to suppress the deformation of bumps 6053a to 6053p. As a result, the sealing member 6035 made of a glass material can be formed.

In the above embodiments, the bumps 6012a, 6012b are made of Au. The material for the bumps, however, is not limited to Au, and bumps formed by soldering may be used. Further, instead of bumps, solder plating formed in-electrodes may be used. When "K-PSK100" manufactured by Sumita Optical Glass, Inc. is used, sealing is carried out at a temperature above 400° C. and the viscosity of glass during processing is so high that even Au bumps collapse. On the other hand, in the case of a hybrid low-melting glass as an inorganic-organic mixture, sealing at a lower temperature is possible. As in solder bumps, when the melting point is below the sealing temperature, short-circuiting between-electrodes occurs even at a lower pressure. This invention is effective to overcome this problem.

Further, in the above embodiments, a phosphor layer for wavelength conversion may be formed on the upper part of the LED elements 6012, 6032 within the sealing members 6014, 6025, 6035.

Furthermore, in the above embodiments, one LED element was provided within one sealing member. Alternatively, however, two or more LED elements may be provided to constitute a multi-emission-type luminescent device. In this case, a plurality of LED elements to be mounted may be different from each other in emission color, or alternatively the plurality of LED elements may be identical to each other in emission color. Further, regarding the drive mode of the LED elements, all of the plurality of LED elements may be connected in parallel, or alternatively a plurality of LED element groups may be connected in parallel. Further, a plurality of LED elements may be connected in series, or alternatively all the LED elements may be connected in series.

In the above embodiments, the sealing members 6014, 6025, 6035 are in a dome form. The invention, however, is not limited to the form shown in the drawings, and any form such as a form not having any lens part, a polygonal form, or a cylindrical form may be adopted.

Further, the method for molding the sealing members 6014, 6025, 6035 is not limited to the molding method using a glass sheet by pressing, and other sealing methods may also be used.

Figure 94:
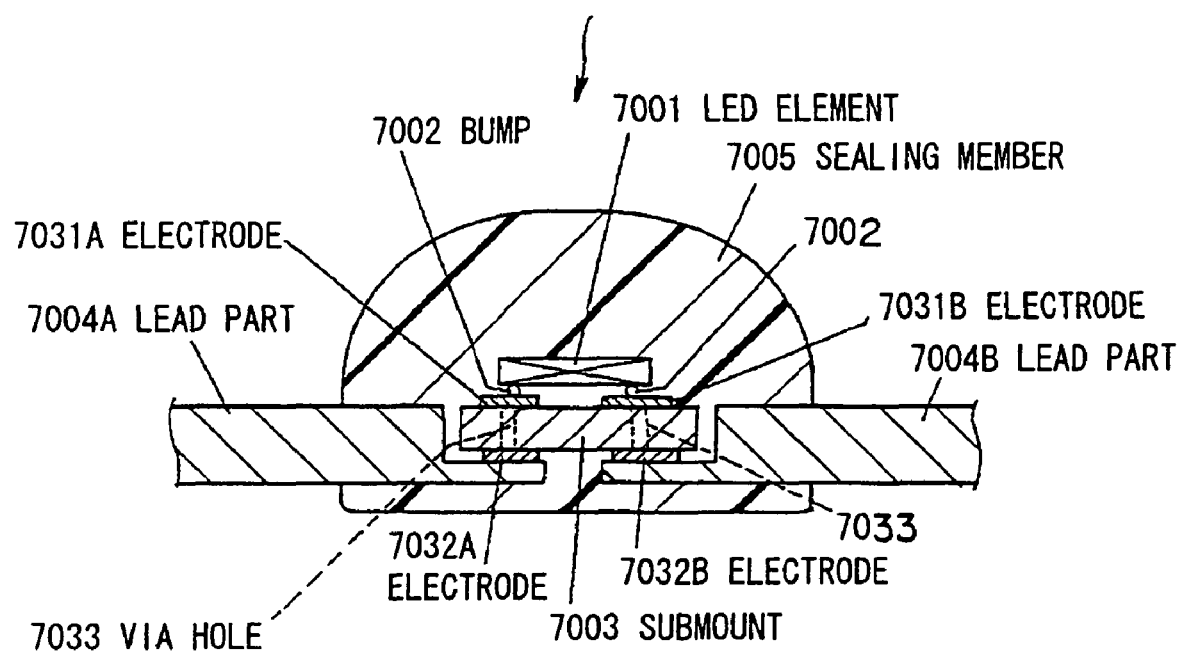
FIG. 94 is a cross-sectional view showing the construction of a luminescent device in a twentieth embodiment.

FIG. 94 is a cross-sectional view showing the construction of a luminescent device in the twentieth embodiment of the invention. In general, the lead frame is provided with a strip (not shown) to both sides of which the outer side of each lead part is connected. In general, plural LED elements are mounted on the lead frame. Here only one of the plural LED elements is shown. Further, in FIG. 94, the submount is shown in a non-cross sectional state.

The luminescent device 7010 is of a metal lead mounting type and includes a GaN-based LED element 7001 (coefficient of thermal expansion: 4.5 to $6 \times 10^{-6}$/° C.) which is subjected to flip chip bonding through a bump 7002 onto the mounting face, a submount 7003 on which the LED element 7001 is mounted, lead parts of Cu (coefficient of thermal expansion 15 to $17 \times 10^{-6}$/° C., thermal conductivity 400 $W \cdot m^{-1} \cdot k^{-1}$) 7004A, 7004B as a power supply member on which the submount 3 is mounted, and a sealing member 7005 made of transparent glass for sealing the LED element 7001 and the periphery around the LED element 7001.

The submount 7003 is made of, for example, AlN (aluminum nitride: coefficient of thermal expansion $5 \times 10^{-6}$/° C., thermal conductivity 180 $W \cdot m^{-1} \cdot k^{-1}$). Electrodes 7031A, 7031B connected to the bump 7002 are formed on the mounting face side of the LED element 1, and electrodes 7032A, 7032B for connection to a pair of lead parts 7004A, 7004B are formed on the opposite face (lead frame side face). The level of the mounting face of the LED element 7001 on the upper face of the lead parts 7004A, 7004B is lower by one step than the other part, and the submount 7003 is disposed within this recess. A through-hole 7033 is provided within the submount 7003 for connection of the electrodes 7031A, 7031B to the electrodes 7032A, 7032B.

The sealing member 7005 is formed by heat fusing a glass sheet, which is transparent and has a low melting point and a coefficient of thermal expansion close to the lead parts 7004A, 7004B (or within a predetermined difference in coefficient of thermal expansion), and constitutes a light transparent glass part for sealing the LED element 7001, the submount 7003, and a part of the lead parts 7004A, 70045.

When the lead part 7004A is a positive (+) power supply terminal, current supplied to the lead part 7004 is passed through a lead part 7004A, one of electrodes 7032A, 7032B, one via hole 7033, one of electrodes 7031A, 7031B, and one bump 7002 and flows to the anode of the LED element 7001. Further, the current output from the cathode of the LED element 7001 is passed through the other bump 7002, the other one of the electrodes 7031A, 7031B, the other via hole 7033, and the other one of the electrodes 7032A, 7032B and flows to the lead part 704B, whereby the LED element 7001 emits light.

Figure 95:
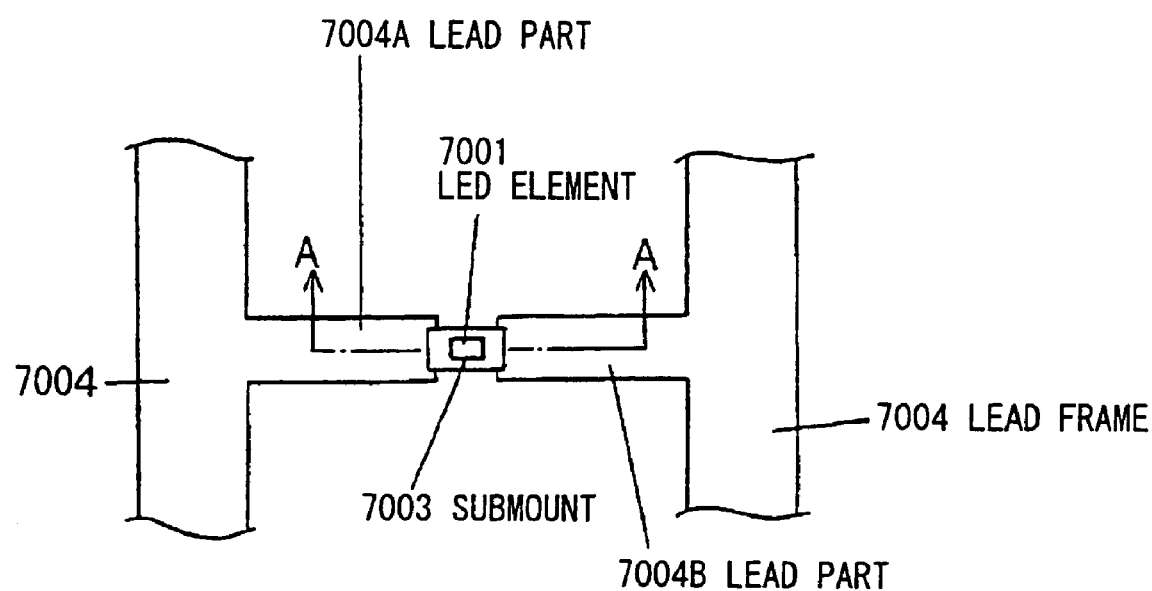
FIG. 95 is a plan view illustrating the state of mounting of a submount on a lead frame.

FIG. 95 is a plan view showing such a state that a submount has been mounted on a lead frame. The LED element 7001 is mounted at the center part of the submount 7003. The lead parts 7004A, 7004B are formed as a part of the lead frame so as to face each other while providing a predetermined gap therebetween on the inner side of the strip part on both sides, and a pair of lead parts are allocated to one LED element.

Figure 96:
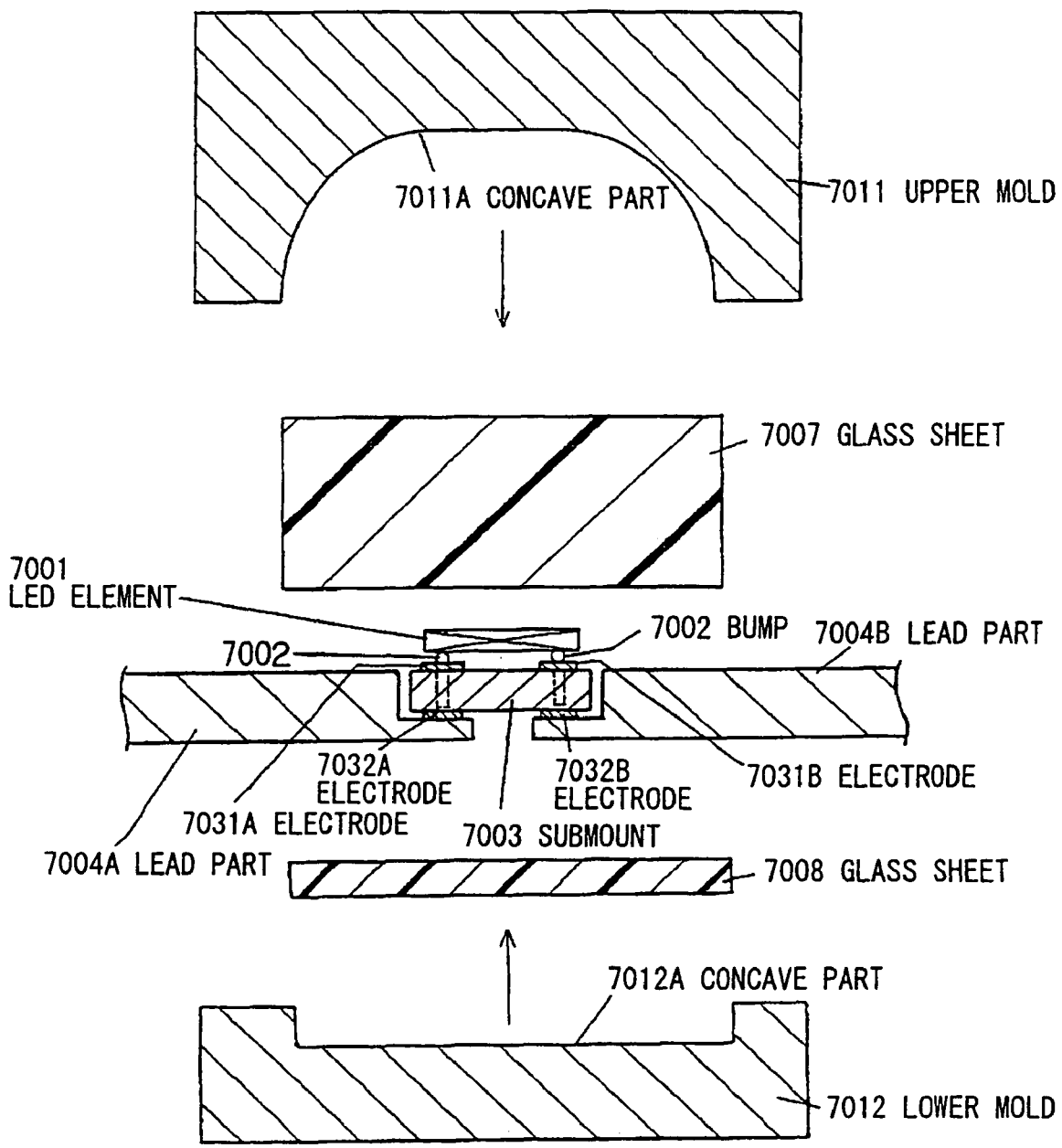
FIG. 96 is a diagram illustrating the state immediately before glass sealing using a mold.

FIG. 96 is a diagram showing a state just before glass sealing using a mold and is a diagram taken on line A-A of FIG. 95. The method for the manufacture of the luminescent device 7010 will be explained in conjunction with FIGS. 94 to 96.

The LED element 7001 provided with bumps 7002 is positioned on the submount 7003, followed by reflow for electrical connection of the bumps 7002 to the electrodes 7031 and mechanical fixation.

Next, the LED element 7001 mounted on the submount 7003 is disposed within a recess provided at the front end of the lead parts 7004A, 7004B so that energization direction is identical. A submount in which electrodes 7031A, 7031B, electrodes 7032A, 7032B and via holes 7033 have been previously formed is used as the submount 7003.

Next, a lead frame 7006 is carried in a mold, and glass sheets 7007, 7008 are disposed respectively on and under the LED element 7001. The glass sheets 7007, 7008 are for sealing member 7005 formation and has such a size that a plurality of LED elements 7001 are simultaneously sealed.

Next, an upper mold 7011 is disposed so as to cover the glass sheet 7007. Further, a lower mold 7012 is disposed so as to cover the glass sheet 7008. The glass sheets 7007, 7008 are then heated at 450° C. in a vacuum atmosphere for softening, and, in this state, the upper mold 7011 and the lower mold 7012 are moved in a direction indicated by an arrow shown in FIG. 95 to apply pressure to the glass sheets 7007, 7008. As a result, the glass sheets 7007, 7008 are molded into a dome like the sealing member 7005 shown in FIG. 94 along the upper mold 7011 in its concave part 7011A and the lower mold 7012 in its concave part 7012A.

Next, unnecessary parts such as the strip part in the lead frame 7004 are removed to isolate individual luminescent devices 7010 from the lead frame 7004.

In the luminescent device 7010, when a forward voltage is applied through the bump 7002 electrically connected to the pad electrode 7108 and the n-type electrode 7109, carrier recombination of hole and electron occurs within the active layer in the LED element 7001 resulting in light emission. The output light is emitted through the sapphire substrate 7101 to the outside of the LED element 7001. This output light is then radiated to the outside of the device through the sealing member 7005.

The following effects can be attained by the twentieth embodiment.

(1) Since the whole LED element 7001 having a lower coefficient of thermal expansion has been sealed with and surrounded by the sealing material 7005 made of a glass material having a larger coefficient of thermal expansion, the internal stress produced based on a difference in coefficient of thermal expansion is regulated so as to be directed to the center of the LED element 7001. That is, even when internal stress based on heat shrinkage of the glass material occurs after glass sealing, the internal stress functions as compressive force directed to the center direction of the LED element 1. Therefore, the glass material having strength against the compression can realize glass sealing structure without breaking.

(2) The LED element 7001 having a lower coefficient of thermal expansion is mounted on the submount 7003 having a lower coefficient of thermal expansion, and the assembly is mounted on the lead parts 7004A, 7004B having a higher coefficient of thermal expansion. Accordingly, for the glass material constituting the sealing member 7005, the adhesion to both the LED element 7001 having a lower coefficient of thermal expansion and the lead parts 7004A, 7004B having a higher coefficient of thermal expansion are required. In this case, a glass material having a coefficient of thermal expansion close to that of the LED element 7001 is preferably selected for sealing. The lead parts 7004A, 7004B made of a soft metal such as Cu is more elastic than the glass material. Therefore, if the difference in coefficient of thermal expansion between the lead parts, and the LED element 1 and the submount 3 is in the range of 150% to 400%, then the stress based on the heat shrinkage difference can be structurally absorbed while maintaining good adhesion to the glass material. This indicates that cracking or other unfavorable phenomenon does not occur even in the case where the lead parts 7004A, 7004B are sandwiched by the glass material for sealing.

(3) Even in the case where the electric power applied to the LED element 7001 is so large that the temperature of the generated heat is increased due to the electric power, the heat generated from the LED element 7001 can be released to the outside of the device, whereby a lowering in emission efficiency can be effectively prevented. In particular, this can be realized by bringing the thermal conductivity of the submount 7003 and the lead parts 7004A, 7004B to not less than 100 $W \cdot m^{-1} \cdot k^{-1}$.

(4) Since the sealing member 7005 is formed using the low melting glass sheets 7007, 7008, the time necessary for heating can be shortened and, in addition, the use of a simple heating device becomes possible. This can facilitate glass sealing.

(5) A failure such as cracking is less likely to occur during processing. Therefore, a high level of glass sealing properties can be stably maintained for a long period of time, there is no deterioration in luminescence characteristics even in water and under highly humid conditions, and, thus, excellent durability can be realized for a long period of time.

In the first embodiment, a construction using a GaN-based LED element 7001 as the LED element 7001 has been explained. However, it should be noted that the LED element is not limited to the GaN-based LED element and other LED elements may also be used.

Further, in the above embodiments, a construction in which the submount 7003 made of AlN is mounted on the lead parts 7004A, 7004B made of Cu has been explained. Alternatively, for example, a construction may also be adopted in which a submount 3 made of Si (coefficient of thermal expansion 170 $W \cdot m^{-1} \cdot k^{-1}$) is mounted on a lead part made of brass (coefficient of thermal expansion 106 $W \cdot m^{-1} \cdot k^{-1}$).

Further, the method for the formation of the sealing member 7005 is not limited to one in which plural LED elements 7001 and submounts 7003 are sealed at a time with a glass sheet, and a method may also be adopted in which a melted glass material is fed to a part around the LED element 7001 and the submount 7003 followed by heat pressing using an upper mold 7011 and a lower mold 7012 to form the sealing member. Further, the glass material used is also not limited to a transparent glass material and may be a colored glass material so far as the glass material is transparent to light.

Further, the sealing member 7005 may be in various forms depending upon specifications or the like. Examples of forms usable herein include round, elliptical, or quadrilateral forms and, further, forms with or without a lens.

In the above twentieth embodiment, the flip chip-type luminescent device using a metal lead as a power supply member has been explained. However, it should be noted that application to other types of luminescent devices is possible. For example, application to a face up (FU)-type luminescent devices using wire bonding is possible.

Figure 97:
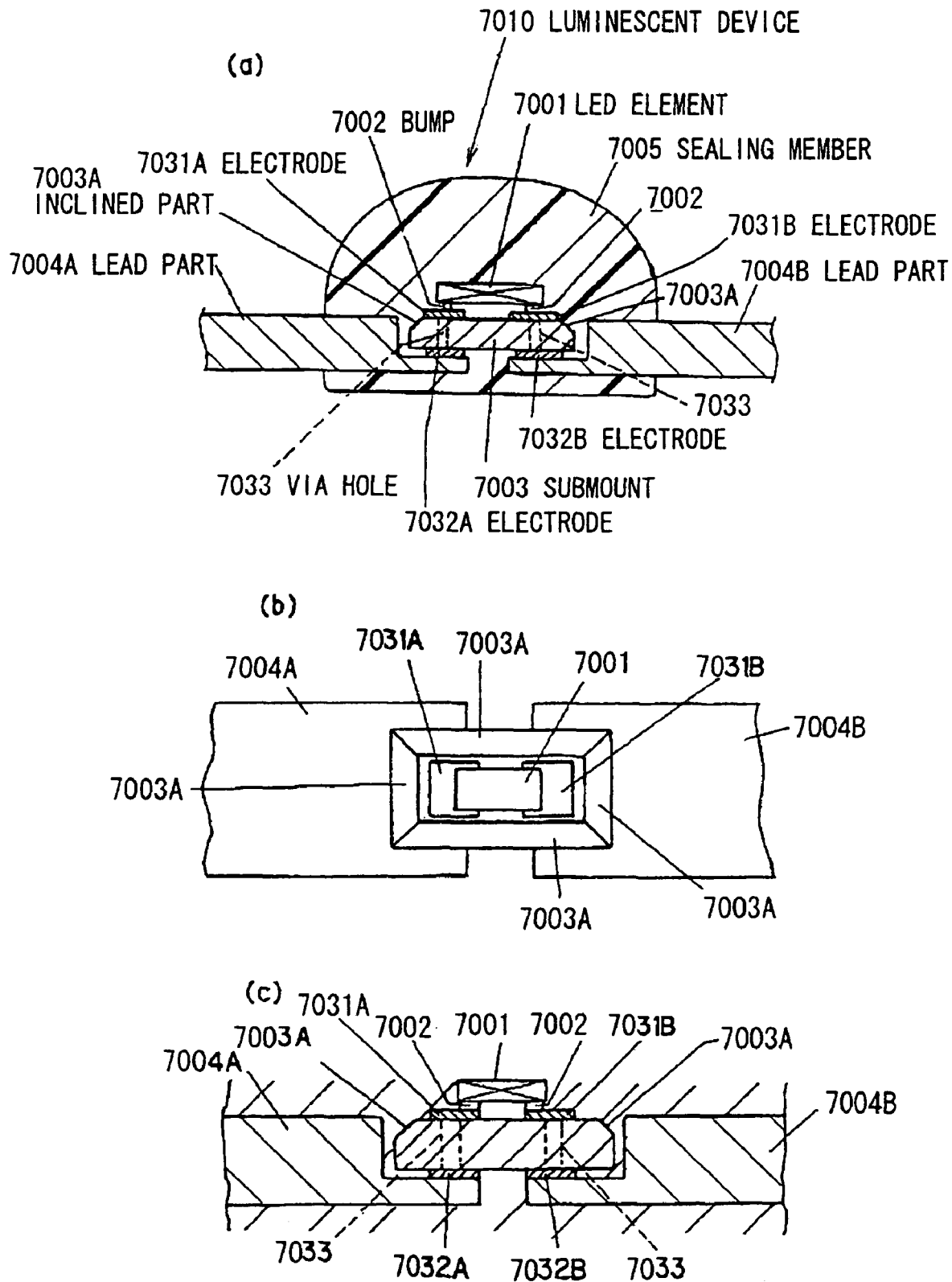
FIG. 97 is a cross-sectional view showing a variant of a luminescent device in the twentieth embodiment.

FIG. 97 is a cross-sectional view showing a variant of the luminescent device in the twentieth embodiment. The construction of this luminescent device 7010 is that, in order to prevent cracking caused by heat expansion and heat shrinkage of the sealing member 7005, an inclined part 7003A is provided by removing a corner part of the submount 7003. The use of this submount 3 can realize a glass sealing luminescent device 7010 which, in addition to advantageous effects attained by the twentieth embodiment, is advantageously less likely to cause cracking.

Figure 98:
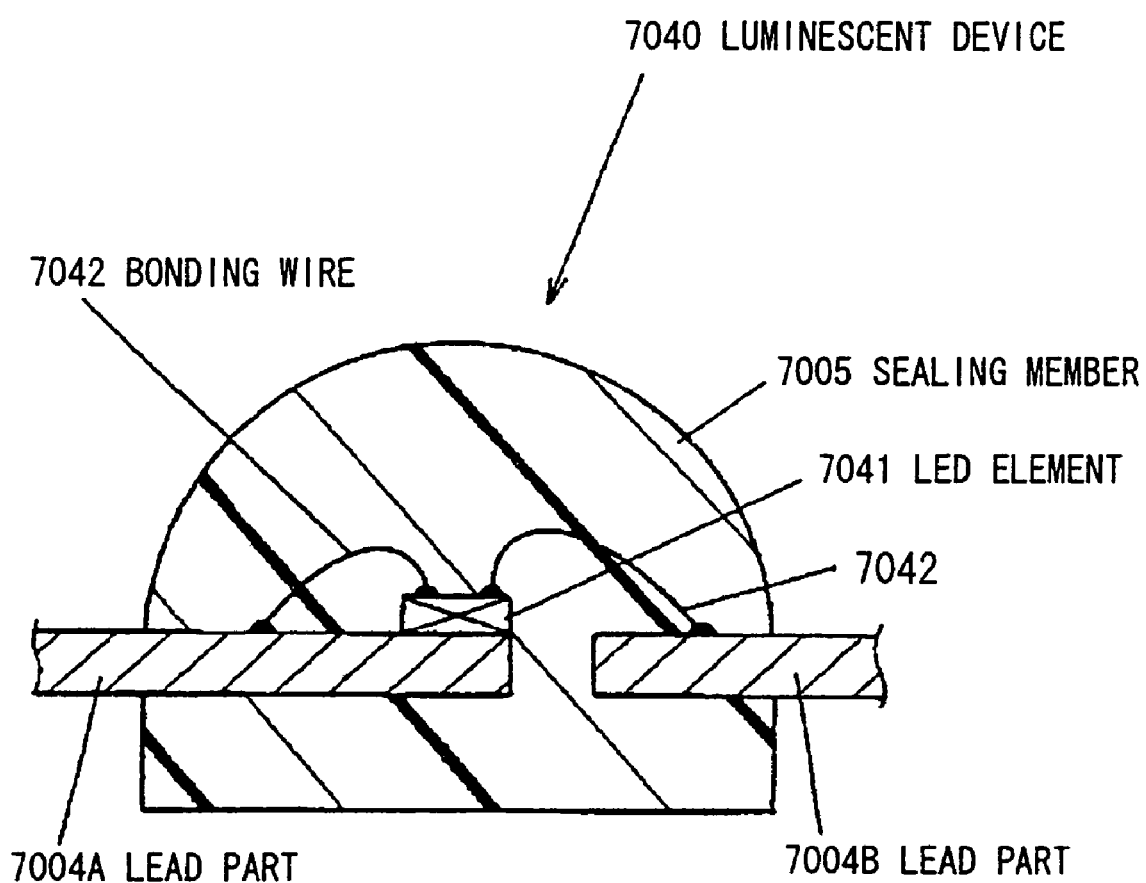
FIG. 98 is a cross-sectional view showing a face up-type luminescent device in a twenty-first embodiment of the invention.

FIG. 98 is a cross-sectional view showing a face up-type luminescent device in the twenty-first embodiment of the invention. This luminescent device 7040 includes lead parts 7004A, 7004B as a power supply member disposed horizontally on a straight line at the front end while providing a space therebetween, a GaN-based LED element 7041 mounted on the upper face of the front end of the lead part 7004A through an adhesive or the like, a wire 7042 for connecting two electrodes (not shown) on the LED element 7041 to the lead parts 7004A, 7004B, and a sealing member 7005 made of a glass material for sealing LED element 7041 and the front end part of the lead parts 7004A, 7004B.

The sealing member 7005 is made of a glass material which is transparent, has a low melting point, and has a coefficient of thermal expansion in a predetermined value range. In particular, in the face up type, when a wire is used, in the glass sealing, the heat softened wire 7042 and wire connection 7042A are likely to be collapsed upon exposure to pressure, and, consequently, for example, short-circuiting is likely to occur. For this reason, the use of a glass material having the lowest possible melting point is preferred.

Assembling of the luminescent device 7040 will be explained.

At the outset, in such a state before the separation of the lead frame, the LED element 7041 is mounted on the upper face of the front end of the lead part 7004A. Next, one electrode on the upper face of the LED element 7041 and the upper face of the lead part 7004A are connected to each other through a wire 7042, and, further, the other electrode on the upper face of the LED element 7041 and the upper face of the lead part 7004B are connected to each other through a wire 7042. Next, as explained above in connection with the twentieth embodiment, the molding of the glass material is carried out using a mold to form a sealing member 7005 having a predetermined shape. Finally, unnecessary parts in the lead frame 7004 are removed to isolate individual luminescent devices 7040 from the lead frame 7004.

In FIG. 98, for example, when the lead part 7004A is on the anode side, a positive side of a direct current source (not shown) is connected to the lead part 7004A, and a negative side is connected to the lead part 70048. Upon this energization, the LED element 7041 emits light. This light is emitted from the upper face of the LED element 7041 and practically passes through the sealing member 7005 and goes to the outside of the sealing member 7005, and a part of the light is internally reflected and goes to the outside of the sealing member 7005.

In the twenty-first embodiment, in addition to the advantageous effects of the twentieth embodiment, even in the case of the face up-type luminescent device 7040, the occurrence of separation or cracking can be prevented by taking into consideration the values of coefficient of thermal expansion of the lead parts 7004A, 7004B and the sealing member 7005 and using the low melting glass material.

In the above embodiments, a reflecting surface may be formed on the surface of the lead parts 7004A, 7004B for enhancing light outgoing efficiency.

Further, a wavelength conversion part using a phosphor or the like excited by a predetermined wavelength light may be provided within the sealing member 7005 on the upper part of the LED elements 7001, 7042.

In the above embodiments, one LED element was provided within one sealing member. Alternatively, however, two or more LED elements may be provided to constitute a multi-emission-type luminescent device. Regarding the type of the luminescent device in this case, the construction shown in FIG. 94 which is of a flip chip bonding type is suitable. In this case, a plurality of LED elements to be mounted may be different from each other in emission color, or alternatively the plurality of LED elements may be identical to each other in emission color.

Further, regarding the drive mode of the LED elements, all of the plurality of LED elements may be connected in parallel, or alternatively a plurality of LED element groups may be connected in parallel. Further, a plurality of LED elements may be connected in series, or alternatively all the LED elements may be connected in series.

Further, in the above embodiments, the sealing member 7005 is in a semispherical form having a lens part on its top part. However, it should be noted that the sealing member 7005 is not limited to the form shown in the drawings, and any form such as a form not having any lens part, a polygonal form, or a cylindrical form may be adopted.

Furthermore, the glass sheet has been used in molding the sealing member 7005. The method for sealing member formation is not limited to the method using a glass sheet, and other sealing methods may also be used.

FIG. 99 shows a flip chip-type luminescent device in the twenty-second embodiment of the invention, wherein (a) is a cross-sectional view and (b) a side view as viewed from the right side face of (a). Parts having the same construction as those in the twentieth embodiment are identified with the same reference numerals. The construction of this luminescent device 7010 is that, as shown in FIG. 99 (a), the submount element 7003 is mounted on a heat dissipating part 7050 made of Cu followed by integral sealing with a sealing member 7005 made of low melting glass. A lens 7005A is provided in the sealing member 7005.

The submount element 7003 is received in a groove part 7051 provided in the heat dissipating part 7050, and a wiring pattern 7053 provided on its surface and the LED element 7001 in its electrode are electrically connected to each other through the bump 7002 to constitute a part of the power supply part. After connection to the LED element 7001, the wiring pattern 7053 is soldered to the lead parts 7004A, 7004B made of Cu, a soft metal. As shown in FIG. 99 (b), the lead part 7004B is placed in the groove part 7051 through a glass material 7052 which is rectangular in section and is in a rod form, and, in this state of insulation from the heat dissipating part 7050, the sealing member 5 is heat pressed. In this case, the lead part 7004A is also treated in the same manner as in the lead part 7004B. The lead parts 7004A, 7004B are integrated in such a state that the lead parts 7004A, 7004B are insulated from the heat dissipating part 7050 by the glass material 7052 and sealing member 7005 which have been melted based on heat pressing.

In the twenty-second embodiment, the heat dissipating part 7050 on which the submount element 7003 has been mounted is integrally sealed by the sealing member 7005 made of a glass material. Therefore, in addition to advantageous effects in the first embodiment, the dissipation of heat conveyed from the submount element 7003 can be advantageously enhanced, and, thus, a luminescent device 7001 can be provided in which excellent heat dissipation can be realized in glass sealing, as well as, for example, in the case where the quantity of heat generated from the LED element 7001 by the flow of large current is increased, and package cracks derived from a thermal expansion coefficient difference are less likely to occur.

In the twenty-second embodiment, the construction using the heat dissipating part 7050 made of Cu has been explained. However, other materials, which have good thermal conductivity and are small in a difference in coefficient of thermal expansion from the sealing member 7005, for example, Cu alloys and aluminum may also be used. When the heat dissipating part 7050 is made of aluminum, the difference in coefficient of thermal expansion between the heat dissipating part 7050, and the LED element 7001 and the submount 7003 is about 500%.

FIG. 100 shows a face up-type luminescent device in the twenty-third embodiment of the invention, wherein (a) is a cross-sectional view and (b) a side view as viewed from the right side face of (a). Parts identical to those in the twenty-first embodiment are identified with the same reference numerals. In this luminescent device 70040, as shown in FIG. 100 (a), the LED element 7040 is bonded to the center of the heat dissipating part 50 made of Cu. Lead parts 7004A, 7004B and the LED element 7040 in its electrode for supplying electric power to the LED element 7040 are electrically bonded to each other through a wire 7042. The LED element 7040, the wire 7042, and the lead parts 7004A, 7004B are covered by a silicone coating part 7060 made of a silicone resin so as to withstand heat at the time of low melting glass sealing. The sealing member 7005 covers the silicone coating part 7060 and, in addition, is integrated with the heat dissipating part 7050. A lens 7005A is formed in the sealing member 7005.

In the twenty-third embodiment, even in the case of a face up-type luminescent device 7040, glass sealing while preventing the deformation of the electrode in the LED element 7041 and the wire 7042 caused by the pressure of the glass sealing becomes possible by covering the periphery of the LED element 7041 with the heat resistant and elastic silicone coating part 7060. Therefore, a luminescent device 7001 can be realized which, in addition to advantageous effects attained by the twenty-first embodiment, is excellent in LED element 7041 mounting properties, and, in addition, is good in heat dissipating properties not only during glass sealing, but also, for example, in the case where the quantity of heat generated from the LED element 7041 is increased due to the use of large current and is less likely to cause package cracking derived from a thermal expansion coefficient difference. Further, the silicone coating part 7060 may contain a phosphor.

In the twenty-third embodiment, a construction has been explained in which electric power is supplied to the LED element 7041 mounted on the heat dissipating part 7050 from a pair of lead parts 7004A, 7004B. For example, a construction may also be adopted in which the heat dissipating part 7050 is integrated with one lead part, and the other lead part is insulated from the heat dissipating part 7050 through a glass material 7052.

In addition to the use of the silicone resin as the coating material, other heat resistant materials such as ceramic coating materials may be used. The construction in which the coating material is applied is not limited to the face up-type LED element and can be applied to flip chip-type LED elements.

In light emitting elements such as LEDs, when the refractive index of the light emitting element is 2 or more, sealing of the element with a sealing material with a refractive index of about 1.5 or more can enhance the efficiency of takeout of light from the element by about twice or more. In this case, the sealing material should be transparent to light. In photodetectors, this effect cannot be attained, and the effect attained by intimate contact sealing of the element directly with the light transparent material is only the effect of reducing reflection at interface between dissimilar media. Light transparency is not required when the element is not an optical element.

In the above embodiments, the sealing material is glass. The sealing material, however, may be one obtained by crystallization after glass processing, and may be any inorganic material so far as it has high chemical stability.

INDUSTRIAL APPLICABILITY

As described above, according to the invention, even when a hard glass material of $10^8$ to $10^9$ poises is used, sealing can be carried out without damage to solid elements. Therefore, low melting glass can be used, good glass sealing can be realized while reducing thermal load applied to the solid elements. The realization of a solid element device sealed with glass which, as compared with resin materials, requires high temperature processing and is a hard material that enables the solid element device to be used in high-temperature environments and environments where weathering resistance is required. Further, the adoption of light transparent glass can realize such a high level of reliability that the light transmittance of the optical device is stable and undergoes no change with the elapse of time. Further, for the solid light emitting element, when high refractive index glass is selected, the efficiency of takeout of light from the light emitting element can be improved and, consequently, highly efficient luminescent devices can be realized.

What is claimed is:

1. A solid element device, comprising:
a solid element;
an electric power receiving and supplying part for receiving electric power from and supplying the electric power to said solid element; and
an inorganic sealing material for sealing said solid element, said inorganic sealing material comprising a low melting glass selected from $SiO_2$—$Nb_2O_5$-based, $B_2O_3$—F-based, $P_2O_5$—F-based, $P_2O_5$—ZnO-based, $SiO_2$—$B_2O_3$—$La_2O_3$-based, and $SiO_2$—$B_2O_3$-based low melting glasses,
wherein said electric power receiving and supplying part comprises an inorganic material substrate with an electrically conductive pattern formed thereon, and
wherein said inorganic material substrate seals said solid element with said inorganic sealing material.

2. The solid element device according to claim 1, wherein said electric power receiving and supplying part comprises a metal lead.

3. The solid element device according to claim 2, wherein said metal lead comprises a soft metal.

4. The solid element device according to claim 1, wherein said inorganic material substrate has a coefficient of thermal expansion equivalent to that of said inorganic sealing material.

5. The solid element device according to claim 1, wherein said inorganic sealing material has a lower coefficient of thermal expansion than that of said inorganic material substrate.

6. The solid element device according to claim 4, wherein said inorganic material substrate seals said solid element based on a chemical reaction bonding with said inorganic sealing material.

7. The solid element device according to claim 1, wherein said inorganic sealing material comprises a surface subjected to coating treatment for rendering said surface resistant to moisture, acids or alkalis.

8. The solid element device according to claim 1, wherein said solid element comprises an optical element, and said inorganic sealing material comprises a transparent material.

9. The solid element device according to claim 8, wherein said optical element comprises a light emitting element.

10. The solid element device according to claim 8, wherein said optical element is sealed by said inorganic sealing material with a refractive index of 1.7 or more.

11. The solid element device according to claim 8, wherein said optical element comprises a light receiving element.

12. The solid element device according to claim 1, wherein said inorganic sealing material comprises a surface subjected to a coating treatment for reducing reflection at an interface of said inorganic sealing material and air.

13. The solid element device according to claim 1, wherein said inorganic sealing material comprises a surface overmolded with a resin.

14. A solid element device, comprising:
a solid element;
an electric power receiving and supplying part for receiving electric power from and supplying the electric power to said solid element; and
an inorganic sealing material for sealing said solid element, said inorganic sealing material comprising a low melting glass selected from $SiO_2$—$Nb_2O_5$-based, $B_2O_3$—F-based, $P_2O_5$—F-based, $P_2O_5$—ZnO-based, $SiO_2$—$B_2O_3$—$La_2O_3$-based, and $SiO_2$—$B_2O_3$-based low melting glasses,
wherein said electric power receiving and supplying part comprises an inorganic material substrate with an electrically conductive pattern formed thereon, and
wherein said inorganic sealing material is bonded to the inorganic material substrate by hot pressing.

* * * * *